(12) United States Patent
Pak et al.

(10) Patent No.: US 12,245,496 B2
(45) Date of Patent: Mar. 4, 2025

(54) LIGHT EMITTING DEVICE

(71) Applicant: Samsung Display Co., Ltd., Yongin-si (KR)

(72) Inventors: Sun Young Pak, Suwon-si (KR); Taeil Kim, Hwaseong-si (KR); Junha Park, Gwacheon-si (KR); Jang Yeol Baek, Yongin-si (KR); Kyoung Sunwoo, Hwaseong-si (KR); Mun-Ki Sim, Seoul (KR); Chanseok Oh, Seoul (KR); Minjung Jung, Gangwon-do (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 831 days.

(21) Appl. No.: 17/403,040

(22) Filed: Aug. 16, 2021

(65) Prior Publication Data

US 2022/0209116 A1    Jun. 30, 2022

(30) Foreign Application Priority Data

Dec. 23, 2020    (KR) ........................ 10-2020-0181950

(51) Int. Cl.
*H10K 85/60*    (2023.01)
*C07F 5/02*    (2006.01)
(Continued)

(52) U.S. Cl.
CPC ........... *H10K 85/322* (2023.02); *C07F 5/027* (2013.01); *C09K 11/06* (2013.01);
(Continued)

(58) Field of Classification Search
CPC ............ H10K 85/658; H10K 85/6572; H10K 85/636; H10K 85/322; H10K 50/121;
(Continued)

(56) References Cited

U.S. PATENT DOCUMENTS

| | | |
|---|---|---|
| 10,374,166 B2 | 8/2019 | Hatakeyama et al. |
| 2020/0185626 A1 | 6/2020 | Yuuki |
| 2020/0190115 A1* | 6/2020 | Hatakeyama ...... H10K 85/6572 |

FOREIGN PATENT DOCUMENTS

| | | |
|---|---|---|
| KR | 10-2016-0119683 | 10/2016 |
| KR | 10-2020-0006965 | 1/2020 |

(Continued)

OTHER PUBLICATIONS

Anton Pershin et al., "Highly emissive excitons with reduced exchange energy in thermally activated delayed fluorescent molecules", Nature Communications, Feb. 5, 2019, pp. 1-5, vol. 10, No. 597.

(Continued)

*Primary Examiner* — Shane Fang
(74) *Attorney, Agent, or Firm* — KILE PARK REED & HOUTTEMAN PLLC

(57) ABSTRACT

A light emitting device according to an embodiment includes a first electrode, a hole transport region disposed on the first electrode, an emission layer disposed on the hole transport region, an electron transport region disposed on the emission layer, and a second electrode disposed on the electron transport region. The emission layer includes a (Continued)

fused polycyclic compound represented by Formula 1, which is defined in the specification.

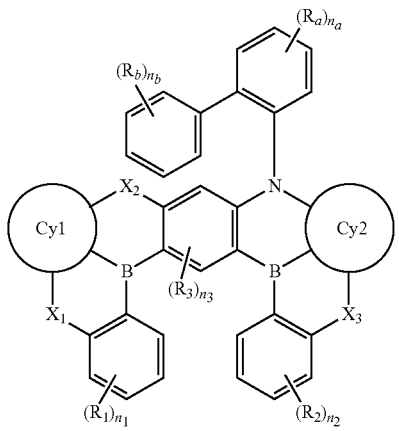

[Formula 1]

20 Claims, 6 Drawing Sheets

(51) Int. Cl.
| | |
|---|---|
| *C09K 11/06* | (2006.01) |
| *H10K 50/11* | (2023.01) |
| *H10K 50/13* | (2023.01) |
| *H10K 50/15* | (2023.01) |
| *H10K 50/18* | (2023.01) |
| *H10K 59/12* | (2023.01) |
| *H10K 59/38* | (2023.01) |
| *H10K 85/30* | (2023.01) |
| *H10K 101/10* | (2023.01) |

(52) U.S. Cl.
CPC ...... *C09K 2211/1018* (2013.01); *H10K 50/11* (2023.02); *H10K 50/15* (2023.02); *H10K 2101/10* (2023.02)

(58) Field of Classification Search
CPC ..... H10K 2101/10; H10K 50/11; C07F 5/027; C08G 61/10; C08G 61/122; C08G 2261/124; C08G 2261/1412; C08G 2261/1414; C08G 2261/148; C08G 2261/18; C08G 2261/228; C08G 2261/312; C08G 2261/3142; C08G 2261/3162; C08G 2261/3221; C08G 2261/95; C09K 11/06; C09K 2211/1018
See application file for complete search history.

(56) References Cited

FOREIGN PATENT DOCUMENTS

| | | |
|---|---|---|
| KR | 10-2020-0011383 | 2/2020 |
| KR | 10-2141284 | 8/2020 |
| WO | 2018/212169 | 11/2018 |

OTHER PUBLICATIONS

Yasuhiro Kondo et al., "Narrowband deep-blue organic light-emitting diode featuring an organoboron-based emitter", Nature Photonics, Jul. 15, 2019, https://doi.org/10.1038/s41566-019-0476-5.

\* cited by examiner

LIGHT EMITTING DEVICE

CROSS-REFERENCE TO RELATED APPLICATION(S)

This application claims priority to and benefits of Korean Patent Application No. 10-2020-0181950 under 35 U.S.C. § 119, filed on Dec. 23, 2020 in the Korean Intellectual Property Office, the entire contents of which are incorporated herein by reference.

BACKGROUND

1. Technical Field

The disclosure relates to a light emitting device including a novel fused polycyclic compound as a light emitting material.

2. Description of the Related Art

Active development continues for an organic electroluminescence display as an image display. The organic electroluminescence display is different from a liquid crystal display and is a so-called self-luminescent display in which holes and electrons respectively injected from a first electrode and a second electrode recombine in an emission layer so that a light emitting material including an organic compound in the emission layer emits light to achieve display.

In the application of an organic electroluminescence device to an image display, there is a need for decreasing driving voltage, increasing emission efficiency, and increasing the life of the organic electroluminescence device, as well as for continuous development of materials for an organic electroluminescence device which stably achieves such characteristics.

Recently, in order to develop an organic electroluminescence device with high efficiency, techniques on phosphorescence emission which uses energy in a triplet state or delayed fluorescence emission which uses the generating phenomenon of singlet excitons by the collision of triplet excitons (triplet-triplet annihilation, TTA) are being developed, and development on a material for thermally activated delayed fluorescence (TADF) using delayed fluorescence phenomenon is being conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device showing improved emission efficiency.

The disclosure also provides a fused polycyclic compound which is capable of improving the emission efficiency of a light emitting device.

An embodiment provides a light emitting device which may include a first electrode, a hole transport region disposed on the first electrode, an emission layer disposed on the hole transport region, an electron transport region disposed on the emission layer, and a second electrode disposed on the electron transport region. The emission layer includes a fused polycyclic compound represented by Formula 1 below.

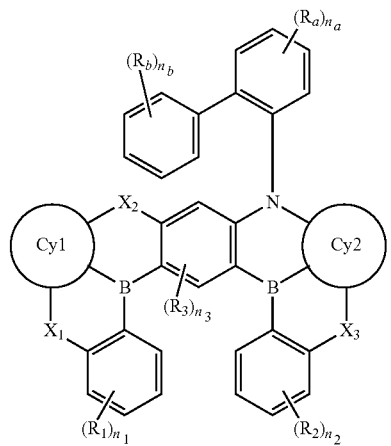

[Formula 1]

In Formula 1, $X_1$ to $X_3$ may each independently be $C(R_4)(R_5)$, $N(R_6)$, O, S, or Se, $R_1$ to $R_6$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, $R_a$ and $R_b$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, $n_1$ and $n_2$ may each independently be an integer from 0 to 4, $n_3$ may be an integer from 0 to 2, $n_a$ may be an integer from 0 to 4, $n_b$ may be an integer from 0 to 5, Cy1 and Cy2 may each independently be a group represented by Formula 2-1 or Formula 2-2 below, and at least of among Cy1 and Cy2 may be represented by Formula 2-1 below.

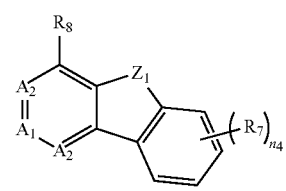

[Formula 2-1]

In Formula 2-1, $Z_1$ may be $C(R_9)(R_{10})$, $N(R_{11})$, O, S, or Se, $R_7$ to $R_{11}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, $n_4$ may be an integer from 0 to 4, $A_1$ may be a position bonded to a boron atom in Formula 1, and $A_2$ may be positions bonded to $X_1$ and $X_2$ in Formula 1, or positions bonded to a nitrogen atom and $X_3$ in Formula 1.

[Formula 2-2]

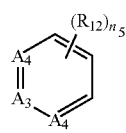

In Formula 2-2, $R_{12}$ may be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, $n_5$ may be an integer from 0 to 3, $A_3$ may be a position bonded to a boron atom in Formula 1, and $A_4$ may be positions bonded to $X_1$ and $X_2$ in Formula 1, or positions bonded to a nitrogen atom and $X_3$ in Formula 1.

The hole transport region includes an amine compound represented by Formula H-a below.

[Formula H-a]

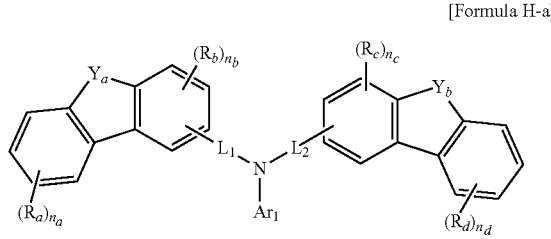

In Formula H-a, $Y_a$ and $Y_b$ may each independently be $C(R_e)(R_f)$, $N(R_g)$, O, or S, $Ar_1$ may be a substituted or unsubstituted aryl group of 6 to 30 ring-forming carbon atoms, or a substituted or unsubstituted heteroaryl group of 2 to 30 ring-forming carbon atoms, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms, $R_a$ to $R_g$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, $n_a$ and $n_d$ may each independently be integers from 0 to 4, and $n_b$ and $n_c$ may each independently be integers from 0 to 3.

In an embodiment, the emission layer may emit delayed fluorescence.

In an embodiment, the emission layer may be a delayed fluorescence emission layer including a host and a dopant, and the dopant may include the fused polycyclic compound.

In an embodiment, the emission layer may emit light with a central wavelength in a range of about 430 nm to about 490 nm.

In an embodiment, the fused polycyclic compound represented by Formula 1 may be represented by Formula 3 below.

[Formula 3]

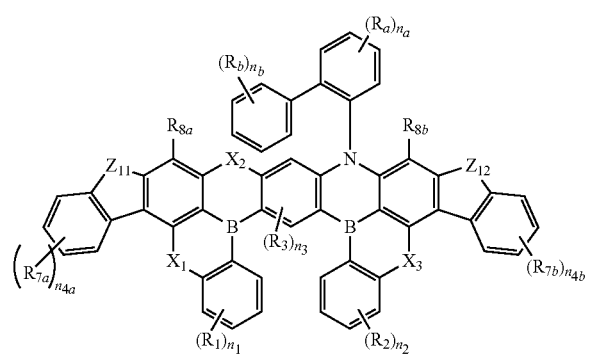

In Formula 3, $Z_{11}$ and $Z_{12}$ may each independently be $C(R_{9a})(R_{10a})$, $N(R_{11a})$, O, S, or Se. In Formula 3, $R_{7a}$, $R_{7b}$, $R_{8a}$, $R_{8b}$, $R_{9a}$, $R_{10a}$, and $R_{11a}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, and $n_{4a}$ and $n_{4b}$ may each independently be an integer from 0 to 4.

In Formula 3, $X_1$ to $X_3$, $R_1$ to $R_6$, $R_a$, $R_b$, $n_1$ to $n_3$, $n_a$, and $n_b$ may be the same as defined in connection with Formula 1.

In an embodiment, the fused polycyclic compound represented by Formula 3 may be represented by Formula 4 below.

[Formula 4]

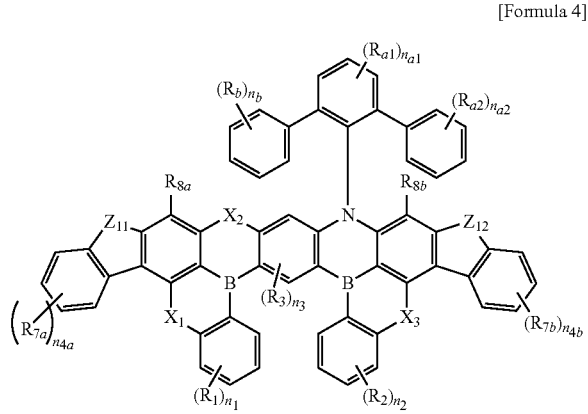

In Formula 4, $R_{a1}$ and $R_{a2}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring, $n_{a1}$ may be an integer from 0 to 3, and $n_{a1}$ may be an integer from 0 to 5.

In Formula 4, $X_1$ to $X_3$, $Z_{11}$, $Z_{12}$, $R_1$ to $R_6$, $R_a$, $R_b$, $R_{7a}$, $R_{7b}$, $R_{8a}$, $R_{8b}$, $R_{9a}$, $R_{10a}$, $R_{11a}$, $n_1$ to $n_3$, $n_a$, $n_b$, $n_{4a}$, and $n_{4b}$ may be the same as defined in connection with Formula 1 and Formula 3.

In an embodiment, at least one of Cy1 and Cy2 may be represented by Formula 2-1a below.

[Formula 2-1a]

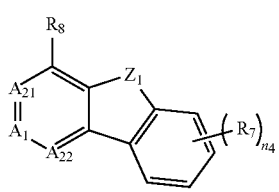

In Formula 2-1a, $A_{21}$ may be a position bonded to $X_2$ in Formula 1 or a position bonded to a nitrogen atom in Formula 1, and $A_{22}$ may be a position bonded to $X_1$ in Formula 1 or a position bonded to $X_3$ in Formula 1.

In Formula 2-1a, $A_1$, $Z_1$, $R_7$, $R_8$, and $n_4$ may be the same as defined in connection with Formula 2-1.

In an embodiment, at least one of Cy1 and Cy2 may be represented by Formula 2-1-1 or Formula 2-1-2 below.

[Formula 2-1-1]

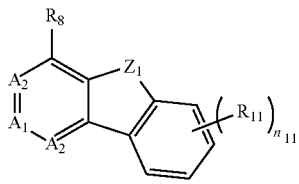

[Formula 2-1-2]

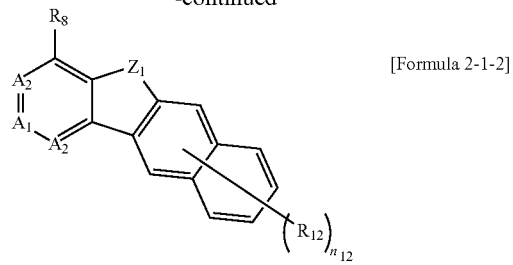

In Formula 2-1-1 and Formula 2-1-2, $R_{11}$ and $R_{12}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, $n_{11}$ may be an integer from 0 to 4, and $n_{12}$ may be an integer from 0 to 6.

In Formula 2-1-1 and Formula 2-1-2, $A_1$, $A_2$, $Z_1$, and $R_8$ may be the same as defined in connection with Formula 2-1.

In an embodiment, in Formula 1, in case where each of $X_1$ to $X_3$ is $N(R_6)$, $R_6$ may be a substituted or unsubstituted phenyl group.

In an embodiment, in Formula 1, Formula 2-1, and Formula 2-2, $R_1$ to $R_{12}$ may each independently be a hydrogen atom, a deuterium atom, a substituted or unsubstituted methyl group, a substituted or unsubstituted t-butyl group, a substituted or unsubstituted phenyl group, or a substituted or unsubstituted biphenyl group.

In an embodiment, the light emitting device may further include a capping layer disposed on the second electrode. The capping layer may have a refractive index equal to or greater than about 1.6.

In an embodiment, the light emitting device may further include an encapsulating layer disposed on the second electrode, and the encapsulating layer may include at least one inorganic layer and at least one organic layer.

In an embodiment, the host may include a compound represented by Formula E-2a or Formula E-2b below.

[Formula E-2a]

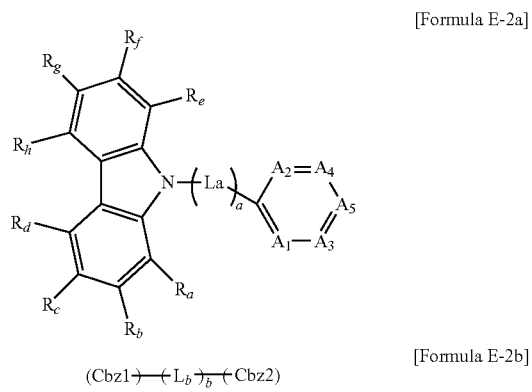

[Formula E-2b]

(Cbz1)─(L$_b$)$_b$─(Cbz2)

In Formula E-2a, a may be an integer from 0 to 10, $L_a$ may be a direct linkage, a substituted or unsubstituted arylene group of 6 to 30 ring-forming carbon atoms, or a substituted or unsubstituted heteroarylene group of 2 to 30 ring-forming carbon atoms, $A_1$ to $A_5$ may each independently be N or $C(R_i)$, two or three of $A_1$ to $A_5$ may be N, and the remainder of $A_1$ to $A_5$ may be $C(R_i)$, and $R_a$ to $R_1$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-2b, Cbz1 and Cbz2 may each independently be an unsubstituted carbazole group, or a carbazole group substituted with an aryl group of 6 to 30 ring-forming carbon atoms, $L_b$ may be a direct linkage, a substituted or unsubstituted arylene group of 6 to 30 ring-forming carbon atoms, or a substituted or unsubstituted heteroarylene group of 2 to 30 ring-forming carbon atoms, and b may be an integer from 0 to 10.

A fused polycyclic compound according to an embodiment may be represented by Formula 1 above.

BRIEF DESCRIPTION OF THE DRAWINGS

The accompanying drawings are included to provide a further understanding of the embodiments, and are incorporated in and constitute a part of this specification. The drawings illustrate embodiments of the disclosure principles thereof. The above and other aspects and features of the disclosure will become more apparent by describing in detail embodiments thereof with reference to the attached drawings, in which.

DETAILED DESCRIPTION OF THE EMBODIMENTS

Figure 1:
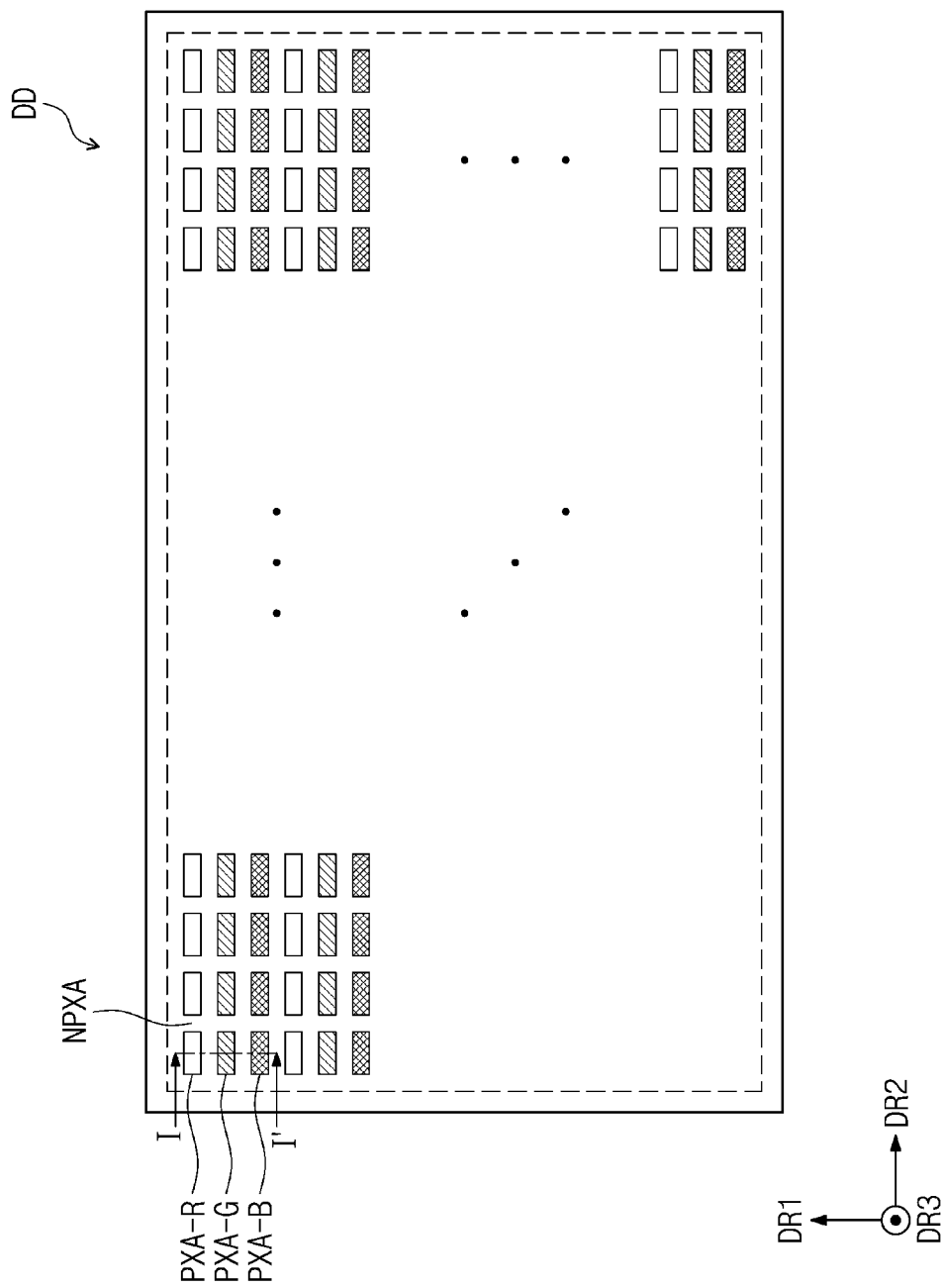
FIG. 1 is a plan view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

The term "at least one of" is intended to include the meaning of "at least one selected from" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, 10%, or 5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the description, the term "substituted or unsubstituted" may mean a group that is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine group, a phosphine oxide group, a phosphine sulfide group, an alkyl group, an alkenyl group, an alkynyl group, an alkoxy group, a hydrocarbon ring group, an aryl group, and a heterocyclic group. Each of the substituents listed above may themselves be substituted or unsubstituted. For example, a biphenyl group may be interpreted as an aryl group or a phenyl group substituted with a phenyl group.

In the description, the term "combined with an adjacent group to form a ring" may mean a group that is bonded to an adjacent group to form a substituted or unsubstituted hydrocarbon ring, or a substituted or unsubstituted heterocycle. The hydrocarbon ring may be an aliphatic hydrocarbon ring or an aromatic hydrocarbon ring. The heterocycle may be an aliphatic heterocycle or an aromatic heterocycle. The hydrocarbon ring and the heterocycle may each be monocyclic or polycyclic. A ring formed via the combination of adjacent groups may be combined with another ring to form a spiro structure.

In the description, the term "adjacent group" may mean a substituent substituted for an atom which is directly combined with an atom substituted with a corresponding substituent, another substituent substituted for an atom which is substituted with a corresponding substituent, or a substituent sterically positioned at the nearest position to a corresponding substituent. For example, in 1,2-dimethylbenzene, two methyl groups may be interpreted as "adjacent groups" to each other, and in 1,1-diethylcyclopentene, two ethyl groups may be interpreted as "adjacent groups" to each other. For example, in 1,13-dimethylquinolino[3,2,1-de]acridine-5,9-dione, two methyl groups connected with carbon at position 1 and carbon at position 13, respectively, may be interpreted as "adjacent groups" to each other.

In the description, examples of a halogen atom may include a fluorine atom, a chlorine atom, a bromine atom, and an iodine atom.

In the description, an alkyl group may be a linear, a branched, or a cyclic type. The number of carbon atoms in the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-henicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, a hydrocarbon ring group may be any functional group or substituent derived from an aliphatic hydrocarbon ring. For example, the hydrocarbon ring group may be a saturated hydrocarbon ring group having 5 to 30 or 5 to 20 ring-forming carbon atoms.

In the description, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 60, 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the description, a fluorenyl group may be substituted, and two substituents may be combined with each other to form a spiro structure. Examples of substituted fluorenyl groups are as follows, but embodiments are not limited thereto.

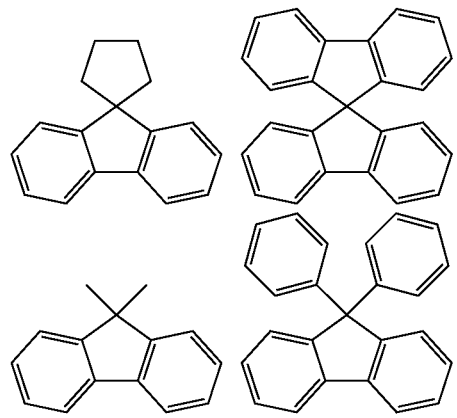

In the description, a heterocyclic group may be any functional group or substituent derived from a ring including at least one of B, O, N, P, Si, S, and Se as heteroatoms. The heterocyclic group may be an aliphatic heterocyclic group or an aromatic heterocyclic group. The aromatic heterocyclic group may be a heteroaryl group. The aliphatic heterocyclic group and the aromatic heterocyclic group may be monocyclic or polycyclic.

In the description, a heterocyclic group may include at least one of B, O, N, P, Si, S, and Se as heteroatoms. If the heterocyclic group includes two or more heteroatoms, the two or more heteroatoms may be the same or different. The heterocyclic group may be a monocyclic heterocyclic group or a polycyclic heterocyclic group, and this term may also include a heteroaryl group. The number of ring-forming carbon atoms in the heteroaryl group may be 2 to 60, 2 to 30, 2 to 20, and 2 to 10.

In the description, an aliphatic heterocyclic group may include at least one of B, O, N, P, Si, S, and Se as heteroatoms. The number of ring-forming carbon atoms in the aliphatic heterocyclic group may be 2 to 60, 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyran group, a 1,4-dioxane group, etc., without limitation.

In the description, a heteroaryl group may include at least one of B, O, N, P, Si, S, and Se as heteroatoms. If the heteroaryl group includes two or more heteroatoms, the two or more heteroatoms may be the same or different. The heteroaryl group may be a monocyclic heterocyclic group or a polycyclic heterocyclic group. The number of ring-forming carbon atoms in the heteroaryl group may be 2 to 60, 2 to 30, 2 to 20, or 2 to 10. Examples of the heteroaryl group may include thiophene, furan, pyrrole, imidazole, triazole, pyridine, bipyridine, pyrimidine, triazine, triazole, acridyl, pyridazine, pyrazinyl, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the description, the explanation with respect to the aryl group may be applied to an arylene group except that the arylene group is a divalent group. The explanation with respect to the heteroaryl group may be applied to a heteroarylene group except that the heteroarylene group is a divalent group.

In the description, an alkenyl group may be a linear chain or a branched chain. The number of carbon atoms in the alkenyl group is not specifically limited but may be 2 to 30, 2 to 20, or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the description, the number of carbon atoms in an alkynyl group is not specifically limited, but may be 2 to 30, 2 to 20 or 2 to 10. Examples of the alkynyl group may include a vinyl group, a 2-butynyl group, a 2-pentynyl group, and a 1,3-pentadinyl aryl group, without limitation.

In the description, the explanation with respect to the alkyl group, alkenyl group, alkynyl group, aryl group, and heteroaryl group may be applied to the alkyl connecting group, alkenyl connecting group, aryl connecting group, and heteroaryl connecting group, respectively, except that these are divalent, trivalent, or tetravalent groups.

In the description, a silyl group may be an alkyl silyl group or an aryl silyl group. Examples of the silyl group may include a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group, etc., without limitation.

In the description, the number of carbon atoms in a carbonyl group is not specifically limited, but may be 1 to 40, 1 to 30, or 1 to 20. For example, the carbonyl group may have a structure as shown below, but is not limited thereto.

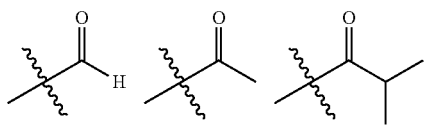

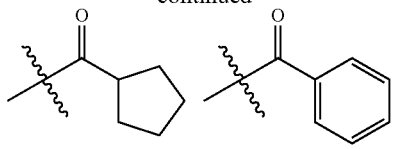

In the description, the number of carbon atoms in a sulfinyl group and in a sulfonyl group is not specifically limited, but may be 1 to 30. The sulfinyl group may be an alkyl sulfinyl group or an aryl sulfinyl group. The sulfonyl group may be an alkyl sulfonyl group or an aryl sulfonyl group.

In the description, a thio group may be an alkyl thio group or an aryl thio group as defined above. The thio group may be a sulfur atom that is combined with an alkyl group or an aryl group. Examples of the thiol group include a methylthio group, an ethylthio group, a propylthio group, a pentylthio group, a hexylthio group, an octylthio group, a dodecylthio group, a cyclopentylthio group, a cyclohexylthio group, a phenylthio group, a naphthylthio group, etc., without limitation.

In the description, an oxy group may be an oxygen atom that is combined with an alkyl group or an aryl group as defined above. The oxy group may be an alkoxy group or an aryl oxy group. The alkoxy group may be a linear, branched, or cyclic chain. The number of carbon atoms in the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, embodiments are not limited thereto.

In the description, the boron group may a boron atom that is combined with an alkyl group or an aryl group. The boron group may be an alkyl boron group or an aryl boron group. Examples of the boron group may include a trimethylboron group, a triethylboron group, a t-butyldimethylboron group, a triphenylboron group, a diphenylboron group, a phenylboron group, etc., without limitation.

In the description, the number of carbon atoms in an amine group is not specifically limited, but may be 1 to 30. The amine group may be an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., without limitation.

In the description, an alkyl group in the alkylthio group, alkylsulfoxy group, alkylaryl group, alkylamino group, alkylboron group, alkyl silyl group, and alkyl amine group may be the same as the examples of the above-described alkyl group.

In the description, the aryl group in the aryloxy group, arylthio group, arylsulfoxy group, aryl amino group, arylboron group, and aryl silyl group may be the same as the examples of the above-described aryl group.

In the description, a direct linkage may be a single bond.

In the description,

and -* each represent a binding site to a neighboring atom.

Hereinafter, embodiments will be explained with reference to the drawings.

Figure 2:
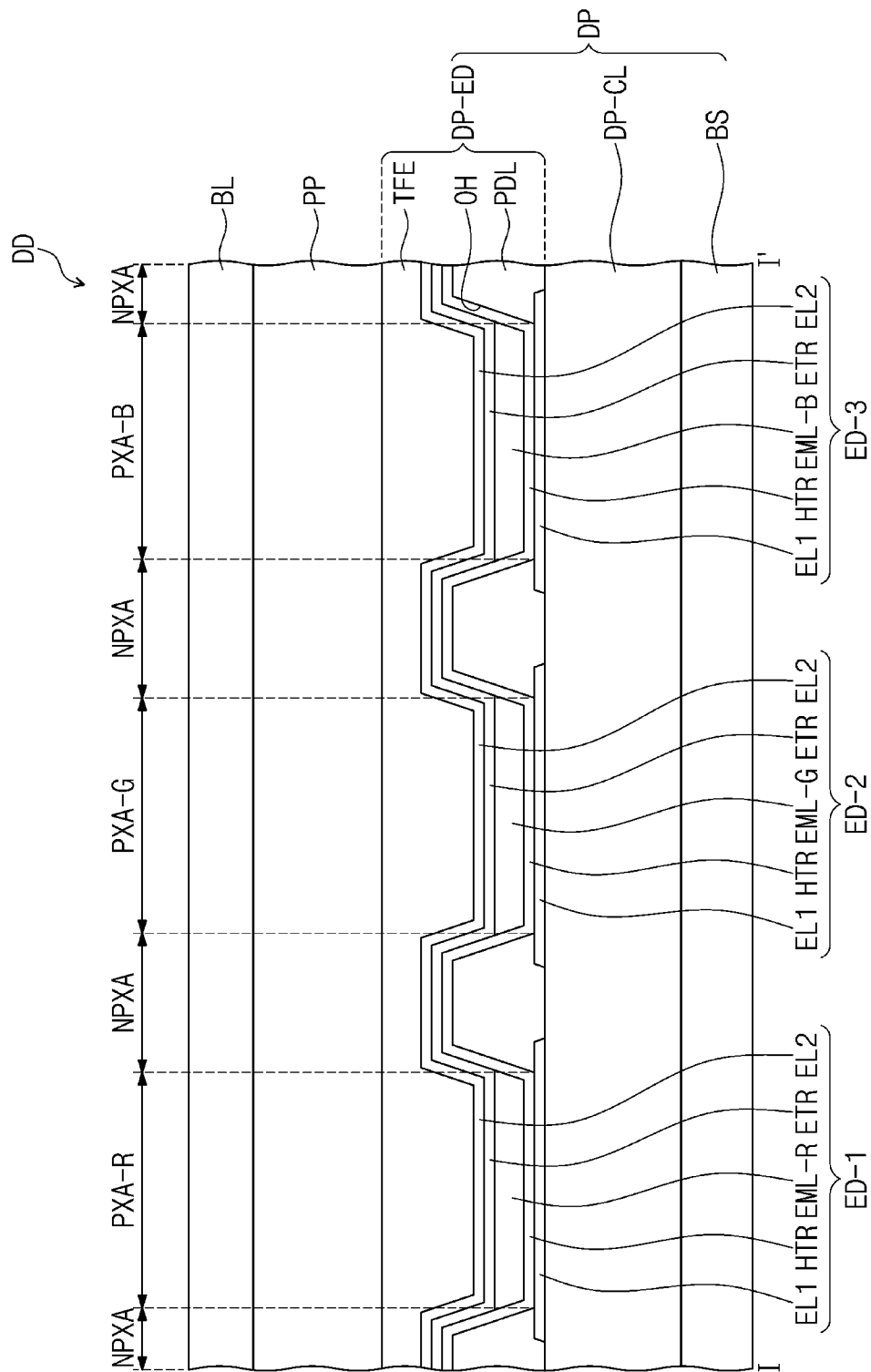
FIG. 2 is a schematic cross-sectional view of a display apparatus according to an embodiment.

FIG. 1 is a plan view showing an embodiment of a display apparatus DD. FIG. 2 is a schematic cross-sectional view of a display apparatus DD of an embodiment. FIG. 2 is a schematic cross-sectional view showing a part corresponding to line I-I'.

The display apparatus DD may include a display panel DP and an optical layer PP disposed on the display panel DP. The display panel DP includes light emitting devices ED-1, ED-2, and ED-3. The display apparatus DD may include multiples of each of the light emitting devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawings, in an embodiment, the optical layer PP may be omitted from the display apparatus DD.

An upper base layer BL may be disposed on the optical layer PP. The upper base layer BL may provide a base surface where the optical layer PP is disposed. The upper base layer BL may be a glass substrate, a metal substrate, a plastic substrate, etc. However, embodiments are not limited thereto, and the upper base layer BL may include an inorganic layer, an organic layer, or a composite material layer. Although not shown in the drawings, in an embodiment, the upper base layer BL may be omitted.

The display apparatus DD according to an embodiment may further include a filling layer (not shown). The filling layer (not shown) may be disposed between a display device layer DP-ED and an upper base layer BL. The filling layer (not shown) may be an organic layer. The filling layer (not shown) may include at least one of an acryl-based resin, a silicon-based resin, and an epoxy-based resin.

The display panel DP may include a base layer BS, a circuit layer DP-CL provided on the base layer BS, and a display device layer DP-ED. The display device layer DP-ED may include a pixel definition layer PDL, light emitting devices ED-1, ED-2, and ED-3 disposed in the pixel definition layer PDL, and an encapsulating layer TFE disposed on the light emitting devices ED-1, ED-2, and ED-3.

The base layer BS may provide a base surface where the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include switching transistors and driving transistors for driving the light emitting devices ED-1, ED-2, and ED-3 of the display device layer DP-ED.

Each of the light emitting devices ED-1, ED-2, and ED-3 may have a structure of a light emitting device ED according to an embodiment of FIG. 3 to FIG. 6, which will be explained later. Each of the light emitting devices ED-1, ED-2, and ED-3 may include a first electrode EL1, a hole transport region HTR, emission layers EML-R, EML-G, and EML-B, an electron transport region ETR, and a second electrode EL2.

In FIG. 2, shown is an embodiment where the emission layers EML-R, EML-G, and EML-B of light emitting devices ED-1, ED-2, and ED-3, are disposed in opening portions OH defined in a pixel definition layer PDL, and a hole transport region HTR, an electron transport region ETR, and a second electrode EL2 are each provided as common layers for the light emitting devices ED-1, ED-2, and ED-3. However, embodiments are not limited thereto. Although not shown in FIG. 2, in an embodiment, the hole transport region HTR and the electron transport region ETR may each be patterned and provided in the opening portions OH defined in the pixel definition layer PDL. For example, in an embodiment, the hole transport region HTR, the emission layers EML-R, EML-G and EML-B, and the electron transport region ETR of the light emitting devices ED-1, ED-2, and ED-3 may each be patterned by an ink jet printing method and provided.

An encapsulating layer TFE may cover the light emitting devices ED-1, ED-2, and ED-3. The encapsulating layer TFE may encapsulate the display device layer DP-ED. The encapsulating layer TFE may be a thin film encapsulating layer. The encapsulating layer TFE may be one layer or a stack of multiple layers. The encapsulating layer TFE may include at least one insulating layer. The encapsulating layer TFE according to an embodiment may include at least one inorganic layer (hereinafter, encapsulating inorganic layer). For example, the encapsulating layer TFE according to an embodiment may include at least one organic layer (hereinafter, encapsulating organic layer) and at least one encapsulating inorganic layer.

The encapsulating inorganic layer may protect the display device layer DP-ED from moisture and/or oxygen, and the encapsulating organic layer may protect the display device layer DP-ED from foreign materials such as dust particles. The encapsulating inorganic layer may include silicon nitride, silicon oxy nitride, silicon oxide, titanium oxide, or aluminum oxide, without specific limitation. The encapsulating organic layer may include an acryl-based compound, an epoxy-based compound, etc. The encapsulating organic layer may include a photopolymerizable organic material, without specific limitation.

The encapsulating layer TFE may be disposed on the second electrode EL2 and may be disposed to fill the opening portions OH.

Referring to FIG. 1 and FIG. 2, the display apparatus DD may include a non-luminous area NPXA and luminous areas PXA-R, PXA-G, and PXA-B. The luminous areas PXA-R, PXA-G, and PXA-B may each be areas emitting light produced from the light emitting devices ED-1, ED-2, and ED-3, respectively. The luminous areas PXA-R, PXA-G, and PXA-B may be separated from each other on a plane.

The luminous areas PXA-R, PXA-G, and PXA-B may each be areas separated by the pixel definition layer PDL. The non-luminous areas NPXA may be areas between neighboring luminous areas PXA-R, PXA-G, and PXA-B and may be areas corresponding to the pixel definition layer PDL. In the disclosure, the luminous areas PXA-R, PXA-G, and PXA-B may each correspond to a pixel. The pixel definition layer PDL may divide the light emitting devices ED-1, ED-2, and ED-3. The emission layers EML-R, EML-G, and EML-B of the light emitting devices ED-1, ED-2, and ED-3 may be disposed and divided in the opening portions OH defined in the pixel definition layer PDL.

The luminous areas PXA-R, PXA-G, and PXA-B may be divided into groups according to the color of light produced from the light emitting devices ED-1, ED-2, and ED-3. In the display apparatus DD of an embodiment, shown in FIG. 1 and FIG. 2, three luminous areas PXA-R, PXA-G, and PXA-B respectively emitting red light, green light, and blue light are illustrated as an embodiment. For example, the display apparatus DD of an embodiment may include a red luminous area PXA-R, a green luminous area PXA-G and a blue luminous area PXA-B, which are separated from each other.

In the display apparatus DD according to an embodiment, light emitting devices ED-1, ED-2, and ED-3 may emit light having different wavelength regions. For example, in an embodiment, the display apparatus DD may include a first light emitting device ED-1 emitting red light, a second light emitting device ED-2 emitting green light, and a third light emitting device ED-3 emitting blue light. For example, the red luminous area PXA-R, the green luminous area PXA-G, and the blue luminous area PXA-B of the display apparatus DD may respectively correspond to the first light emitting device ED-1, the second light emitting device ED-2, and the third light emitting device ED-3.

However, embodiments are not limited thereto, and the first to third light emitting devices ED-1, ED-2, and ED-3 may emit light in a same wavelength region, or at least one thereof may emit light in a different wavelength region. For example, the first to third light emitting devices ED-1, ED-2, and ED-3 may each emit blue light.

The luminous areas PXA-R, PXA-G, and PXA-B in the display apparatus DD according to an embodiment may be arranged in a stripe shape. Referring to FIG. 1, multiple red luminous areas PXA-R, multiple green luminous areas PXA-G, and multiple blue luminous areas PXA-B may be arranged along a second directional DR2. For example, the red luminous area PXA-R, the green luminous area PXA-G, and the blue luminous area PXA-B may be arranged by turns along a first directional DR1.

In FIG. 1 and FIG. 2, the areas of the luminous areas PXA-R, PXA-G, and PXA-B are shown as having a similar size, but embodiments are limited thereto. The areas of the luminous areas PXA-R, PXA-G, and PXA-B may be different from each other according to the wavelength region of light emitted. The areas of the luminous areas PXA-R, PXA-G, and PXA-B may be areas in a plan view that are defined by the first directional DR1 and the second directional DR2.

The arrangement type of the luminous areas PXA-R, PXA-G, and PXA-B is not limited to the configuration shown in FIG. 1, and the arrangement order of the red luminous areas PXA-R, the green luminous areas PXA-G, and the blue luminous areas PXA-B may be provided in various combinations according to the properties of display quality required for the display apparatus DD. For example, the arrangement type of the luminous areas PXA-R, PXA-G, and PXA-B may be a PenTile® arrangement type, or a diamond arrangement type.

In an embodiment, the areas of the luminous areas PXA-R, PXA-G, and PXA-B may be different from each other. For example, in an embodiment, the area of the green luminous area PXA-G may be smaller than the area of the blue luminous area PXA-B, but embodiments are not limited thereto.

Figure 3:
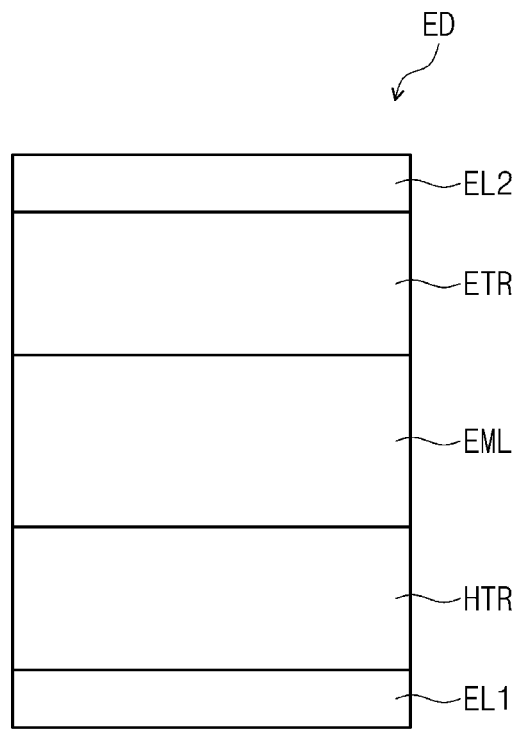
FIG. 3 is a schematic cross-sectional view showing a light emitting device according to an embodiment.

Hereinafter, FIG. 3 to FIG. 6 are each a schematic cross-sectional view showing a light emitting device according to embodiments. In FIG. 3, the light emitting device ED according to an embodiment may include a first electrode EL1, a hole transport region HTR, an emission layer EML, an electron transport region ETR, and a second electrode EL2, stacked in that order.

Figure 4:
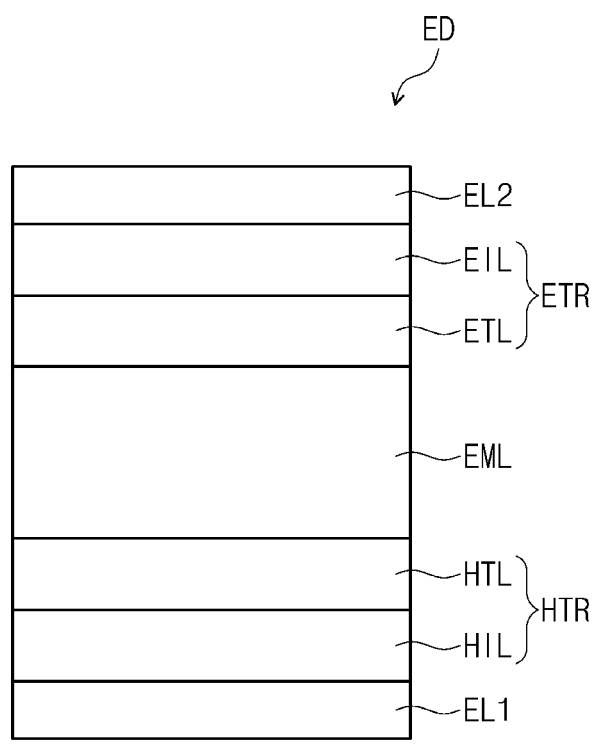
FIG. 4 is a schematic cross-sectional view showing a light emitting device according to an embodiment.
Figure 5:
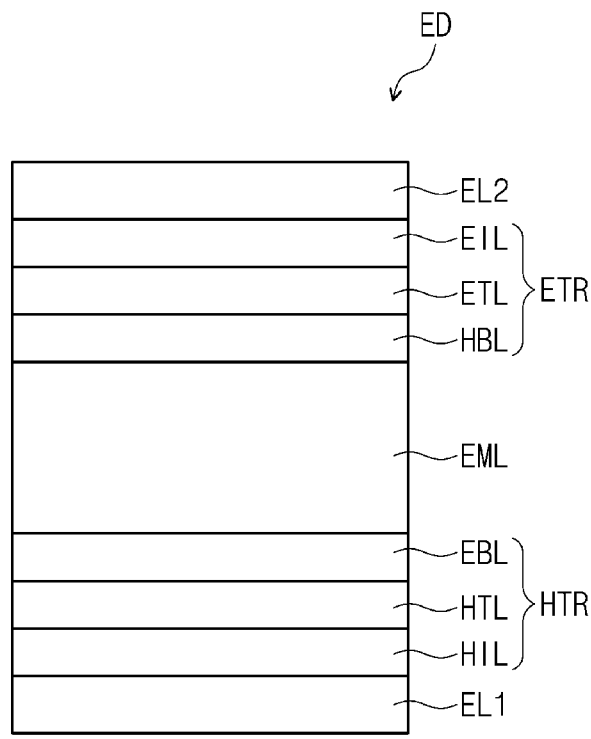
FIG. 5 is a schematic cross-sectional view showing a light emitting device according to an embodiment.
Figure 6:
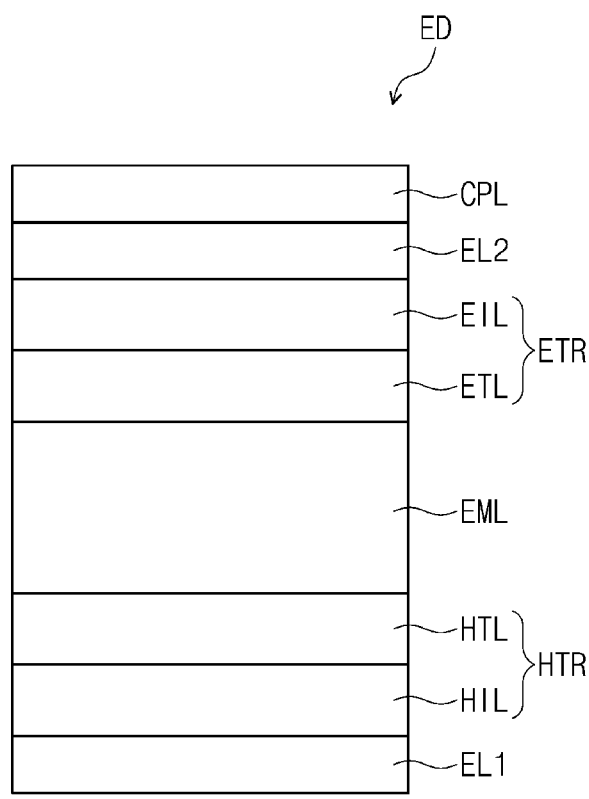
FIG. 6 is a schematic cross-sectional view showing a light emitting device according to an embodiment.

In comparison to FIG. 3, FIG. 4 shows a schematic cross-sectional view of a light emitting device ED of an embodiment, wherein a hole transport region HTR includes a hole injection layer HIL and a hole transport layer HTL, and an electron transport region ETR includes an electron injection layer EIL and an electron transport layer ETL. In comparison to FIG. 3, FIG. 5 shows a schematic cross-sectional view of a light emitting device ED of an embodiment, wherein a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 shows a schematic cross-sectional view of a light emitting device ED of an embodiment, further including a capping layer CPL disposed on the second electrode EL2.

The first electrode EL1 has conductivity. The first electrode EL1 may be formed using a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may include a transparent metal oxide such as indium tin oxide (ITO), indium zinc oxide (IZO), zinc oxide (ZnO), and indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, In, Zn, Sn, compounds thereof, or mixtures thereof (for example, a mixture of Ag and Mg). In another embodiment, the first electrode EL1 may have a structure including multiple layers including a reflective layer or a transflective layer formed using the above materials, and a transmissive conductive layer formed using ITO, IZO, ZnO, or ITZO. For example, the first electrode EL1 may include a three-layer structure of ITO/Ag/ITO. However, embodiments are not limited thereto. The first electrode EL1 may include the above-described metal materials, combinations of two or more metal materials selected from the above-described metal materials, or oxides of the above-described metal materials. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode ELL The hole transport region HTR may include at least one of a hole injection layer HIL, a hole transport layer HTL, a buffer layer (not shown), an emission auxiliary layer (not shown), and an electron blocking layer EBL. A thickness of the hole transport region HTR may be in a range of about 50 Å to about 15,000 Å.

The hole transport region HTR may have a layer formed using a single material, a layer formed using different materials, or a multilayer structure including layers formed using different materials.

For example, the hole transport region HTR may have the structure of a single layer of a hole injection layer HIL or a hole transport layer HTL, and may have a structure of a single layer formed using a hole injection material and a hole transport material. As another example, the hole transport region HTR may have a structure of a single layer formed using multiple different materials, or a structure stacked from the first electrode EL1 of a hole injection layer HIL/a hole transport layer HTL, a hole injection layer HIL/a hole transport layer HTL/a buffer layer (not shown), a hole injection layer HIL/a buffer layer (not shown), a hole transport layer HTL/a buffer layer (not shown), or a hole injection layer HIL/a hole transport layer HTL/a electron blocking layer EBL, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR may include a compound represented by Formula H-1 below.

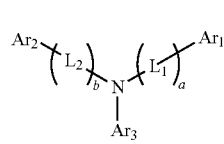

[Formula H-1]

In Formula H-1 above, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. In Formula H-1, a and b may each independently be an integer from 0 to 10. If a or b is 2 or more, multiple $L_1$ groups and multiple $L_2$ groups may each independently be a substituted or unsubstituted arylene group of 6 to 30 ring-forming carbon atoms, or a substituted or unsubstituted heteroarylene group of 2 to 30 ring-forming carbon atoms.

In Formula H-1, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. In Formula H-1, $Ar_3$ may be a substituted or unsubstituted aryl group of 6 to 30 ring-forming carbon atoms.

The compound represented by Formula H-1 may be a monoamine compound. In another embodiment, the compound represented by Formula H-1 may be a diamine compound in which at least one of $Ar_1$ to $Ar_3$ includes an amine group as a substituent. For example, the compound represented by Formula H-1 may be a carbazole-based compound in which at least one of $Ar_1$ to $Ar_3$ includes a substituted or unsubstituted carbazole group, or a fluorene-based compound in which at least one among $Ar_1$ to $Ar_3$ includes a substituted or unsubstituted fluorene group.

The compound represented by Formula H-1 may be any one selected from Compound Group H below. However, the compounds shown in Compound Group H are only examples, and the compound represented by Formula H-1 is not limited to the compounds in Compound Group H below.

[Compound Group H]

H-1-1
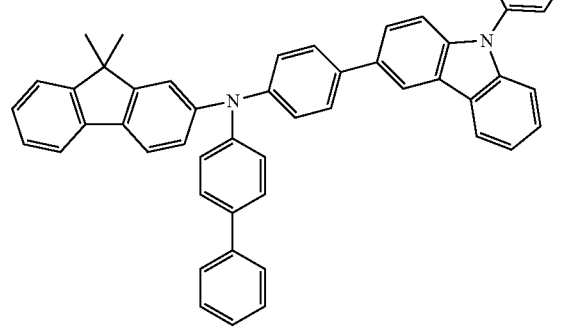

H-1-2
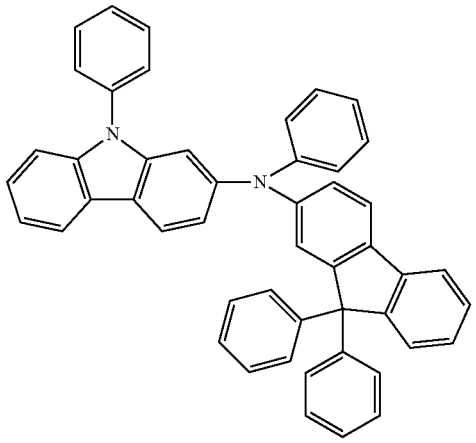

H-1-3
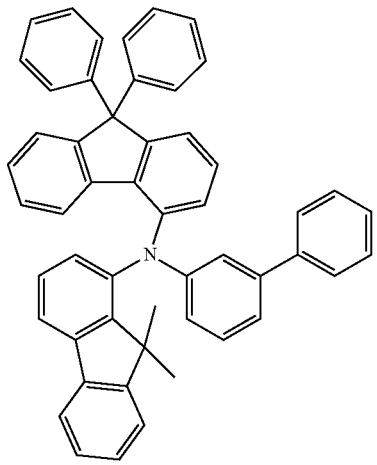

H-1-4
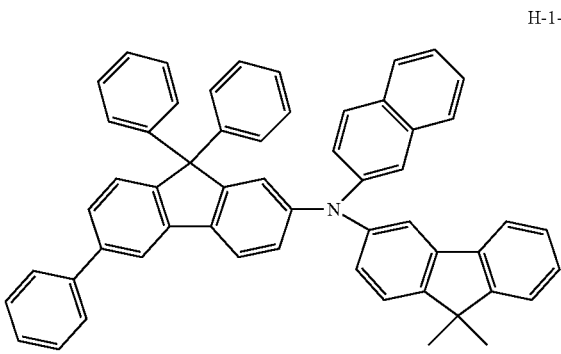

H-1-5
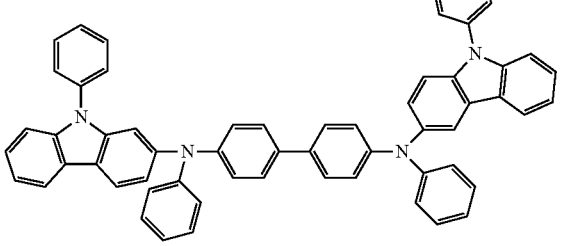

H-1-6
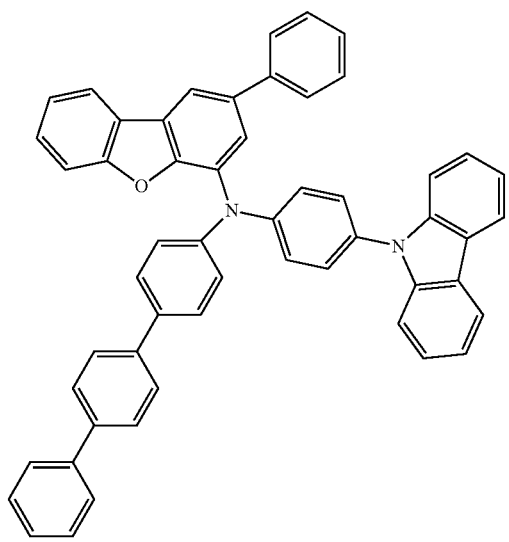
H-1-7
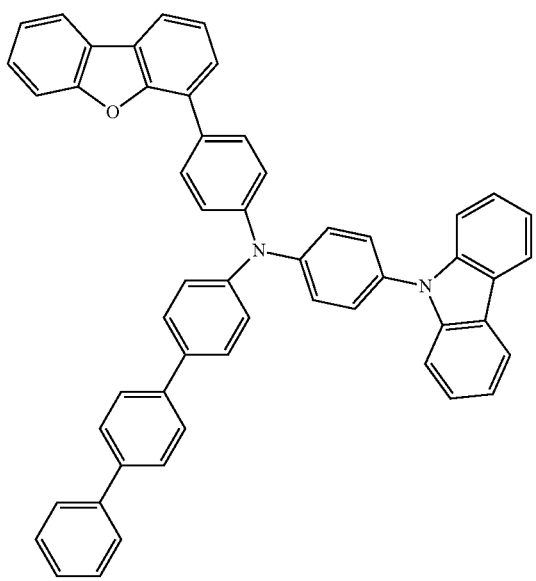
H-1-8
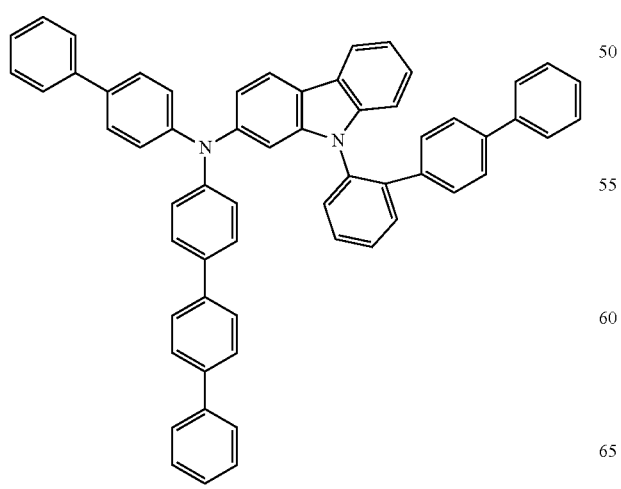
H-1-9
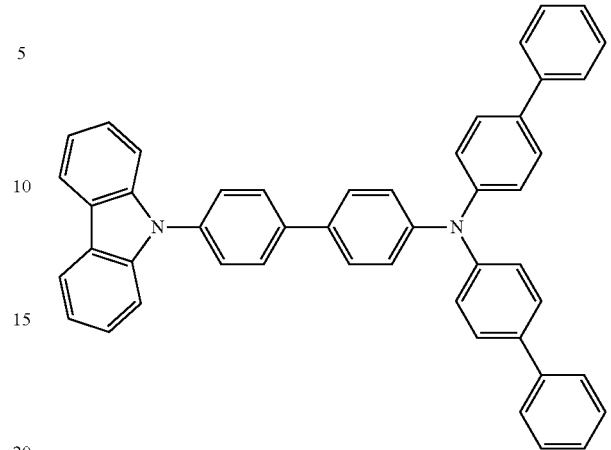
H-1-10
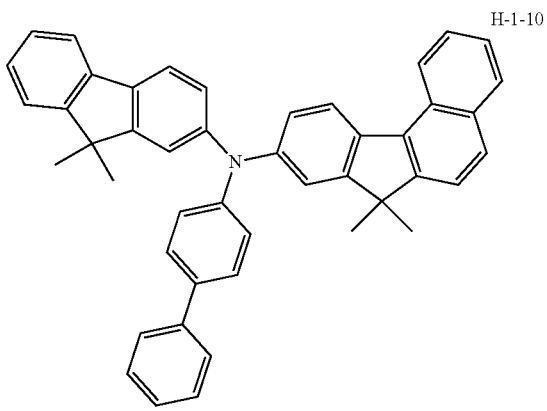
H-1-11
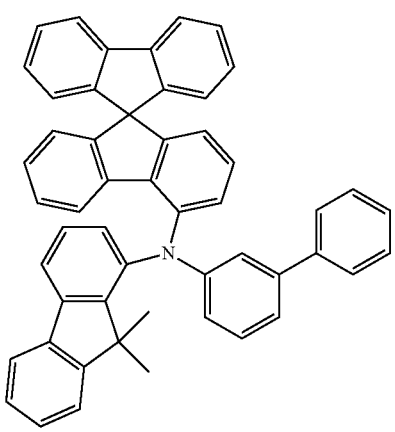

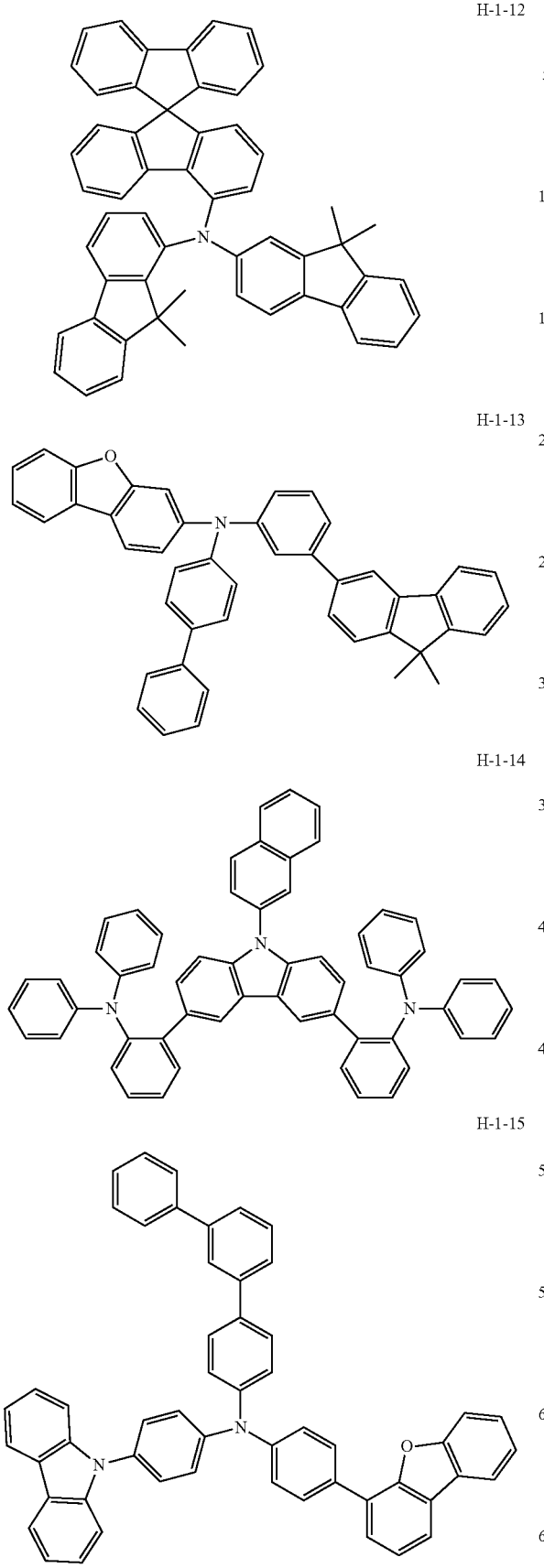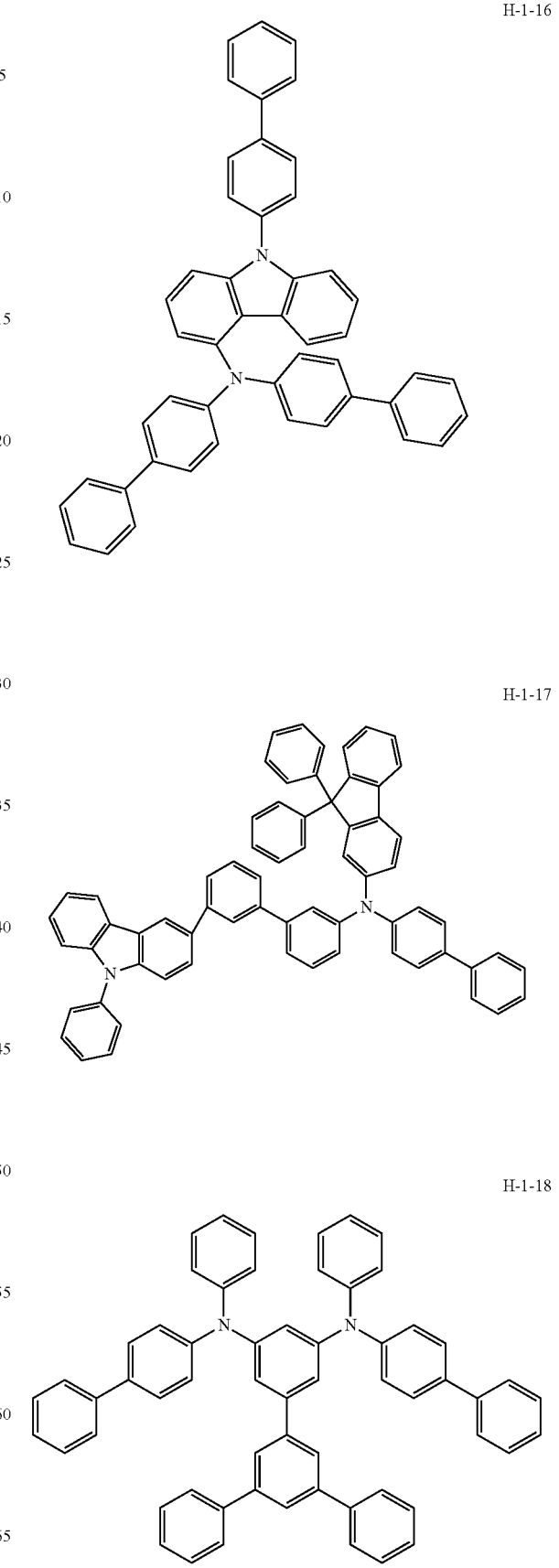

H-1-19

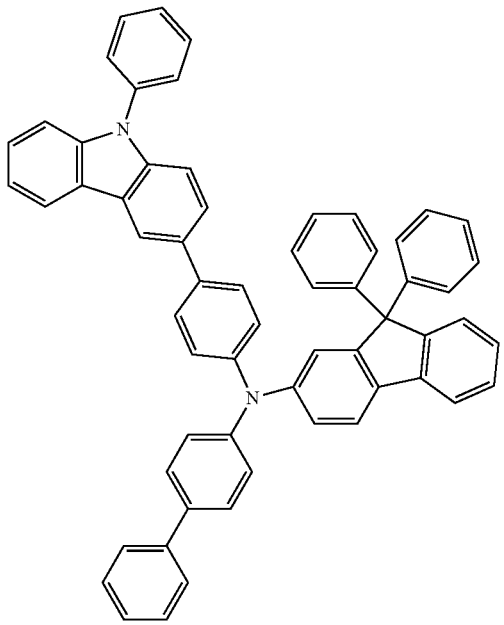

The hole transport region HTR may include a compound represented by Formula H-a below. The compound represented by Formula H-a may be a monoamine compound.

[Formula H-a]

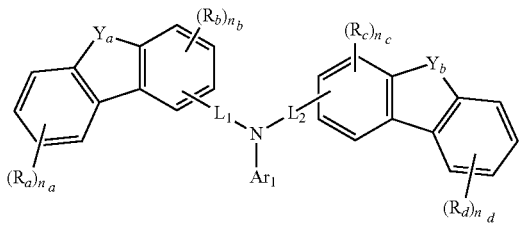

In Formula H-a, $Y_a$ and $Y_b$ may each independently be $C(R_e)(R_f)$, $N(R_g)$, O, or S. $Y_a$ and $Y_b$ may be the same or different. In an embodiment, $Y_a$ and $Y_b$ may each be $C(R_e)(R_f)$. In another embodiment, any one of $Y_a$ and $Y_b$ may be $C(R_e)(R_f)$, and the other of $Y_a$ and $Y_b$ may be $N(R_g)$.

In Formula H-a, $Ar_1$ may be a substituted or unsubstituted aryl group of 6 to 30 ring-forming carbon atoms, or a substituted or unsubstituted heteroaryl group of 2 to 30 ring-forming carbon atoms. For example, $Ar_1$ may be a substituted or unsubstituted phenyl group, a substituted or unsubstituted biphenyl group, a substituted or unsubstituted naphthyl group, a substituted or unsubstituted fluorenyl group, or a substituted or unsubstituted terphenyl group.

In Formula H-a, $L_1$ and $L_2$ may each independently be a direct linkage, a substituted or unsubstituted arylene group of 6 to 30 ring-forming carbon atoms, or a substituted or unsubstituted heteroarylene group of 2 to 30 ring-forming carbon atoms. For example, $L_1$ and $L_2$ may be direct linkages, substituted or unsubstituted phenylene groups, or substituted or unsubstituted divalent biphenyl groups.

In Formula H-a, $R_a$ to $R_g$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. For example, $R_a$ to $R_g$ may each independently be a hydrogen atom, a substituted or unsubstituted methyl group, or a substituted or unsubstituted phenyl group.

In Formula H-a, $n_a$ and $n_d$ may each independently be an integer from 0 to 4, and $n_b$ and $n_c$ may each independently be an integer from 0 to 3.

The hole transport region HTR may include a phthalocyanine compound such as copper phthalocyanine, $N^1,N^{1'}$-([1,1'-biphenyl]-4,4'-diyl)bis($N^1$-phenyl-$N^4,N^4$-di-m-tolyl-benzene-1,4-diamine) (DNTPD), 4,4%4"-[tris(3-methylphenyl)phenylamino]triphenylamine (m-MTDATA), 4,4',4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and dipyrazino[2,3-f:2',3'-h] quinoxaline-2,3,6,7,10,11-hexacarbonitrile (HAT-CN).

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine](TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may include carbazole derivatives such as N-phenyl carbazole and polyvinyl carbazole, fluorene-based derivatives, N,N'-bis(3-methylphenyl)-N,N'-diphenyl-[1,1'-biphenyl]-4,4'-diamine (TPD), triphenylamine-based derivatives such as 4,4',4"-tris(N-carbazolyl)triphenylamine (TCTA), N,N'-di(1-naphthalene-1-yl)-N,N'-diphenyl-benzidine (NPB), 4,4'-cyclohexylidene bis[N,N-bis(4-methylphenyl)benzeneamine](TAPC), 4,4'-bis[N,N'-(3-tolyl)amino]-3,3'-dimethylbiphenyl (HMTPD), 9-(4-tert-butylphenyl)-3,6-bis(triphenylsilyl)-9H-carbazole (CzSi), 9-phenyl-9H-3,9'-bicarbazole (CCP), 1,3-bis(N-carbazolyl)benzene (mCP), 1,3-bis(1,8-dimethyl-9H-carbazol-9-yl)benzene (mDCP), etc.

The hole transport region HTR may include the compounds of the hole transport region in at least one of the hole injection layer HIL, the hole transport layer HTL, and the electron blocking layer EBL.

A thickness of the hole transport region HTR may be in a range of about 100 Å to about 10,000 Å. For example, thickness of the hole transport region HTR may be in a range of about 100 Å to about 5,000 Å. In case where the hole transport region HTR includes a hole injection layer HIL, a thickness of the hole injection region HIL may be, for example, in a range of about 30 Å to about 1,000 Å. In case where the hole transport region HTR includes a hole transport layer HTL, a thickness of the hole transport layer HTL may be in a range of about 30 Å to about 1,000 Å. For example, in case where the hole transport region HTR includes an electron blocking layer, a thickness of the electron blocking layer EBL may be in a range of about 10 Å to about 1,000 Å. If the thicknesses of the hole transport region HTR, the hole injection layer HIL, the hole transport layer HTL, and the electron blocking layer EBL satisfy the above-described ranges, satisfactory hole transport properties may be achieved without substantial increase of a driving voltage.

The hole transport region HTR may further include a charge generating material to increase conductivity, in addition to the above-described materials. The charge generating material may be dispersed uniformly or non-uniformly in the hole transport region HTR. The charge generating material may be, for example, a p-dopant. The p-dopant may include at least one of metal halide compounds, quinone derivatives, metal oxides, and cyano group-containing compounds, without limitation. For example, the p-dopant may include metal halide compounds such as CuI and RbI, quinone derivatives such as tetracyanoquinodimethane (TCNQ) and 2,3,5,6-tetrafluoro-7,7',8,8-tetracyanoquinodimethane (F4-TCNQ), metal oxides such as tungsten oxide and molybdenum oxide, cyano group-containing compounds such as dipyrazino[2, 3-f:2',3'-h] quinoxaline-2,3,6,7,10,11-hexacarbonitrile (HATCN) and 4-[[2,3-bis[cyano-(4-cyano-2,3,5,6-tetrafluorophenyl)methylidene]cyclopropylidene]-cyanomethyl]-2, 3,5,6-tetrafluorobenzonitrile, etc., without limitation.

As described above, the hole transport region HTR may further include at least one of a buffer layer (not shown) and an electron blocking layer EBL, in addition to the hole injection layer HIL and the hole transport layer HTL. The buffer layer (not shown) may compensate for a resonance distance according to a wavelength of light emitted from an emission layer EML and may increase light emitting efficiency. Materials which may be included in the hole transport region HTR may be used as materials included in the buffer layer (not shown). The electron blocking layer EBL may prevent the injection of electrons from an electron transport region ETR into a hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may have a layer formed using a single material, a layer formed using different materials, or a multilayer structure having layers formed using different materials.

In the light emitting device ED according to an embodiment, the emission layer EML may include a fused polycyclic compound of an embodiment.

The fused polycyclic compound of an embodiment has a wide plate-type resonance structure containing two boron atoms and at least one nitrogen atom, wherein an additional aromatic structure is fused via a pentagonal heterocycle, and a phenyl group in which at least one phenyl group is substituted at an ortho position, is substituted at the nitrogen atom.

The fused polycyclic compound of an embodiment is represented by Formula 1 below.

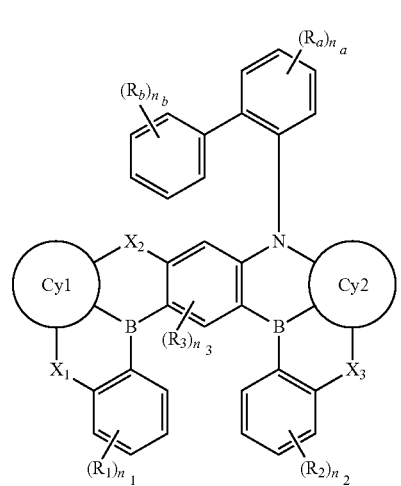

[Formula 1]

In Formula 1, $X_1$ to $X_3$ may each independently be $C(R_4)(R_5)$, $N(R_6)$, O, S, or Se. $X_1$ to $X_3$ may be the same or different. For example, $X_1$ to $X_3$ may each be $C(R_4)(R_5)$, may each be $N(R_6)$, may each be O, may each be S, or may each be Se. As another example, any one of $X_1$ to $X_3$ may be $N(R_6)$, and at least one remainder of $X_1$ to $X_3$ may be O or S. As yet another example, any one of $X_1$ to $X_3$ may be O, and at least one remainder of $X_1$ to $X_3$ may be S.

In Formula 1, $R_1$ to $R_6$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. For example, $R_1$ to $R_6$ may each independently be a hydrogen atom, a deuterium atom, a substituted or unsubstituted methyl group, a substituted or unsubstituted t-butyl group, a substituted or unsubstituted phenyl group, or a substituted or unsubstituted biphenyl group.

In Formula 1, $R_a$ and $R_b$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. For example, in an embodiment, $R_a$ and $R_b$ may each independently be a hydrogen atom, a deuterium atom, a substituted or unsubstituted methyl group, a substituted or unsubstituted t-butyl group, a substituted or unsubstituted phenyl group, or a substituted or unsubstituted biphenyl group.

In Formula 1, $n_1$ and $n_2$ may each independently be an integer from 0 to 4. In Formula 1, $n_3$ may be an integer from 0 to 2. If each of $n_1$ to $n_3$ is 0, the fused polycyclic compound according to an embodiment may be a compound unsubstituted with each of $R_1$ to $R_3$. If each of $n_1$ to $n_3$ is 2 or more, each of the multiple $R_1$ to $R_3$ groups may be the same, or at least one among the multiple $R_1$ to $R_3$ groups may be different.

In Formula 1, $n_a$ may be an integer from 0 to 4, and $n_b$ may be an integer from 0 to 5. If each of $n_a$ and $n_b$ is 0, the fused polycyclic compound according to an embodiment may be a compound unsubstituted with each of $R_a$ and $R_b$. If each of $n_a$ and $n_b$ is 2 or more, each of the multiple $R_a$ groups and $R_b$ groups may be the same, or at least one of the multiple $R_a$ groups and $R_b$ groups may be different.

In Formula 1, Cy1 and Cy2 may each independently be an aromatic hydrocarbon ring, or an aromatic heterocycle. In an embodiment, Cy1 and Cy2 may each independently be a group represented by Formula 2-1 or Formula 2-2 below, and at least one of Cy1 and Cy2 may be represented by Formula 2-1 below. In an embodiment, Cy1 and Cy2 may each be a group represented by Formula 2-1. In another embodiment, any one of Cy1 and Cy2 may have a structure represented by Formula 2-1, and the remainder of Cy1 and Cy2 may have a structure represented by Formula 2-2.

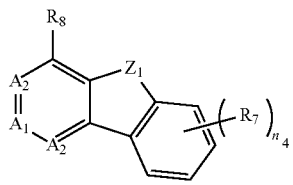

[Formula 2-1]

In Formula 2-1, $Z_1$ may be $C(R_9)(R_{10})$, $N(R_{11})$, O, S, or Se.

In Formula 2-1, $R_7$ to $R_{11}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. For example, in an embodiment, $R_7$ to $R_{11}$ may each independently a hydrogen atom, a deuterium atom, a substituted or unsubstituted methyl group, a substituted or unsubstituted t-butyl group, a substituted or unsubstituted phenyl group, or a substituted or unsubstituted biphenyl group. In an embodiment, multiple $R_7$ groups may be provided, and at least two adjacent ones of multiple $R_7$ groups may be combined to form a ring.

In Formula 2-1, $n_4$ may be an integer from 0 to 4. If $n_4$ is 0, the fused polycyclic compound according to an embodiment may be a compound unsubstituted with $R_7$. If $n_4$ is 2 or more, the multiple $R_7$ groups may be the same, or at least one of the multiple $R_7$ groups may be different.

In Formula 2-1, $A_1$ may be a position bonded to a boron atom in Formula 1.

In Formula 2-1, $A_2$ may be positions bonded to $X_1$ and $X_2$ in Formula 1, or positions bonded to a nitrogen atom and $X_3$ in Formula 1. One of the two $A_2$ shown in Formula 2-1 may be bonded to $X_2$ or a nitrogen atom, and the remaining one may be bonded to $X_1$ or $X_3$.

In an embodiment, Cy1 may be a structure represented by Formula 2-1, wherein $A_2$ positioned at an ortho position to $R_8$ may be a position bonded to $X_2$, and $A_2$ positioned at a para position to $R_8$ may be a position bonded to $X_1$. In another embodiment, $A_2$ positioned at a para position to $R_8$ may be a position bonded to $X_2$, and $A_2$ positioned at an ortho position to $R_8$ may be a position bonded to $X_1$.

In an embodiment, Cy2 may be a structure represented by Formula 2-1, wherein $A_2$ positioned at an ortho position to $R_8$ may be a position bonded to a nitrogen atom in Formula 1, and $A_2$ positioned at a para position to $R_8$ may be a position bonded to $X_3$. In another embodiment, $A_2$ positioned at an ortho position to $R_8$ may be a position bonded to $X_3$, and $A_2$ positioned at a para position to $R_8$ may be a position bonded to a nitrogen atom in Formula 1.

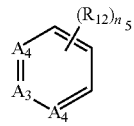

[Formula 2-2]

In Formula 2-2, $R_{12}$ may be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. For example, in an embodiment, Rig may be a hydrogen atom, a deuterium atom, a substituted or unsubstituted methyl group, a substituted or unsubstituted t-butyl group, a substituted or unsubstituted phenyl group, or a substituted or unsubstituted biphenyl group.

In Formula 2-2, $n_5$ may be an integer from 0 to 3. If $n_5$ is 0, the fused polycyclic compound according to an embodiment may be a compound unsubstituted with $R_{12}$. If $n_5$ is 2 or more, the multiple Rig groups may be the same, or at least one of the multiple Rig groups may be different.

In Formula 2-2, $A_3$ may be a position bonded to a boron atom in Formula 1.

In Formula 2-2, $A_4$ may be positions bonded to $X_1$ and $X_2$ in Formula 1, or positions bonded to a nitrogen atom and $X_3$ in Formula 1. Any one of the two $A_4$ shown in Formula 2-2 may be bonded to $X_2$ or a nitrogen atom, and the remaining one may be bonded to $X_1$ or $X_3$.

The fused polycyclic compound of an embodiment includes a wide plate-type resonance structure including two boron atoms and at least one nitrogen atom, and has a structure in which an additional aromatic ring is fused to the plate-type structure, and a substituent inducing steric hindrance is substituted at the nitrogen atom. The fused polycyclic compound of an embodiment has a structure in which an additional aromatic structure is fused to the plate-type structure via a pentagonal heterocycle, and a phenyl group in which at least one phenyl group is substituted at an ortho position is substituted at the nitrogen atom. Accordingly, the fused polycyclic compound of an embodiment forms a wide conjugation structure and has a low $\Delta E_{ST}$ value, and a polycyclic aromatic ring structure is stabilized. Accordingly, a wavelength region suitable as a blue light emitting material may be selected, and if applied to a light emitting device, the efficiency of the light emitting device may be improved. The fused polycyclic compound of an embodiment may have a structure in which a core skeleton structure has high electron density and the p-orbital of a boron atom is protected via a substituent with steric hindrance, and thus, the molecular stability of the fused polycyclic compound may be improved, and if applied to a light emitting device, the life and emission efficiency of the light emitting device may be improved.

In an embodiment, the group represented by Formula 2-1 in Formula 1 may be represented by Formula 2-1a below. In an embodiment, in Formula 1, at least one of Cy1 and Cy2 may be represented by Formula 2-1a below.

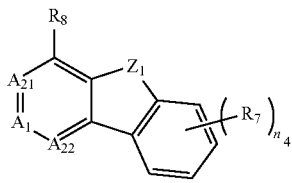

[Formula 2-1a]

Formula 2-1a represents a case where a group with the structure of Formula 2-1 is combined with the structure of Formula 1 at a specific position.

In Formula 2-1a, $A_{21}$ may be a position bonded to $X_2$ in Formula 1 or a position bonded to a nitrogen atom in Formula 1. In Formula 2-1a, $A_{22}$ may be a position bonded to $X_1$ in Formula 1 or a position bonded to $X_3$ in Formula 1.

In Formula 2-1a, $A_1$, $Z_1$, $R_7$, $R_8$, and $n_4$ may be the same as defined in connection with Formula 2-1.

The group represented by Formula 2-1 may be represented by Formula 2-1-1 or Formula 2-1-2 below. In an embodiment, at least one of Cy1 and Cy2 may be represented by Formula 2-1-1 or Formula 2-1-2 below.

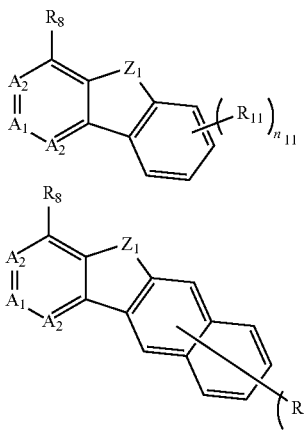

[Formula 2-1-1]

[Formula 2-1-2]

Formula 2-1-1 and Formula 2-1-2 each represent a case specifying whether or not an additional fused ring is formed by combining multiple $R_7$ groups in Formula 2-1. Formula 2-1-1 represents Formula 2-1 in which an additional fused ring is not formed, and Formula 2-1-2 represents a case in which multiple $R_7$ groups connected at a meta position and a para position with respect to $Z_1$ are combined with each other to form an additional ring.

In Formula 2-1-1 and Formula 2-1-2, $R_{11}$ and $R_{12}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms. For example, $R_{11}$ and $R_{12}$ may each independently be a hydrogen atom, a deuterium atom, a substituted or unsubstituted methyl group, a substituted or unsubstituted t-butyl group, or a substituted or unsubstituted phenyl group.

In Formula 2-1-1, $n_{11}$ may be an integer from 0 to 4. In Formula 2-1-2, $n_{12}$ may be an integer from 0 to 6. If each of $n_{11}$ and $n_{12}$ is 0, the fused polycyclic compound according to an embodiment may be a compound unsubstituted with each of $R_{11}$ and $R_{12}$. If each of $n_{11}$ and $n_{12}$ is 2 or more, each of the multiple $R_{11}$ groups and $R_{12}$ groups may be the same, or at least one of the multiple $R_{11}$ groups and $R_{12}$ groups may be different.

In Formula 2-1-1 and Formula 2-1-2, $A_1$, $A_2$, $Z_1$, and $R_8$ may be the same as defined in connection with Formula 2-1.

In an embodiment, the fused polycyclic compound represented by Formula 1 may be represented by Formula 3 below.

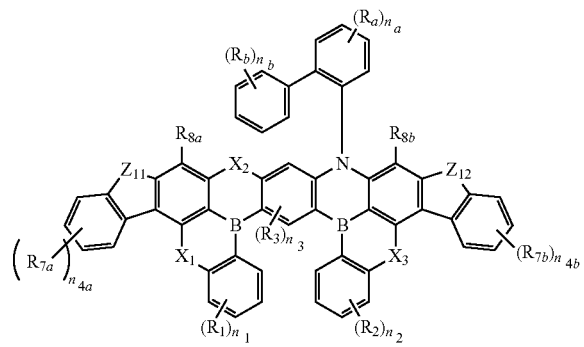

[Formula 3]

Formula 3 represents Formula 1 in which the structures of Cy1 and Cy2 are specified. Formula 3 represents Formula 1 in which both Cy1 and Cy2 include a structure represented by Formula 2-1.

In Formula 3, $Z_{11}$ and $Z_{12}$ may each independently be $C(R_{9a})(R_{10a})$, $N(R_{11a})$, O, S, or Se. In Formula 3, $Z_{11}$ and $Z_{12}$ may be the same or different. For example, $Z_1$ and $Z_{12}$ may each be $C(R_{9a})(R_{10a})$, each may be $N(R_{11a})$, both may be O, both may be S, or both may be Se. In an embodiment, any one of $Z_{11}$ and $Z_{12}$ may be $N(R_{11a})$, and the remaining one may be O or S. In another embodiment, any one of $Z_{11}$ and $Z_{12}$ may be O, and the remaining one may be S. In yet another embodiment, any one of $Z_{11}$ and $Z_{12}$ may be O, and the remaining one may be Se.

In Formula 3, $R_{7a}$, $R_{7b}$, $R_{8a}$, $R_{8b}$, $R_{9a}$, $R_{10a}$, and $R_{11a}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. For example, in an embodiment, $R_{7a}$, $R_{7b}$, $R_{8a}$, $R_{8b}$, $R_{9a}$, $R_{10a}$, and $R_{11a}$ may each independently be a hydrogen atom, a deuterium atom, a substituted or unsubstituted methyl group, a substituted or unsubstituted t-butyl group, or a substituted or unsubstituted phenyl group. In an embodiment, multiple $R_{7a}$ groups and $R_{7b}$, groups may be provided, and adjacent groups among multiple $R_{7a}$ groups and $R_{7b}$ groups may be combined with each other to form a ring.

In Formula 3, $n_{4a}$ and $n_{4b}$ may each independently be an integer from 0 to 4. If each of $n_{4a}$ and $n_{4b}$ is 0, the fused polycyclic compound according to an embodiment may be a compound unsubstituted with each of $R_{7a}$ and $R_{7b}$. If each of $n_{4a}$ and $n_{4b}$ is 2 or more, the multiple $R_{7a}$ groups and $R_{7b}$ groups may be the same or different, or at least one among the multiple $R_{7a}$ groups and $R_{7b}$ groups may be different.

In Formula 3, $X_1$ to $X_3$, $R_1$ to $R_6$, $R_a$, $R_b$, $n_1$ to $n_3$, $n_a$, and $n_b$ may be the same as defined in connection with Formula 1.

In an embodiment, the fused polycyclic compound represented by Formula 3 may be represented by Formula 4 below.

[Formula 4]

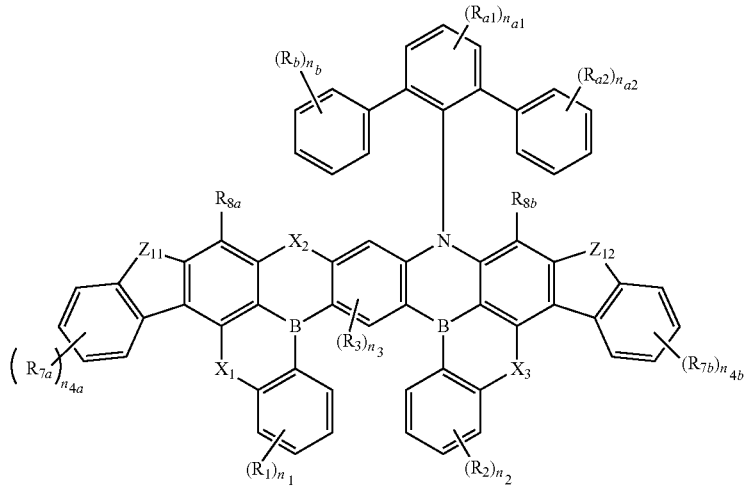

In comparison to Formula 3, Formula 4 represents a case in which phenyl groups are substituted at two ortho positions in a phenyl group which is substituted at a nitrogen atom.

In Formula 4, $R_{a1}$ and $R_{a2}$ may each independently be a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or may be combined with an adjacent group to form a ring. For example, in an embodiment, $R_{a1}$ and $R_{a2}$ may each independently be a hydrogen atom, a deuterium atom, a substituted or unsubstituted methyl group, a substituted or unsubstituted t-butyl group, or a substituted or unsubstituted phenyl group. In an embodiment, multiple $R_{a1}$ groups and $R_{a2}$ groups may be provided, and adjacent groups among multiple $R_{a1}$ groups and $R_{a2}$ groups may be combined with each other to form a ring.

In Formula 4, $n_{a1}$ may be an integer from 0 to 3, and $n_{a2}$ may be an integer from 0 to 5. If each of $n_{a1}$ and $n_{a2}$ is 0, the fused polycyclic compound according to an embodiment may be a compound unsubstituted with each of $R_{a1}$ and $R_{a2}$. If each of $n_{a1}$ and $n_{a2}$ is 2 or more, the multiple $R_{a1}$ groups and $R_{a2}$ groups may be the same, or at least one of the multiple $R_{a1}$ groups and $R_{a2}$ groups may be different.

In Formula 4, $X_1$ to $X_3$, $Z_{11}$, $Z_{12}$, $R_1$ to $R_6$, $R_a$, $R_b$, $R_{7a}$, $R_{7b}$, $R_{8a}$, $R_{8b}$, $R_{9a}$, $R_{10a}$, $R_{11a}$, $n_1$ to $n_3$, $n_a$, $n_b$, nu, and $n_{4b}$ may be the same as defined in connection with Formula 1 and Formula 3.

In an embodiment, the fused polycyclic compound may be any one selected from Compound Group 1 below. The light emitting device ED of an embodiment may include at least one fused polycyclic compound selected from Compound Group 1 in an emission layer EML.

[Compound Group 1]

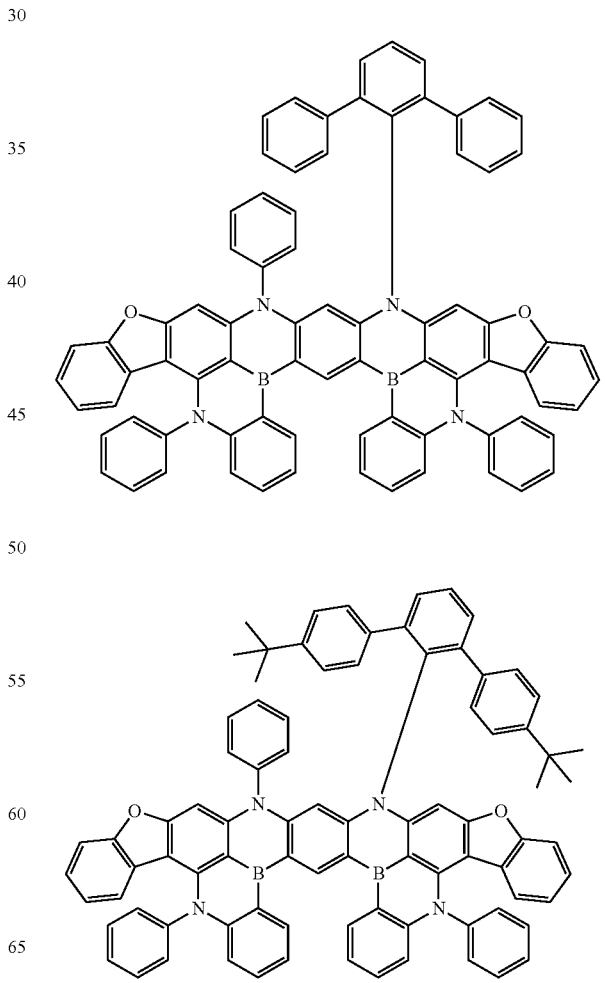

33
-continued
3
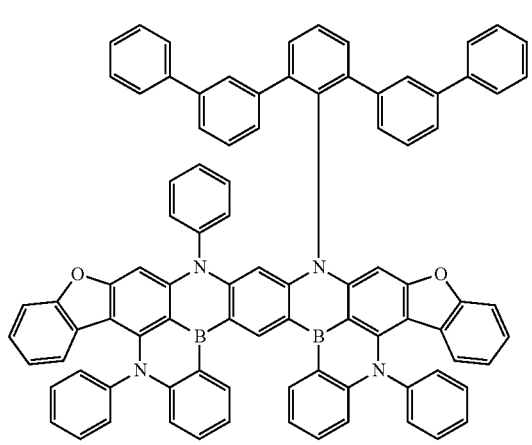
4
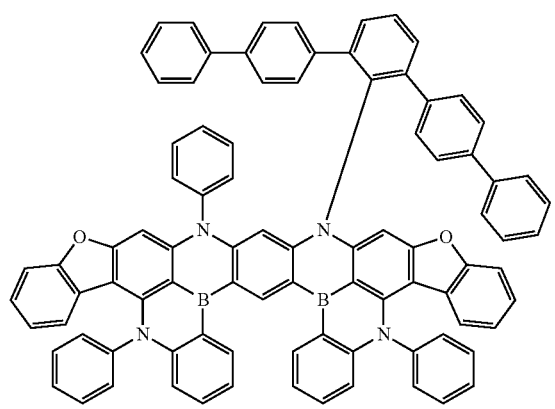
5
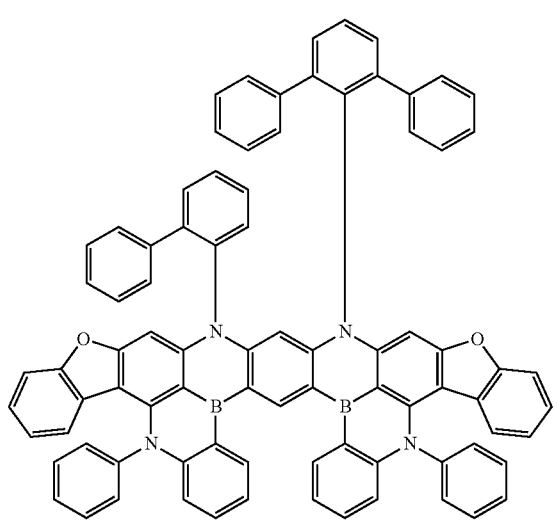
34
-continued
6
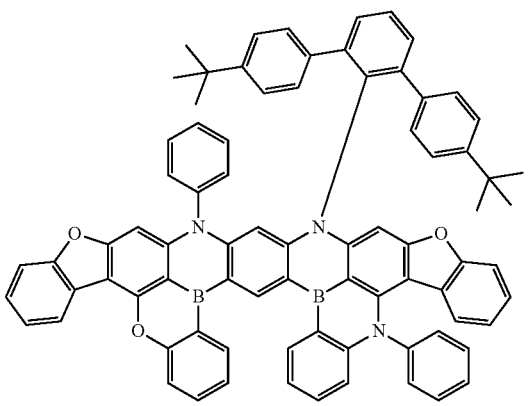
7
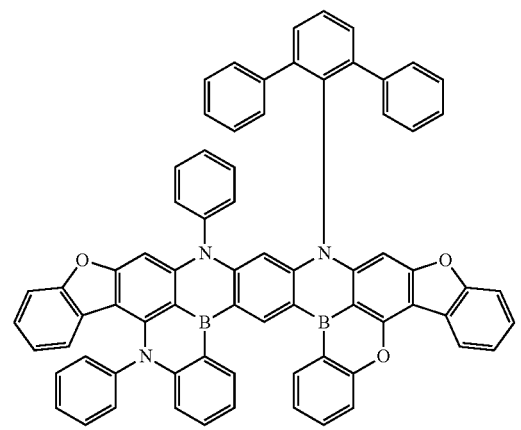
8
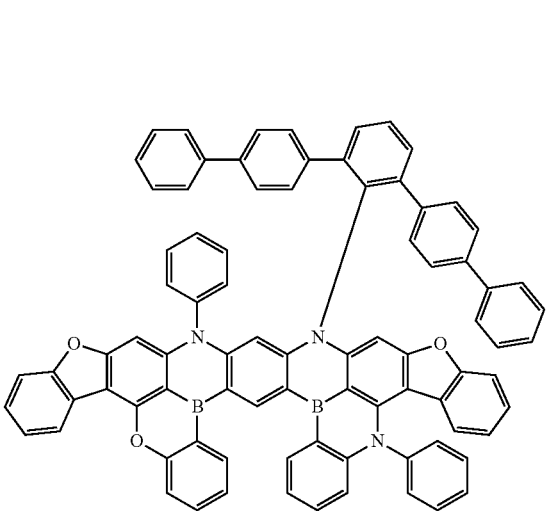

9
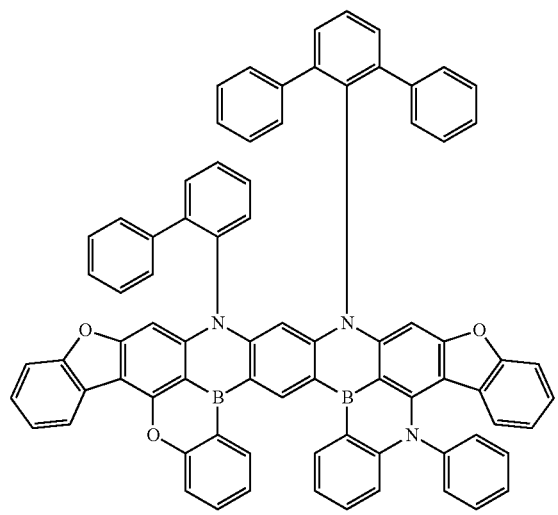
10
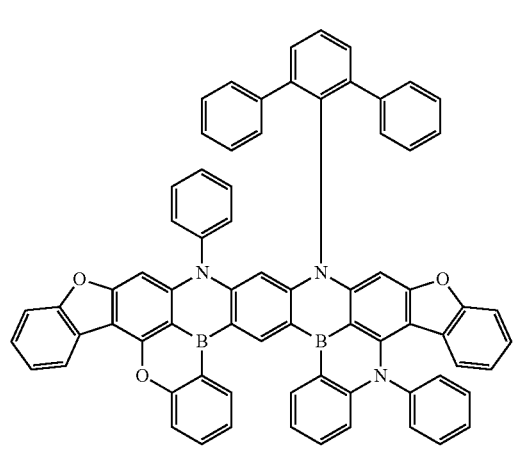
12
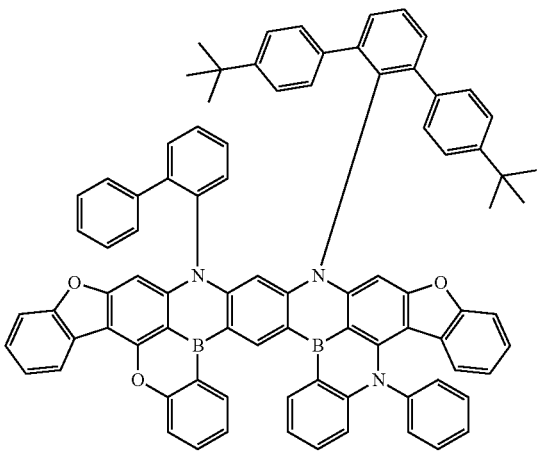
13
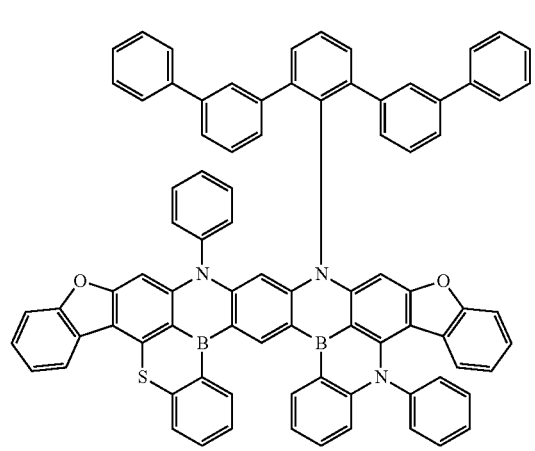

-continued
15
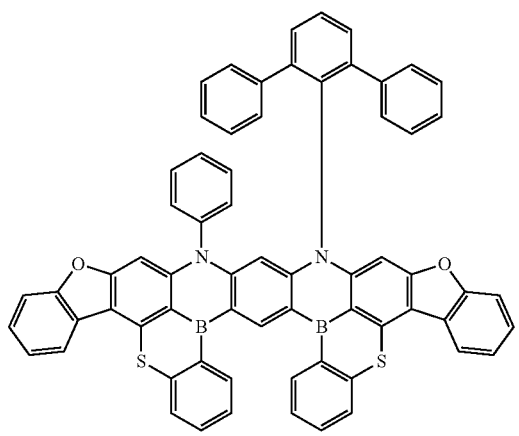
16
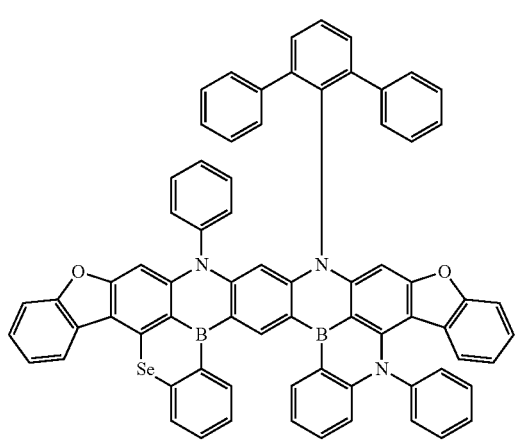
17
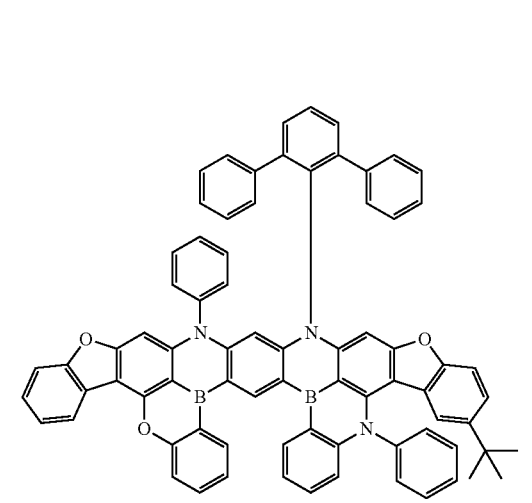
-continued
18
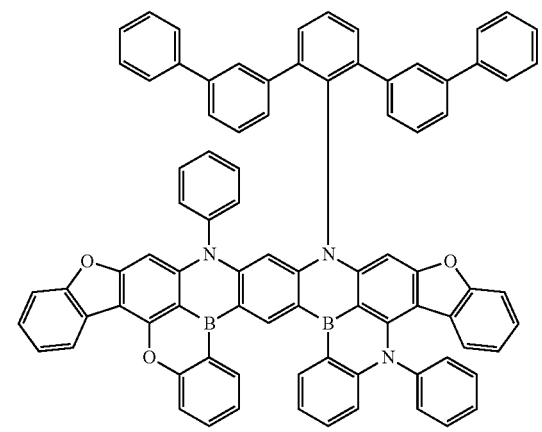
19
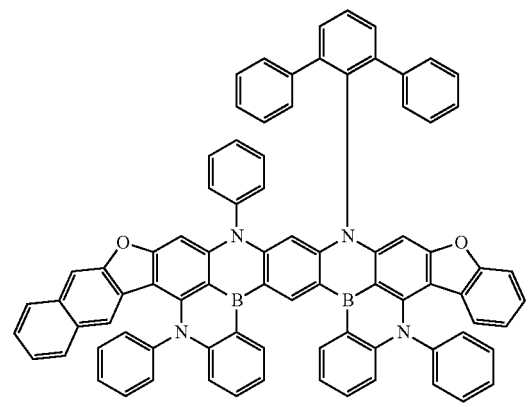
20

21
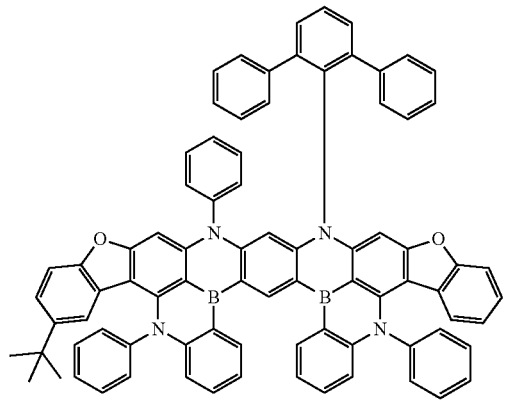
22
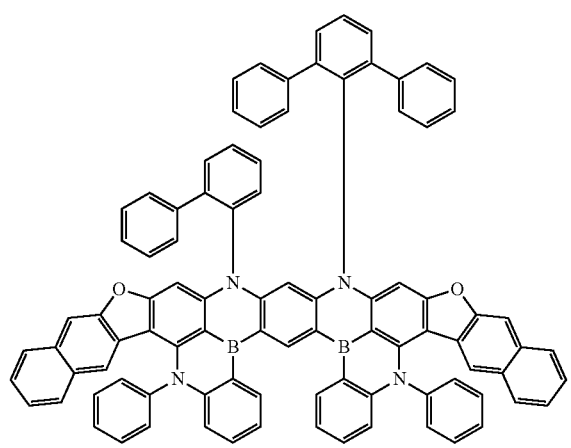
23
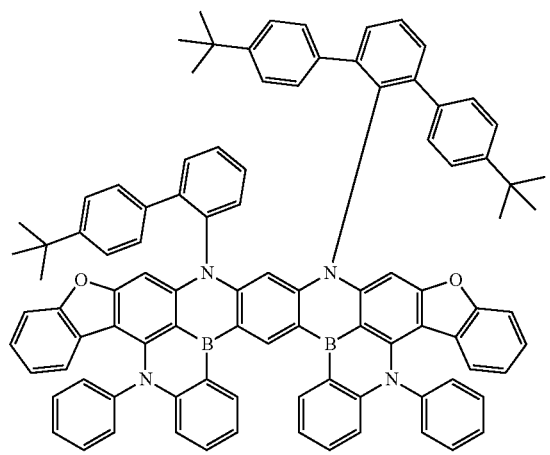
24
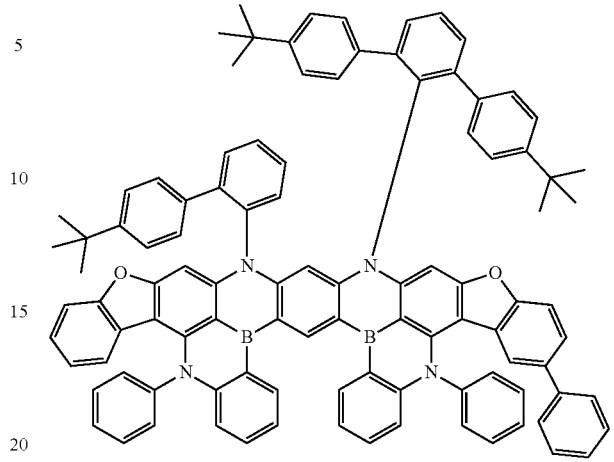
25
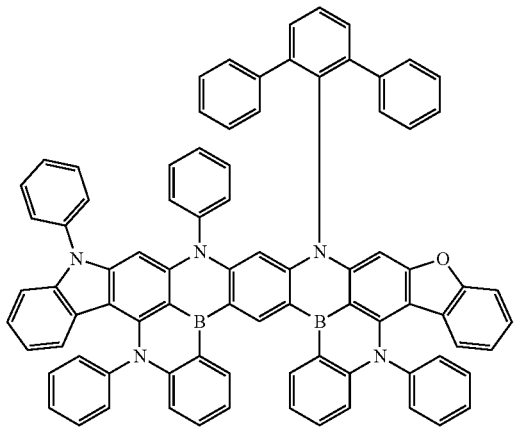
26
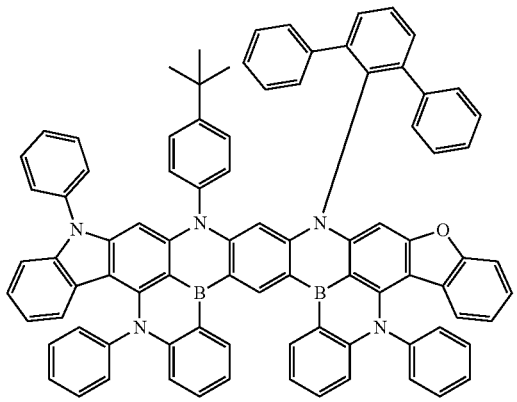

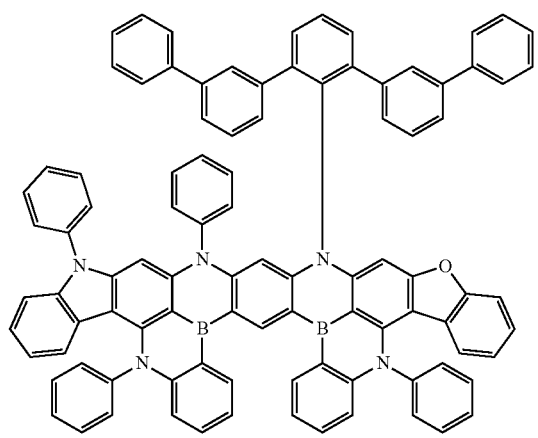
27
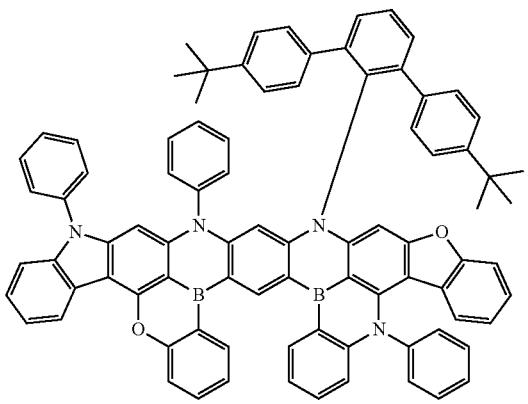
30
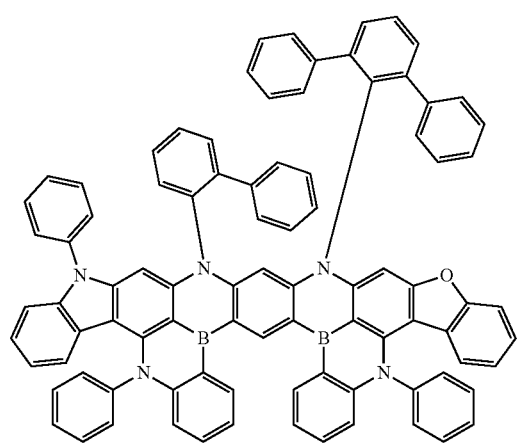
28
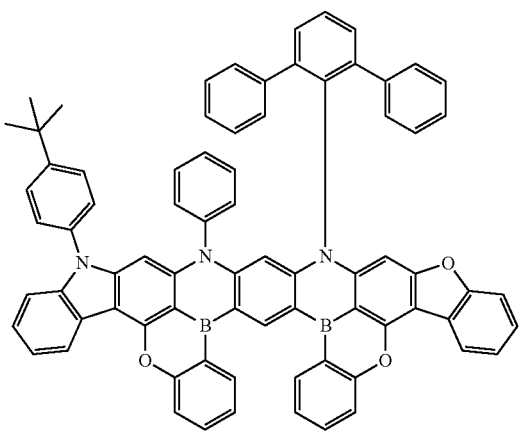
31
29
32

-continued
33
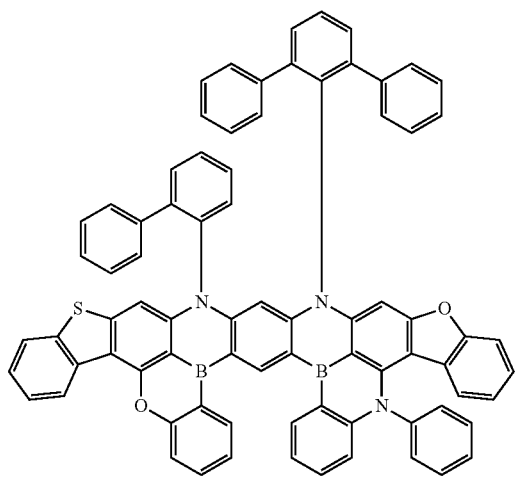
34
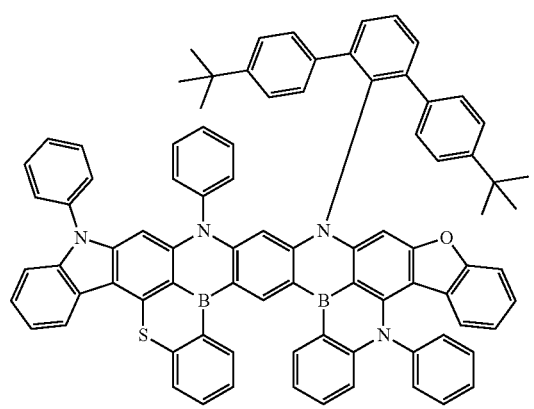
35
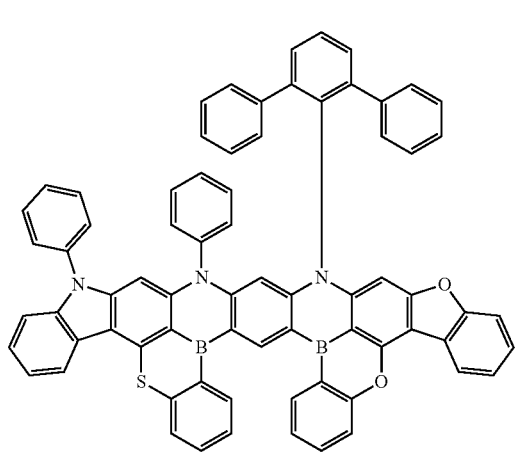
36
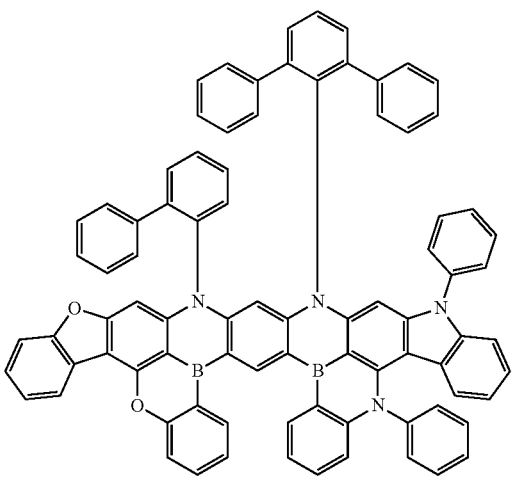
37
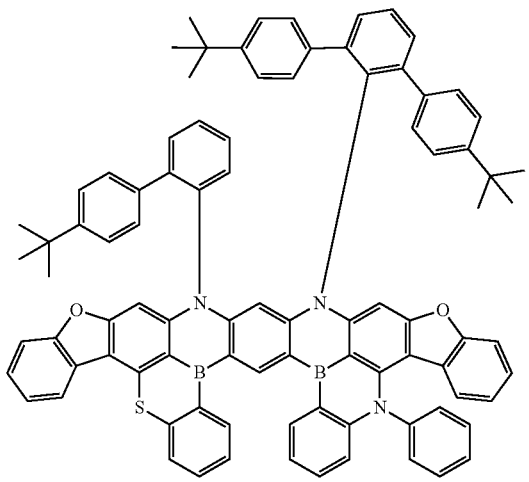
38
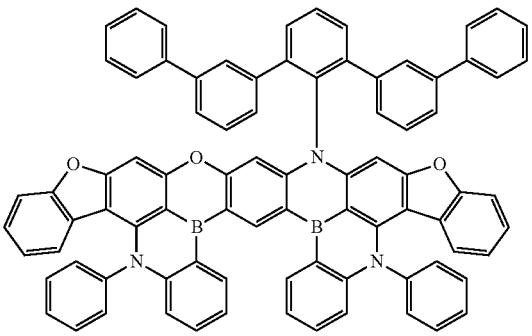

39
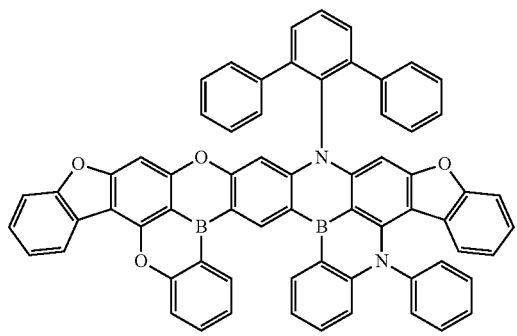
40
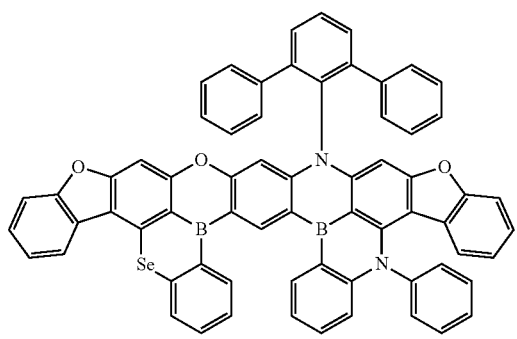
41
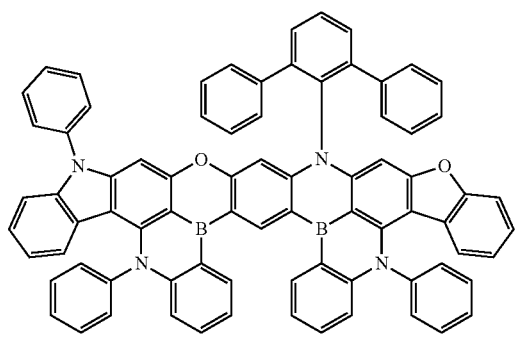
42
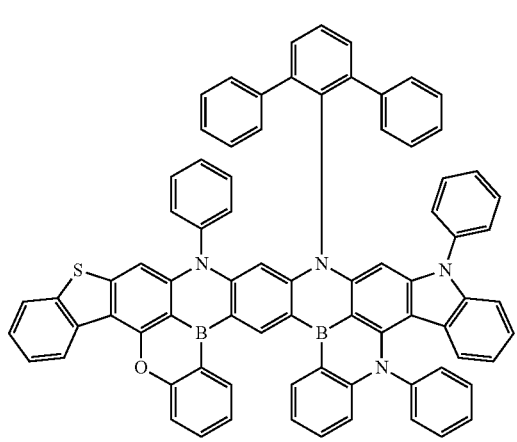
43
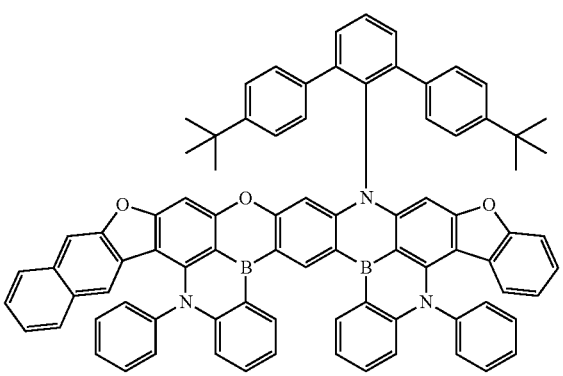
44
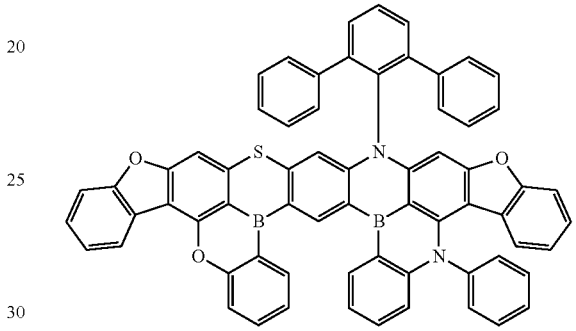
45
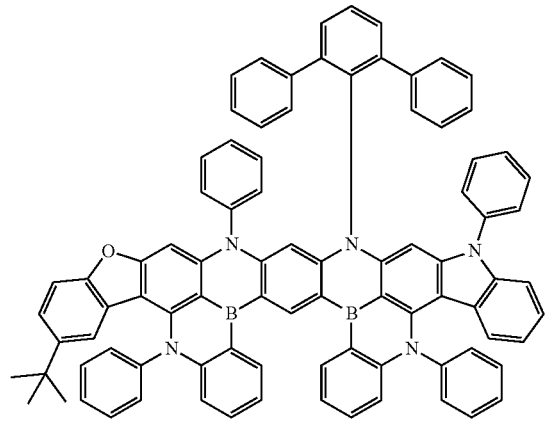
46
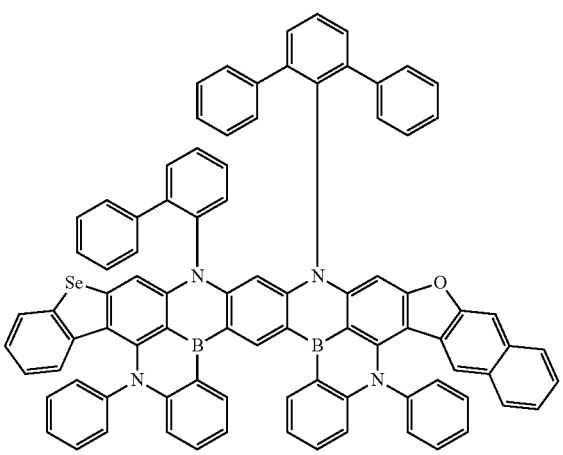

47
-continued
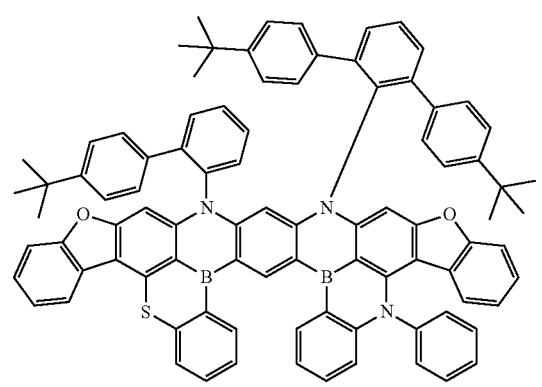
47
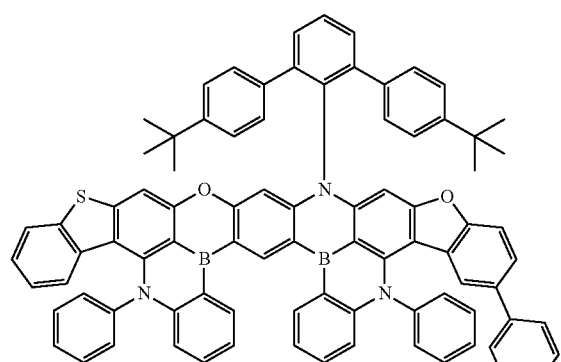
48
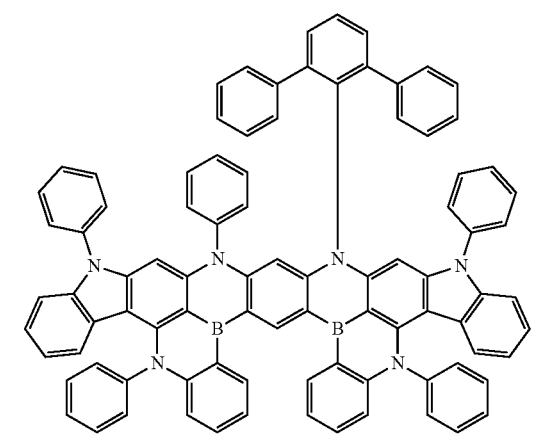
49
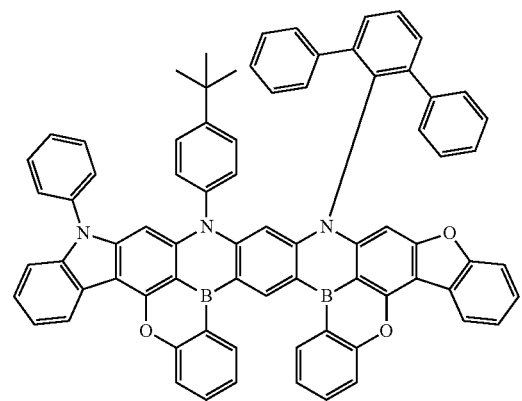
50
48
-continued
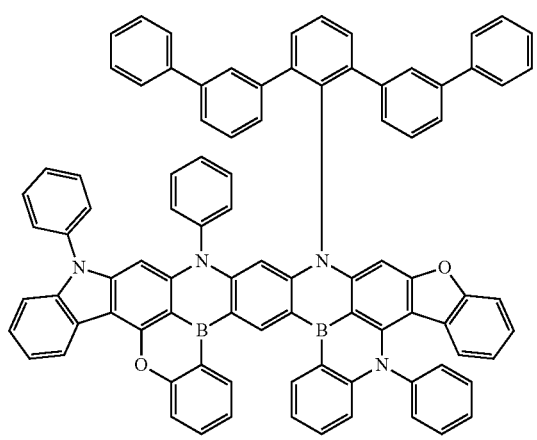
51
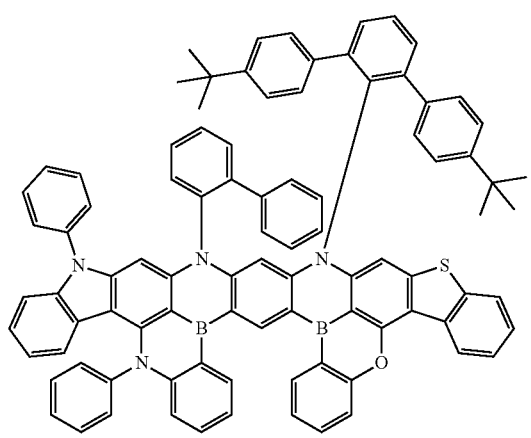
52
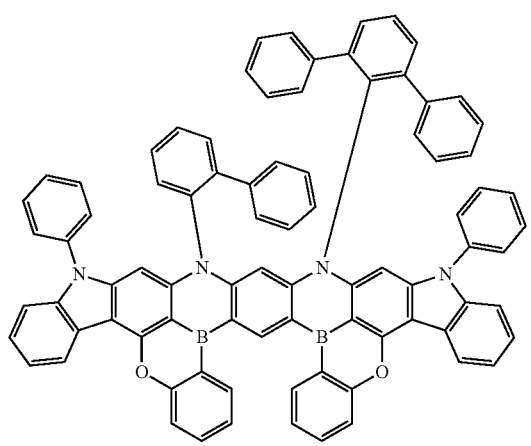
53

-continued
54
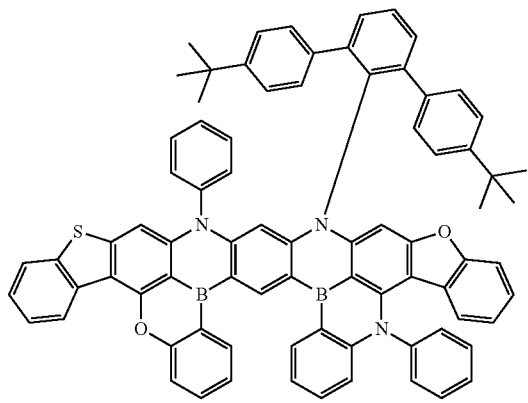
55
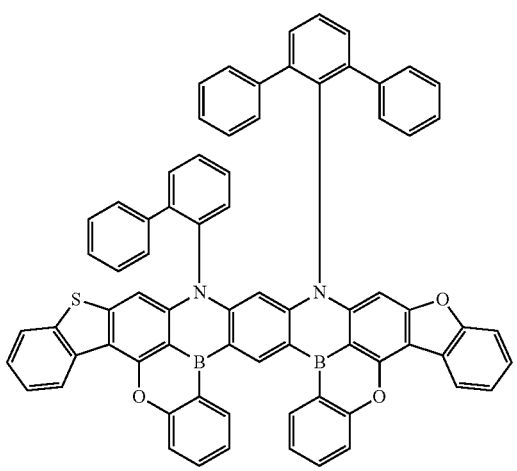
56
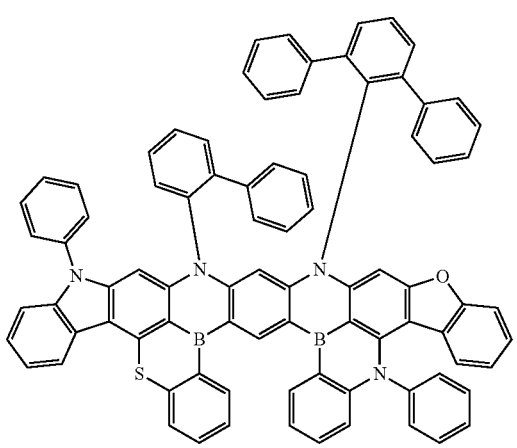
-continued
57
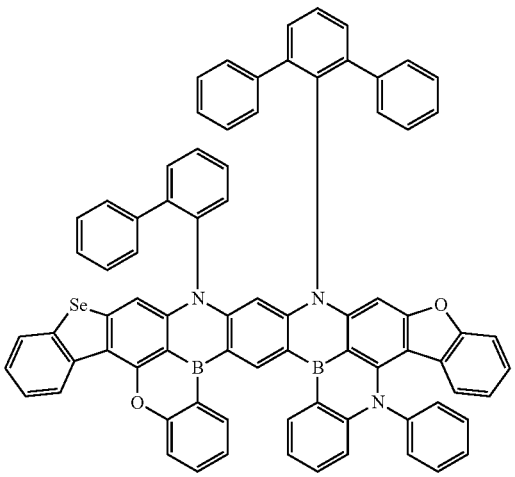
58
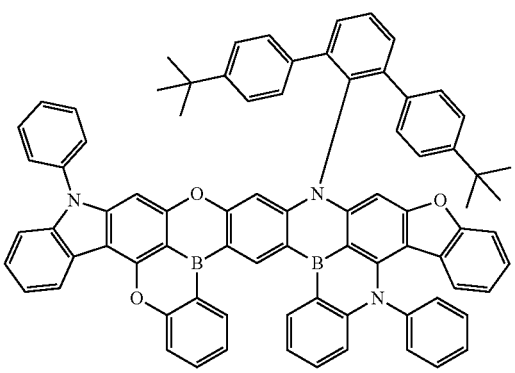
59
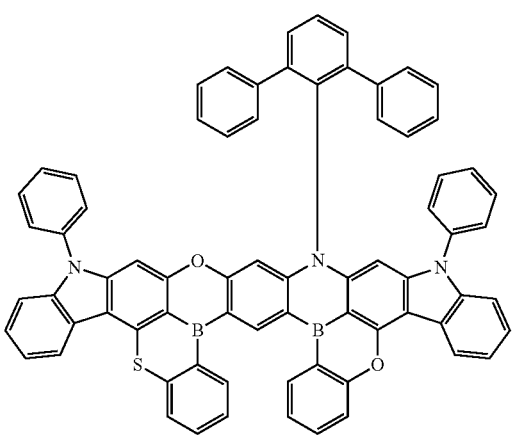

60
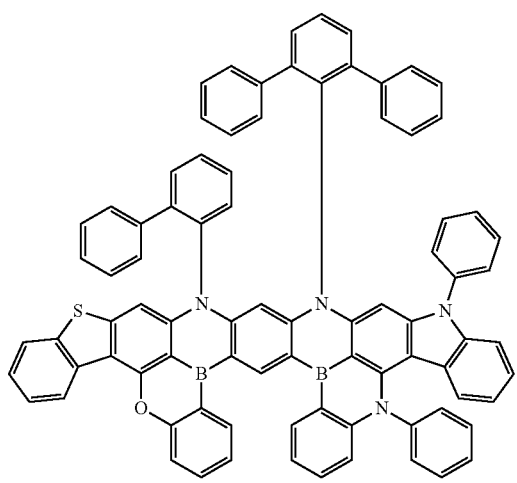
61
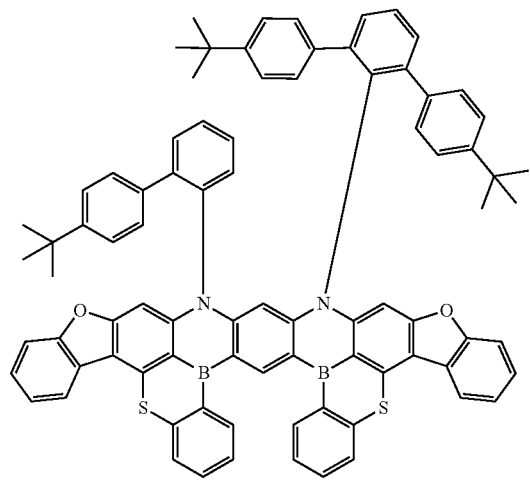
62
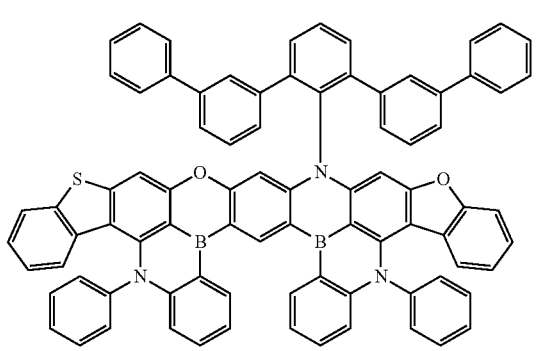
63
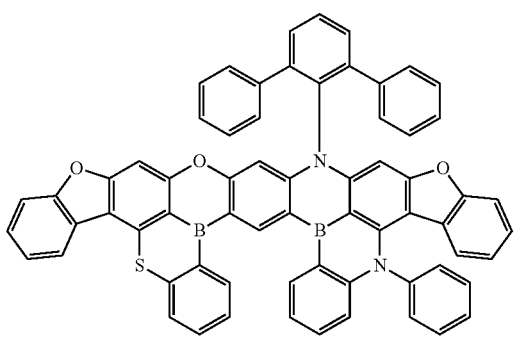
64
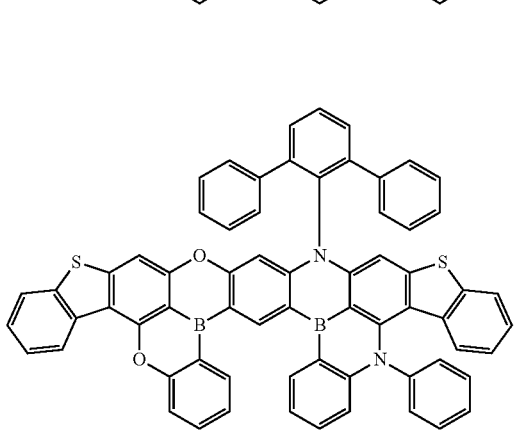
65
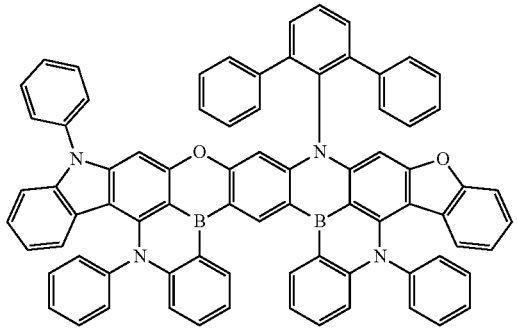
66
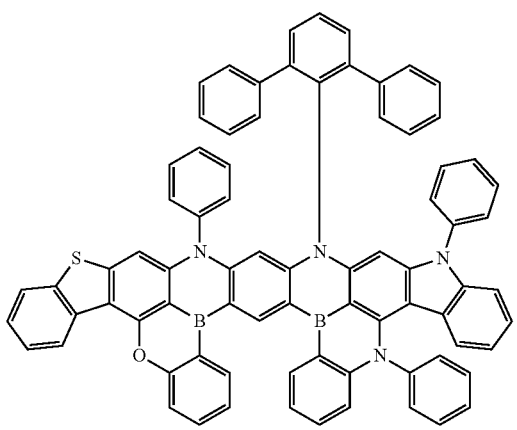

67
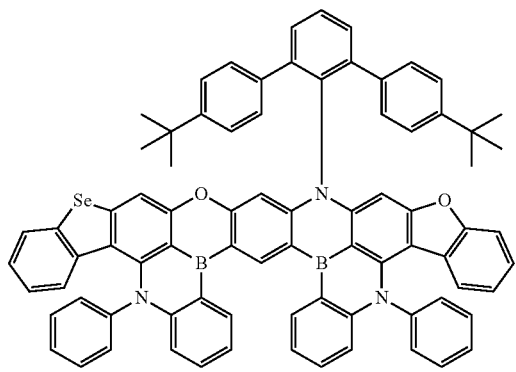
68
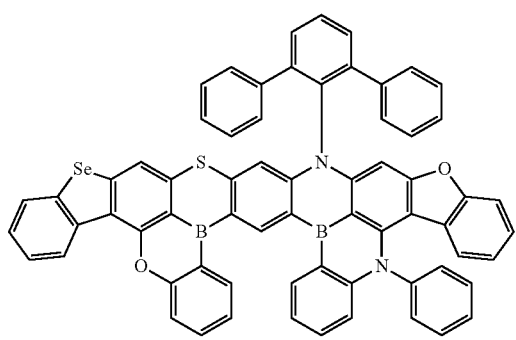
69
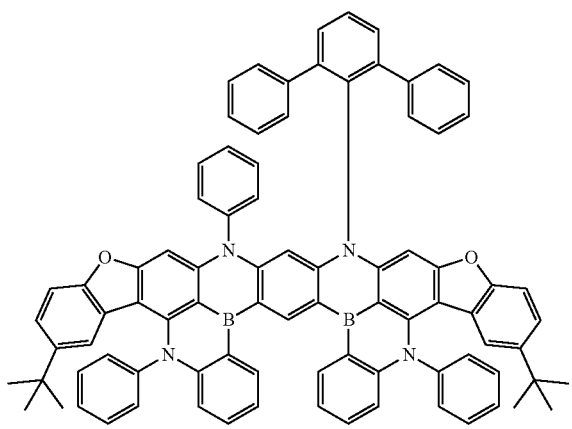
70
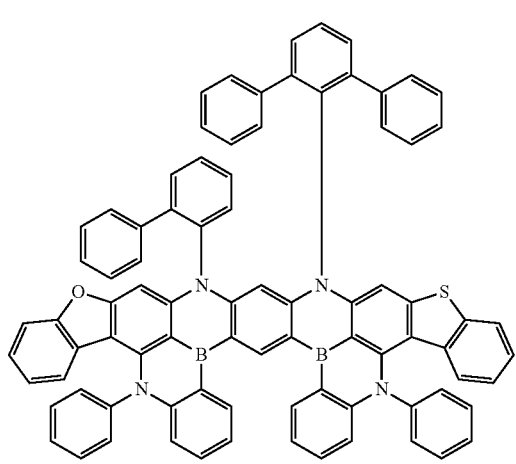
71
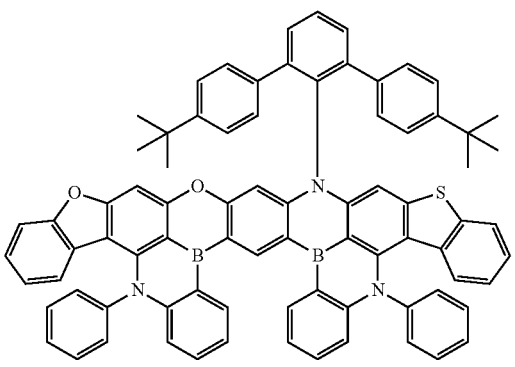
72
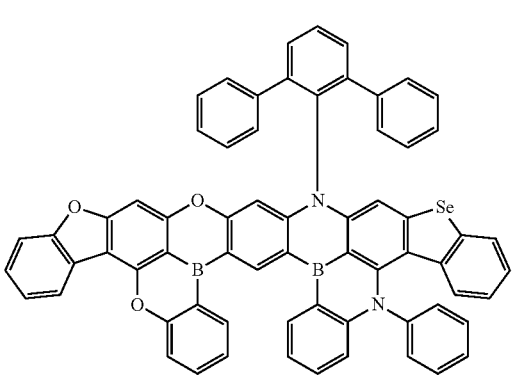
73
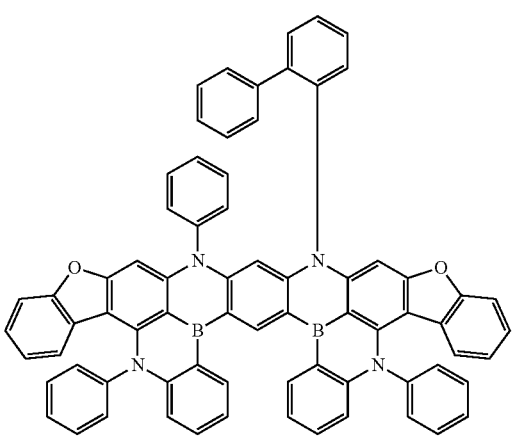
74
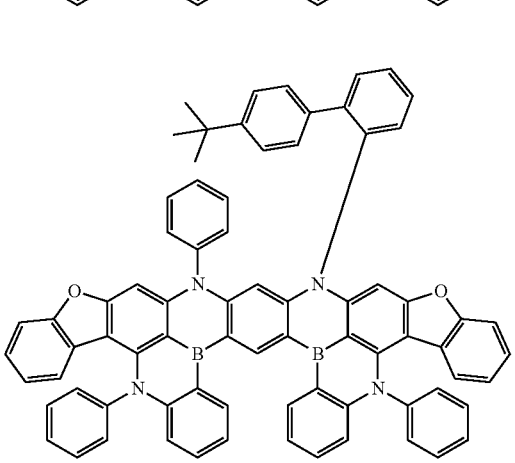

75
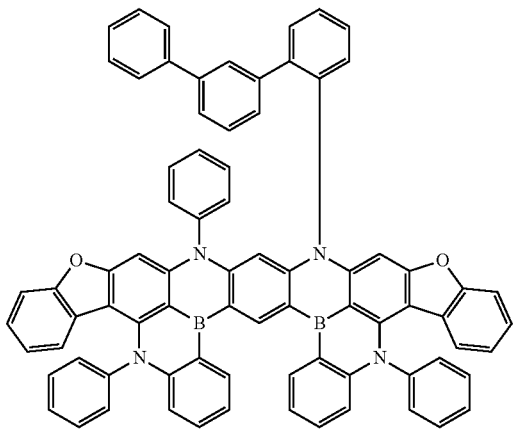
76
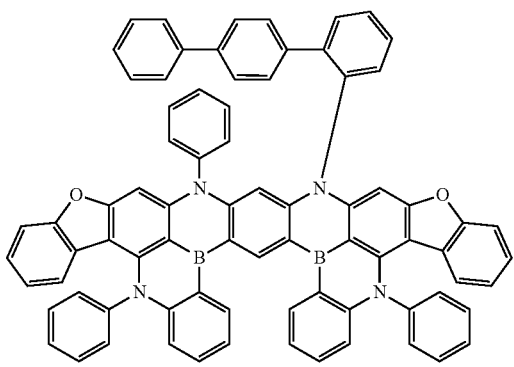
77
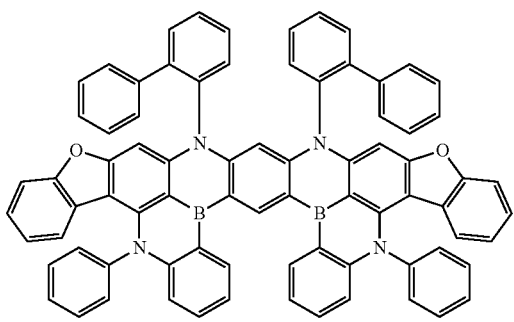
78
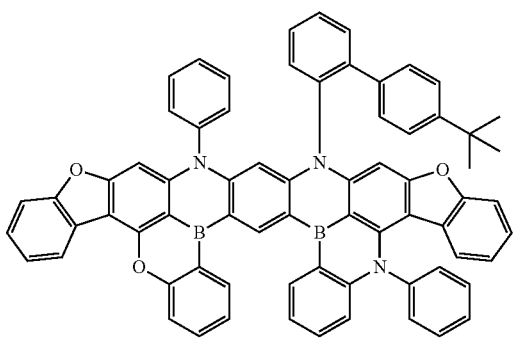
79
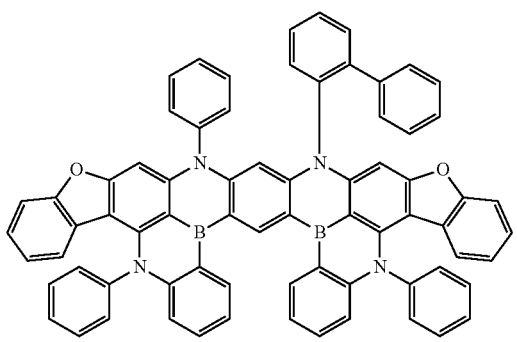
80
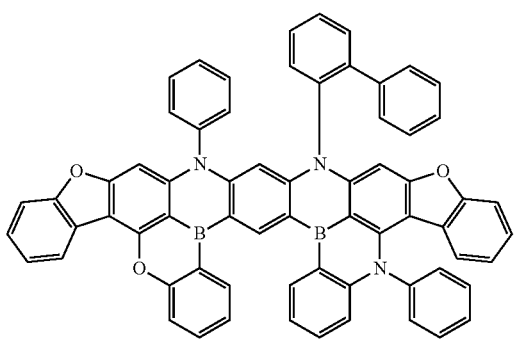
81
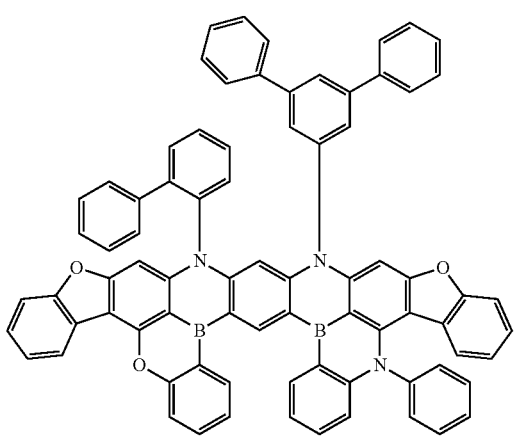
82
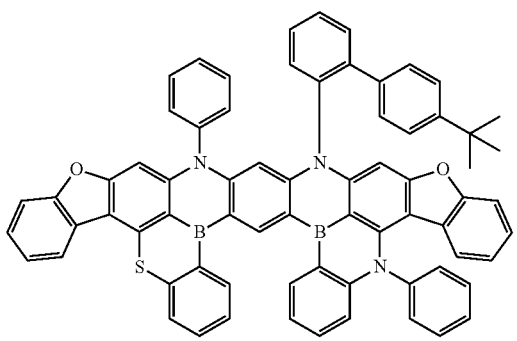

83
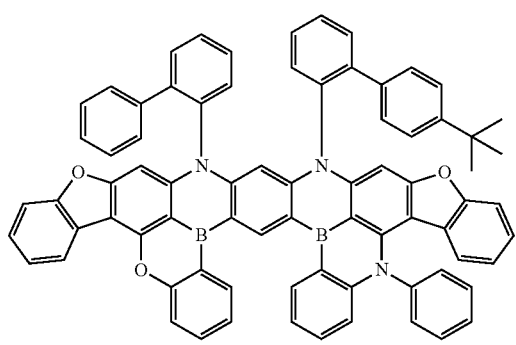
84
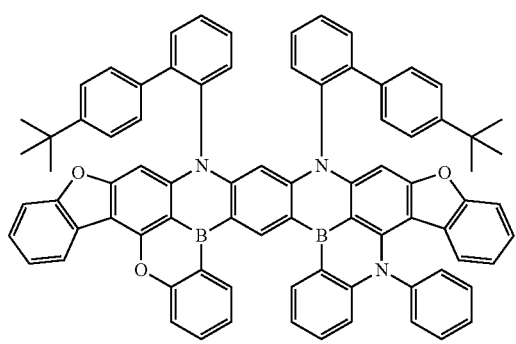
85
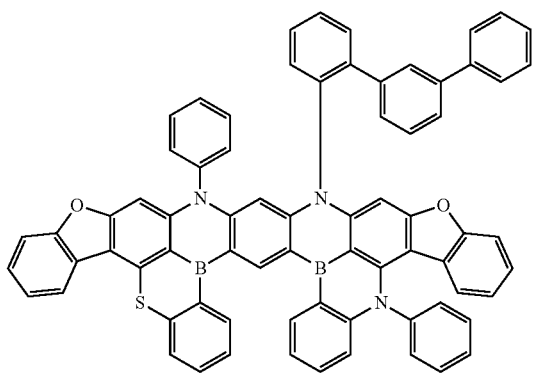
86
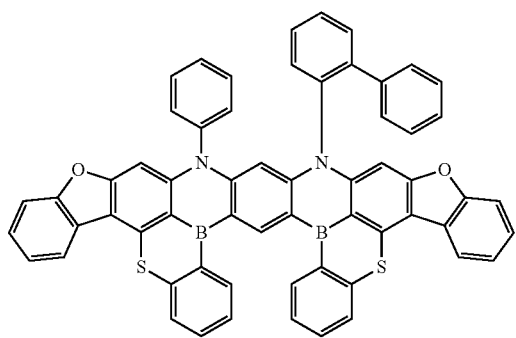
87
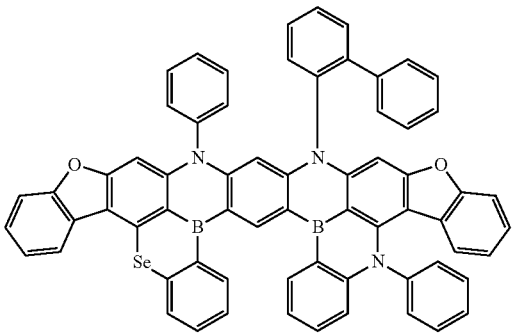
88
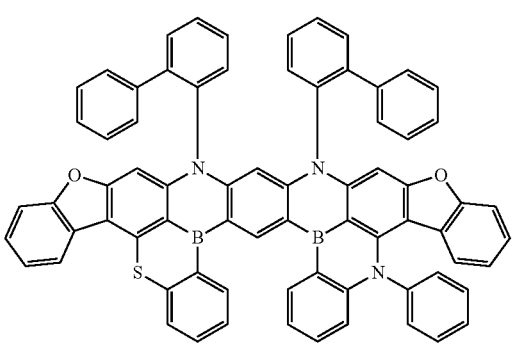
89
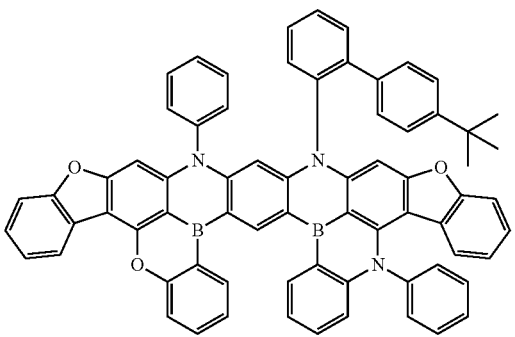
90
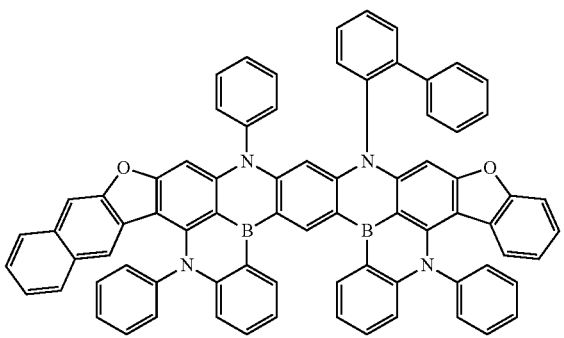

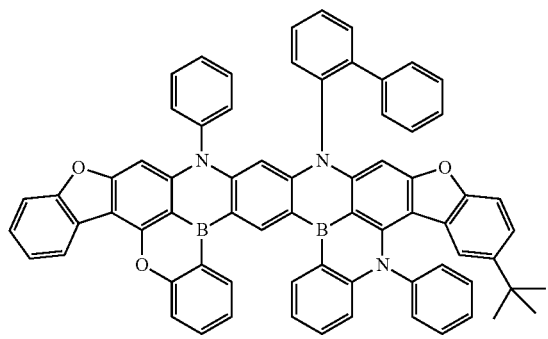

91

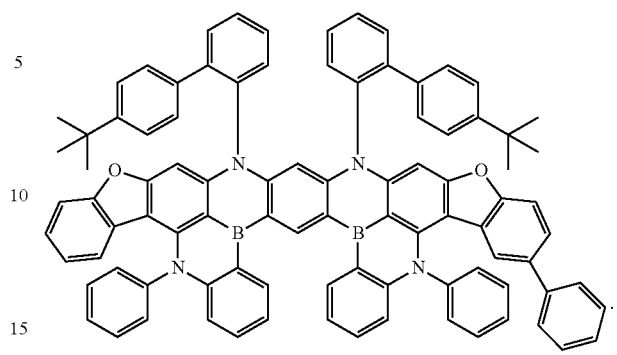

95

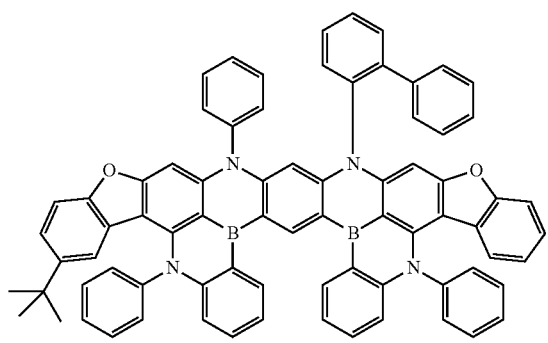

92

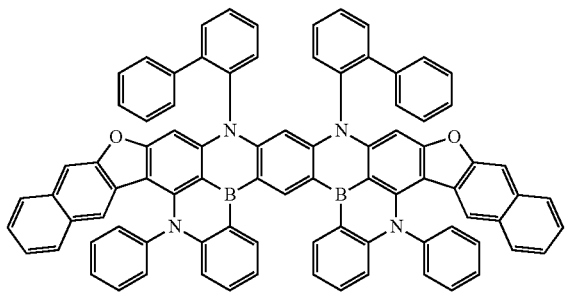

93

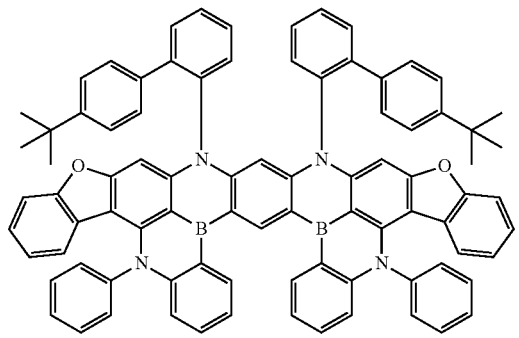

94

The light emission spectrum of the fused polycyclic compound represented by Formula 1 may have a full width at half maximum in a range of about 10 nm to about 50 nm. For example, the light emission spectrum of the fused polycyclic compound may have a full width at half maximum in a range of about 20 nm to about 40 nm. Since the light emission spectrum of the fused polycyclic compound represented by Formula 1 has a full width at half maximum in the ranges as described above, when a light emitting device includes the fused polycyclic compound, emission efficiency may be improved. When the fused polycyclic compound of an embodiment is used as a material for a blue light emitting device, device life may be improved.

The fused polycyclic compound of an embodiment represented by Formula 1 may be a material for emitting thermally activated delayed fluorescence. For example, the fused polycyclic compound of an embodiment represented by Formula 1 may be a thermally activated delayed fluorescence dopant having a difference ($\Delta E_{ST}$) between the lowest triplet excitation energy level (T1 level) and the lowest singlet excitation energy level (S1 level) equal to or less than about 0.6 eV. The fused polycyclic compound of an embodiment represented by Formula 1 may be a thermally activated delayed fluorescence dopant having a difference ($\Delta E_{ST}$) between the lowest triplet excitation energy level (T1 level) and the lowest singlet excitation energy level (S1 level) equal to or less than about 0.2 eV.

The fused polycyclic compound of an embodiment represented by Formula 1 may be a light emitting material having a central wavelength of emitting light in a wavelength region of about 430 nm to about 490 nm. For example, in an embodiment, a light emitting device which has an emission layer that includes the fused polycyclic compound represented by Formula 1 may emit light with a central wavelength in a range of about 430 nm to about 490 nm. For example, the fused polycyclic compound of an embodiment, represented by Formula 1 may be a blue thermally activated delayed fluorescence (TADF) dopant. However, embodiments are not limited thereto. In case of using the fused polycyclic compound of an embodiment as a light emitting material, the fused polycyclic compound may be used as a dopant material emitting light in various wavelength regions including a red light emitting dopant, a green light emitting dopant, etc.

In the light emitting device ED of an embodiment, an emission layer EML may emit delayed fluorescence. For example, the emission layer EML may emit thermally activated delayed fluorescence (TADF).

The emission layer EML of the light emitting device ED may emit blue light. For example, the emission layer EML of the light emitting device ED may emit blue light in a wavelength region equal to or less than about 490 nm. However, embodiments are not limited thereto. The emission layer EML may emit green light or red light.

In an embodiment, the emission layer EML includes a host and a dopant and may include the fused polycyclic compound as the dopant. For example, in the light emitting device ED of an embodiment, the emission layer EML may include a host for emitting delayed fluorescence and a dopant for emitting delayed fluorescence. The dopant may include the fused polycyclic compound for emitting delayed fluorescence. The emission layer EML may include at least one of the fused polycyclic compounds selected from Compound Group 1 as a thermally activated delayed fluorescence dopant.

In the light emitting device ED of an embodiment, the emission layer EML may further include anthracene derivatives, pyrene derivatives, fluoranthene derivatives, chrysene derivatives, dihydrobenzanthracene derivatives, or triphenylene derivatives. For example, the emission layer EML may include anthracene derivatives or pyrene derivatives.

In the light emitting devices ED of embodiments, shown in FIG. 3 to FIG. 6, the emission layer EML may include a host and a dopant, and the emission layer EML may include a compound represented by Formula E-1 below. The compound represented by Formula E-1 below may be used as a fluorescence host material or a delayed fluorescence host material.

[Formula E-1]

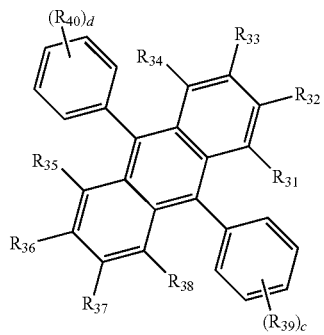

In Formula E-1, $R_{31}$ to $R_{40}$ may each independently be a hydrogen atom, a deuterium atom, a halogen atom, a substituted or unsubstituted silyl group, a substituted or unsubstituted alkyl group of 1 to 10 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula E-1, $R_{31}$ to $R_{40}$ may be combined with an adjacent group to form a saturated hydrocarbon ring or an unsaturated hydrocarbon ring.

In Formula E-1, c and d may each independently be an integer from 0 to 5.

The compound represented by Formula E-1 may be any one selected from Compound E1 to Compound E18 below.

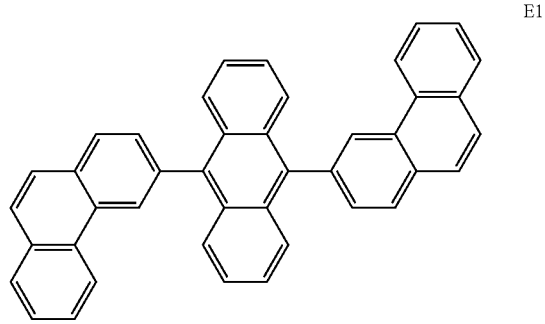

E1

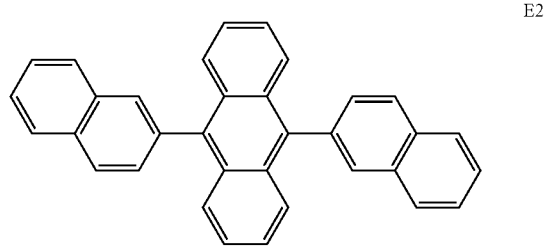

E2

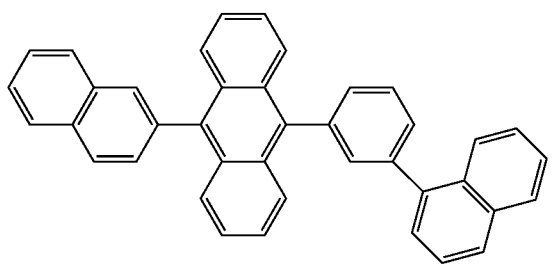

E3

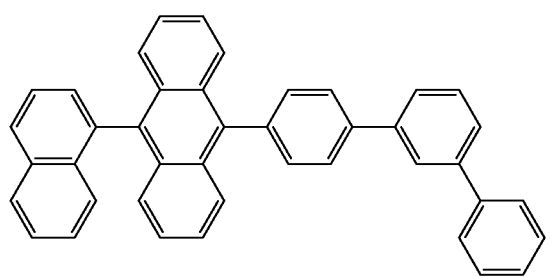

E4

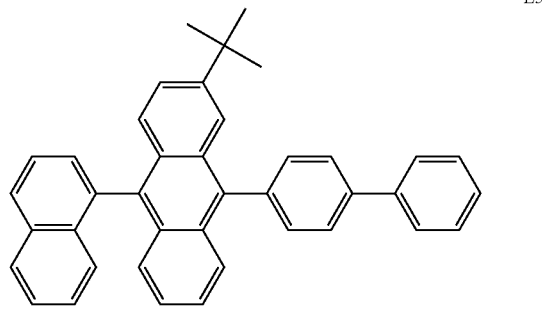

E5

-continued
E6
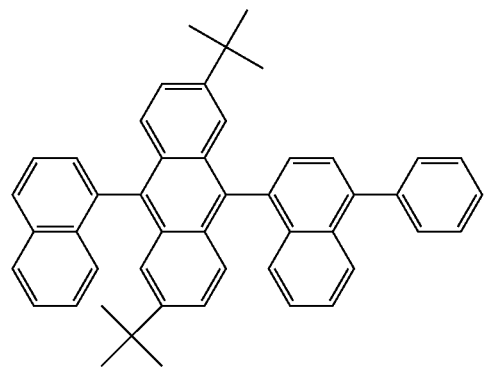
E7
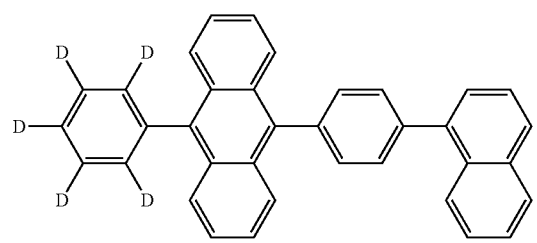
E8
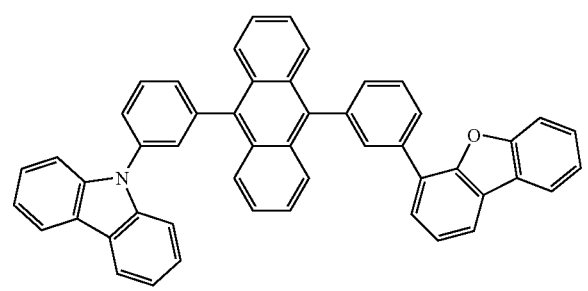
E9
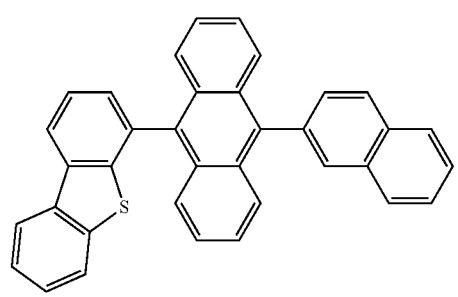
E10
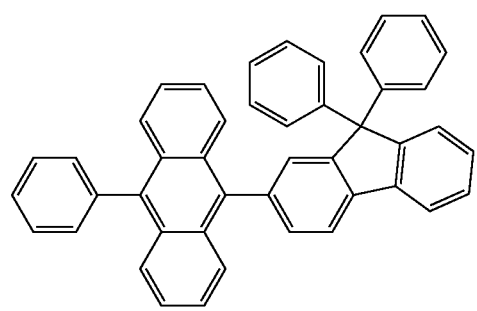
-continued
E11
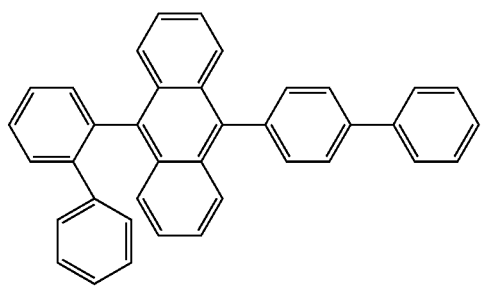
E12
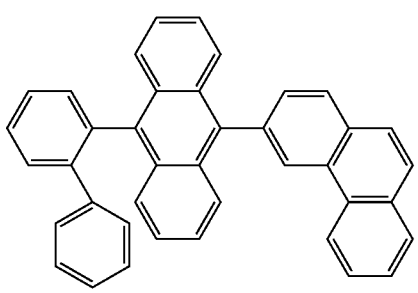
E13
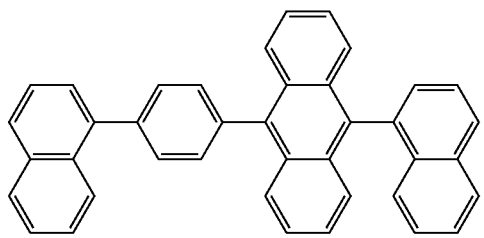
E14
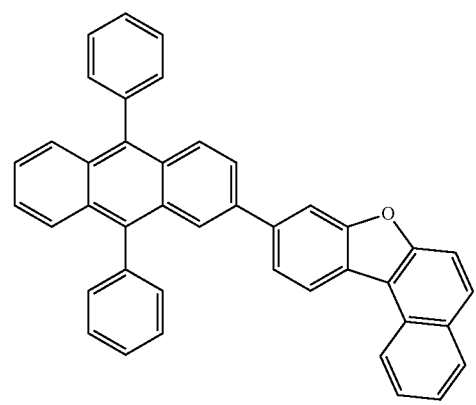

E15

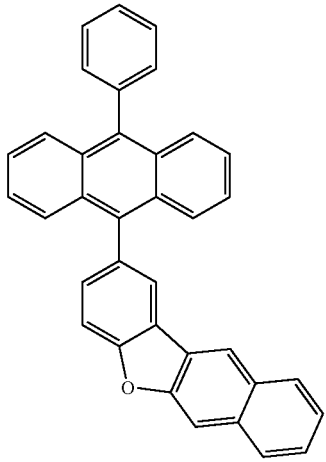

E16

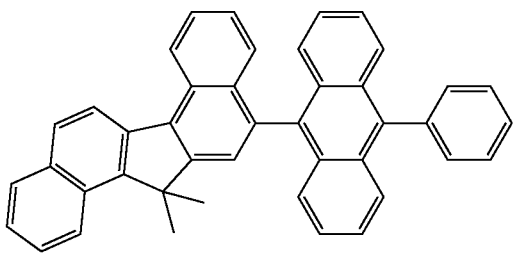

E17

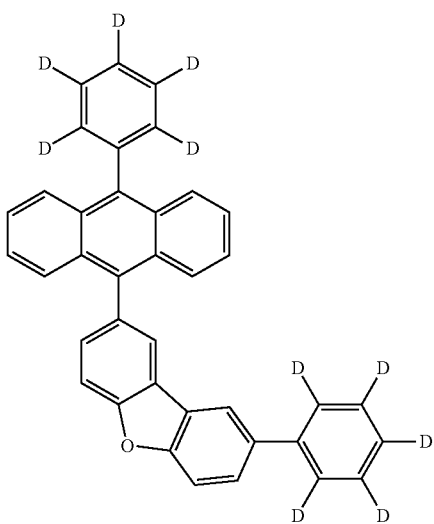

E18

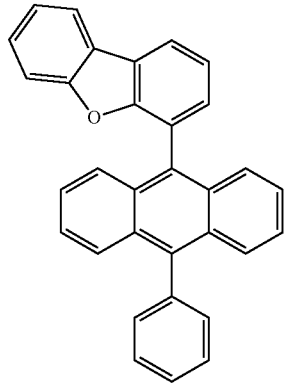

In an embodiment, the emission layer EML may include a compound represented by Formula E-2a or Formula E-2b below. The compound represented by Formula E-2a or Formula E-2b below may be used as a phosphorescence host material or a delayed fluorescence host material.

[Formula E-2a]

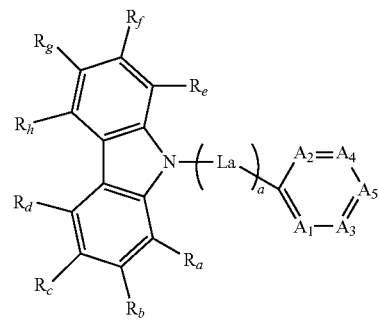

In Formula E-2b, a may be an integer from 0 to 10, $L_a$ may be a direct linkage, a substituted or unsubstituted arylene group of 6 to 30 ring-forming carbon atoms, or a substituted or unsubstituted heteroarylene group of 2 to 30 ring-forming carbon atoms. If a is 2 or more, multiple $L_a$ groups may each independently be a substituted or unsubstituted arylene group of 6 to 30 ring-forming carbon atoms, or a substituted or unsubstituted heteroarylene group of 2 to 30 ring-forming carbon atoms.

In Formula E-2a, $A_1$ to $A_5$ may each independently be N or C(Ri). $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. $R_a$ to $R_i$ may be combined with an adjacent group to form a hydrocarbon ring or a heterocycle including N, O, S, etc. as a ring-forming atom.

In Formula E-2a, two or three of $A_1$ to $A_5$ may be N, and the remainder of $A_1$ to $A_5$ may be $C(R_i)$.

[Formula E-2b]

$$(Cbz1)\!-\!\!(L_b)_{\overline{b}}\!-\!(Cbz2)$$

In Formula E-2b, Cbz1 and Cbz2 may each independently be an unsubstituted carbazole group, or a carbazole group substituted with an aryl group of 6 to 30 ring-forming carbon atoms. In Formula E-2b, $L_b$ may be a direct linkage, a substituted or unsubstituted arylene group of 6 to 30 ring-forming carbon atoms, or a substituted or unsubstituted heteroarylene group of 2 to 30 ring-forming carbon atoms. In Formula E-2b, b may be an integer of 0 to 10. If b is 2 or more, multiple $L_b$ groups may each independently be a substituted or unsubstituted arylene group of 6 to 30 ring-forming carbon atoms, or a substituted or unsubstituted heteroarylene group of 2 to 30 ring-forming carbon atoms.

The compound represented by Formula E-2a or Formula E-2b may be any one selected from Compound Group E-2 below. However, the compounds shown in Compound Group E-2 below are only examples, and the compound represented by Formula E-2a or Formula E-2b is not limited to the compounds listed in Compound Group E-2 below.

[Compound Group E-2]

E-2-1

E-2-2

E-2-3

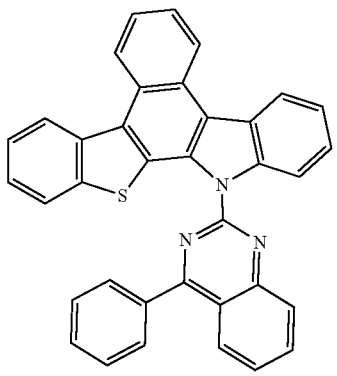

E-2-4

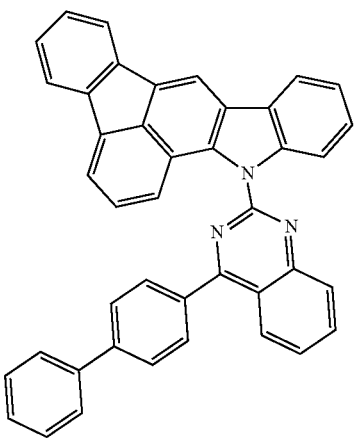

E-2-5

E-2-6

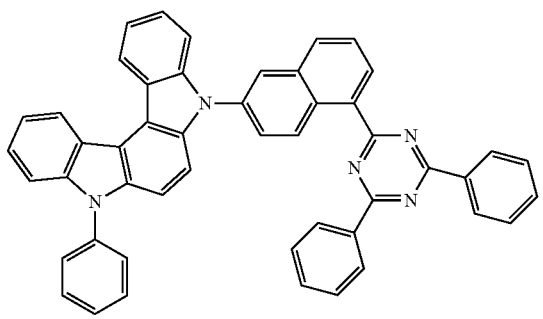

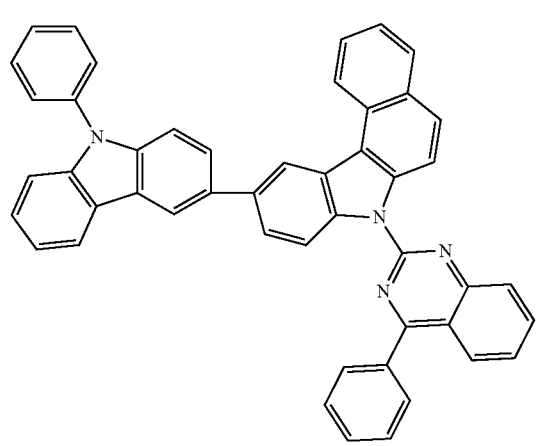

-continued
E-2-7
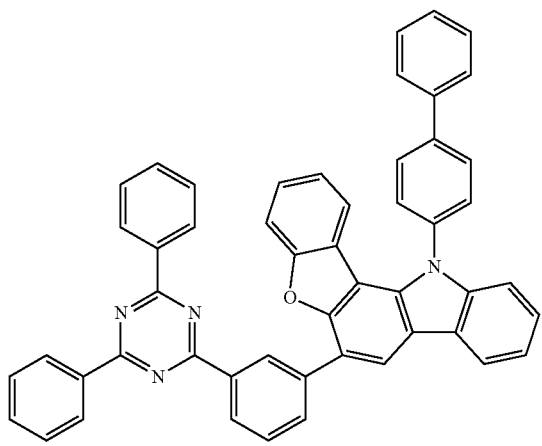
E-2-8
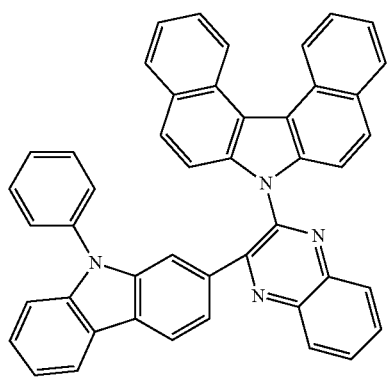
E-2-9
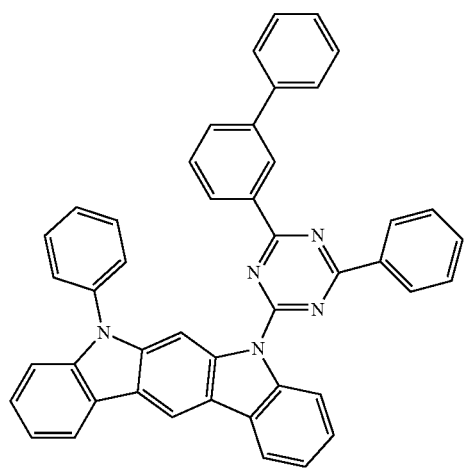
-continued
E-2-10
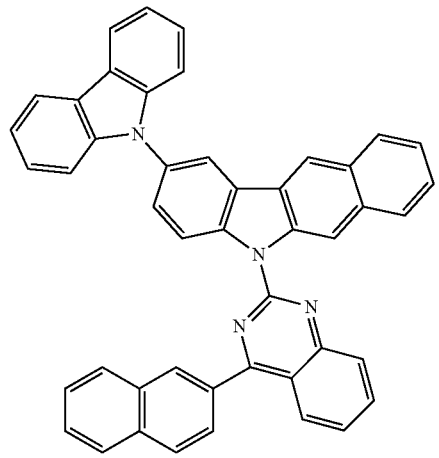
E-2-11
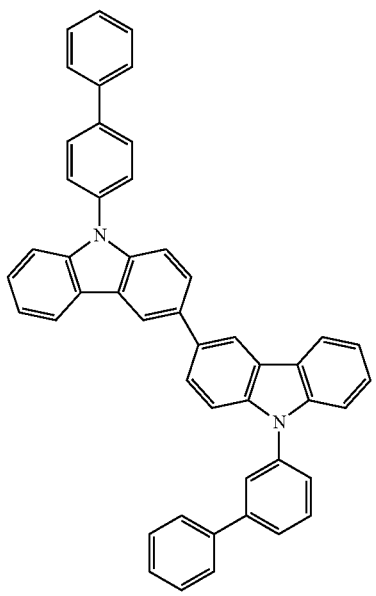
E-2-12
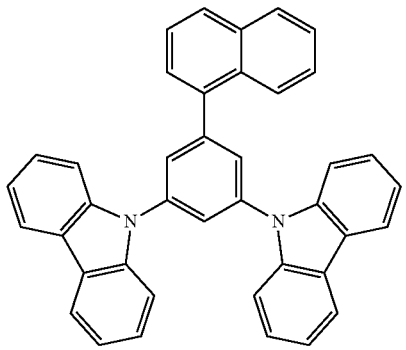

E-2-13
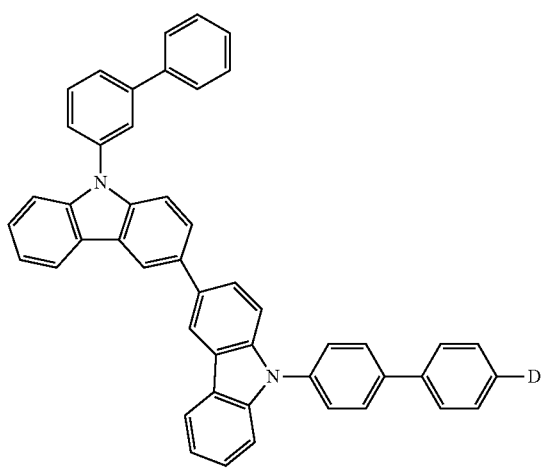
E-2-14
E-2-15
E-2-16
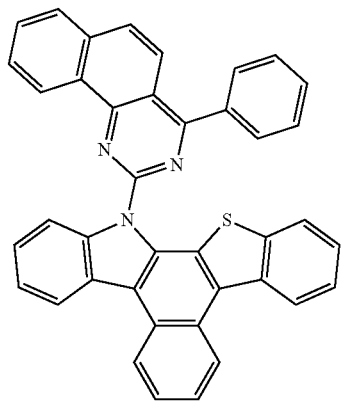
E-2-17
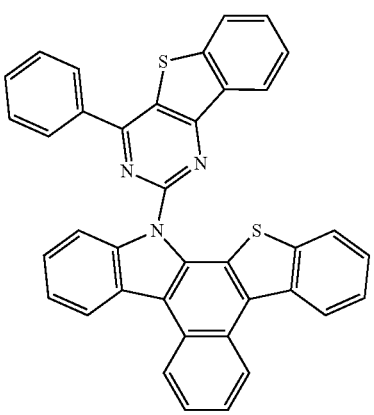
E-2-18
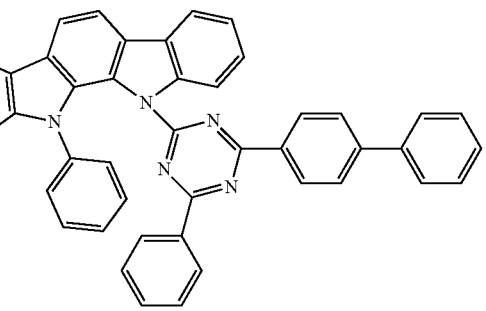
E-2-19
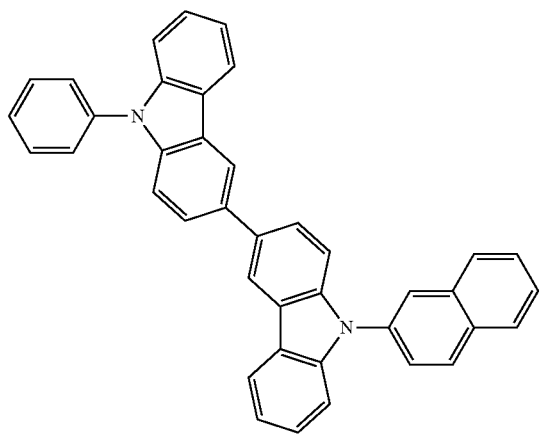

E-2-20

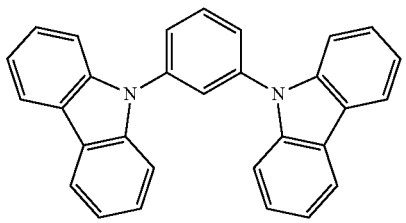

The emission layer EML may further include a common material in the art as a host material. For example, the emission layer EML may include as a host material, at least one of bis[2-(diphenylphosphino)phenyl] ether oxide (DPEPO), 4,4'-bis(carbazol-9-yl)biphenyl (CBP), 1,3-bis (carbazol-9-yl)benzene (mCP), 2,8-bis(diphenylphosphoryl) dibenzo[b,d]furan (PPF), 4,4',4''-tris(carbazol-9-yl)-triphenylamine (TCTA), and 1,3,5-tris(1-phenyl-1H-benzo[d] imidazole-2-yl)benzene (TPBi). However, embodiments are not limited thereto. For example, tris(8-hydroxyquinolino) aluminum (Alq$_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenyamine (TCTA), 1,3,5-tris(N-phenylbenzimidazole-2-yl)benzene (TPBi), 2-tert-butyl-9,10-di(naphth-2-yl) anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc. may be used as the host material.

The emission layer EML may include a compound represented by Formula M-a or Formula M-b below. The compound represented by Formula M-a or Formula M-b may be used as a phosphorescence dopant material.

[Formula M-a]

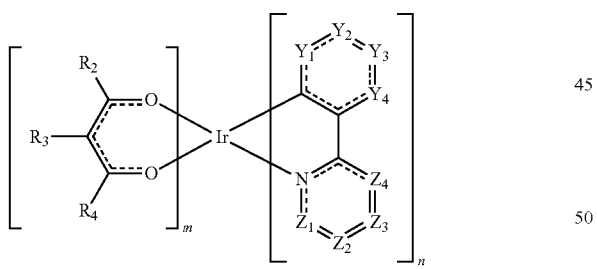

In Formula M-a, $Y_1$ to $Y_4$, and $Z_1$ to $Z_4$ may each independently be $C(R_i)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring. In Formula M-a, m may be 0 or 1, and n may be 2 or 3. In Formula M-a, if m is 0, n may be 3, and if is 1, n may be 2.

The compound represented by Formula M-a may be used as a red phosphorescence dopant or a green phosphorescence dopant.

The compound represented by Formula M-a may be any one selected from Compounds M-a1 to M-a5 below. However, Compounds M-a1 to M-a5 below are only examples, and the compound represented by Formula M-a is not limited to Compounds M-a1 to M-a5 below.

M-a1

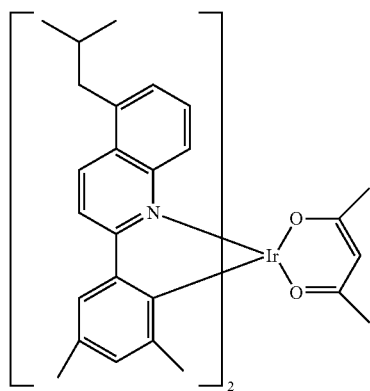

M-a2

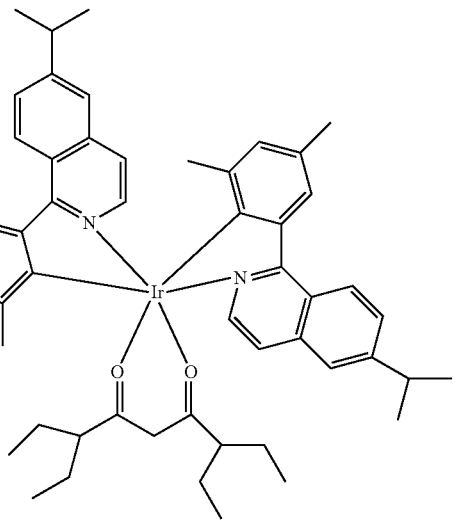

M-a3

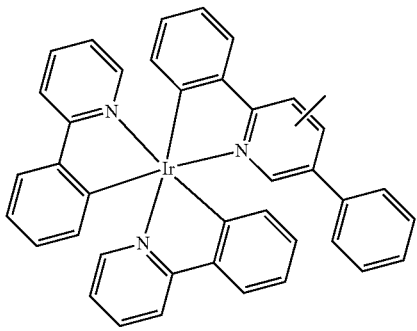

-continued

M-a4

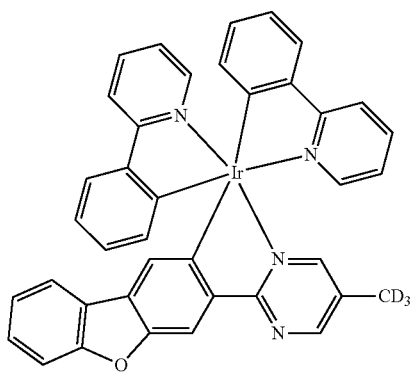

M-a5

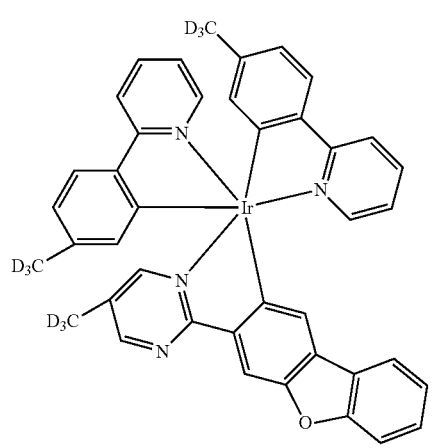

Compound M-a1 and Compound M-a2 may be used as red dopant materials, and

Compound M-a3 to Compound M-a5 may be used as green dopant materials.

[Formula M-b]

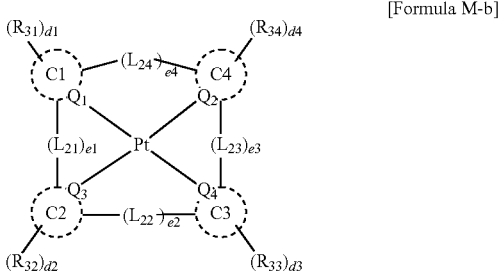

In Formula M-b, $Q_1$ to $Q_4$ may each independently be C or N, C1 to C4 may each independently be a substituted or unsubstituted hydrocarbon ring of 5 to 30 ring-forming carbon atoms, or a substituted or unsubstituted heterocycle of 2 to 30 ring-forming carbon atoms. $L_{21}$ to $L_{24}$ may each independently be a direct linkage, *—O—*, *—S—*,

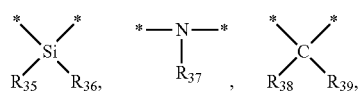

-continued

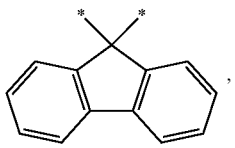

a substituted or unsubstituted divalent alkyl group of 1 to 20 carbon atoms, a substituted or unsubstituted arylene group of 6 to 30 ring-forming carbon atoms, or a substituted or unsubstituted heteroarylene group of 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be any one selected from the compounds below. However, the compounds below are only examples, and the compound represented by Formula M-b is not limited to the compounds below.

M-b-1

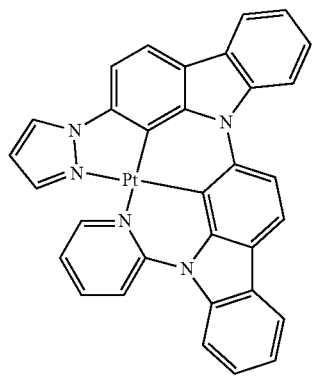

M-b-2

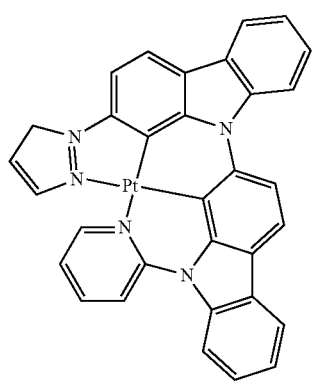

-continued
M-b-3
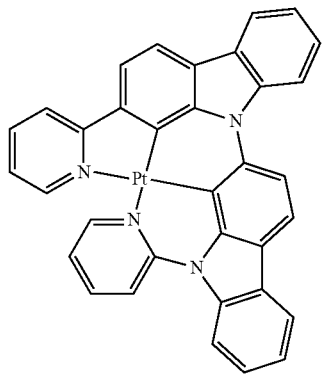
M-b-4
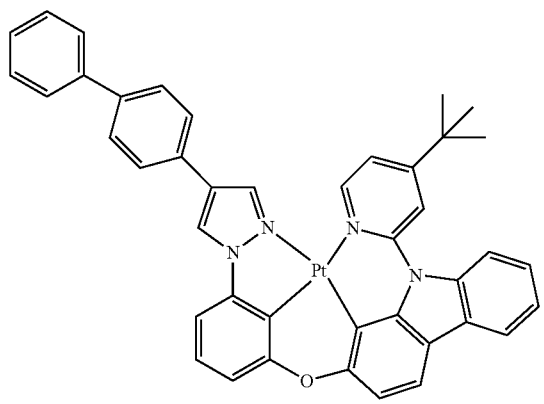
M-b-5
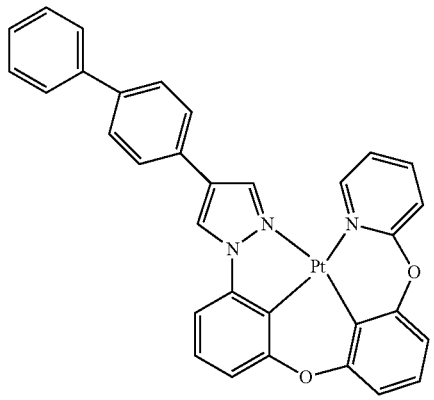
M-b-6
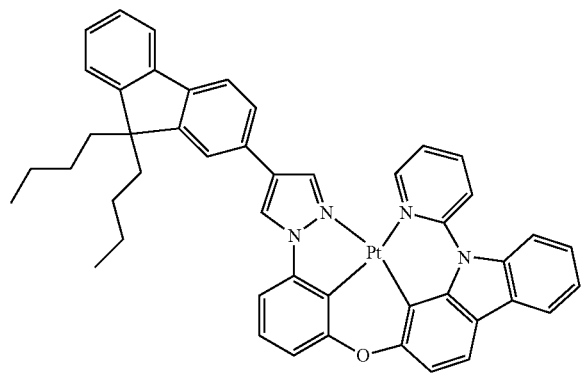
-continued
M-b-7
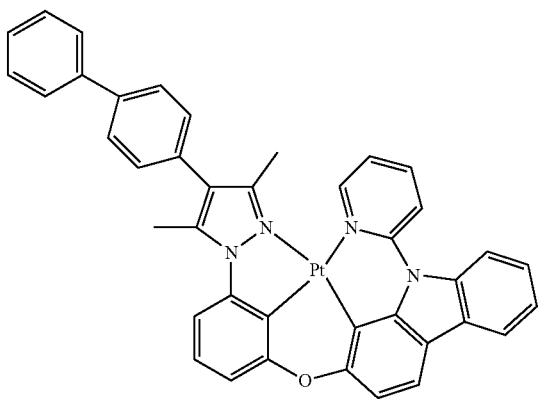
M-b-8
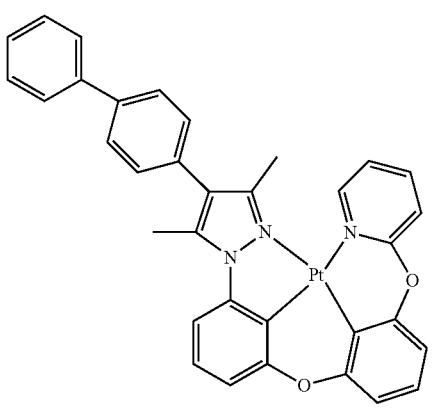
M-b-9
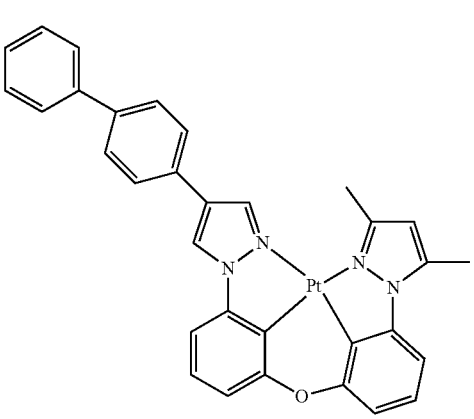
M-b-10
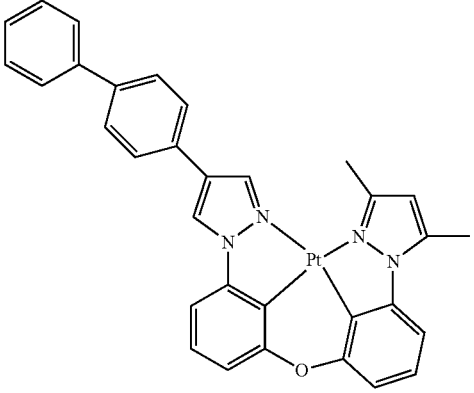

-continued

M-b-11

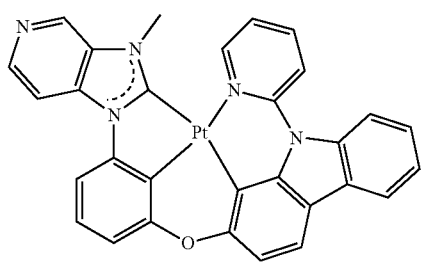

M-b-12

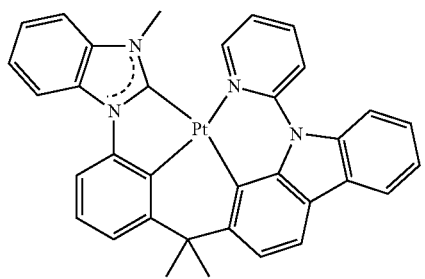

In the compounds above, R, $R_{38}$, and $R_{39}$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

The emission layer EML may include any one of Formula F-a to Formula F-c below. The compounds represented by Formula F-a to Formula F-c below may be used as fluorescence dopant materials.

[Formula F-a]

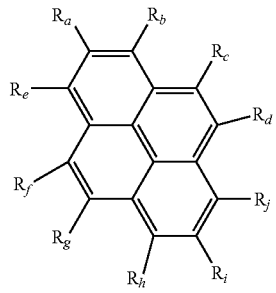

In Formula F-a, two selected from $R_a$ to $R_j$ may each independently be substituted with *—$NAr_1Ar_2$. The remainder of $R_a$ to $R_j$ not substituted with *—$NAr_1Ar_2$ may each independently be a hydrogen atom, a deuterium atom, a halogen atom, a cyano group, a substituted or unsubstituted amine group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In the group *—$NAr_1Ar_2$, $Ar_1$ and $Ar_2$ may each independently be a substituted or unsubstituted aryl group of 6 to 30 ring-forming carbon atoms, or a substituted or unsubstituted heteroaryl group of 2 to 30 ring-forming carbon atoms. For example, at least one of $Ar_1$ and $Ar_2$ may be a heteroaryl group including 0 or S as a ring-forming atom.

[Formula F-b]

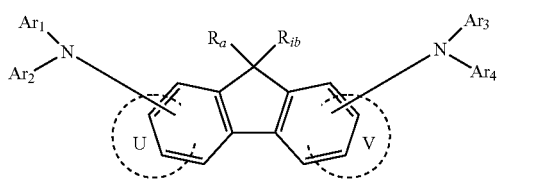

In Formula F-b, $R_a$ and $R_b$ may each independently be a hydrogen atom, a deuterium atom, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-b, U and V may each independently be a substituted or unsubstituted hydrocarbon ring of 5 to 30 ring-forming carbon atoms, or a substituted or unsubstituted heterocycle of 2 to 30 ring-forming carbon atoms.

In Formula F-b, the number of rings represented by U and V may each independently be 0 or 1. For example, in Formula F-b, if the number of U or V is 1, a fused ring may be present at the part designated by U or V, and if the number of U or V is 0, a fused ring may not be present at the part designated by U or V. If the number of U is 0, and the number of V is 1, or if the number of U is 1, and the number of V is 0, a fused ring having the fluorene core of Formula F-b may be a ring compound with four rings. If the number of both U and V is 0, the fused ring of Formula F-b may be a ring compound with three rings. If the number of both U and V is 1, a fused ring having the fluorene core of Formula F-b may be a ring compound with five rings.

[Formula F-c]

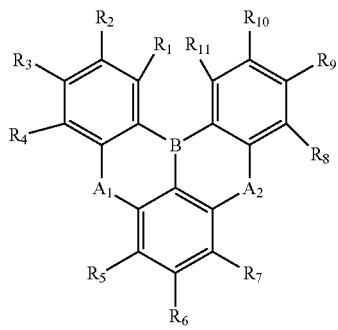

In Formula F-c, $A_1$ and $A_2$ may each independently be O, S, Se, or $N(R_m)$, and $R_m$ may be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boron group, a substituted or unsubstituted oxy group, a substituted or unsubstituted thio group, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms, or may be combined with an adjacent group to form a ring.

In Formula F-c, $A_1$ and $A_2$ may each independently be combined with the substituents of an adjacent ring to form a fused ring. For example, if $A_1$ and $A_2$ are each independently $N(R_m)$, $A_1$ may be combined with $R_4$ or $R_5$ to form a ring. For example, $A_2$ may be combined with $R_7$ or $R_8$ to form a ring.

In an embodiment, the emission layer EML may include as a dopant material, styryl derivatives (for example, 1,4-bis[2-(3-N-ethylcarbazoryl)vinyl]benzene (BCzVB), 4-(di-p-tolylamino)-4'-[ (di-p-tolylamino) styryl]stilbene (DPAVB), N-(4-((E)-2-(6-((E)-4-(diphenylamino)styryl) naphthalen-2-yl)vinyl)phenyl)-N-phenylbenzenamine (N-BDAVBi), and 4,4'-bis[2-(4-(N,N-diphenylamino)phenyl)vinyl]biphenyl (DPAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, and 1,4-bis(N,N-diphenylamino)pyrene), etc.

The emission layer EML may include a phosphorescence dopant material. For example, the phosphorescence dopant may use a metal complex including iridium (Ir), platinum (Pt), osmium (Os), gold (Au), titanium (Ti), zirconium (Zr), hafnium (Hf), europium (Eu), terbium (Tb), or thulium (Tm). For example, iridium(III) bis(4,6-difluorophenylpyridinato-N,C2')picolinate (FIrpic), bis(2,4-difluorophenylpyridinato)-tetrakis(1-pyrazolyl)borate iridium(M) (Fir6), or platinum octaethyl porphyrin (PtOEP) may be used as the phosphorescence dopant. However, embodiments are not limited thereto.

The emission layer EML may include a quantum dot material. The core of the quantum dot may be selected from a II-VI group compound, a III-VI group compound, a I-III-VI group compound, a III-V group compound, a IV-VI group compound, a IV group element, a IV group compound, and combinations thereof.

The II-VI group compound may be selected from the group consisting of: a binary compound selected from the group consisting of CdSe, CdTe, CdS, ZnS, ZnSe, ZnTe, ZnO, HgS, HgSe, HgTe, MgSe, MgS, and mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The III-VI group compound may include a binary compound such as $In_2S_3$, and $In_2Se_3$, a ternary compound such as $InGaS_3$, and $InGaSe_3$, or combinations thereof.

The I-III-VI group compound may be selected from a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$ and mixtures thereof, or a quaternary compound such as $AgInGaS_2$, and $CuInGaS_2$.

The III-V group compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, MAINAs, InAlNSb, InAlPAs, InAlPSb, and mixtures thereof. The III-V group compound may further include a II group metal. For example, InZnP, etc. may be selected as a III-II-V group compound.

The IV-VI group compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The IV group element may be selected from the group consisting of Si, Ge, and a mixture thereof. The IV group compound may be a binary compound selected from the group consisting of SiC, SiGe, and a mixture thereof.

A binary compound, a ternary compound, or a quaternary compound may be present at a uniform concentration in a particle or may be present at a partially different concentration distribution in a particle. For example, the quantum dot may have a core/shell structure in which one quantum dot surrounds another quantum dot. An interface of the core and the shell may have a concentration gradient in which the concentration of an element present in the shell decreases toward the core.

In embodiments, the quantum dot may have the above-described core-shell structure including a core including a nanocrystal and a shell surrounding the core. The shell of the quantum dot may be a protection layer for preventing the chemical deformation of the core to maintain semiconductor properties and/or may be a charging layer for imparting the quantum dot with electrophoretic properties. The shell may have a single layer or a multilayer. The interface of the core and the shell may have concentration gradient in which the concentration of an element present in the shell decreases toward a core. Examples of the shell of the quantum dot may include a metal or non-metal oxide, a semiconductor compound, or combinations thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, COO, $Co_3O_4$ and NiO, or a ternary compound such as $MgAl_2O_4$, $CoFe_2O_4$, $NiFe_2O_4$ and $CoMn_2O_4$, but embodiments are not limited thereto.

For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of an emission wavelength spectrum equal to or less than about 45 nm. For example, the quantum dot may have a FWHM of an emission wavelength spectrum equal to or less than about 40 nm. For example, the quantum dot may have a FWHM of an emission wavelength spectrum equal to or less than about 30 nm. Within these ranges, color purity or color reproducibility may be improved. Light emitted through such a quantum dot may be emitted in all directions, and light viewing angle properties may be improved.

The shape of the quantum dot may be one that is generally used in the art, without specific limitation. For example, the quantum dot may have a spherical, a pyramidal, a multi-arm, or a cubic shape, or the quantum dot may be in the form of a nanoparticle, a nanotube, a nanowire, a nanofiber, a nanoplate particle, etc.

The quantum dot may control the color of light emitted according to the particle size, and accordingly, the quantum dot may have various emission colors such as blue, red, and green.

In the light emitting device ED of an embodiment, as shown in FIG. 3 to FIG. 6, the electron transport region ETR is provided on the emission layer EML. The electron transport region ETR may include at least one of a hole blocking layer HBL, an electron transport layer ETL, and an electron injection layer EIL. However, embodiments are not limited thereto.

The electron transport region ETR may have a layer formed using a single material, a layer formed using different materials, or a multilayer structure having layers formed using different materials.

For example, the electron transport region ETR may have a single layer structure of an electron injection layer EIL or an electron transport layer ETL, or a single layer structure formed using an electron injection material and an electron transport material. As another example, the electron transport region ETR may have a single layer structure formed using multiple different materials, or a structure stacked from the emission layer EML of an electron transport layer ETL/an electron injection layer EIL, or a hole blocking layer HBL/an electron transport layer ETL/an electron injection layer EIL, without limitation. A thickness of the electron transport region ETR may be, for example, in a range of about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

The electron transport region ETR may include a compound represented by Formula ET-1 below.

[Formula ET-1]

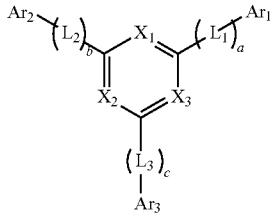

In Formula ET-1, at least one of $X_1$ to $X_3$ may be N, and the remainder of $X_1$ to $X_3$ may be $C(R_a)$. $R_a$ may be a hydrogen atom, a deuterium atom, a substituted or unsubstituted alkyl of 1 to 20 carbon atoms, a substituted or unsubstituted aryl group of 6 to 30 ring-forming carbon atoms, or a substituted or unsubstituted heteroaryl group of 2 to 30 ring-forming carbon atoms. In Formula ET-1, $Ar_1$ to $Ar_3$ may each independently be a hydrogen atom, a deuterium atom, a substituted or unsubstituted alkyl group of 1 to 20 carbon atoms, a substituted or unsubstituted aryl group of 6 to 30 ring-forming carbon atoms, or a substituted or unsubstituted heteroaryl group of 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group of 6 to 30 ring-forming carbon atoms, or a substituted or unsubstituted heteroarylene group of 2 to 30 ring-forming carbon atoms. If a to c are 2 or more, $L_1$ to $L_3$ may each independently be a substituted or unsubstituted arylene group of 6 to 30 ring-forming carbon atoms, or a substituted or unsubstituted heteroarylene group of 2 to 30 ring-forming carbon atoms.

The electron transport region ETR may include an anthracene-based compound.

However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-bis[3,5-di(pyridin-3-yl)phenyl]benzene (BmPyPhB), and mixtures thereof, without limitation.

The electron transport region ETR may include a metal halide such as LiF, NaCl, CsF, RbCl, RbI, CuI and KI, a lanthanide such as Yb, or a co-depositing material of the metal halide and the lanthanide. For example, the electron transport region ETR may include KI:Yb, RbI:Yb, etc., as the co-depositing material. The electron transport region ETR may include a metal oxide such as $Li_2O$ and BaO, or 8-hydroxy-lithium quinolate (Liq). However, embodiments are not limited thereto. The electron transport region ETR also may be formed using a mixture of an electron transport material and an insulating organo metal salt. The organo metal salt may be a material having an energy band gap equal to or greater than about 4 eV. For example, the organo metal salt may include metal acetates, metal benzoates, metal acetoacetates, metal acetylacetonates, or metal stearates.

The electron transport region ETR may include at least one of 2,9-dimethyl-4,7-diphenyl-1,10-phenanthroline (BCP), and 4,7-diphenyl-1,10-phenanthroline (Bphen) in addition to the aforementioned materials. However, embodiments are not limited thereto.

The electron transport region ETR may include the compounds of the electron transport region in at least one of an electron injection layer EIL, an electron transport layer ETL, and a hole blocking layer HBL.

If the electron transport region ETR includes an electron transport layer ETL, a thickness of the electron transport layer ETL may be in a range of about 100 Å to about 1,000 Å. For example, the thickness of the electron transport layer ETL may be in a range of about 150 Å to about 500 Å. If the thickness of the electron transport layer ETL satisfies the above-described range, satisfactory electron transport properties may be obtained without substantial increase of a driving voltage. If the electron transport region ETR includes an electron injection layer EIL, a thickness of the electron injection layer EIL may be in a range of about 1 Å to about 100 Å. For example, the thickness of the electron injection layer EIL may be in a range of about 3 Å to about 90 Å. If the thickness of the electron injection layer EIL satisfies the above described range, satisfactory electron injection properties may be obtained without inducing substantial increase of a driving voltage.

The second electrode EL2 is provided on the electron transport region ETR. The second electrode EL2 may be a common electrode. The second electrode EL2 may be a cathode or an anode, but embodiments are not limited thereto. For example, if the first electrode EL1 is an anode, the second cathode EL2 may be a cathode, and if the first electrode EL1 is a cathode, the second electrode EL2 may be an anode.

The second electrode EL2 may be a transmissive electrode, a transflective electrode, or a reflective electrode. If the second electrode EL2 is a transmissive electrode, the second electrode EL2 may include a transparent metal oxide, for example, ITO, IZO, ZnO, ITZO, etc.

If the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, In, Zn, Sn, compounds thereof, or mixtures thereof (for example, AgMg, AgYb, or MgAg). In an embodiment, the second electrode EL2 may have a multilayered structure including a reflective layer or a transflective layer formed using the above-described materials and a transparent conductive layer formed using ITO, IZO, ZnO, ITZO, etc. For example, the second electrode EL2 may include the aforementioned metal materials, combinations of two or more metal materials selected from the aforementioned metal materials, or oxides of the aforementioned metal materials.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting device ED may further include a capping layer CPL disposed on the second electrode EL2. The capping layer CPL may include a multilayer or a single layer.

In an embodiment, the capping layer CPL may include an organic layer or an inorganic layer. For example, if the capping layer CPL includes an inorganic material, the inorganic material may include an alkali metal compound such as LiF, an alkaline earth metal compound such as MgF$_2$, SiON, SiNx, SiOy, etc.

For example, if the capping layer CPL includes an organic material, the organic material may include α-NPD, NPB, TPD, m-MTDATA, Alq$_3$, CuPc, N4,N4,N4',N4'-tetra(biphenyl-4-yl) biphenyl-4,4'-diamine (TPD15), 4,4',4''-tris(carbazol sol-9-yl) triphenylamine (TCTA), etc., or includes an epoxy resin, or acrylate such as methacrylate. A capping layer CPL may include at least one of Compounds P1 to P5 below, but embodiments are not limited thereto.

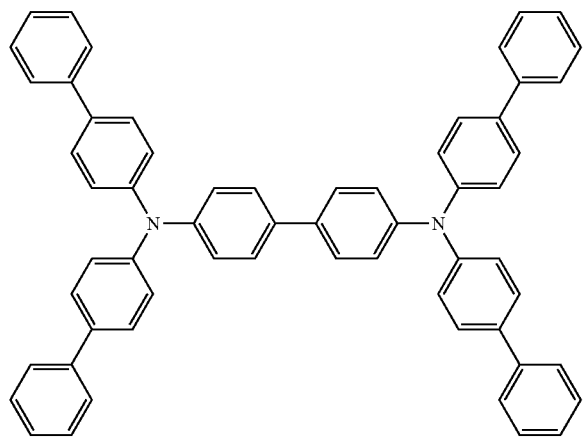

P1

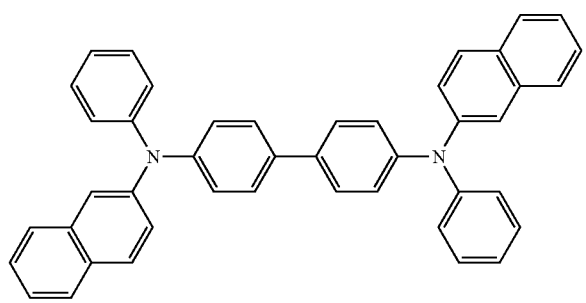

P2

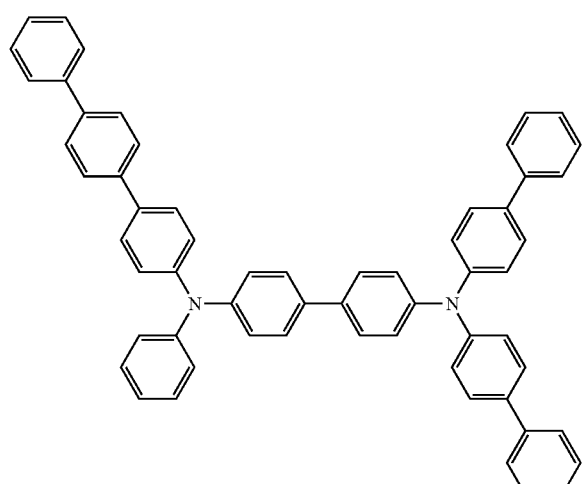

P3

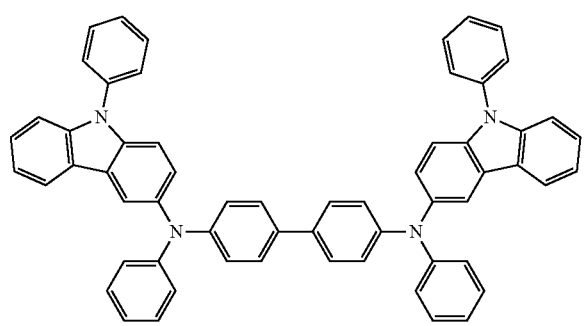

P4

-continued

P5

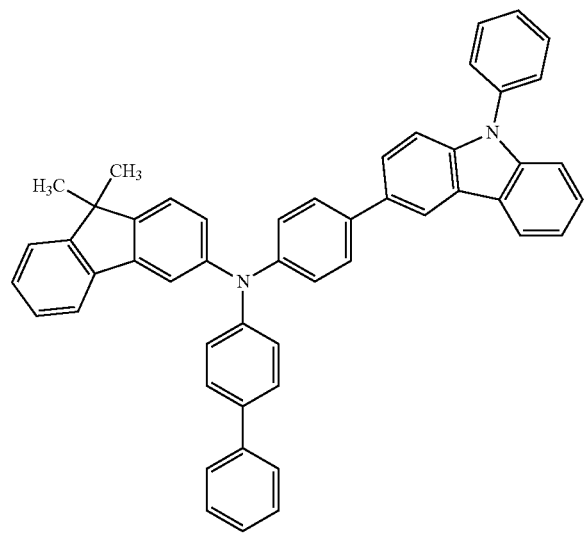

A refractive index of the capping layer CPL may be equal to or greater than about 1.6. For example, the refractive index of the capping layer CPL with respect to light in a wavelength range of about 550 nm to about 660 nm may be equal to or greater than about 1.6.

Figure 7:
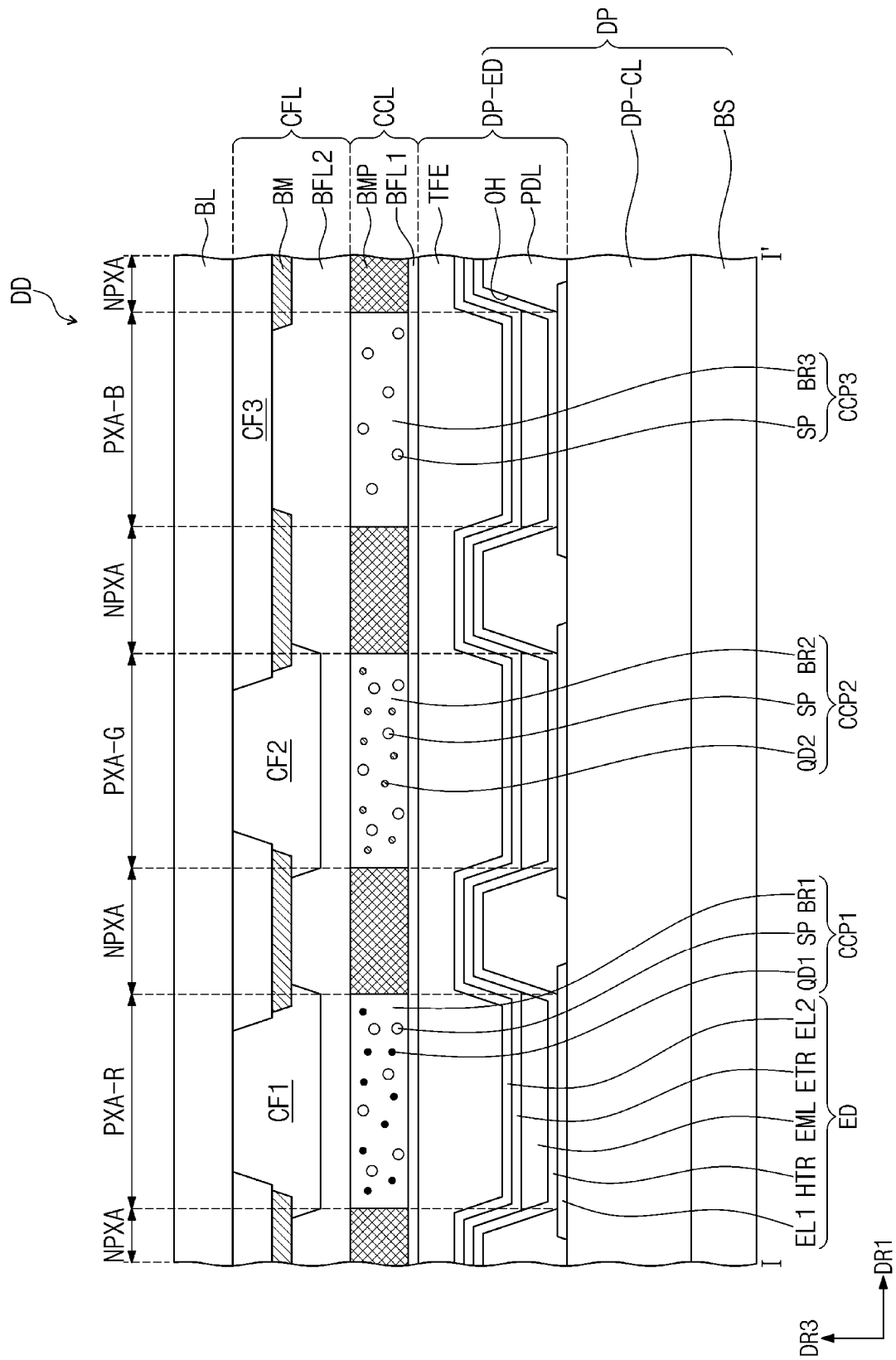
FIG. 7 and FIG. 8 are each a schematic cross-sectional view of a display apparatus according to embodiments.
Figure 8:
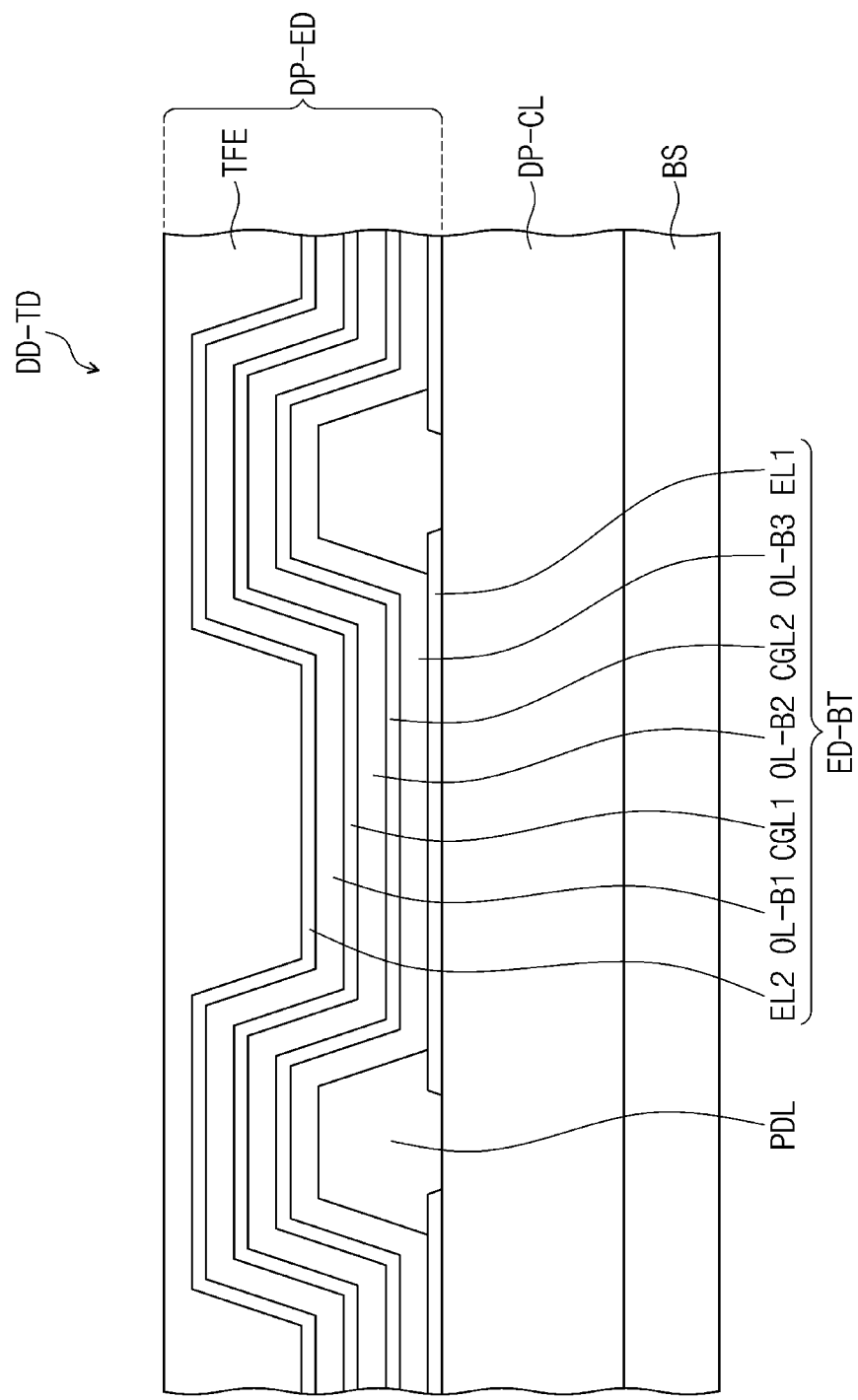

FIG. 7 and FIG. 8 are each a schematic cross-sectional view of a display apparatus according to embodiments, respectively. In the explanation on the display apparatuses of embodiments, referring to FIG. 7 and FIG. 8, the descriptions which overlap with the explanation of FIG. 1 to FIG. 6 will not be explained again, and the differing features will be explained.

Referring to FIG. 7, the display apparatus DD according to an embodiment may include a display panel DP including a display device layer DP-ED, a light controlling layer CCL, and a color filter layer CFL disposed on the display panel DP.

In an embodiment shown in FIG. 7, the display panel DP includes a base layer BS, a circuit layer DP-CL provided on the base layer BS, and a display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. The same structures of the light emitting devices of FIG. 3 to FIG. 6 may be applied to the structure of the light emitting device ED shown in FIG. 7.

Referring to FIG. 7, the emission layer EML may be disposed in an opening portion OH defined in a pixel definition layer PDL. For example, the emission layer EML divided by the pixel definition layer PDL and correspondingly provided to each of luminous areas PXA-R, PXA-G, and PXA-B may emit light in a same wavelength region. In the display apparatus DD of an embodiment, the emission layer EML may emit blue light. Although not shown in the drawings, in an embodiment, the emission layer EML may be provided as a common layer for all luminous areas PXA-R, PXA-G, and PXA-B.

The light controlling layer CCL may be disposed on the display panel DP. The light controlling layer CCL may include a light converter. The light converter may include a quantum dot or a phosphor. The light converter may convert the wavelength of provided light and then emit the converted light. For example, the light controlling layer CCL may be a layer including a quantum dot or a layer including a phosphor.

The light controlling layer CCL may include light controlling parts CCP1, CCP2, and CCP3. The light controlling parts CCP1, CCP2, and CCP3 may be separated from one another.

Referring to FIG. 7, a partition pattern BMP may be disposed between the separated light controlling parts CCP1, CCP2, and CCP3, but embodiments are not limited thereto. In FIG. 8, the partition pattern BMP is shown not to overlap with the light controlling parts CCP1, CCP2, and CCP3, but at least a portion of the edge of the light controlling parts CCP1, CCP2, and CCP3 may overlap with the partition pattern BMP.

The light controlling layer CCL may include a first light controlling part CCP1 including a first quantum dot QD1 converting first color light provided from the light emitting device ED into second color light, a second light controlling part CCP2 including a second quantum dot QD2 converting first color light into third color light, and a third light controlling part CCP3 transmitting first color light.

In an embodiment, the first light controlling part CCP1 may provide red light which is the second color light, and the second light controlling part CCP2 may provide green light which is the third color light. The third light controlling part CCP3 may transmit and provide blue light which is the first color light provided from the light emitting device ED. For example, the first quantum dot QD1 may be a red quantum dot, and the second quantum dot QD2 may be a green quantum dot. The same descriptions as provided above with respect to quantum dots may be applied to quantum dots QD1 and QD2.

The light controlling layer CCL may further include a scatterer SP. The first light controlling part CCP1 may include the first quantum dot QD1 and the scatterer SP, the second light controlling part CCP2 may include the second quantum dot QD2 and the scatterer SP, and the third light controlling part CCP3 may not include a quantum dot but include the scatterer SP.

The scatterer SP may be an inorganic particle. For example, the scatterer SP may include at least one of $TiO_2$, ZnO, $Al_2O_3$, $SiO_2$, and hollow silica. The scatterer SP may include at least one of $TiO_2$, ZnO, $Al_2O_3$, $SiO_2$, and hollow silica, or may be a mixture of two or more materials selected from $TiO_2$, ZnO, $Al_2O_3$, $SiO_2$, and hollow silica.

Each of the first light controlling part CCP1, the second light controlling part CCP2, and the third light controlling part CCP3 may include base resins BR1, BR2, and BR3 dispersing the quantum dots QD1 and QD2 and the scatterer SP. In an embodiment, the first light controlling part CCP1 may include the first quantum dot QD1 and the scatterer SP dispersed in the first base resin BR1, the second light controlling part CCP2 may include the second quantum dot QD2 and the scatterer SP dispersed in the second base resin BR2, and the third light controlling part CCP3 may include the scatterer particle SP dispersed in the third base resin BR3. The base resins BR1, BR2, and BR3 are mediums in which the quantum dots QD1 and QD2 and the scatterer SP are dispersed, and may be composed of various resin compositions which may be generally referred to as a binder. For example, the base resins BR1, BR2, and BR3 may be acryl-based resins, urethane-based resins, silicone-based resins, epoxy-based resins, etc. The base resins BR1, BR2, and BR3 may be transparent resins. In an embodiment, the first base resin BR1, the second base resin BR2, and the third base resin BR3 may be the same as or different from each other.

The light controlling layer CCL may include a barrier layer BFL1. The barrier layer BFL1 may block the penetration of moisture and/or oxygen (hereinafter, will be referred to as "humidity/oxygen"). The barrier layer BFL1 may be disposed on the light controlling parts CCP1, CCP2 and CCP3 to block the exposure of the light controlling parts CCP1, CCP2, and CCP3 to humidity/oxygen. The barrier layer BFL1 may cover the light controlling parts CCP1, CCP2, and CCP3. The barrier layer BFL2 may be provided between the light controlling parts CCP1, CCP2, and CCP3 and a color filter layer CFL.

The barrier layers BFL1 and BFL2 may include at least one inorganic layer. For example, the barrier layers BFL1 and BFL2 may be formed by including an inorganic material. For example, the barrier layers BFL1 and BFL2 may be formed by including silicon nitride, aluminum nitride, zirconium nitride, titanium nitride, hafnium nitride, tantalum nitride, silicon oxide, aluminum oxide, titanium oxide, tin oxide, cerium oxide and silicon oxynitride or a metal thin film securing light transmittance. The barrier layers BFL1 and BFL2 may further include an organic layer. The barrier layers BFL1 and BFL2 may be composed of a single layer or multiple layers.

In the display apparatus DD of an embodiment, the color filter layer CFL may be disposed on the light controlling layer CCL. For example, the color filter layer CFL may be disposed directly on the light controlling layer CCL. In an embodiment, the barrier layer BFL2 may be omitted.

The color filter layer CFL may include a light blocking part BM and filters CF1, CF2, and CF3. The color filter layer CFL may include a first filter CF1 transmitting second color light, a second filter CF2 transmitting third color light, and a third filter CF3 transmitting first color light. For example, the first filter CF1 may be a red filter, the second filter CF2 may be a green filter, and the third filter CF3 may be a blue filter. Each of the filters CF1, CF2, and CF3 may include a photosensitive polymer resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymer photosensitive resin and not include a pigment or dye. The third filter CF3 may be transparent. The third filter CF3 may be formed using a transparent photosensitive resin.

In an embodiment, the first filter CF1 and the second filter CF2 may be yellow filters. The first filter CF1 and the second filter CF2 may be provided in one body without distinction.

The light blocking part BM may be a black matrix. The light blocking part BM may be formed by including an organic light blocking material or an inorganic light blocking material including a black pigment or black dye. The light blocking part BM may prevent light leakage phenomenon and divide the boundaries among adjacent filters CF1, CF2, and CF3. In an embodiment, the light blocking part BM may be formed as a blue filter.

Each of the first to third filters CF1, CF2, and CF3 may be disposed corresponding to each of a red luminous area PXA-R, green luminous area PXA-G, and blue luminous area PXA-B.

An upper base layer BL may be disposed on the color filter layer CFL. The upper base layer BL may provide a base surface on which the color filter layer CFL, the light controlling layer CCL, etc. are disposed. The upper base layer BL may be a glass substrate, a metal substrate, a plastic substrate, etc. However, embodiments are not limited thereto, and the upper base layer BL may include an inorganic layer, an organic layer, or a composite material layer. Although not shown in the drawing, in an embodiment, the upper base layer BL may be omitted.

FIG. 8 is a schematic cross-sectional view showing a portion of the display apparatus according to an embodiment. In FIG. 8, the schematic cross-sectional view of a portion corresponding to the display panel DP in FIG. 7 is shown. In a display apparatus DD-TD of an embodiment, the light emitting device ED-BT may include light emitting structures OL-B1, OL-B2, and OL-B3. The light emitting device ED-BT may include oppositely disposed first electrode EL1 and second electrode EL2, and the light emitting structures OL-B1, OL-B2, and OL-B3 stacked in order in a thickness direction and provided between the first electrode EL1 and the second electrode EL2. Each of the light emitting structures OL-B1, OL-B2, and OL-B3 may include an emission layer EML (FIG. 7), and a hole transport region HTR and an electron transport region ETR, with the emission layer EML (FIG. 7) disposed therebetween.

For example, in an embodiment, the light emitting device ED-BT included in the display apparatus DD-TD may be a light emitting device of a tandem structure including multiple emission layers.

In an embodiment shown in FIG. 8, light emitted from the light emitting structures OL-B1, OL-B2, and OL-B3 may be all blue light. However, embodiments are not limited thereto, and the wavelength regions of light emitted from the light emitting structures OL-B1, OL-B2, and OL-B3 may be different from each other. For example, the light emitting device ED-BT including the multiple light emitting structures OL-B1, OL-B2, and OL-B3 emitting light in different wavelength regions may emit white light.

Charge generating layers CGL1 and CGL2 may be disposed between neighboring light emitting structures OL-B1, OL-B2, and OL-B3. The charge generating layers CGL1 and CGL2 may each independently include a p-type charge generating layer and/or an n-type charge generating layer.

The fused polycyclic compound of an embodiment includes a structure in which two or more quinolinoacridineon or quinolinoacridineon derivative are connected via a linker or direct linkage. Since the fused polycyclic compound according to an embodiment has a wide conjugation structure represented by Formula 1, if using the fused polycyclic compound of an embodiment as a material for a light emitting device, high efficiency of the light emitting device may be achieved.

Hereinafter, the fused polycyclic compound according to an embodiment and the light emitting device of an embodiment will be explained referring to embodiments and comparative embodiments. The embodiments below are only examples to assist the understanding of the disclosure, and the scope thereof is not limited thereto.

EXAMPLES

1. Synthesis of Fused Polycyclic Compound

A synthesis method of a fused polycyclic compound according to an embodiment will be explained by illustrating the synthesis methods of Compounds 1, 11, 31, 39, 49, 74, 77, 15, 16, 54, and 68. The synthesis methods of the fused polycyclic compounds explained hereinafter are embodiments, and the synthesis method of the fused polycyclic compound according to embodiments is not limited to the embodiments below.

(1) Synthesis of Compound 1

Fused Polycyclic Compound 1 according to an embodiment may be synthesized, for example, by the reaction below.

(Synthesis of Intermediate 1-1)

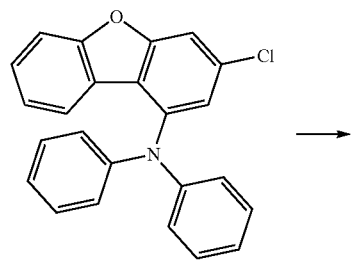

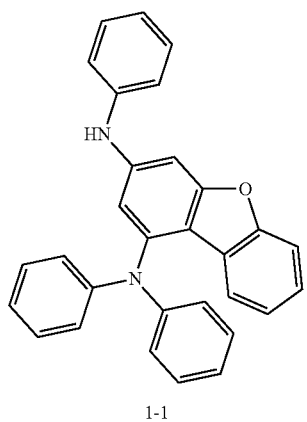

1-1

3-chloro-N,N-diphenyldibenzo[b,d]furan-1-amine (1 eq), aniline (1 eq), tris(dibenzylideneacetone)dipalladium(0) (0.05 eq), P(tBu)$_3$ (0.1 eq), and sodium tert-butoxide (2 eq) were dissolved in toluene and stirred under a nitrogen atmosphere at about 100 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 1-1 was obtained (yield: 80%).

(Synthesis of Intermediate 1-2)

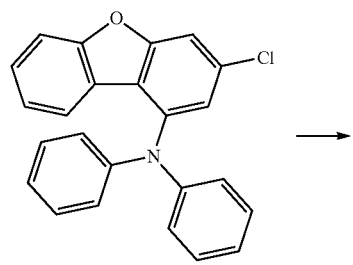

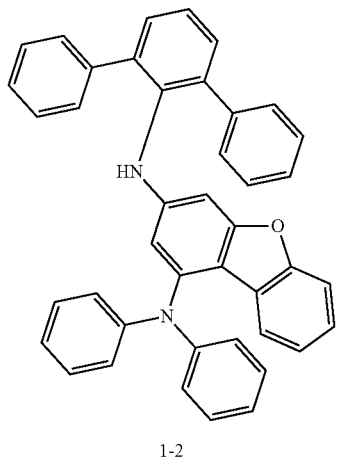

1-2

3-chloro-N,N-diphenyldibenzo[b,d]furan-1-amine (1 eq), [1,1':3',1''-terphenyl]-2'-amine (1 eq), tris(dibenzylideneacetone)dipalladium(0) (0.05 eq), P(tBu)$_3$ (0.1 eq), and sodium tert-butoxide (2 eq) were dissolved in toluene and stirred under a nitrogen atmosphere at about 100 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 1-2 was obtained (yield: 80%).

(Synthesis of Intermediate 1-3)

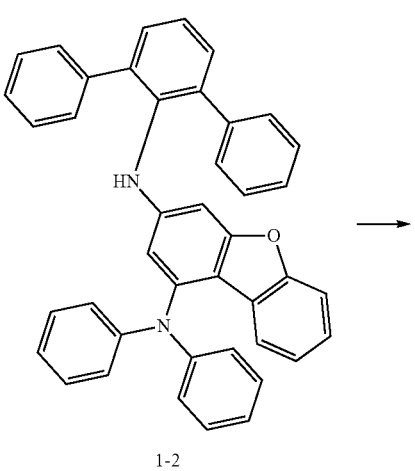

1-2

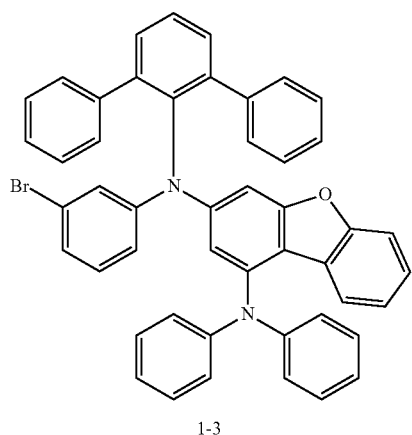

1-3

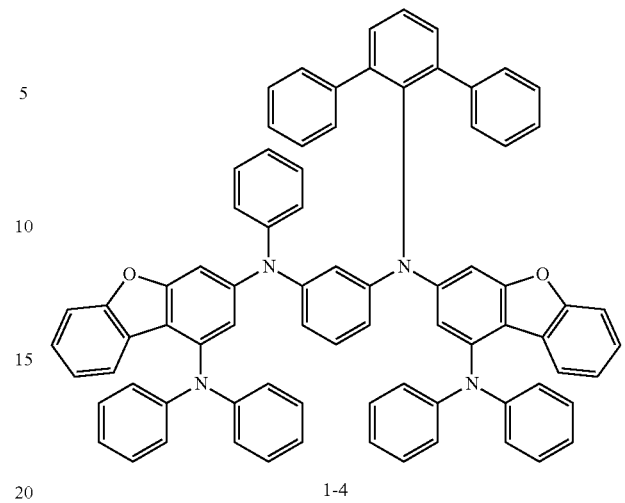

1-4

Intermediate 1-2 (1 eq), 3-bromoiodobenzene (10 eq), copper iodide (1 eq), and potassium carbonate (10 eq) were stirred under a nitrogen atmosphere at about 190 degrees centigrade for about 2 days. After cooling, the reaction solution was washed with ethyl acetate and water three times, and an organic layer obtained was dried with MgSO$_4$ and dried under a reduced pressure. Through column chromatography, Intermediate 1-3 was obtained (yield: 70%).

(Synthesis of Intermediate 1-4)

Intermediate 1-1 (1 eq), Intermediate 1-3 (1 eq), tris (dibenzylideneacetone)dipalladium(0) (0.05 eq), P(tBu)$_3$ (0.1 eq), and sodium tert-butoxide (2 eq) were dissolved in xylene and stirred under a nitrogen atmosphere at about 140 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 1-4 was obtained (yield: 60%).

(Synthesis of Compound 1)

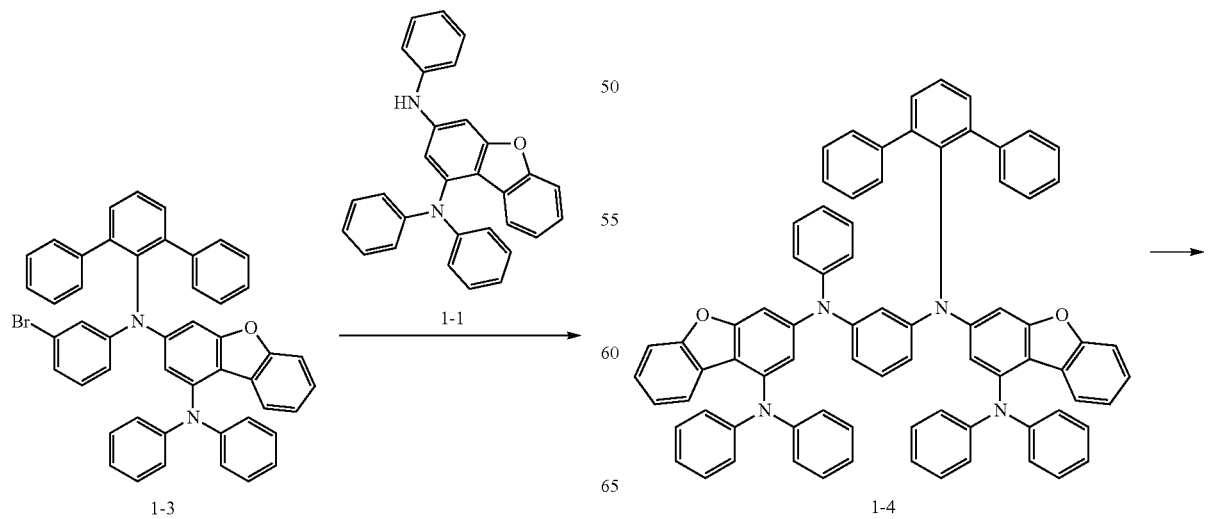

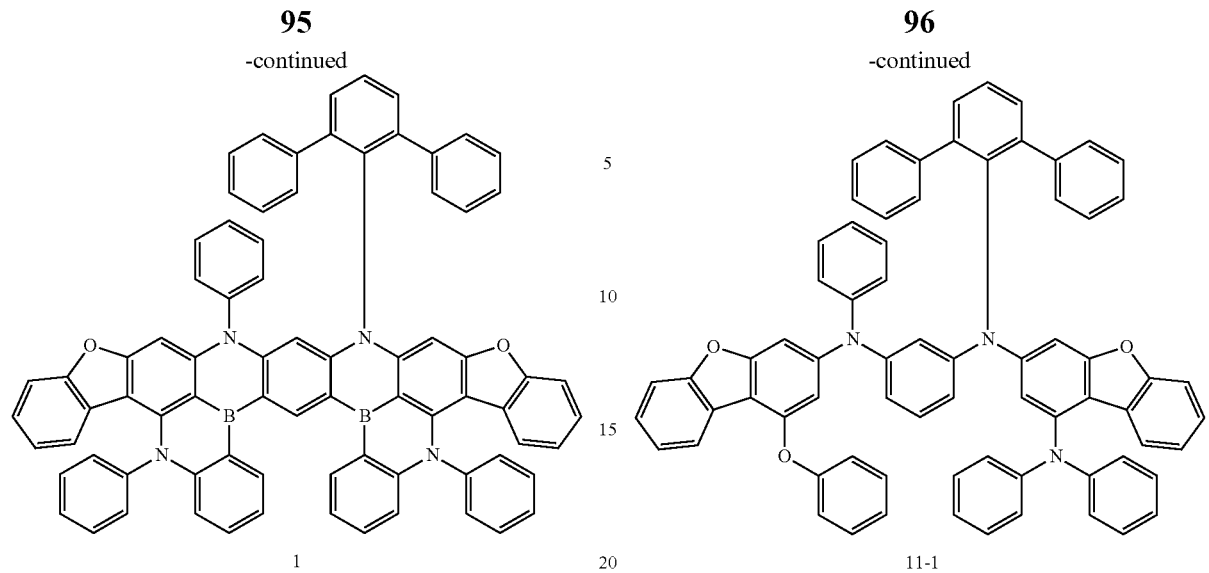

Intermediate 1-4 (1 eq), and boron triiodide (3 eq) were dissolved in ODCB and stirred under a nitrogen atmosphere at about 180 degrees centigrade for about 12 hours. After cooling, the reaction was quenched with triethylamine and filtered with MeOH to obtain a solid. The solid was dried, and through column chromatography, Compound 1 was obtained (yield: 8%).

(2) Synthesis of Compound 11

Fused Polycyclic Compound 11 according to an embodiment may be synthesized by, for example, the reaction below.

(Synthesis of Intermediate 11-1)

1-phenoxy-N-phenyldibenzo[b,d]furan-3-amine (1 eq), Intermediate 1-3 (1 eq), tris(dibenzylideneacetone)dipalladium(0) (0.05 eq), P(tBu)$_3$ (0.1 eq), and sodium tert-butoxide (2 eq) were dissolved in xylene and stirred under a nitrogen atmosphere at about 140 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 11-1 was obtained (yield: 60%).

(Synthesis of Compound 11)

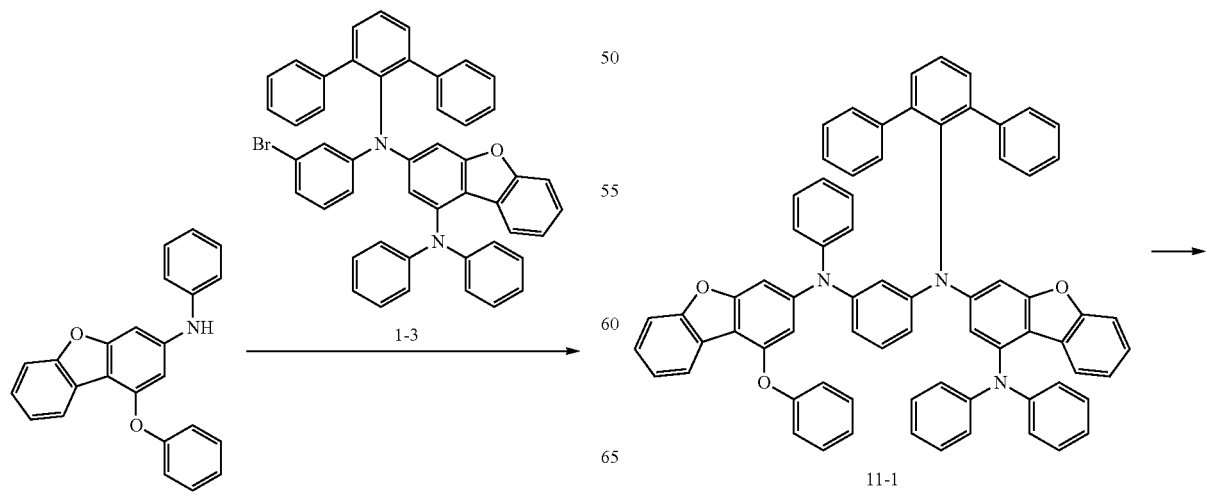

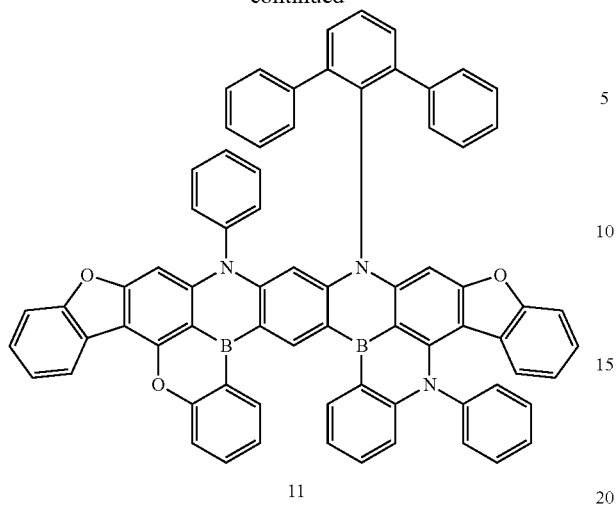

11

Intermediate 11-1 (1 eq), and boron triiodide (3 eq) were dissolved in ODCB and stirred under a nitrogen atmosphere at about 180 degrees centigrade for about 12 hours. After cooling, the reaction was quenched with triethylamine and filtered with MeOH to obtain a solid. The solid was dried, and through column chromatography, Compound 11 was obtained (yield: 10%).

(3) Synthesis of Compound 31

Fused Polycyclic Compound 31 according to an embodiment may be synthesized by, for example, the reaction below.

(Synthesis of Intermediate 31-1)

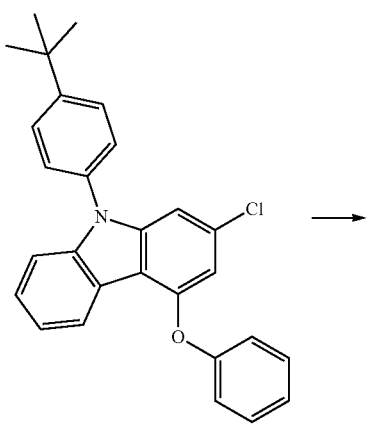

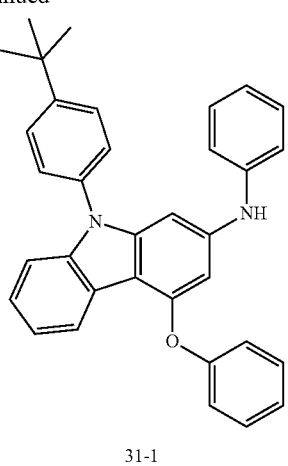

31-1

Intermediate 31-1 was synthesized using 9-(4-(tert-butyl)phenyl)-2-chloro-4-phenoxy-9H-carbazole by the same method as the synthesis of Intermediate 1-1 (yield: 85%).

(Synthesis of Intermediate 31-1')

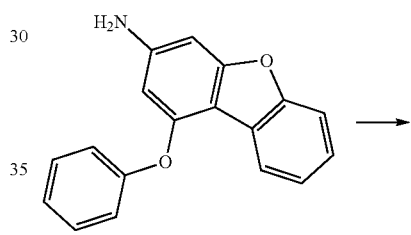

31-1'

Intermediate 31-1' was synthesized using 3-chloro-1-phenoxydibenzo[b,d]furan by the same method as the synthesis of Intermediate 1-2 (yield: 70%).

(Synthesis of Intermediate 31-2')

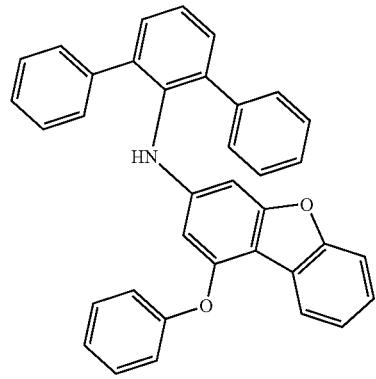

31-1'

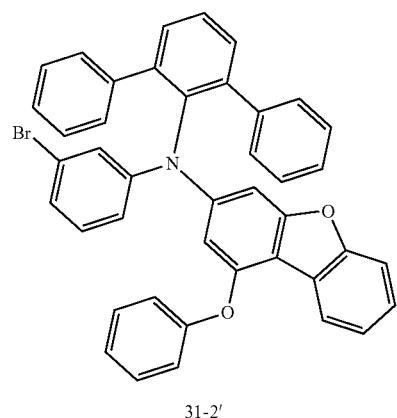

31-2'

Intermediate 31-2' was synthesized using Intermediate 31-1' by the same method as the synthesis of Intermediate 1-3 (yield: 60%).

(Synthesis of Intermediate 31-2)

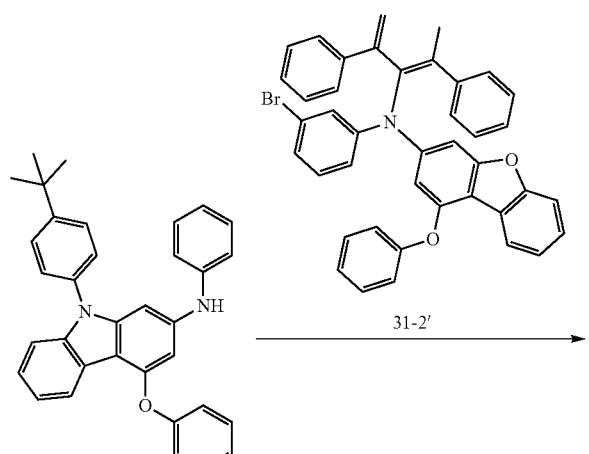

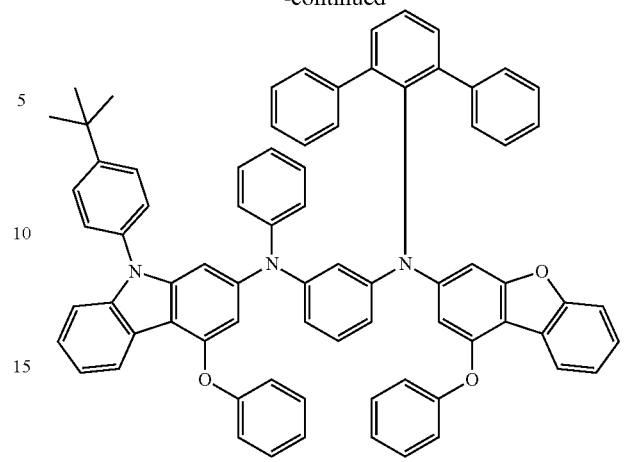

31-2

Intermediate 31-2 was synthesized using Intermediate 31-2' and Intermediate 31-1 by the same method as the synthesis of Intermediate 1-4 (yield: 60%).

(Synthesis of Compound 31)

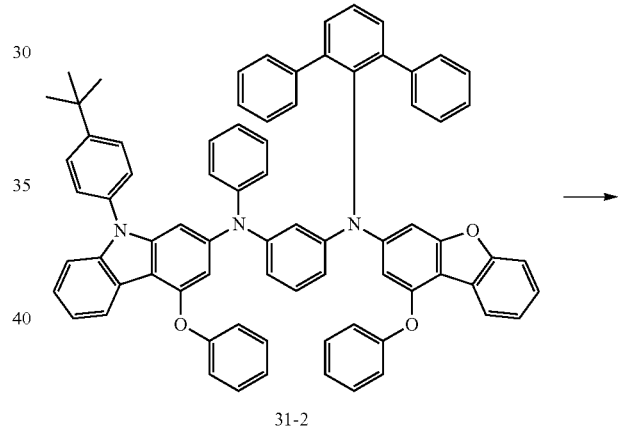

31-2

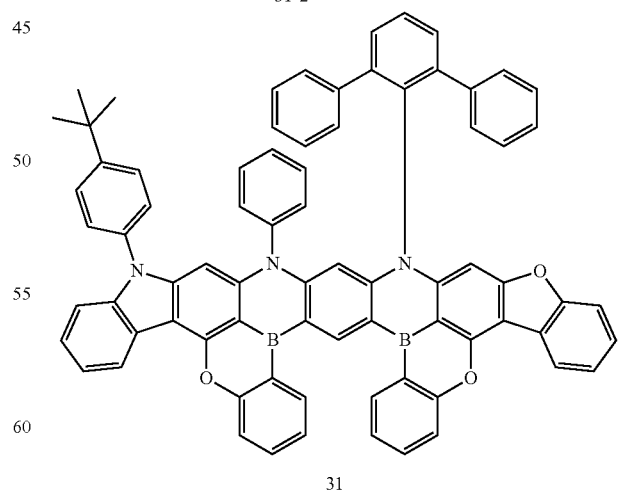

31

Compound 31 was synthesized using Intermediate 31-2 by the same method as the synthesis of Compound 1 (yield: 10%).

(4) Synthesis of Compound 39

Fused Polycyclic Compound 39 according to an embodiment may be synthesized by, for example, the reaction below.

(Synthesis of Intermediate 39-1)

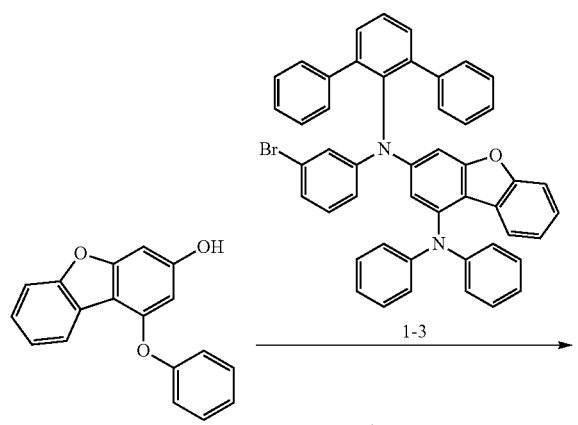

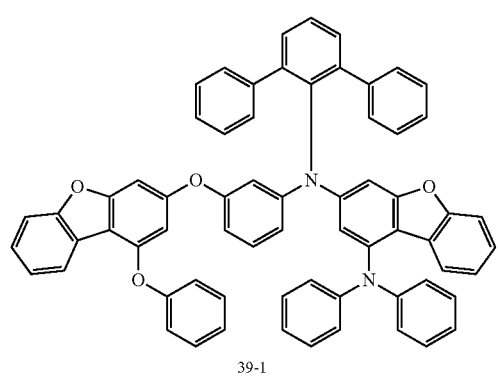

1-phenoxydibenzo[b,d]furan-3-ol (1.3 eq), Intermediate 1-3 (1 eq), copper iodide (0.1 eq), 2-picolinic acid (0.2 eq), and K₃PO₄ (3 eq) were dissolved in DMF and stirred under a nitrogen atmosphere at about 160 degrees centigrade for about 12 hours. After cooling, the reaction solution was washed with ethyl acetate and water three times, and an organic layer obtained was dried with MgSO₄ and dried under a reduced pressure. Through column chromatography, Intermediate 39-1 was obtained (yield: 67%).

(Synthesis of Compound 39)

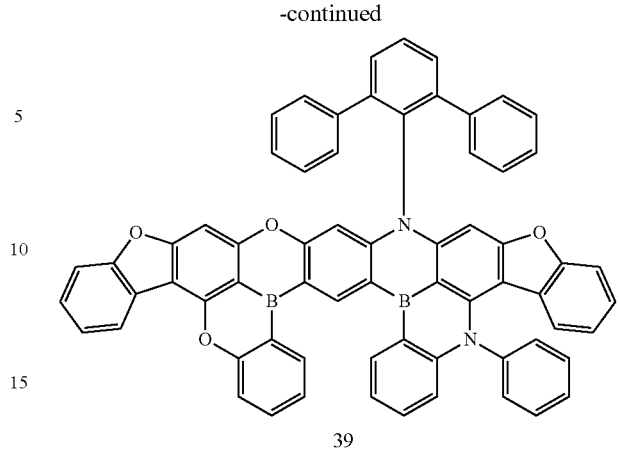

Compound 39 was synthesized using Intermediate 39-1 by the same method as the synthesis of Compound 1 (yield: 9%).

(5) Synthesis of Compound 49

Fused Polycyclic Compound 49 according to an embodiment may be synthesized by, for example, the reaction below.

(Synthesis of Intermediate 49-1)

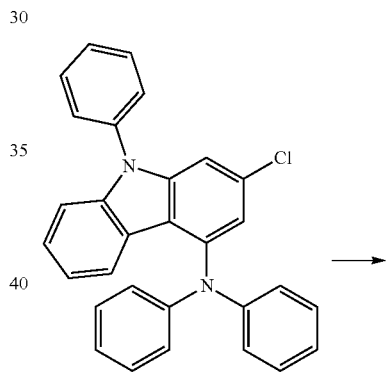

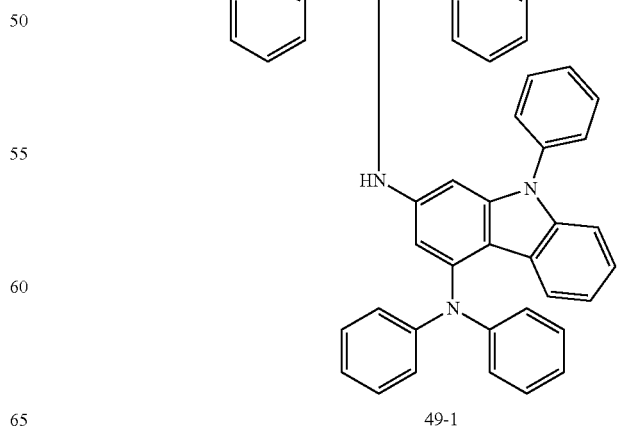

Intermediate 49-1 was synthesized using 2-chloro-N,N,9-triphenyl-9H-carbazol-4-amine by the same method as the synthesis of Intermediate 1-2 (yield: 70%).
(Synthesis of Intermediate 49-1')
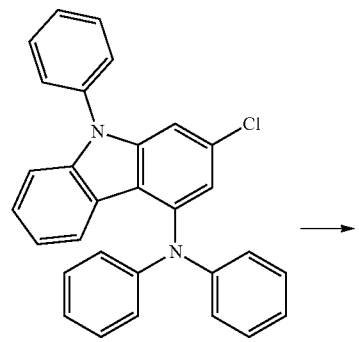
Intermediate 49-1' was synthesized using 2-chloro-N,N,9-triphenyl-9H-carbazol-4-amine by the same method as the synthesis of Intermediate 1-1 (yield: 80%).
(Synthesis of Intermediate 49-2)
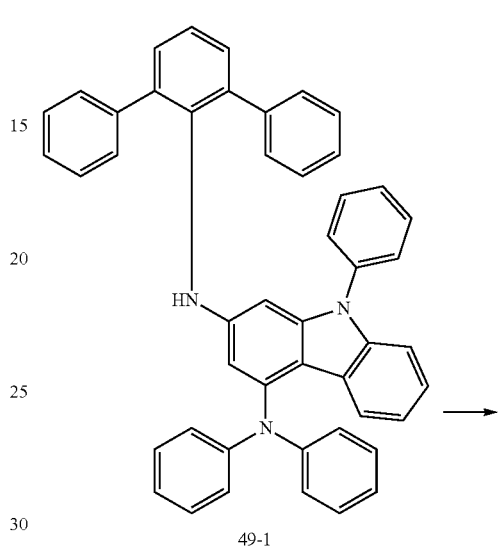
49-1
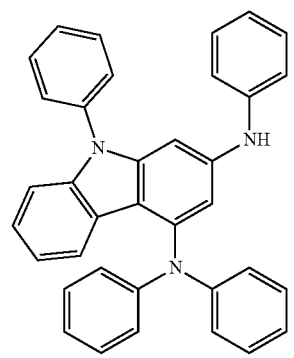
49-1'
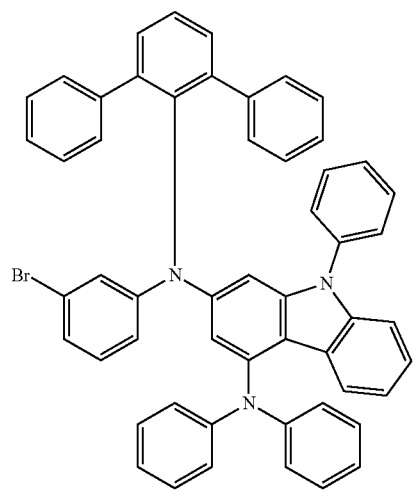
49-2

Intermediate 49-2 was synthesized using Intermediate 49-1 by the same method as the synthesis of Intermediate 1-3 (yield: 60%).
(Synthesis of Intermediate 49-3)
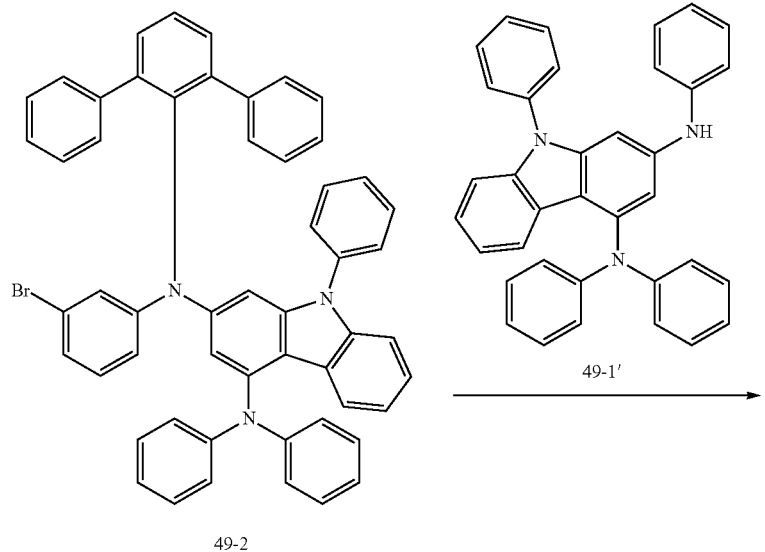
49-2
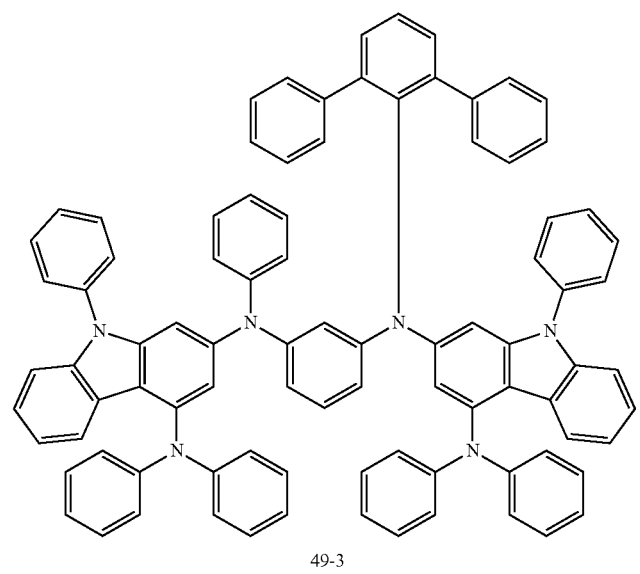
49-3

Intermediate 49-3 was synthesized using Intermediate 49-2 and Intermediate 49-1' by the same method as the synthesis of Intermediate 1-4 (yield: 60%).

(Synthesis of Compound 49)

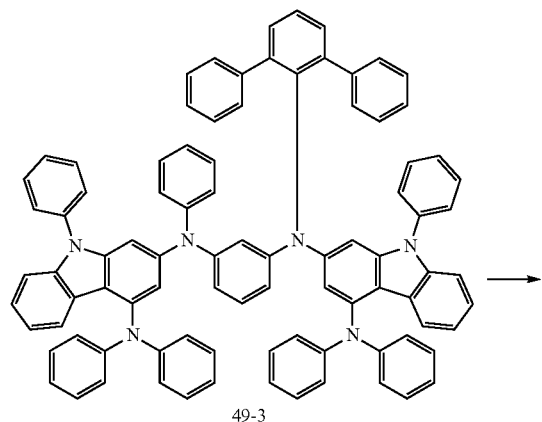

49-3

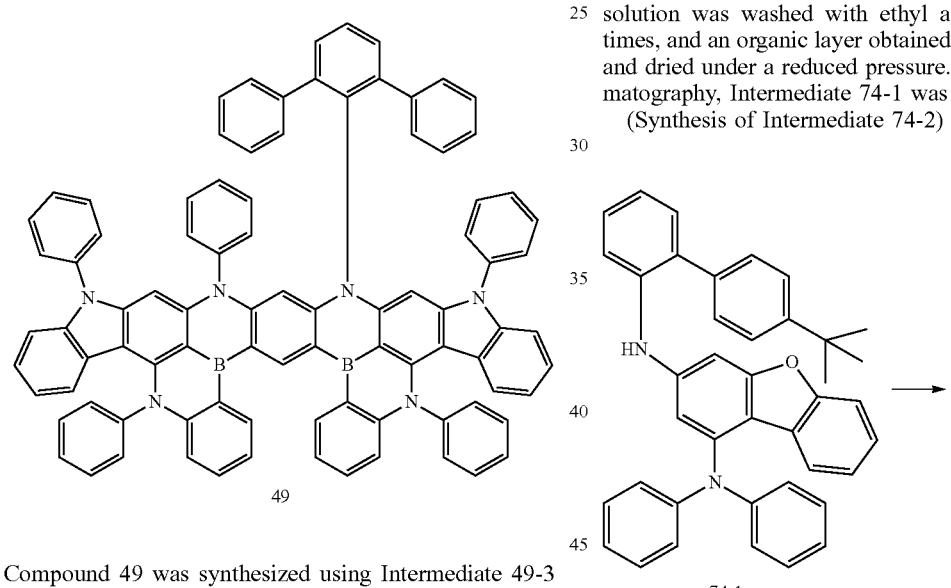

49

Compound 49 was synthesized using Intermediate 49-3 by the same method as the synthesis of Compound 1 (yield: 13%).

(6) Synthesis of Compound 74

Fused Polycyclic Compound 74 according to an embodiment may be synthesized by, for example, the reaction below.

(Synthesis of Intermediate 74-1)

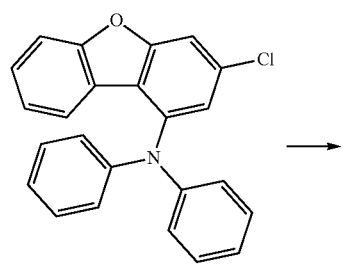

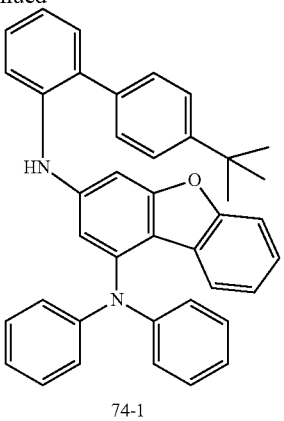

74-1

3-chloro-N,N-diphenyldibenzo[b,d]furan-1-amine (1 eq), 4'-(tert-butyl)-[1,1'-biphenyl]-2-amine (1 eq), tris(dibenzylideneacetone)dipalladium(0) (0.05 eq), P(tBu)$_3$ (0.1 eq), and sodium tert-butoxide (2 eq) were dissolved in toluene and stirred under a nitrogen atmosphere at about 100 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 74-1 was obtained (yield: 83%).

(Synthesis of Intermediate 74-2)

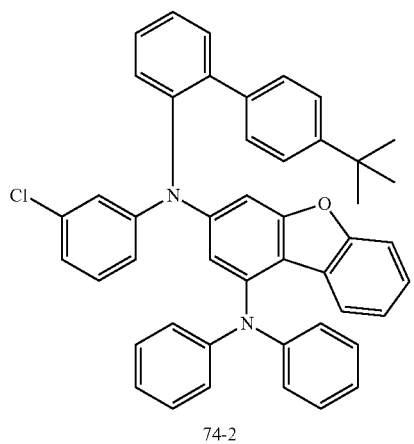

74-1

74-2

Intermediate 74-1 (1 eq), 3-bromochlorobenzene (1.3 eq), tris(dibenzylideneacetone)dipalladium(0) (0.05 eq), P(tBu)$_3$ (0.1 eq), and sodium tert-butoxide (2 eq) were dissolved in toluene and stirred under a nitrogen atmosphere at about 100 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 74-2 was obtained (yield: 80%).

(Synthesis of Intermediate 74-3)

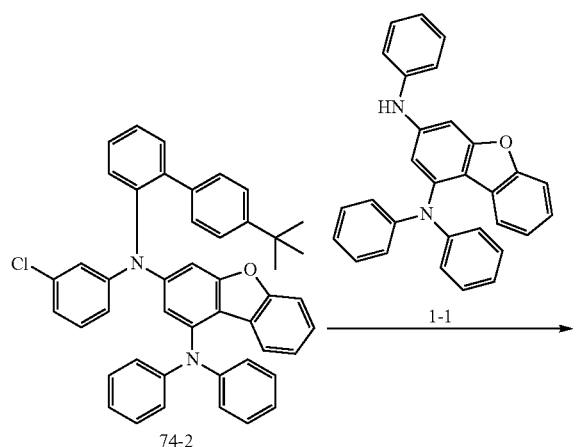

74-2

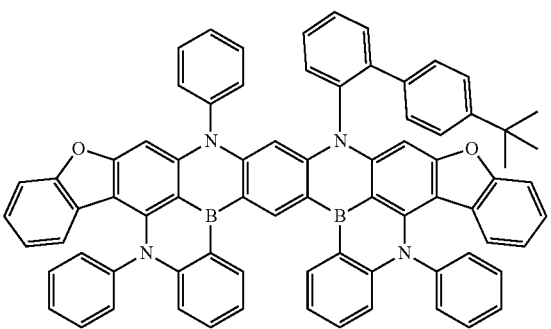

74

Compound 74 was synthesized using Intermediate 74-3 by the same method as the synthesis of Compound 1 (yield: 15%).

(7) Synthesis of Compound 77

Fused Polycyclic Compound 77 according to an embodiment may be synthesized by, for example, the reaction below.

(Synthesis of Intermediate 77-1)

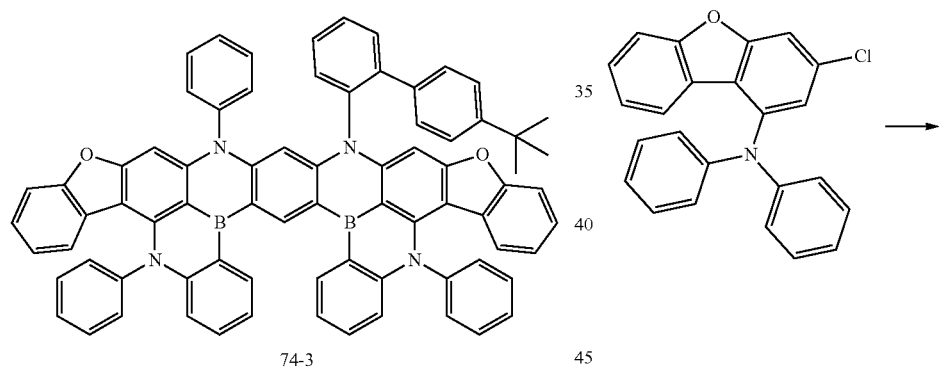

74-3

Intermediate 74-3 was synthesized using Intermediate 74-2 and Intermediate 1-1 by the same method as the synthesis of Intermediate 1-4 (yield: 60%).

(Synthesis of Compound 74)

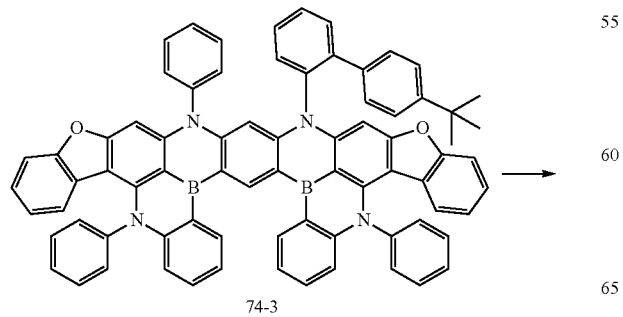

74-3

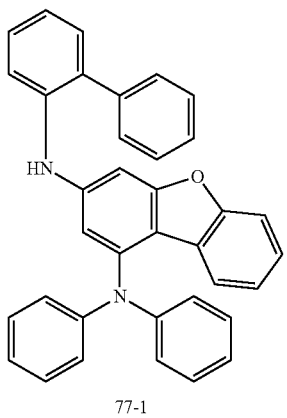

77-1

Intermediate 77-1 was synthesized using 3-chloro-N,N-diphenyldibenzo[b,d]furan-1-amine and [1,1'-biphenyl]-2-amine by the same method as the synthesis of Intermediate 74-1 (yield: 82%).

(Synthesis of Intermediate 77-2)

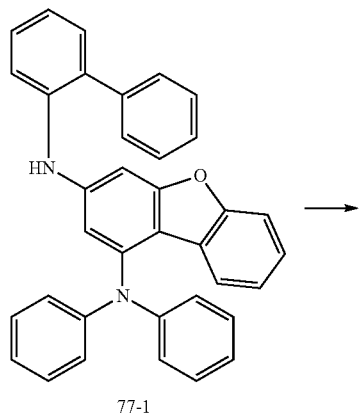

77-1

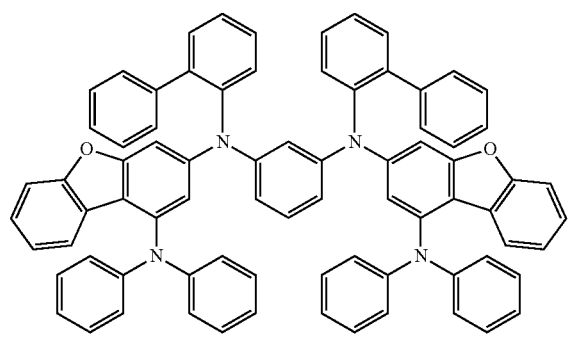

77-2

Intermediate 74-1 (1 eq), 1,3-dibromobenzene (1 eq), tris(dibenzylideneacetone)dipalladium(0) (0.05 eq), P(tBu)₃ (0.1 eq), and sodium tert-butoxide (2 eq) were dissolved in toluene and stirred under a nitrogen atmosphere at about 100 degrees centigrade for about 12 hours. After cooling, the reaction solution was washed with ethyl acetate and water three times, and an organic layer obtained was dried with MgSO₄ and dried under a reduced pressure. Through column chromatography, Intermediate 77-2 was obtained (yield: 75%).

(Synthesis of Compound 77)

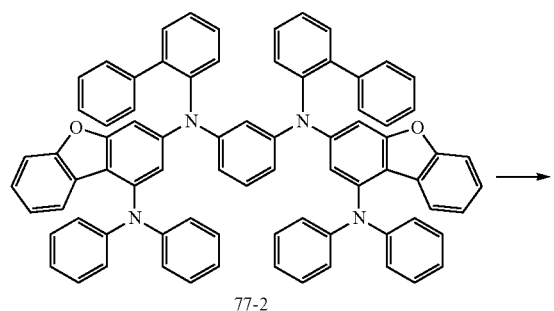

77-2

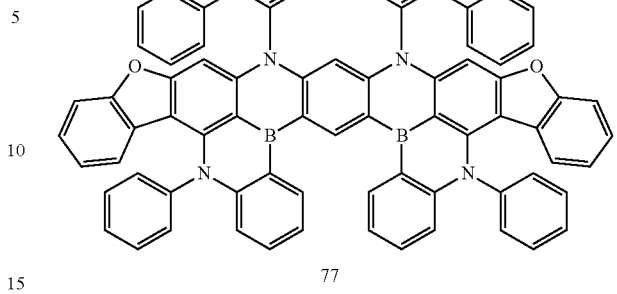

77

Compound 77 was synthesized using Intermediate 77-2 by the same method as the synthesis of Compound 1 (yield: 15%).

(8) Synthesis of Compound 15

Fused Polycyclic Compound 15 according to an embodiment may be synthesized by, for example, the reaction below.

(Synthesis of Intermediate 15-1)

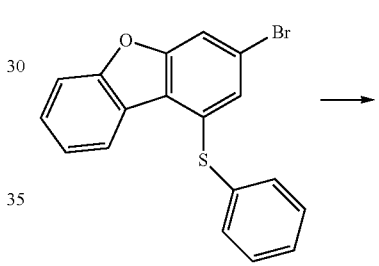

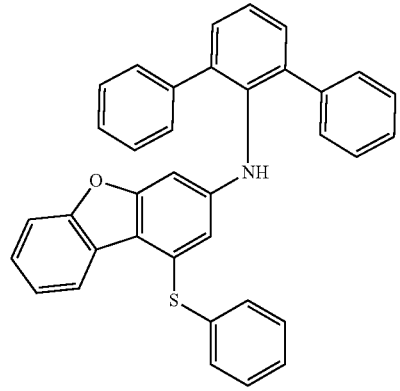

15-1

3-bromo-1-(phenylthio)dibenzo[b,d]furan (1 eq), [1,1':3',1''-terphenyl]-2'-amine (1 eq), tris(dibenzylideneacetone)dipalladium(0) (0.05 eq), P(tBu)₃ (0.1 eq), and sodium tert-butoxide (2 eq) were dissolved in toluene and stirred under a nitrogen atmosphere at about 110 degrees centigrade for about 12 hours. After cooling, the reaction solution was washed with ethyl acetate and water three times, and an organic layer obtained was dried with MgSO₄ and dried under a reduced pressure. Through column chromatography, Intermediate 15-1 was obtained (yield: 75%).

(Synthesis of Intermediate 15-2)
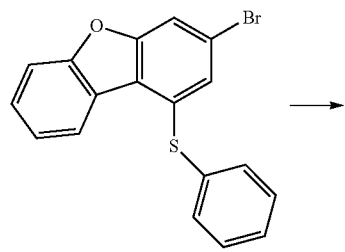
(Synthesis of Intermediate 15-3)
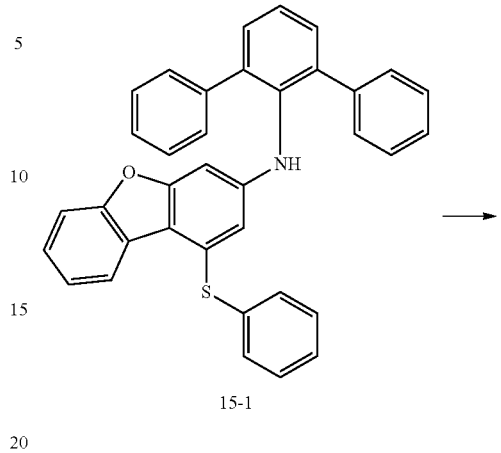
15-1
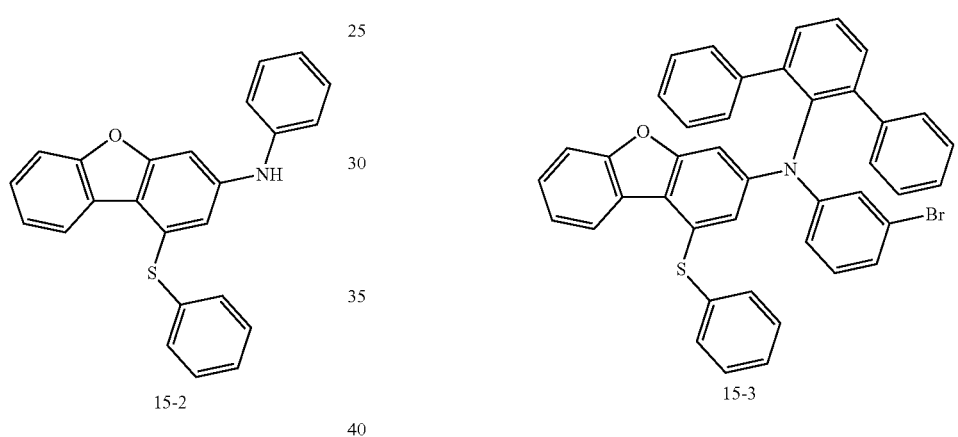
15-2
Intermediate 15-2 was synthesized using 3-bromo-1-(phenylthio)dibenzo[b,d]furan and aniline by the same method as the synthesis of Intermediate 15-1 (yield: 85%).
Intermediate 15-3 was synthesized using Intermediate 15-1 by the same method as the synthesis of Intermediate 1-3 (yield: 60%).
(Synthesis of Intermediate 15-4)
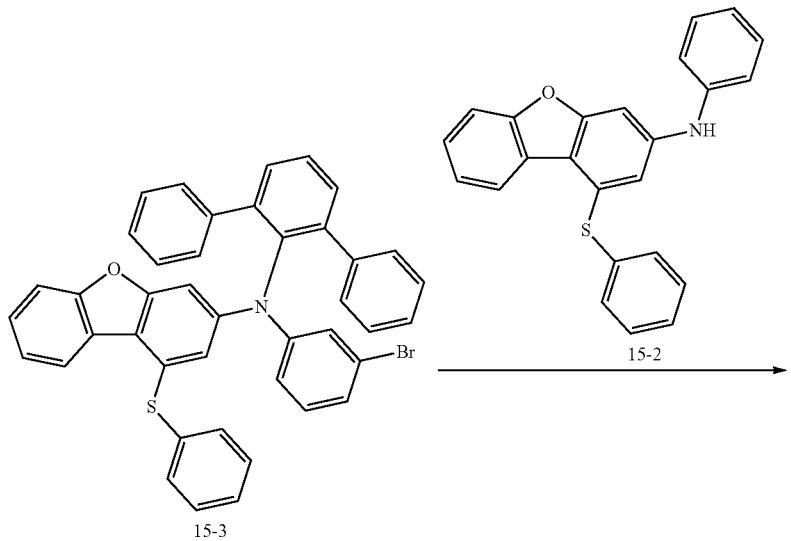
15-3

-continued

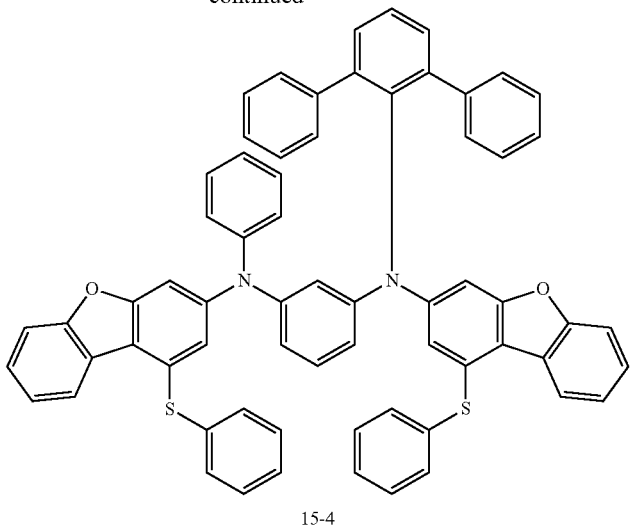

15-4

Intermediate 15-4 was synthesized using Intermediate 15-2 and Intermediate 15-3 by the same method as the synthesis of Intermediate 1-4 (yield: 63%).

(Synthesis of Compound 15)

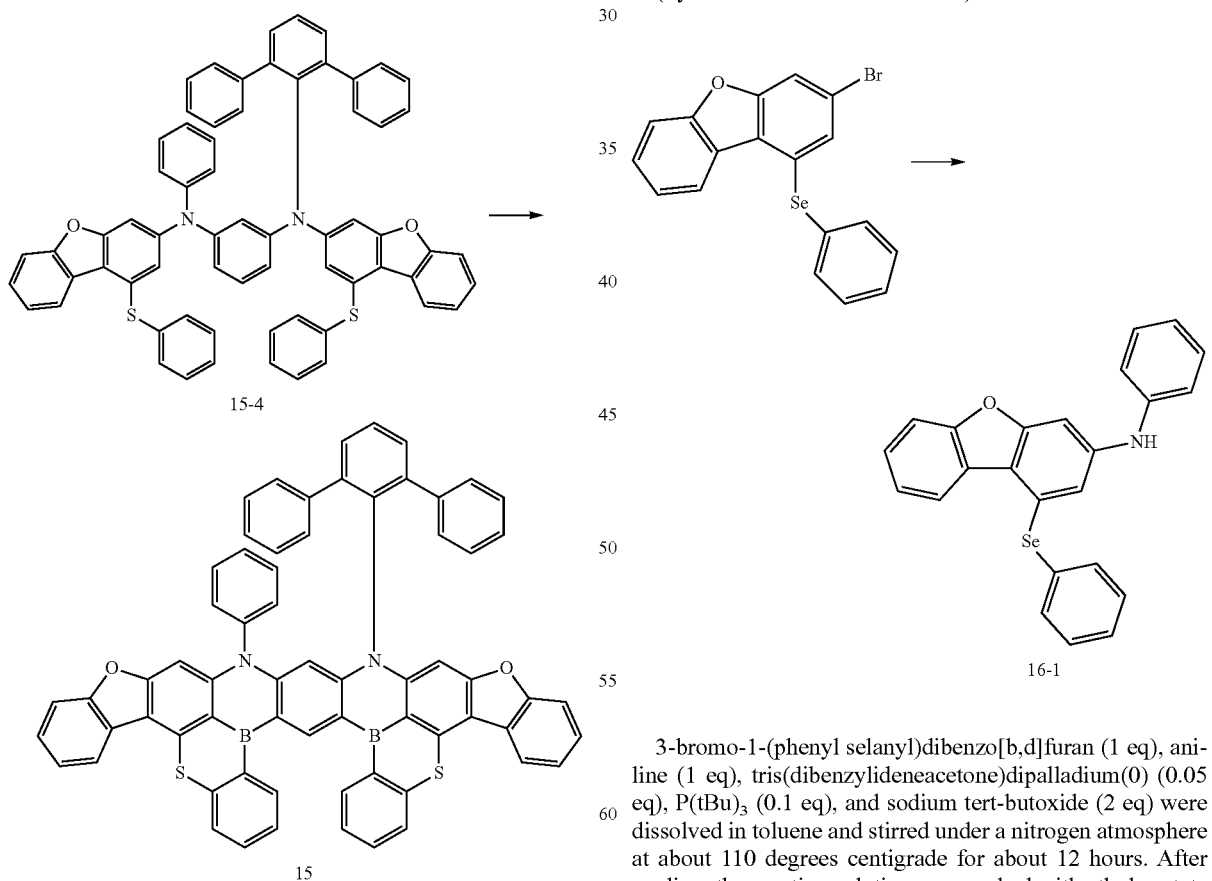

Compound 15 was synthesized using Intermediate 15-4 by the same method as the synthesis of Compound 1 (yield: 10%).

(9) Synthesis of Compound 16

Fused Polycyclic Compound 16 according to an embodiment may be synthesized by, for example, the reaction below.

(Synthesis of Intermediate 16-1)

3-bromo-1-(phenyl selanyl)dibenzo[b,d]furan (1 eq), aniline (1 eq), tris(dibenzylideneacetone)dipalladium(0) (0.05 eq), P(tBu)$_3$ (0.1 eq), and sodium tert-butoxide (2 eq) were dissolved in toluene and stirred under a nitrogen atmosphere at about 110 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 16-1 was obtained (yield: 87%).

(Synthesis of Intermediate 16-2)

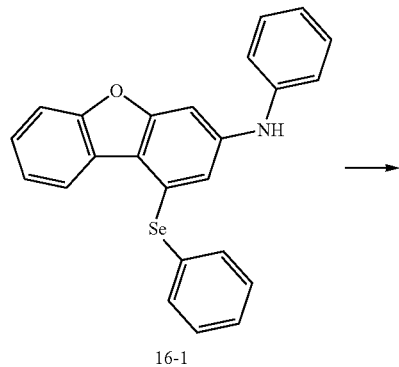

16-1

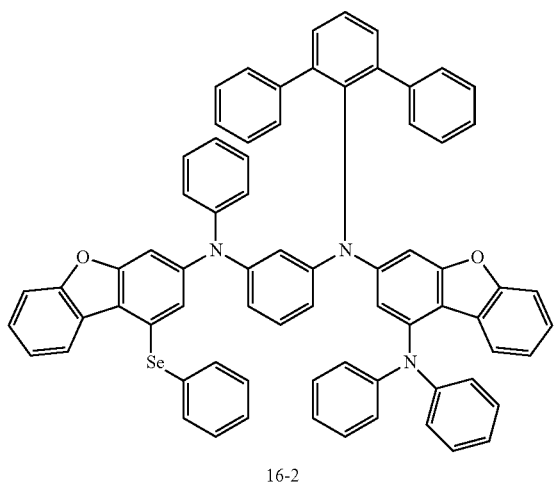

16-2

Intermediate 16-2 was synthesized using Intermediate 16-1 and Intermediate 1-3 by the same method as the synthesis of Intermediate 1-4 (yield: 62%).

(Synthesis of Compound 16)

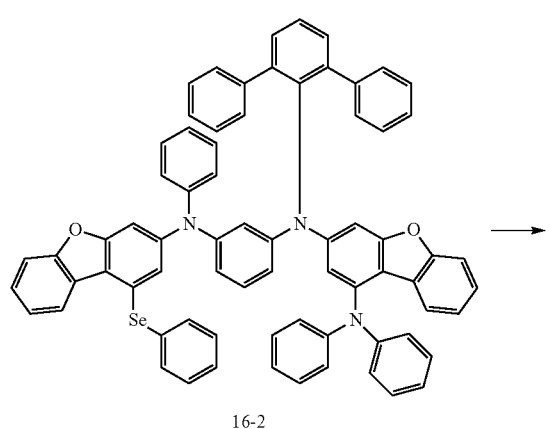

16-2

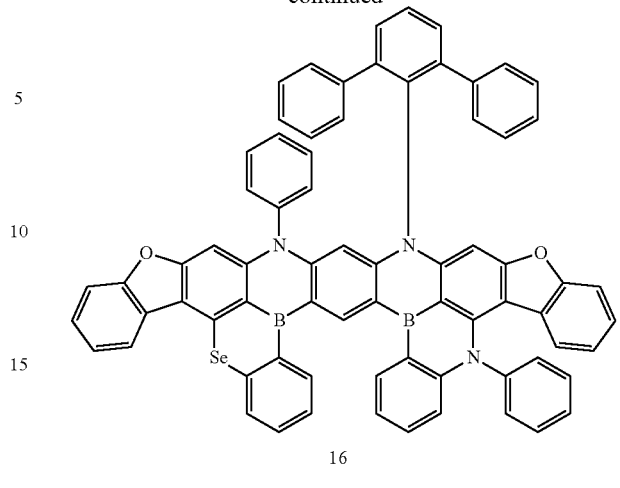

16

Compound 16 was synthesized using Intermediate 16-2 by the same method as the synthesis of Compound 1 (yield: 10%).

(10) Synthesis of Compound 54

Fused Polycyclic Compound 54 according to an embodiment may be synthesized by, for example, the reaction below.

(Synthesis of Intermediate 54-1)

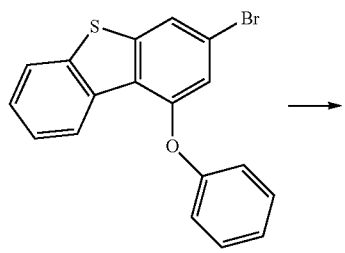

54-1

3-bromo-1-phenoxydibenzo[b,d]thiophene (1 eq), aniline (1 eq), tris(dibenzylideneacetone)dipalladium(0) (0.05 eq), P(tBu)₃ (0.1 eq), and sodium tert-butoxide (2 eq) were dissolved in toluene and stirred under a nitrogen atmosphere at about 110 degrees centigrade for about 12 hours. After cooling, the reaction solution was washed with ethyl acetate and water three times, and an organic layer obtained was dried with $MgSO_4$ and dried under a reduced pressure. Through column chromatography, Intermediate 54-1 was obtained (yield: 83%).

(Synthesis of Intermediate 54-2)

(Synthesis of Intermediate 54-3)

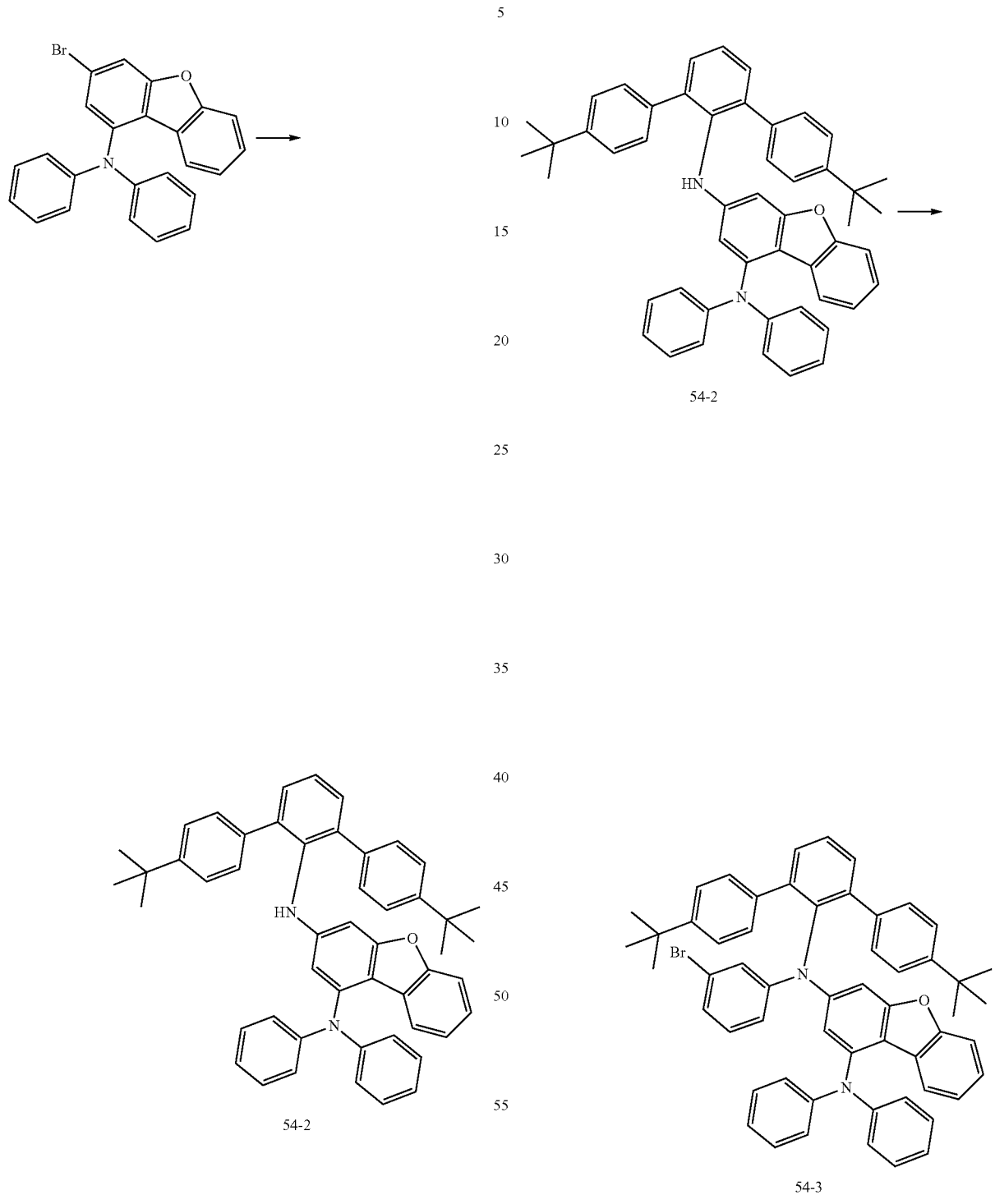

54-2

Intermediate 54-2 was synthesized using 3-bromo-N,N-diphenyldibenzo[b,d]furan-1-amine and 4,4"-di-tert-butyl-[1,1':3',1"-terphenyl]-T-amine by the same synthesis method and purification as the synthesis of Intermediate 54-1 (yield: 75%).

Intermediate 54-3 was synthesized using Intermediate 54-2 by the same method as the synthesis of Intermediate 1-3 (yield: 60%).

(Synthesis of Intermediate 54-4)
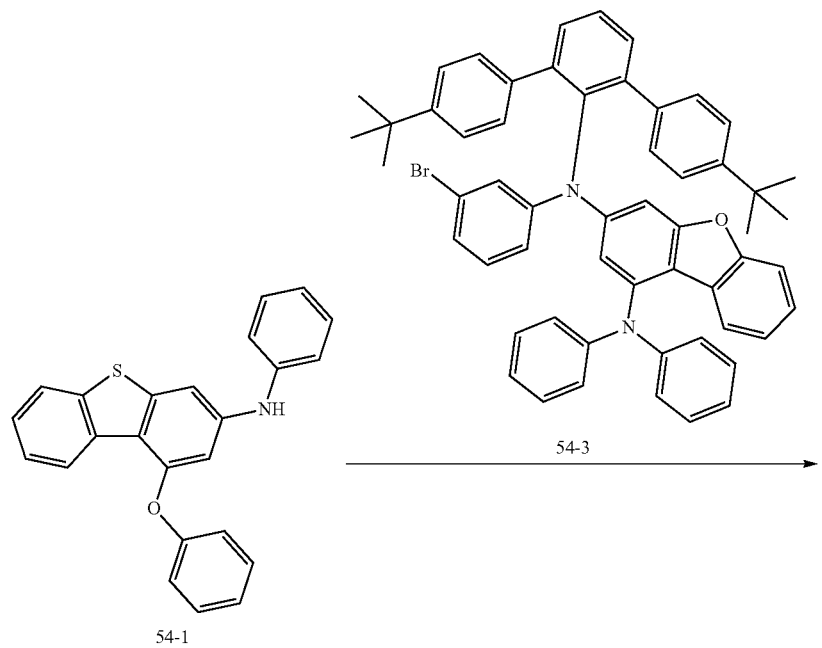
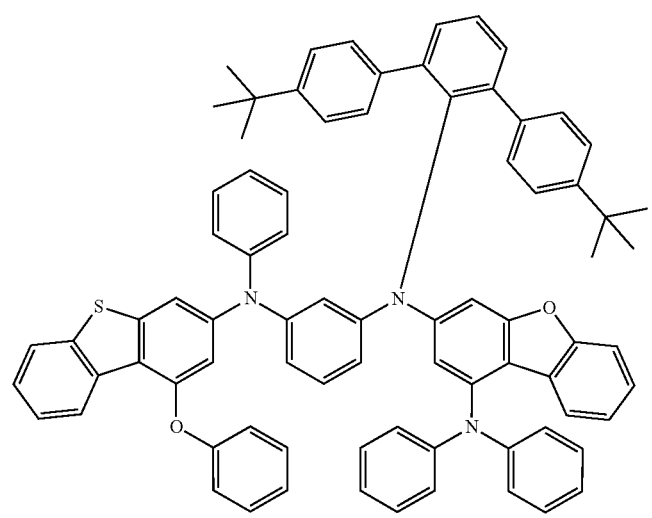

Intermediate 54-4 was synthesized using Intermediate 54-1 and Intermediate 54-3 by the same method as the synthesis of Intermediate 1-4 (yield: 70%).

(Synthesis of Compound 54)

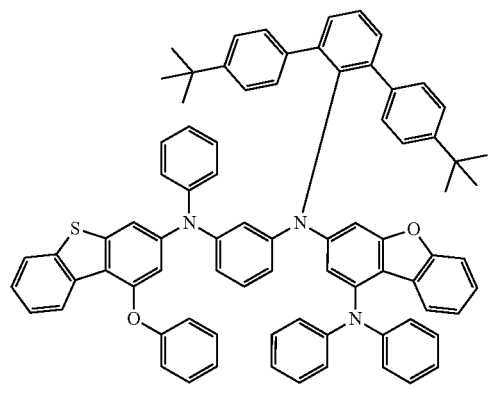

54-4

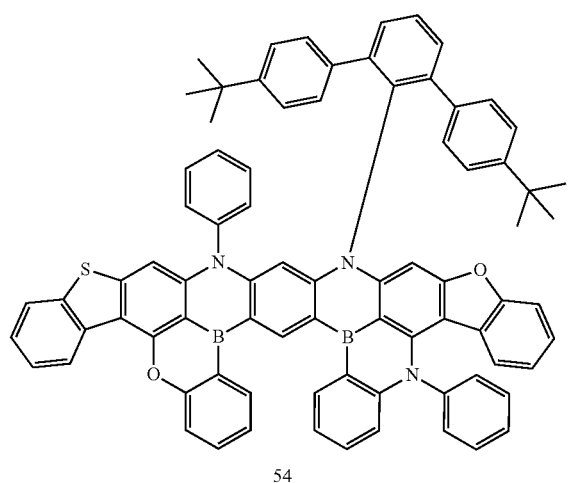

54

Compound 54 was synthesized using Intermediate 54-4 by the same method as the synthesis of Compound 1 (yield: 12%).

(11) Synthesis of Compound 68

Fused Polycyclic Compound 68 according to an embodiment may be synthesized by, for example, the reaction below.

(Synthesis of Intermediate 68-1)

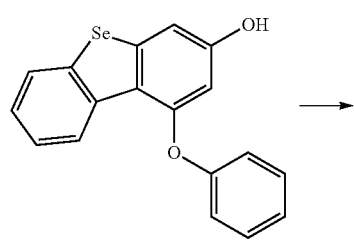

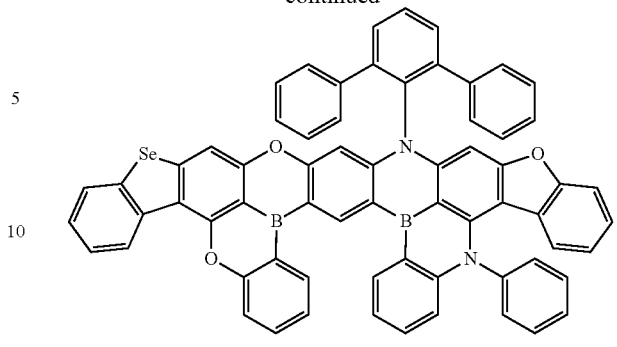

68-1

1-phenoxydibenzo[b,d]selenophen-3-ol (1 eq), Intermediate 1-4 (1 eq), copper iodide (0.1 eq), 2-picolinic acid (0.2 eq), and K$_3$PO$_4$ (3 eq) were dissolved in DMF and stirred under a nitrogen atmosphere at about 160 degrees centigrade for about 12 hours. After cooling, the reaction solution was washed with ethyl acetate and water three times, and an organic layer obtained was dried with MgSO$_4$ and dried under a reduced pressure. Through column chromatography, Intermediate 68-1 was obtained (yield: 65%).

(Synthesis of Compound 68)

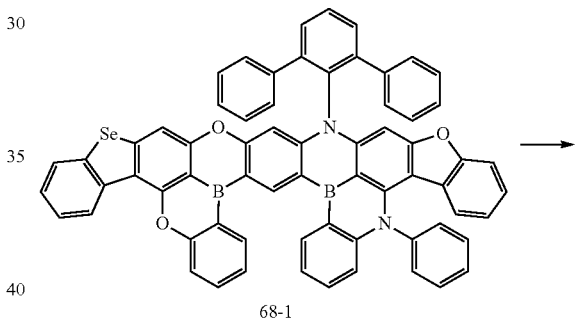

68-1

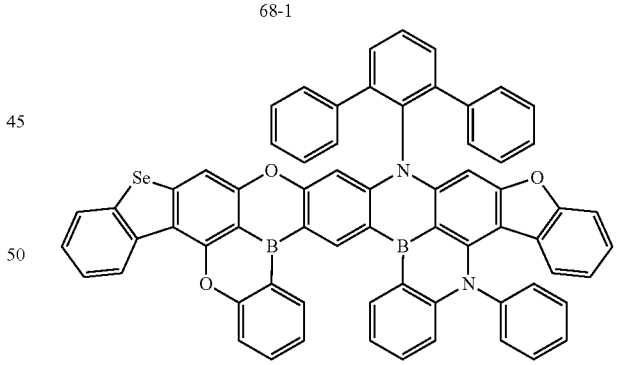

68

Compound 68 was synthesized using Intermediate 68-1 by the same method as the synthesis of Compound 1 (yield: 10%).

The $^1$H NMR and MS/FAB of the compounds synthesized in Synthesis Examples 1 to 11 are shown in Table 1 below. The synthesis method of the compounds other than the compounds shown in Table 1 among the fused polycyclic compound according to an embodiment may be easily recognized by a person skilled in the art referring to the synthesis process and raw materials above.

TABLE 1

| Compound | H NMR (δ) | MS/FAB Calc | Found |
|---|---|---|---|
| 1 | 1H-NMR (400 MHz, CDCl3): 9.91 (s, 1H), 9.34 (d, 2H), 7.89 (d, 1H), 7.72 (d, 1H), 7.54-7.30 (m, 23H), 7.24-7.17 (m, 4H), 7.07-7.13 (m, 17H), 6.94 (s, 1H), 6.81 (ss, 2H), 6.67 (s, 1H). | 1094.89 | 1094.88 |
| 11 | 1H-NMR (400 MHz, CDCl3): 9.78 (s, 1H), 9.32 (d, 1H), 8.94 (d, 1H), 7.63-7.71 (m, 4H), 7.54 (d, 2H), 7.43-7.24 (m, 17H), 7.00-7.11 (m, 14H), 6.91 (s, 1H), 6.90 (ss, 2H), 6.83 (s, 1H). | 1019.77 | 1019.77 |
| 31 | 1H-NMR (400 MHz, CDCl3): 9.82 (s, 1H), 9.21 (d, 1H), 8.93 (d, 1H), 7.54-7.62 (m, 5H), 7.43 (d, 1H), 7.00-7.32 (m, 11H), 6.93 (ss, 2H), 6.89 (s, 1H), 1.33 (s, 9H). | 1075.88 | 1075.86 |
| 39 | 1H-NMR (400 MHz, CDCl3): 9.91 (s, 1H), 9.47 (d, 1H), 9.21 (d, 1H), 7.5-7.61 (m, 6H), 7.24-7.41 (m, 16H), 7.00-7.12 (m, 10H), 6.90 (ss, 2H), 6.86 (s, 1H). | 944.66 | 944.65 |
| 49 | 1H-NMR (400 MHz, CDCl3): 10.02 (s, 1H), 9.64 (dd, 2H), 7.50-7.62 (m, 6H), 7.44-7.62 (m, 19H), 7.00-7.37 (m, 15H), 6.91 (ss, 2H), 6.83 (s, 1H). | 1245.12 | 1245.10 |
| 74 | 1H-NMR (400 MHz, CDCl3): 9.98 (s, 1H), 9.47 (d, 1H), 9.32 (d, 1H), 7.31-7.62 (m, 10H), 7.00-7.28 (m, 17H), 6.92 (s, 1H), 6.90 (s, 1H), 6.83 (s, 1H), 1.34 (s, 9H). | 1074.9 | 1074.89 |
| 77 | 1H-NMR (400 MHz, CDCl3): 9.94 (s, 1H), 9.68 (dd, 2H), 7.57-7.62 (m, 6H), 7.38-7.54 (m, 18H), 7.01-7.34 (m, 16H), 6.96 (s, 2H), 6.86 (s, 1H). | 1094.89 | 1094.87 |
| 15 | 1H-NMR (400 MHz, CDCl3): 9.68 (s, 1H), 9.54 (dd, 2H), 8.03-7.82 (m, 6H), 7.38-7.54 (m, 17H), 7.17-7.31 (m, 9H), 6.83 (s, 1H). | 976.26 | 976.26 |
| 16 | 1H-NMR (400 MHz, CDCl3): 9.71 (s, 1H), 9.44-9.40 (dd, 2H), 8.00-7.77 (m, 5H), 7.38-7.54 (m, 13H), 7.15-7.34 (m, 10H), 7.11 (ss, 2H), 6.94 (s, 1H). | 1083.29 | 1083.27 |
| 54 | H-NMR (400 MHz, CDCl3): 9.83 (s, 1H), 9.67 (dd, 2H), 8.45 (d, 1H), 8.10-7.49 (m, 9H), 7.39-7.24 (m, 18H), 7.01-7.20 (m, 9H), 7.16 (ss, 2H), 6.83 (s, 1H), 1.34 (s, 18H). | 1147.46 | 1147.45 |
| 68 | H-NMR (400 MHz, CDCl3): 9.79 (s, 1H), 9.55 (dd, 2H), 7.77-7.69 (m, 5H), 7.50-7.29 (m, 18H), 7.08-7.20 (m, 10H), 7.09 (ss, 2H), 6.86 (s, 1H). | 1008.23 | 1008.22 |

2. Manufacture and Evaluation of Light Emitting Device Including Fused Polycyclic Compound (Manufacture of Light Emitting Device)

The light emitting devices of Examples 1 to 11 were manufactured using Compounds 1, 11, 15, 16, 31, 39, 49, 54, 68, 74, and 77 as dopant materials of an emission layer.

[Example Compounds]

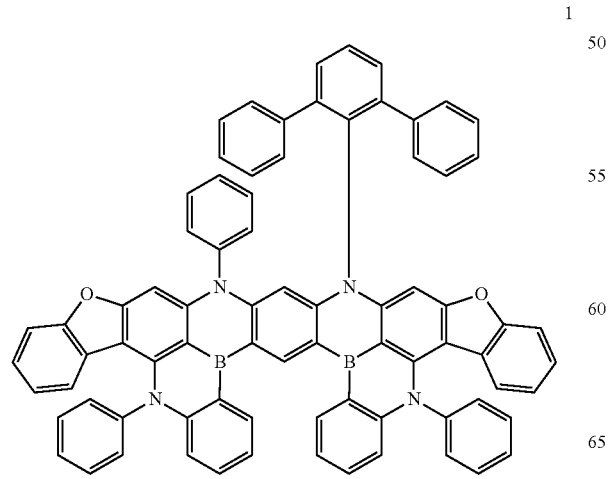

1

-continued
11
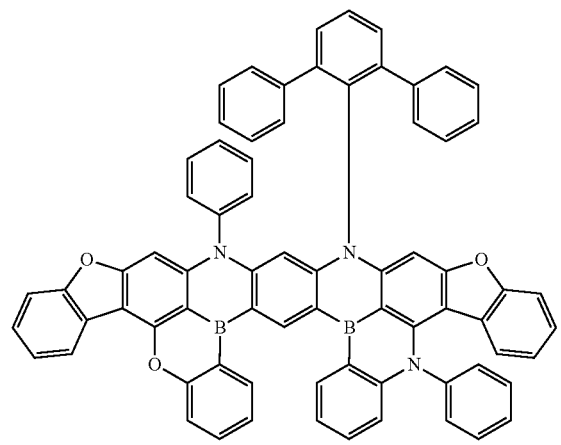
16
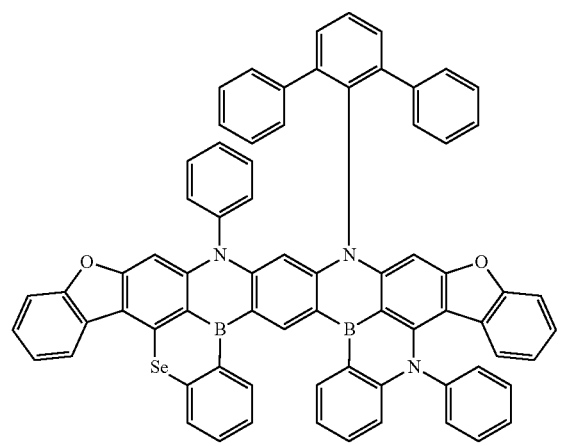
15
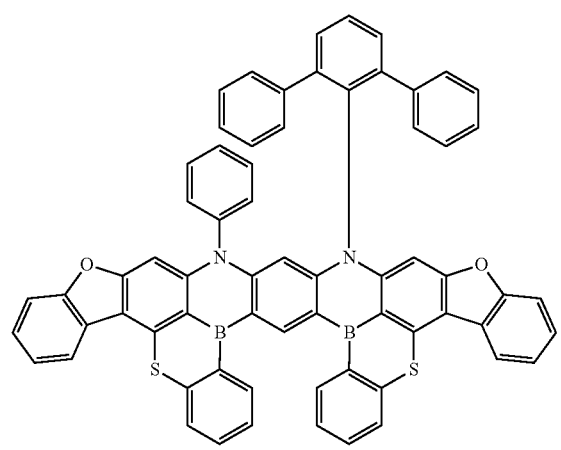
-continued
31
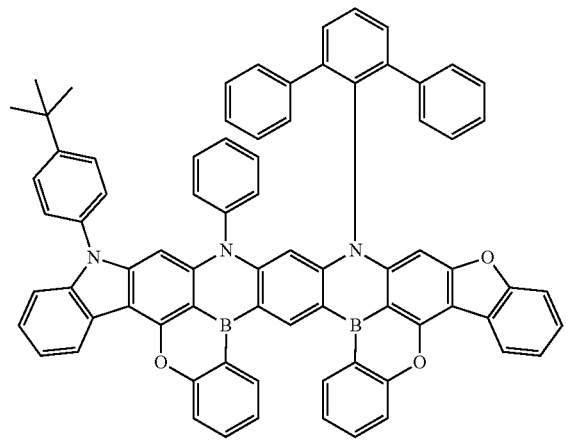
39
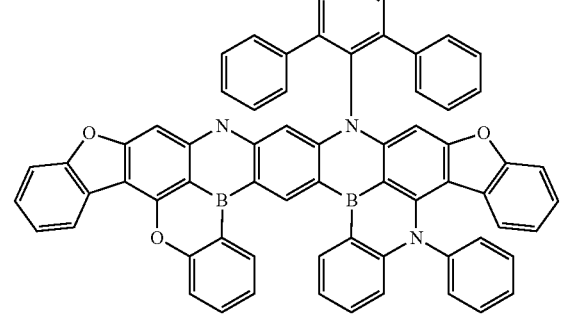
49
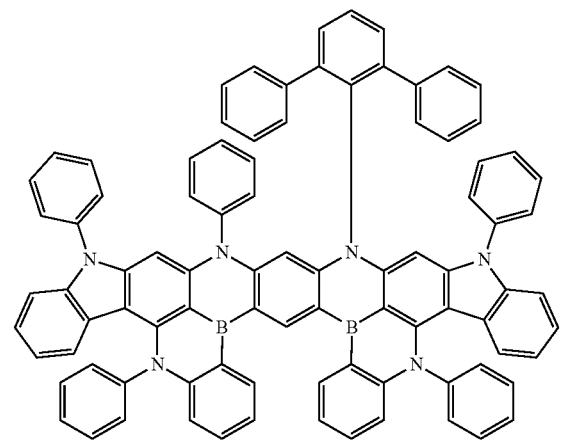

54
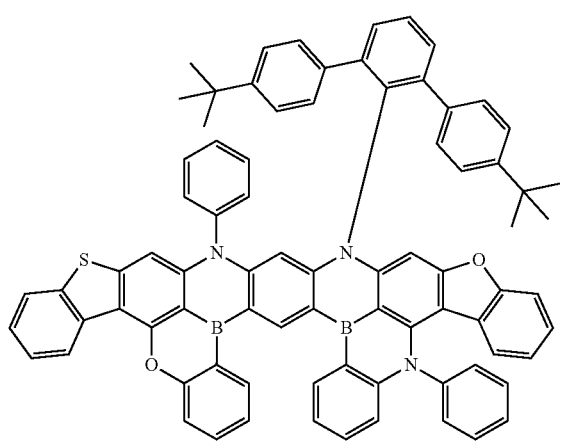
77
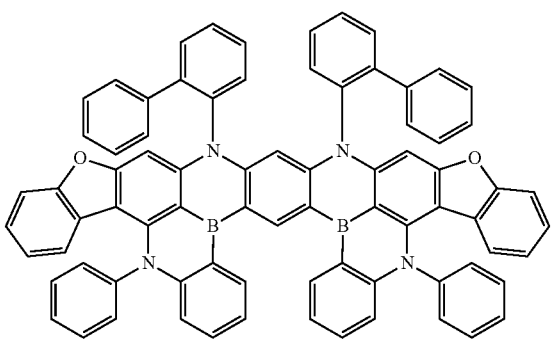
Comparative Compounds X-1 to X-6 below were used for the manufacture of the devices of the Comparative Examples.
[Comparative Compounds]
68
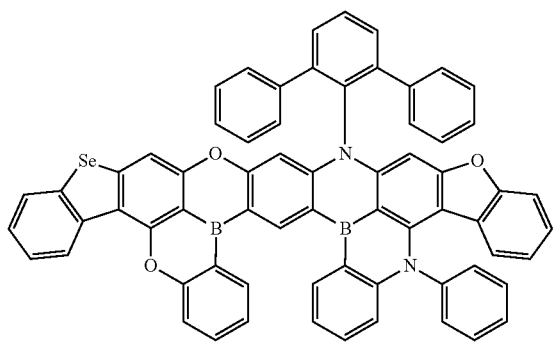
X-1
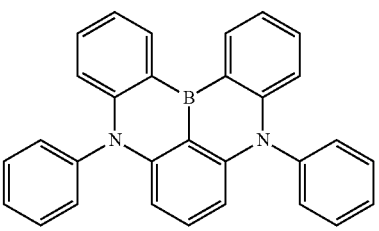
X-2
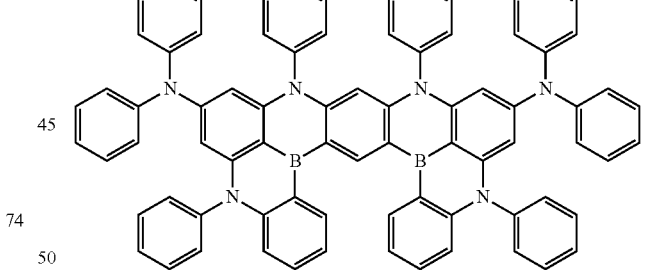
74
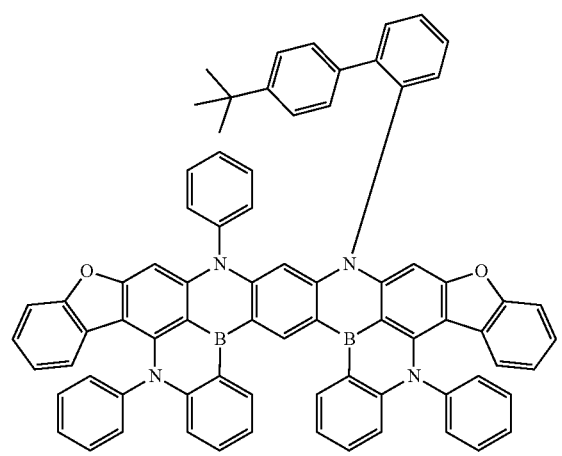
X-3
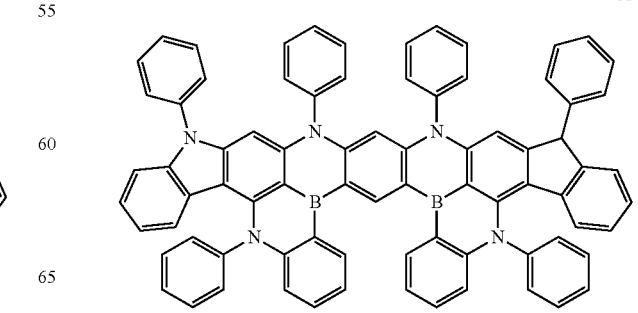

-continued

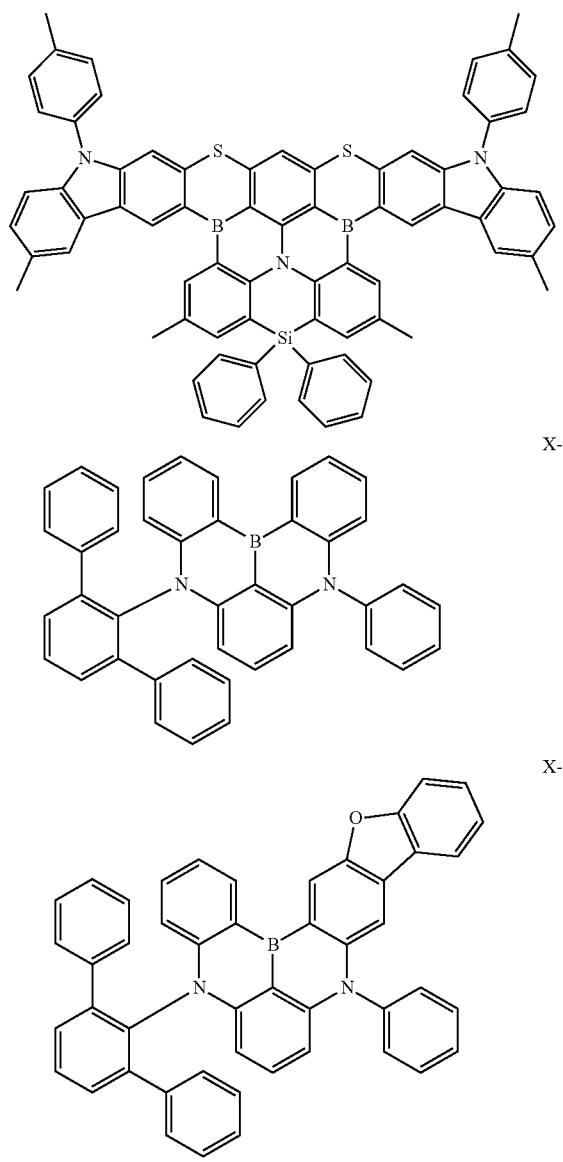

A light emitting device of an embodiment, including the fused polycyclic compound of an embodiment in an emission layer was manufactured by a method below. Example 1 to Example 11 correspond to light emitting devices manufactured by using Compounds 1, 11, 15, 16, 31, 39, 49, 54, 68, 74, and 77, which are aforementioned Example Compounds, as light emitting materials. Comparative Example 1 to Comparative Example 6 correspond to light emitting devices manufactured by using Comparative Compound X-1 to Comparative Compound X-6 as light emitting materials.

A first electrode with a thickness of about 150 nm was formed using ITO, a hole injection layer with a thickness of about 30 nm was formed on the first electrode using N,N'-di(1-naphthyl)-N,N'-diphenyl-(1,1'-biphenyl)-4,4'-diamine (NPD), a hole transport layer with a thickness of about 20 nm was formed on the hole injection layer using N-([1,1'-biphenyl]-4-yl)-9,9-dimethyl-N-(4-(9-phenyl-9H-carbazol-3-yl)phenyl)-9H-fluoren-2-amine (H-1-1) or N-([1,1'-biphenyl]-4-yl)-9,9-diphenyl-N-(4-(9-phenyl-9H-carbazol-3-yl)phenyl)-9H-fluoren-2-amine (H-1-19), an emission auxiliary layer with a thickness of about 10 nm was formed on the hole transport layer using 9-(4-tert-butylphenyl)-3,6-bis(triphenylsilyl)-9H-carbazole (CzSi), an emission layer with a thickness of about 20 nm was formed on the emission auxiliary layer using 1,3-bis(N-carbazolyl)benzene (mCP) doped with 3% of the Example Compound or the Comparative Compound, an electron transport layer with a thickness of about 20 nm was formed on the emission layer using diphenyl[4-(triphenylsilyl)phenyl]phosphineoxide (TSPO1), a buffer layer with a thickness of about 30 nm was formed on the electron transport layer using 2,2',2"-(1,3,5-benzinetriyl)-tris(1-phenyl-1-H-benzimidazole) (TPBI), an electron injection layer with a thickness of about 1 nm was formed on the buffer layer using LiF, and a second electrode with a thickness of about 300 nm was formed on the electron injection layer using Al. On the second electrode, a capping layer with a thickness of about 70 nm was formed through P4. All layers were formed under a vacuum atmosphere by a deposition method.

The compounds used for the manufacture of the light emitting devices of the Examples and the Comparative Example are shown below. The compounds below are commercial materials which were purified by sublimation and used for the manufacture of the devices.

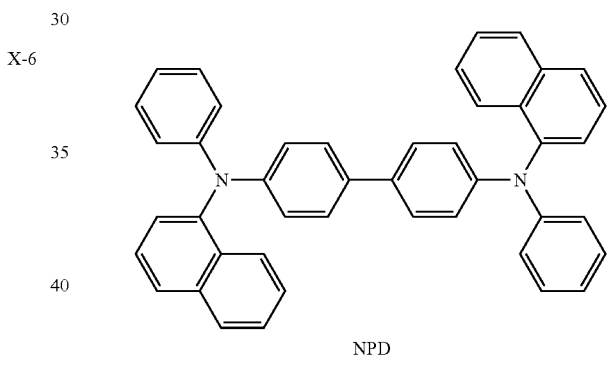

NPD

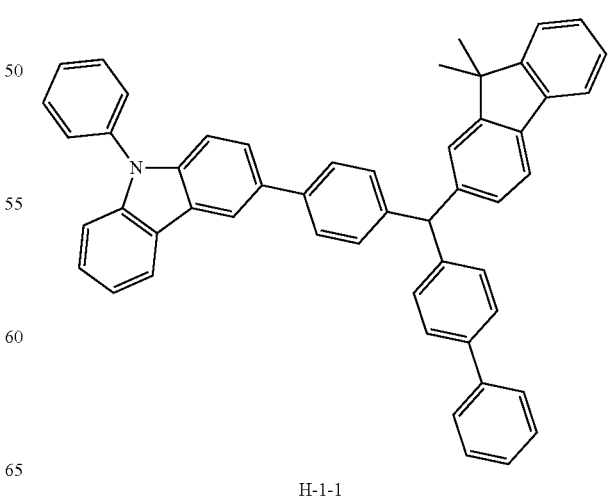

H-1-1

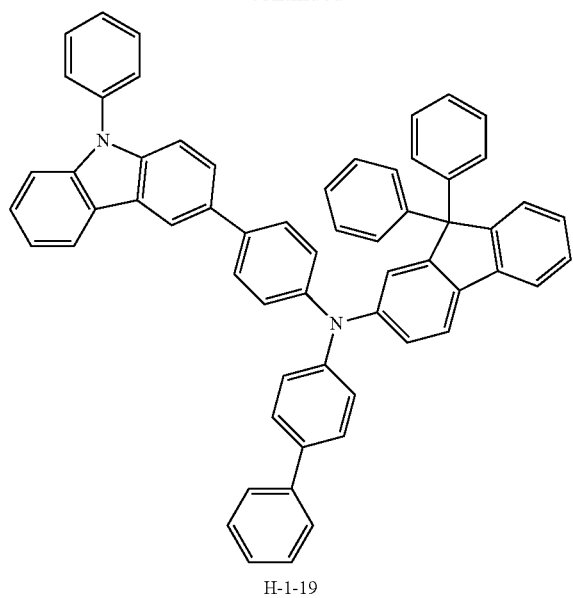

H-1-19

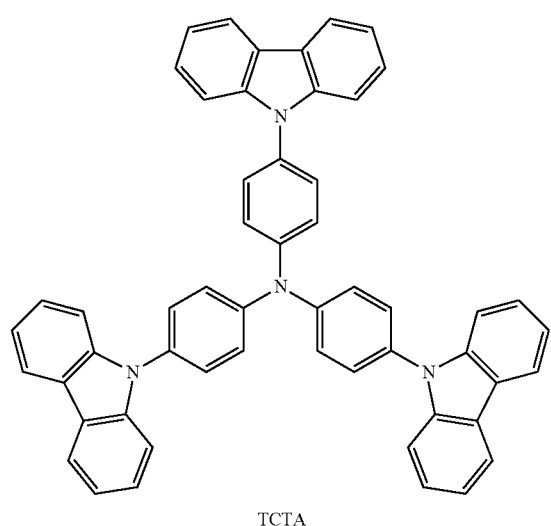

TCTA

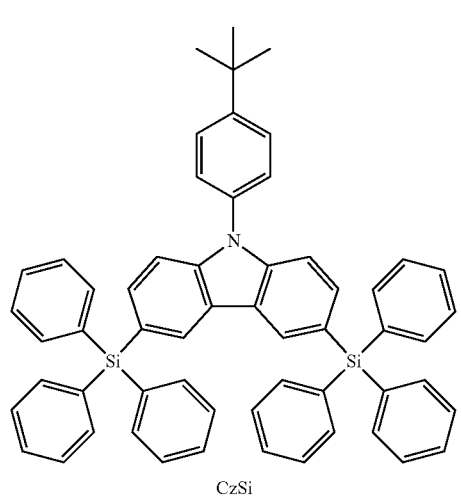

CzSi

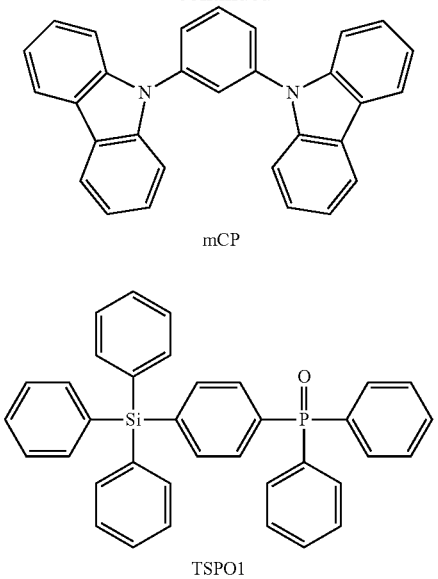

mCP

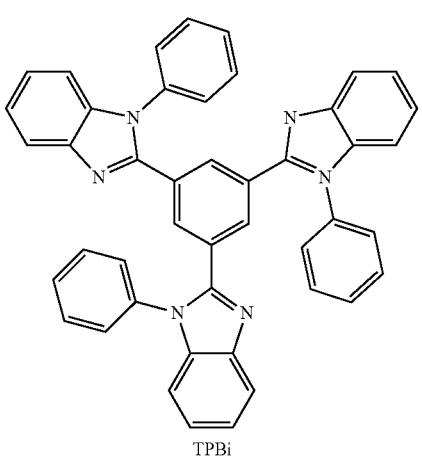

TSPO1

TPBi

P4

Experimental Examples

The device efficiency of the light emitting devices manufactured using Example Compounds 1, 11, 15, 16, 31, 39, 49, 54, 68, 74, and 77, and Comparative Compound X-1 to Comparative Compound X-6 were evaluated. Evaluation results are shown in Table 2 below. In the device evaluation, the driving voltage and device efficiency (cd/A) were measured at a current density of about 10 mA/cm².

TABLE 2

| Device manufacturing example | Hole transport layer material | Dopant compound | Driving voltage (V) | Efficiency (cd/A) | Maximum external quantum efficiency (%) | Emission color |
|---|---|---|---|---|---|---|
| Example 1 | HT-1-1 | Compound 1 | 4.3 | 27.5 | 27.3 | Blue |
| Example 2 | HT-1-1 | Compound 11 | 4.5 | 26.4 | 25.4 | Blue |
| Example 3 | HT-1-1 | Compound 15 | 4.6 | 25.5 | 24.3 | Blue |
| Example 4 | HT-1-1 | Compound 16 | 4.8 | 24.2 | 23.2 | Blue |
| Example 5 | HT-1-1 | Compound 31 | 4.4 | 26.8 | 25.7 | Blue |
| Example 6 | HT-1-1 | Compound 39 | 4.6 | 23.5 | 23.6 | Blue |
| Example 7 | HT-1-1 | Compound 49 | 4.3 | 27.1 | 26.5 | Blue |
| Example 8 | HT-1-1 | Compound 54 | 4.7 | 25.1 | 25.1 | Blue |
| Example 9 | HT-1-1 | Compound 68 | 4.8 | 24.5 | 23.7 | Blue |
| Example 10 | HT-1-19 | Compound 1 | 4.4 | 27.1 | 26.5 | Blue |
| Example 11 | HT-1-19 | Compound 11 | 4.5 | 25.7 | 24.6 | Blue |
| Example 12 | HT-1-19 | Compound 31 | 4.5 | 25.8 | 24.9 | Blue |
| Example 13 | HT-1-19 | Compound 39 | 4.6 | 23.1 | 22.8 | Blue |
| Example 14 | HT-1-19 | Compound 49 | 4.4 | 26.3 | 25.7 | Blue |
| Comparative Example 1 | HT-1-1 | Comparative Compound X-1 | 5.6 | 16.0 | 15.7 | Blue |
| Comparative Example 2 | HT-1-1 | Comparative Compound X-2 | 5.0 | 19.9 | 17.9 | Blue |
| Comparative Example 3 | HT-1-1 | Comparative Compound X-3 | 5.1 | 19.8 | 18.2 | Blue |
| Comparative Example 4 | HT-1-1 | Comparative Compound X-4 | 5.6 | 14.3 | 14.2 | Blue |
| Comparative Example 5 | HT-1-1 | Comparative Compound X-5 | 5.5 | 14.8 | 15.3 | Blue |
| Comparative Example 6 | HT-1-1 | Comparative Compound X-6 | 5.5 | 15.1 | 15.7 | Blue |
| Comparative Example 7 | HT-1-19 | Comparative Compound X-1 | 5.8 | 15.2 | 14.9 | Blue |
| Comparative Example 8 | HT-1-19 | Comparative Compound X-2 | 4.9 | 20.1 | 18.7 | Blue |
| Comparative Example 9 | HT-1-19 | Comparative Compound X-3 | 5.1 | 19.1 | 18.3 | Blue |
| Comparative Example 10 | HT-1-19 | Comparative Compound X-4 | 5.5 | 14.8 | 14.3 | Blue |
| Comparative Example 11 | HT-1-19 | Comparative Compound X-5 | 5.4 | 15.3 | 14.7 | Blue |
| Comparative Example 12 | HT-1-19 | Comparative Compound X-6 | 5.5 | 15.5 | 14.9 | Blue |

Referring to the results of Table 1, it could be confirmed that the Examples of the light emitting devices using the fused polycyclic compounds according to embodiments as light emitting materials showed reduced driving voltages and improved emission efficiency while maintaining the light emitting wavelength of blue light when compared with the Comparative Examples.

The Example Compounds have a structure including at least one pentagonal aromatic ring in a wide plate-type skeleton structure with two boron atoms as center, and form a wide conjugation structure to stabilize a polycyclic aromatic ring structure. Multi-resonance effects may be increased, reverse intersystem crossing may be easily generated, and if the Example Compounds are used as thermally activated delayed fluorescence dopants, a full width at half maximum and a wavelength region may become suitable as blue emission materials, and emission efficiency may be improved. The Example Compounds have a substituent with steric hindrance, and the core skeleton structure has a high electron density, while having a structure by which the p-orbital of a boron atom is protected. Accordingly, if the Example Compound is used as a thermally activated delayed fluorescence dopant, emission efficiency may be improved. The light emitting device of an embodiment may include the fused polycyclic compound of an embodiment as the dopant of a thermally activated delayed fluorescence (TADF) emitting device, and may accomplish high device efficiency in a blue wavelength region, such as in a deep blue wavelength region.

Comparative Compound X-1 included in Comparative Example 1 does not include an additional fused ring and a substituent with steric hindrance, but has a structure including only one boron atom, and thus, it could be confirmed that the driving voltage was high, and the emission efficiency was degraded when compared with the Examples. In Comparative Compound X-2 included in Comparative Example 2, a plate-type skeleton with two boron atoms as center is included, but an additional fused ring is not included in the plate-type skeleton, and a substituent with steric hindrance is not included, either, and thus, it could be confirmed that the driving voltage was high, and the emission efficiency was degraded when compared with the Examples. In Comparative Compound X-3 included in Comparative Example 3, a plate-type skeleton with two boron atoms as center and an additional fused ring are included, but a substituent with steric hindrance is not included, and thus, it could be confirmed that the driving voltage was high, and the emission efficiency was degraded when compared with the Examples. In Comparative Compound X-4 included in Comparative Example 4, a plate-type skeleton with two boron atoms as center and an additional fused ring are included, but a skeleton structure is different, and a substituent with steric hindrance is not included, and thus, it could be confirmed that the driving voltage was high, and the emission efficiency was degraded when compared with the Examples. In Comparative Compound X-5 included in Comparative Example 5, a substituent with steric hindrance is included but a structure includes only one boron atom, and thus, it could be confirmed that the driving voltage was high, and the emission efficiency was degraded when compared with the Examples. In Comparative Compound X-6 included in Comparative Example 6, a substituent with steric hindrance and an additional fused ring are included, but only one boron atom is included in the structure, and thus, it could be confirmed that the driving voltage was high, and the emission efficiency was degraded when compared with the Examples.

The light emitting device of an embodiment may show improved device properties of high efficiency.

The fused polycyclic compound of an embodiment may be included in the emission layer of a light emitting device and may contribute to the increase of efficiency of an organic electroluminescence device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:
1. A light emitting device, comprising:
a first electrode;
a hole transport region disposed on the first electrode;
an emission layer disposed on the hole transport region;
an electron transport region disposed on the emission layer; and
a second electrode disposed on the electron transport region, wherein
the emission layer comprises a fused polycyclic compound represented by Formula 1, and
the hole transport region comprises an amine compound represented by Formula H-a:

[Formula 1]

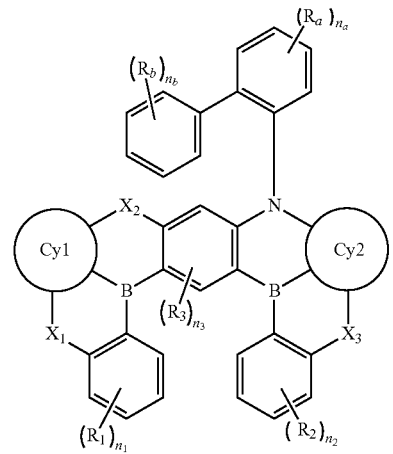

wherein in Formula 1,
$X_1$ to $X_3$ are each independently $C(R_4)(R_5)$, $N(R_6)$, O, S, or Se,
$R_1$ to $R_6$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring,
$R_a$ and $R_b$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_1$ and $n_2$ are each independently an integer from 0 to 4, $n_3$ is an integer from 0 to 2, $n_a$ is an integer from 0 to 4, $n_b$ is an integer from 0 to 5, Cy1 and Cy2 are each independently a group represented by Formula 2-1 or Formula 2-2, and at least one of Cy1 and Cy2 is represented by Formula 2-1:

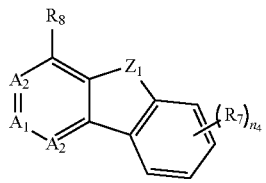

[Formula 2-1]

wherein in Formula 2-1, $Z_1$ is $C(R_9)(R_{10})$, $N(R_{11})$, O, S, or Se, $R_7$ to $R_{11}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_4$ is an integer from 0 to 4, $A_1$ is a position bonded to a boron atom in Formula 1, and $A_2$ are positions bonded $X_1$ and $X_2$ in Formula 1, or positions bonded to a nitrogen atom and $X_3$ in Formula 1,

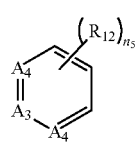

[Formula 2-2]

wherein in Formula 2-2, $R_{12}$ is a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_5$ is an integer from 0 to 3, $A_3$ is a position bonded to a boron atom in Formula 1, and $A_4$ are positions bonded to $X_1$ and $X_2$ in Formula 1, or positions bonded to a nitrogen atom and $X_3$ in Formula 1,

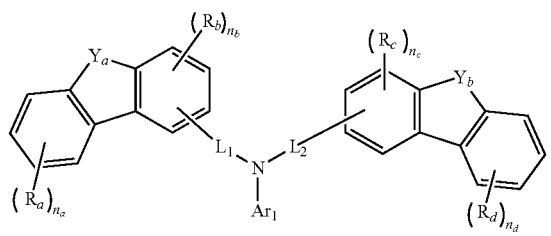

[Formula H-a]

wherein in Formula H-a, $Y_a$ and $Y_b$ are each independently $C(R_e)(R_f)$, $N(R_g)$, O, or S, $Ar_1$ is a substituted or unsubstituted aryl group of 6 to 30 ring-forming carbon atoms, or a substituted or unsubstituted heteroaryl group of 2 to 30 ring-forming carbon atoms, $L_1$ and $L_2$ are each independently a direct linkage, a substituted or unsubstituted arylene group of 6 to 30 ring-forming carbon atoms, or a substituted or unsubstituted heteroarylene group of 2 to 30 ring-forming carbon atoms, $R_a$ to $R_g$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, $n_a$ and $n_d$ are each independently an integer from 0 to 4, and $n_b$ and $n_c$ are each independently an integer from 0 to 3.

2. The light emitting device of claim 1, wherein the emission layer emits delayed fluorescence.

3. The light emitting device of claim 1, wherein the emission layer is a delayed fluorescence emission layer comprising a host and a dopant, and the dopant comprises the fused polycyclic compound.

4. The light emitting device of claim 1, wherein the emission layer emits light with a central wavelength in a range of about 430 nm to about 490 nm.

5. The light emitting device of claim 1, wherein the fused polycyclic compound represented by Formula 1 is represented by Formula 3:

[Formula 3]

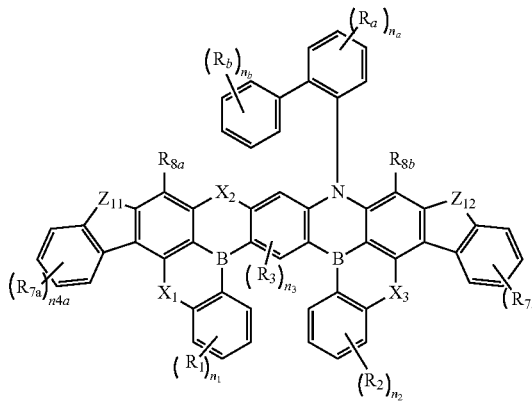

wherein in Formula 3, $Z_{11}$ and $Z_{12}$ are each independently $C(R_{9a})(R_{10a})$, $N(R_{11a})$, O, S, or Se, $R_{7a}$, $R_{7b}$, $R_{8a}$, $R_{8b}$, $R_{9a}$, $R_{10a}$, and $R_{11a}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_{4a}$ and $n_{4b}$ are each independently an integer from 0 to 4, $X_1$ to $X_3$, $R_1$ to $R_6$, $R_a$, $R_b$, $n_1$ to $n_3$, $n_a$, and $n_b$ are the same as defined in connection with Formula 1.

6. The light emitting device of claim 5, wherein the fused polycyclic compound represented by Formula 3 is represented by Formula 4:

[Formula 4]

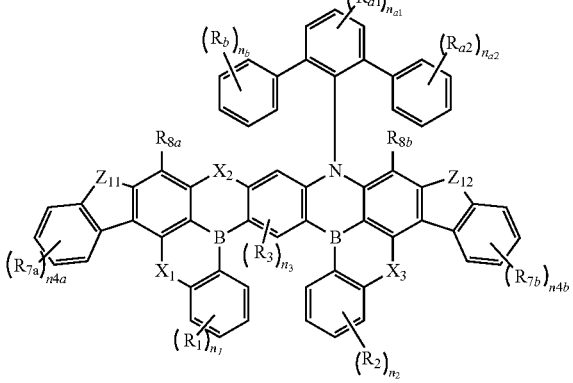

wherein in Formula 4, $R_{a1}$ and $R_{a2}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_{a1}$ is an integer from 0 to 3, $n_{a2}$ is an integer from 0 to 5, and $X_1$ to $X_3$, $Z_{11}$, $Z_{12}$, $R_1$ to $R_6$, $R_a$, $R_b$, $R_{7a}$, $R_{7b}$, $R_{8a}$, $R_{8b}$, $R_{9a}$, $R_{10a}$, $R_{11a}$, $n_1$ to $n_3$, $n_a$, $n_b$, $n_{4a}$, and $n_{4b}$ are the same as defined in connection with Formula 1 and Formula 3.

7. The light emitting device of claim 1, wherein at least one of Cy1 and Cy2 is represented by Formula 2-1a:

[Formula 2-1a]

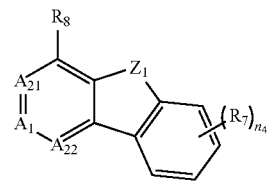

wherein in Formula 2-1a, $A_{21}$ is a position bonded to $X_2$ in Formula 1 or a position bonded to a nitrogen atom in Formula 1, $A_{22}$ is a position bonded to $X_1$ in Formula 1 or a position bonded to $X_3$ in Formula 1, and $A_1$, $Z_1$, $R_7$, $R_8$, and $n_4$ are the same as defined in connection with Formula 2-1.

8. The light emitting device of claim 1, wherein at least one of Cy1 and Cy2 is represented by Formula 2-1-1 or Formula 2-1-2:

[Formula 2-1-1]

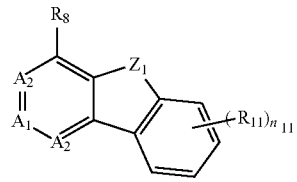

[Formula 2-1-2]

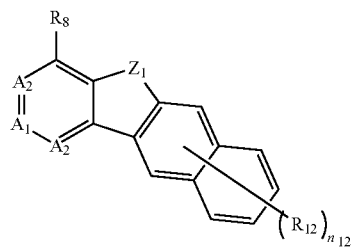

wherein in Formula 2-1-1 and Formula 2-1-2, $R_{11}$ and $R_{12}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, $n_{11}$ is an integer from 0 to 4, $n_{12}$ is an integer from 0 to 6, and $A_1$, $A_2$, $Z_1$, and $R_8$ are the same as defined in connection with Formula 2-1.

9. The light emitting device of claim 1, wherein in Formula 1, in case where each of $X_1$ to $X_3$ is $N(R_6)$, $R_6$ is a substituted or unsubstituted phenyl group.

10. The light emitting device of claim 1, wherein in Formula 1, Formula 2-1, and Formula 2-2, $R_1$ to $R_{12}$ are each independently a hydrogen atom, a deuterium atom, a substituted or unsubstituted methyl group, a substituted or unsubstituted t-butyl group, a substituted or unsubstituted phenyl group, or a substituted or unsubstituted biphenyl group.

11. The light emitting device of claim 1, further comprising a capping layer disposed on the second electrode, wherein the capping layer has a refractive index equal to or greater than about 1.6.

12. The light emitting device of claim 1, further comprising an encapsulating layer disposed on the second electrode, wherein the encapsulating layer comprises at least one inorganic layer and at least one organic layer.

13. The light emitting device of claim 1, wherein the fused polycyclic compound comprises at least one selected from Compound Group 1:

[Compound Group 1]

1

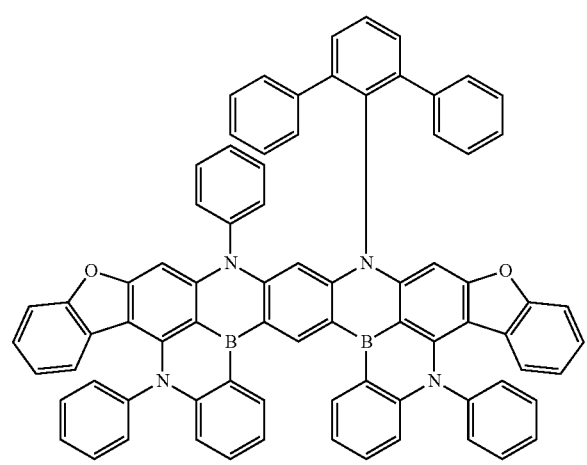

2

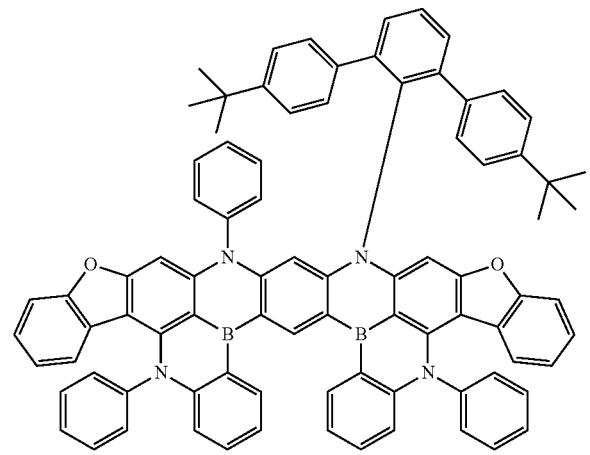

3

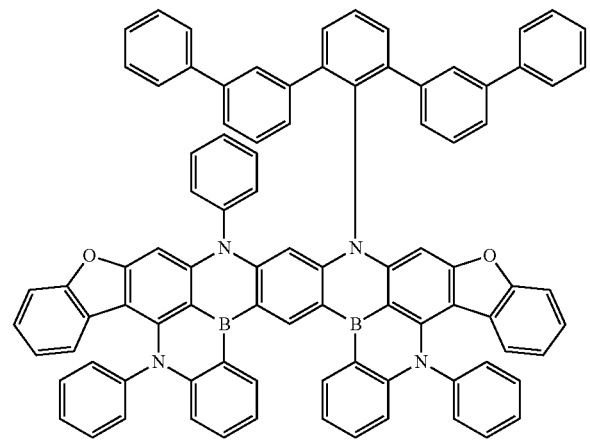

4

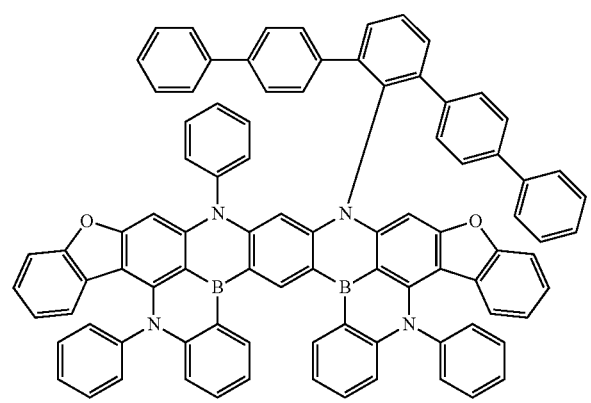

5
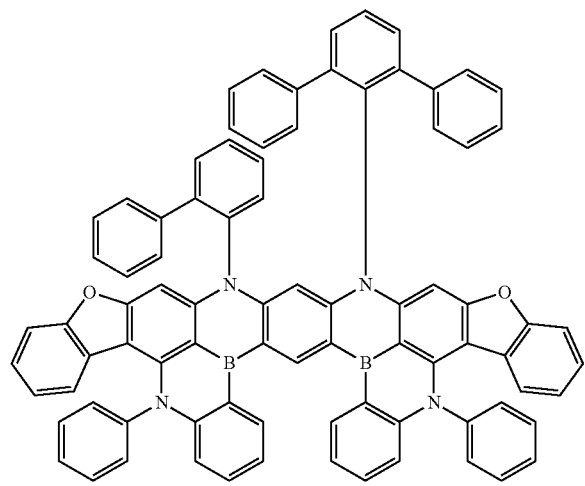
6
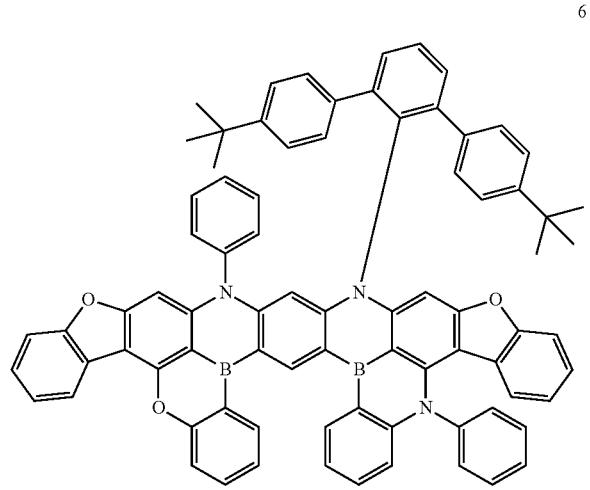
7
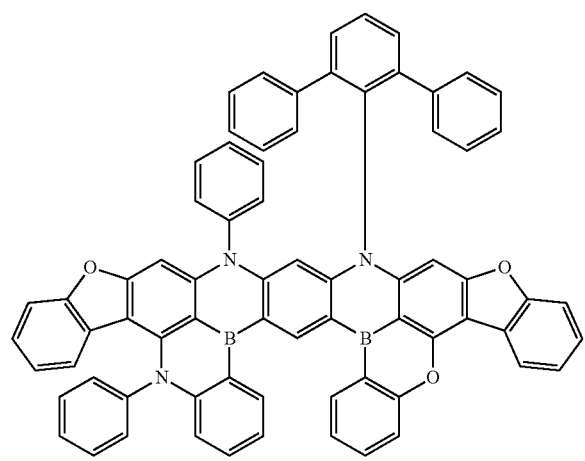
8
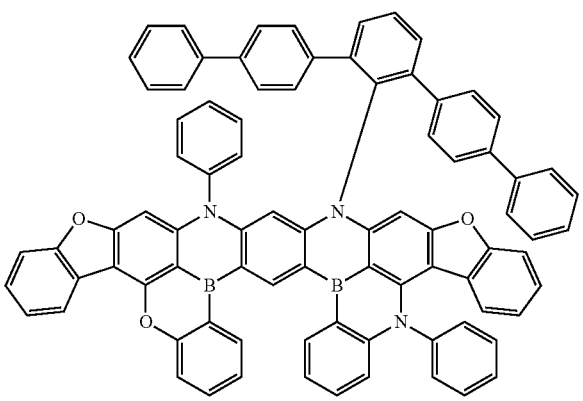
9
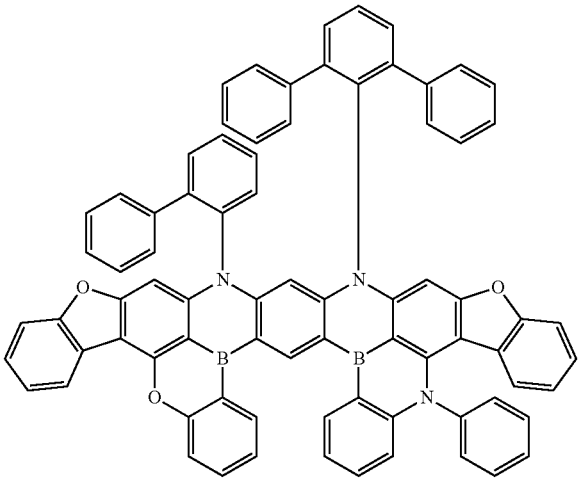
10
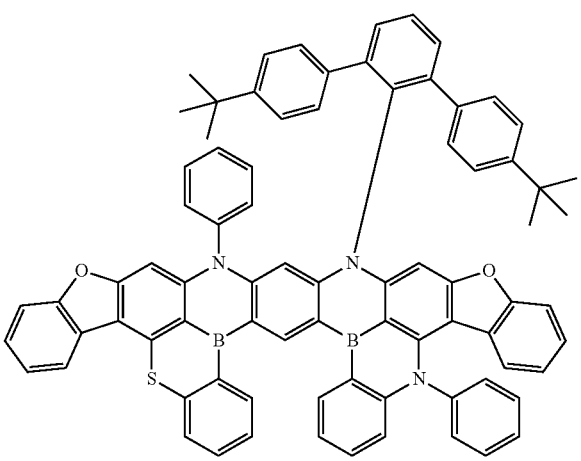

11
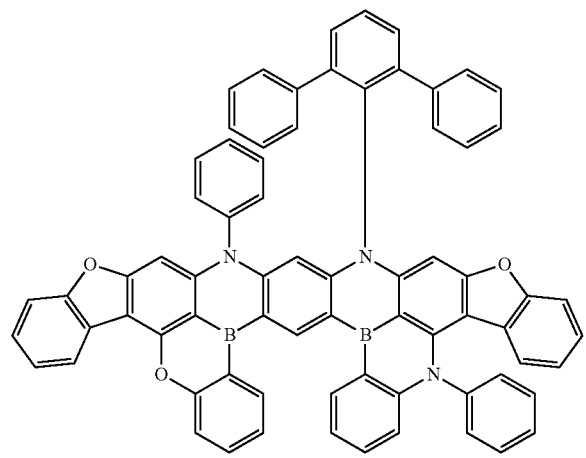
12
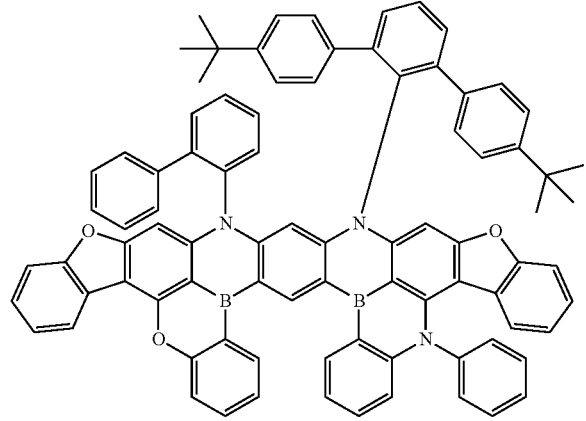
13
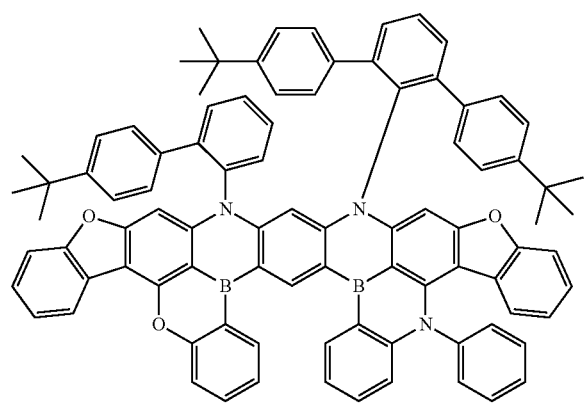
14
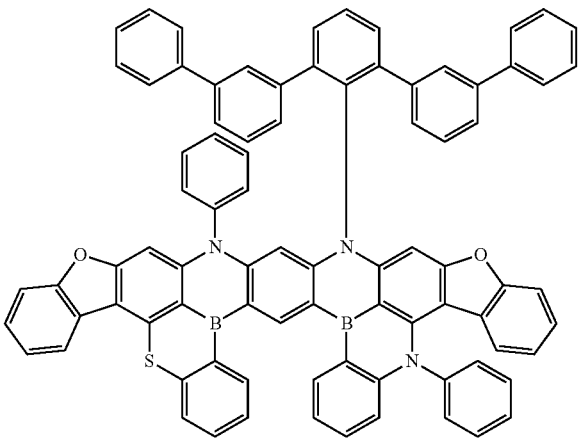
15
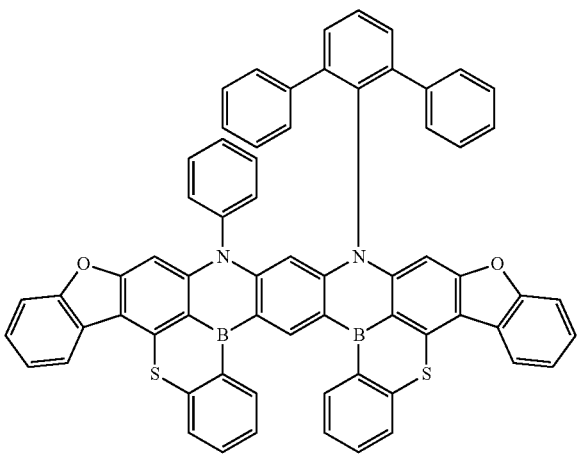
16

17
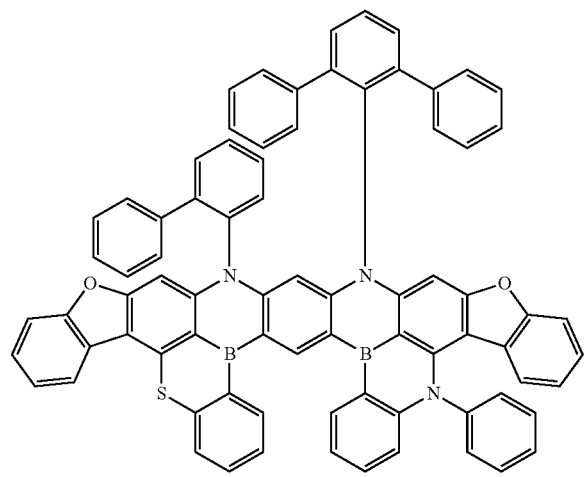
18
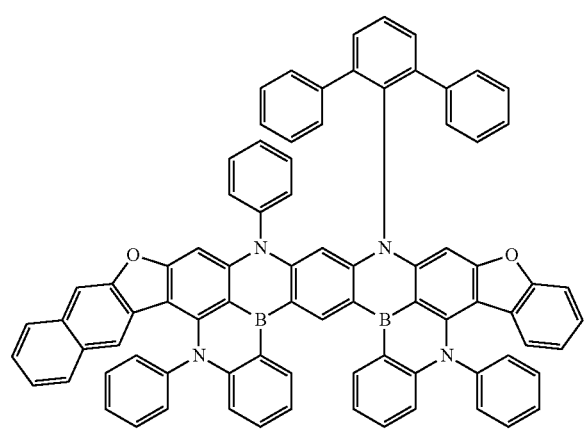
19
20
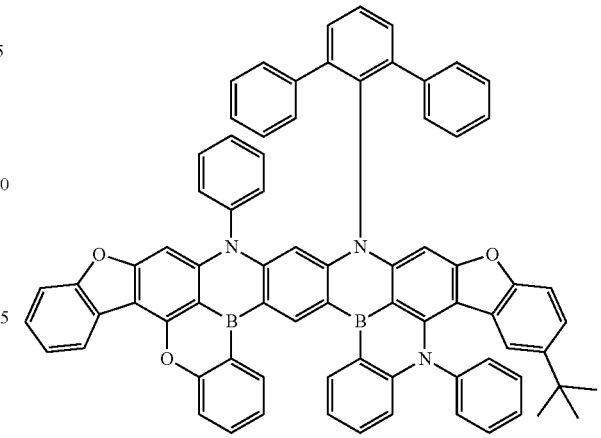
21
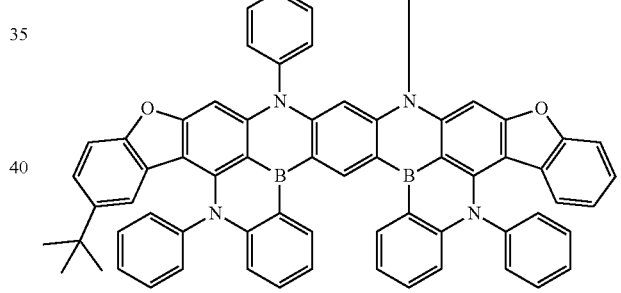
22
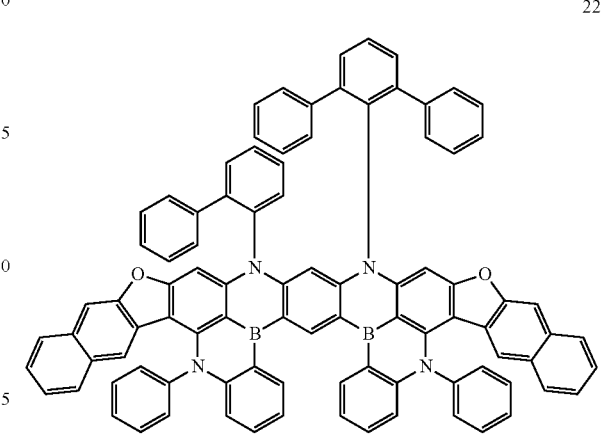

151 -continued
23
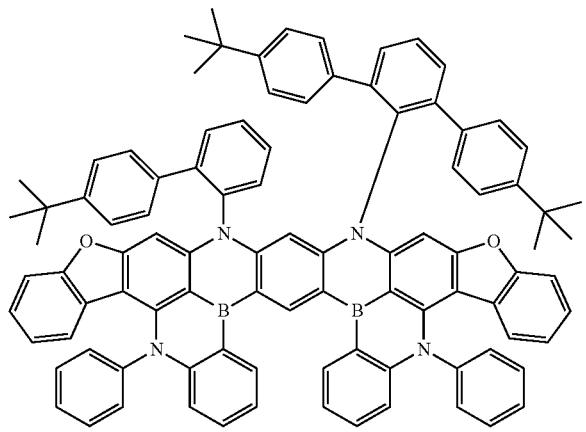
24
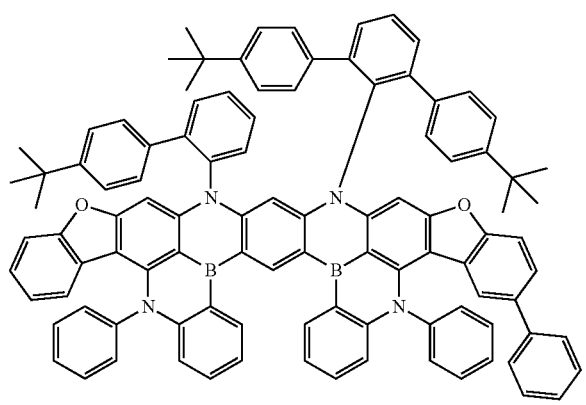
25
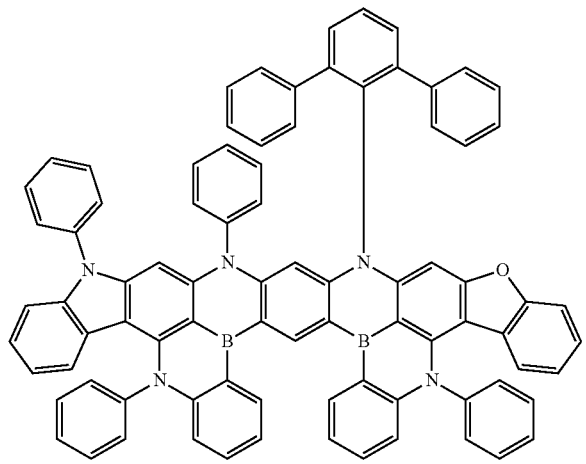
152 -continued
26
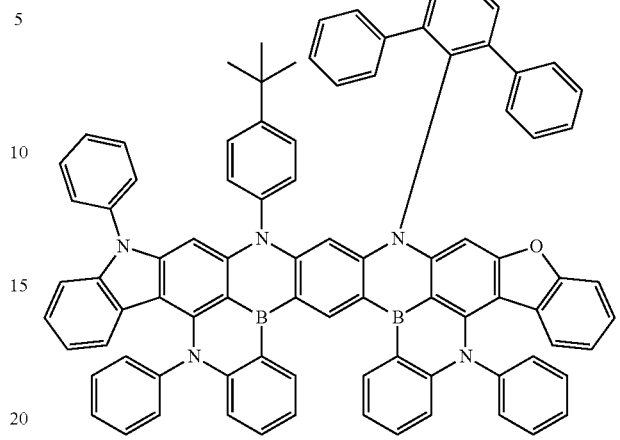
27
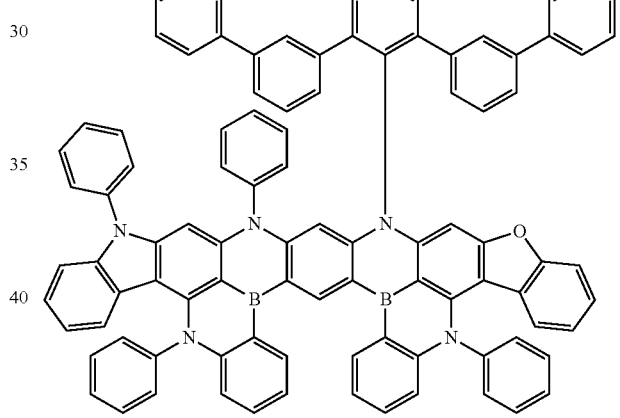
28
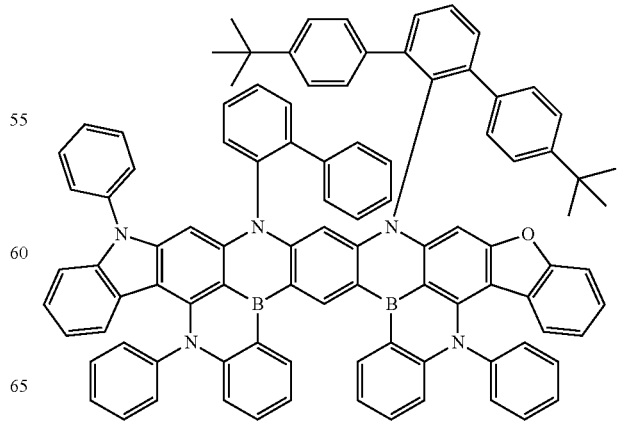

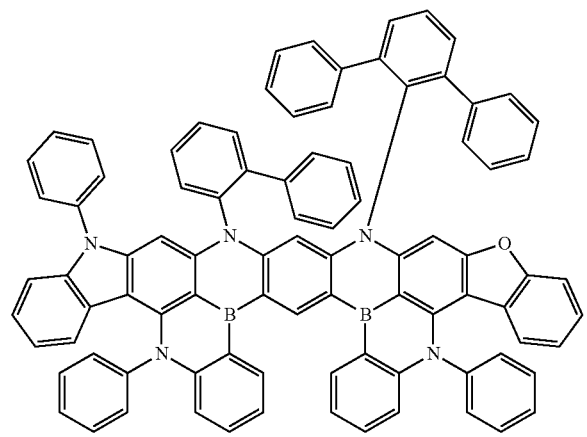
29
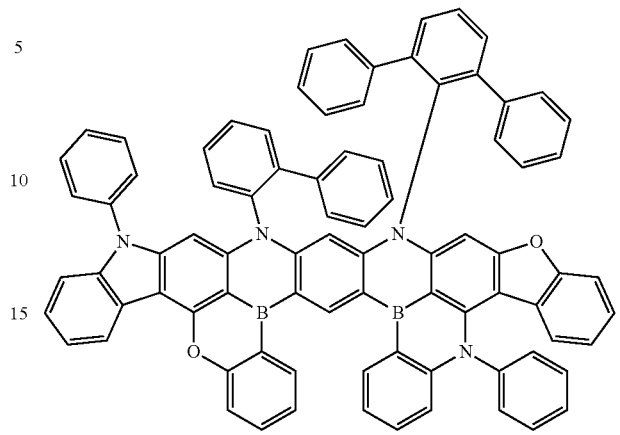
32
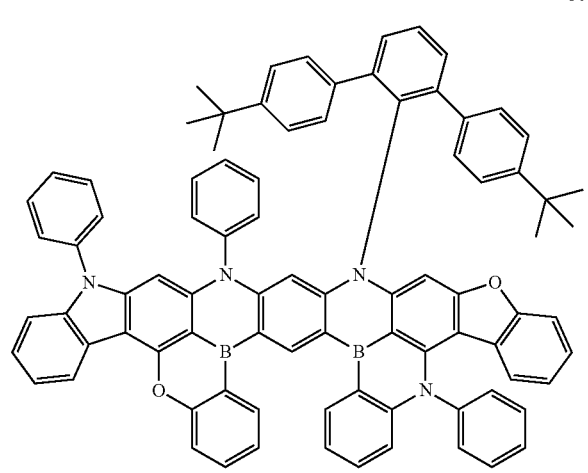
30
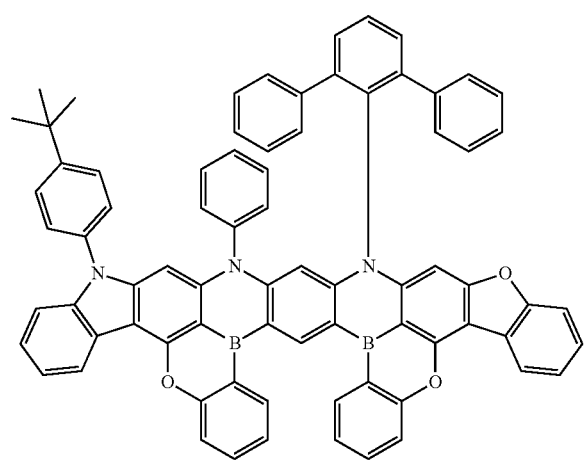
31
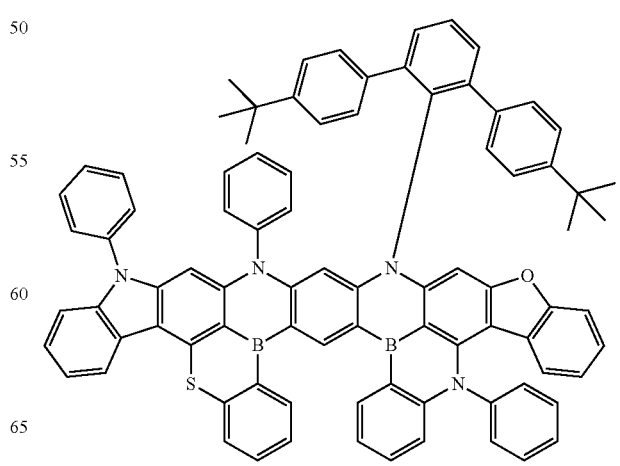
34

35
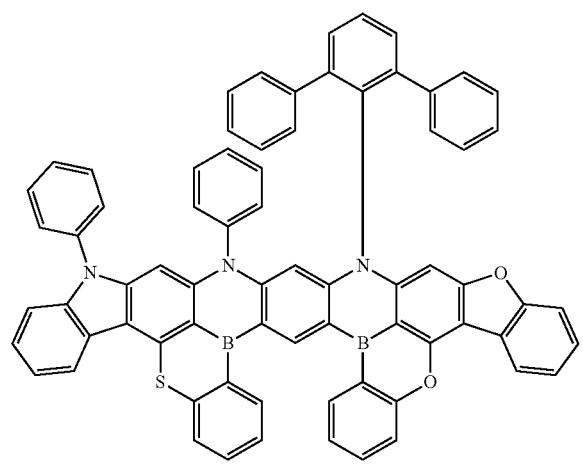
36
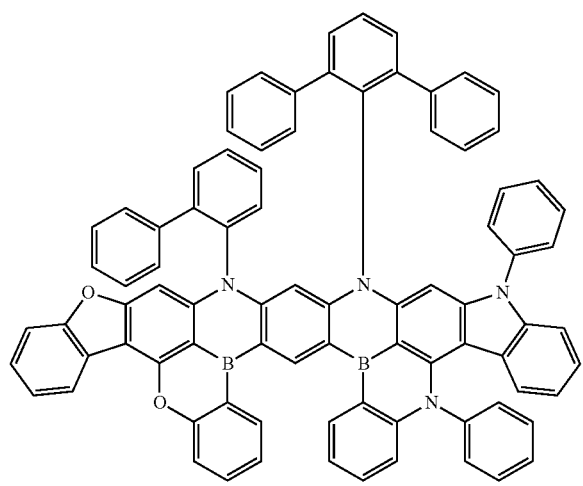
37
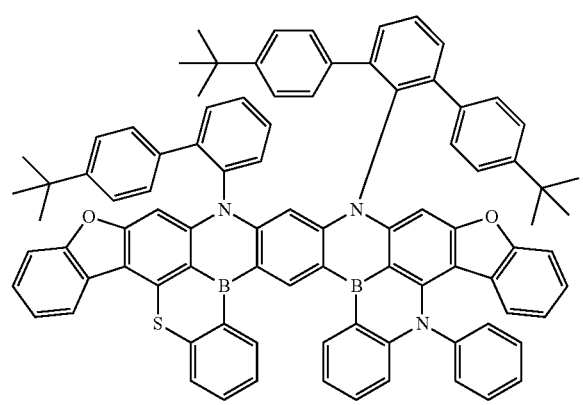
38
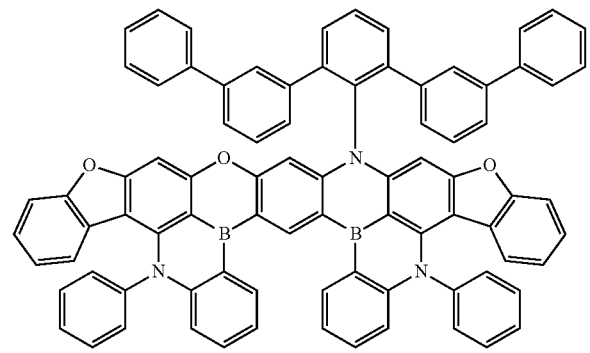
39
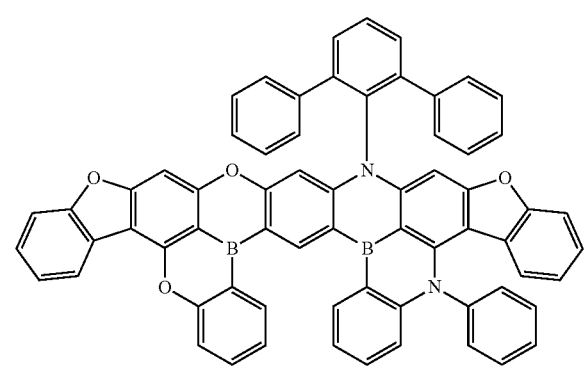
40
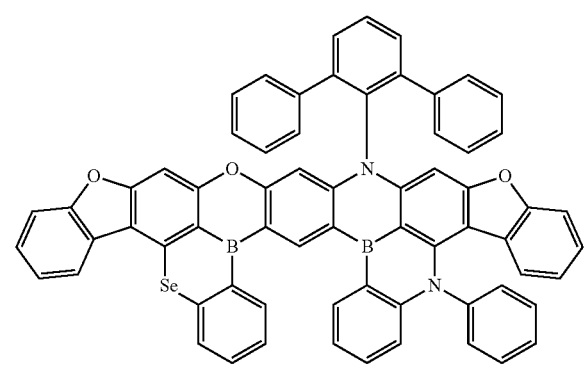
41
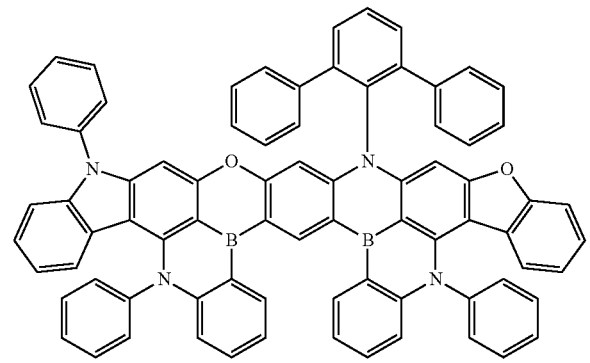

42
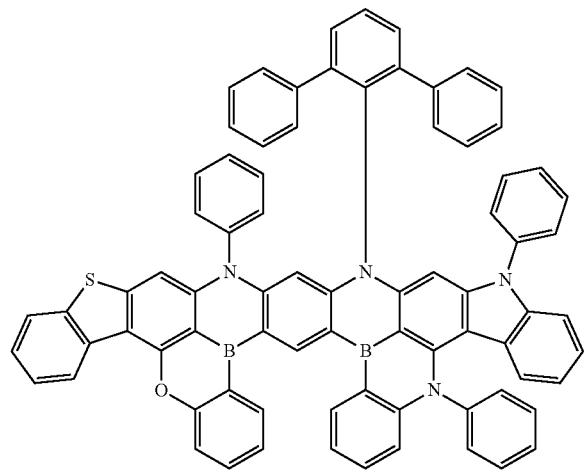
43
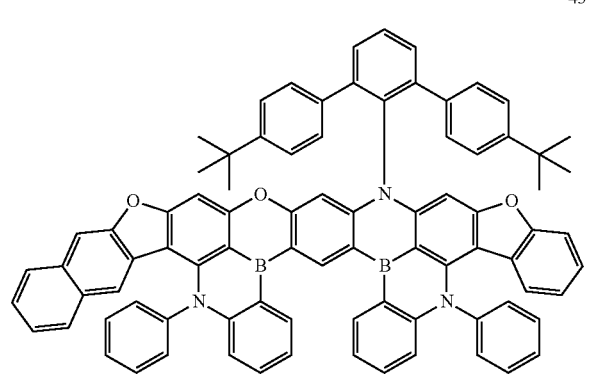
44
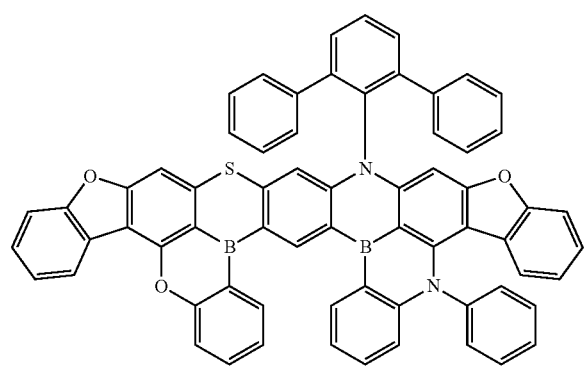
45
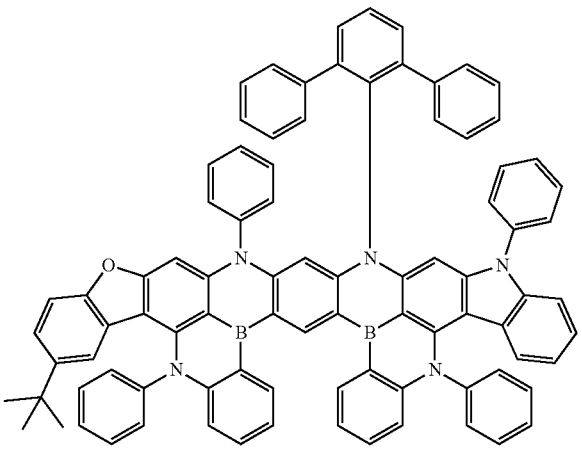
46
47
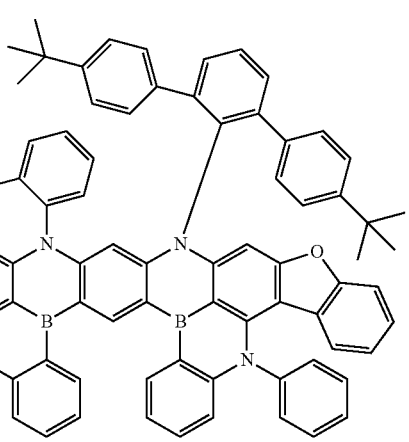

48
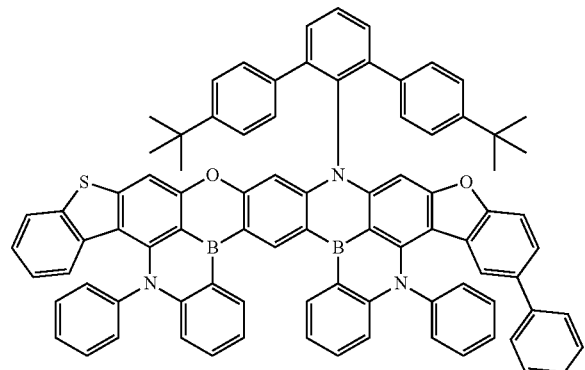
49
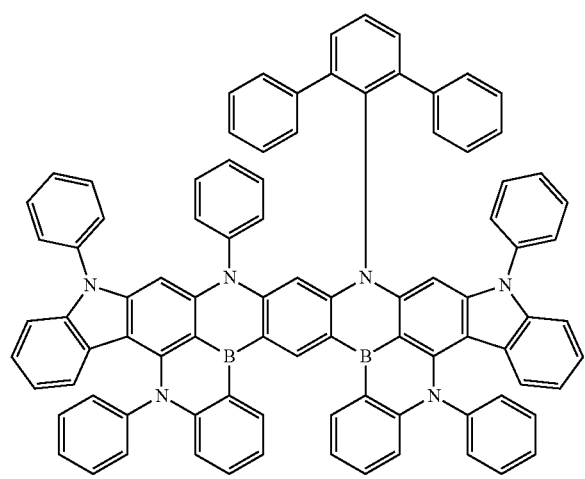
50
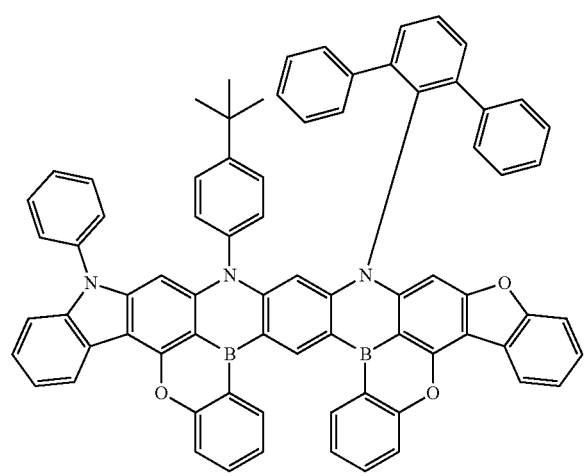
51
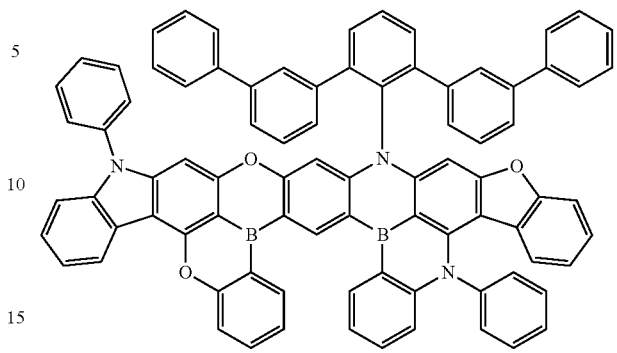
52
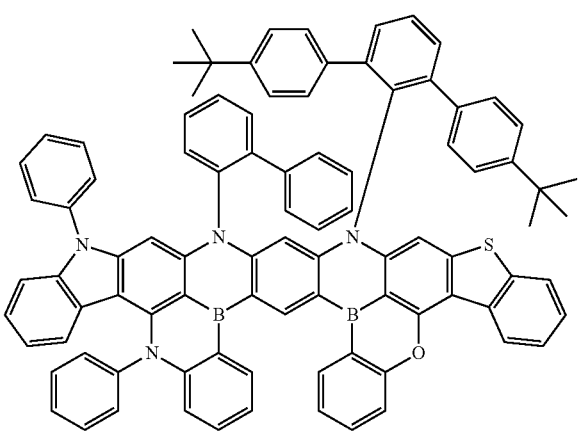
53
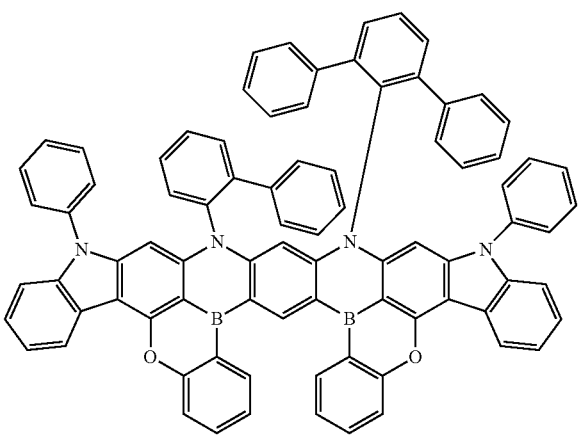

54
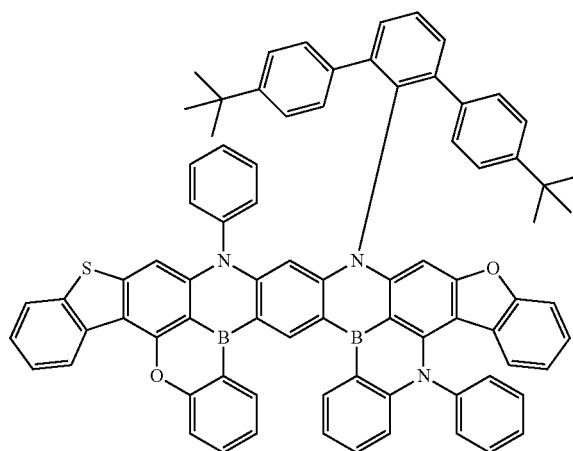
55
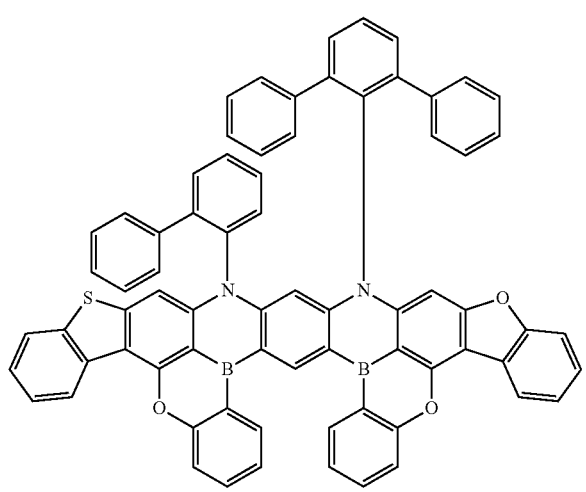
56
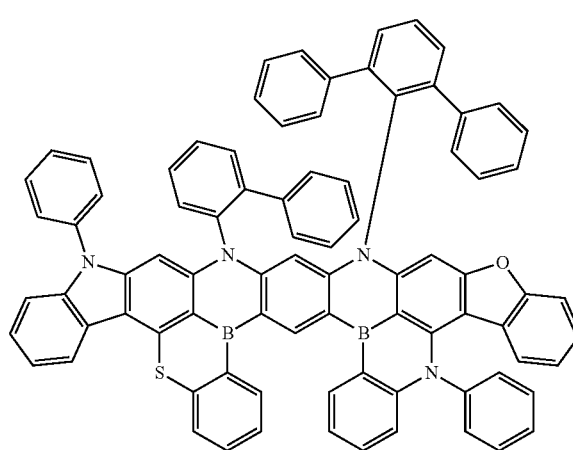
57
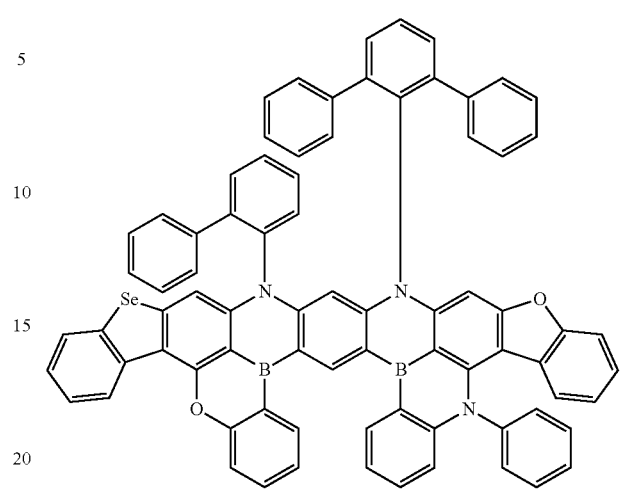
58
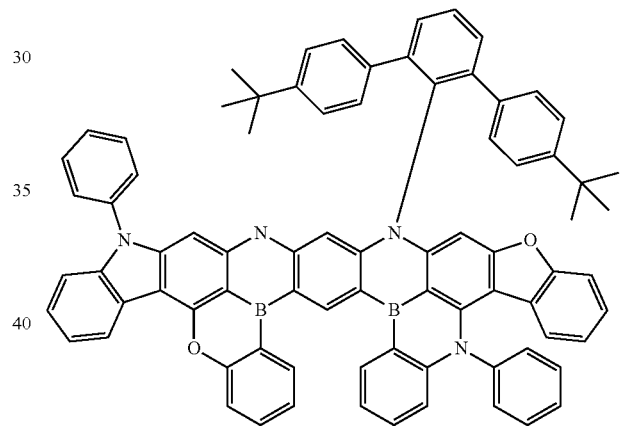
59
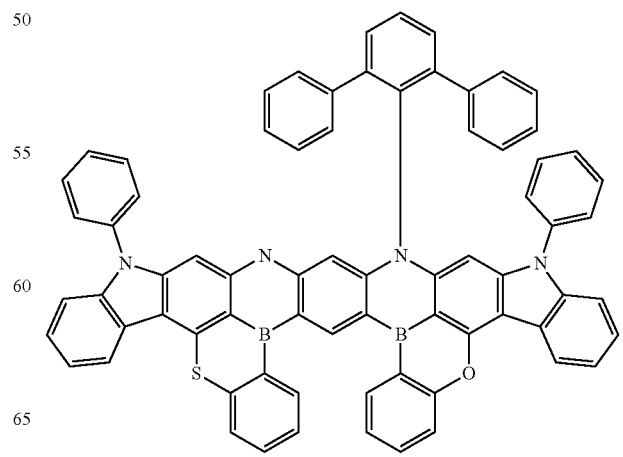

163
-continued
60
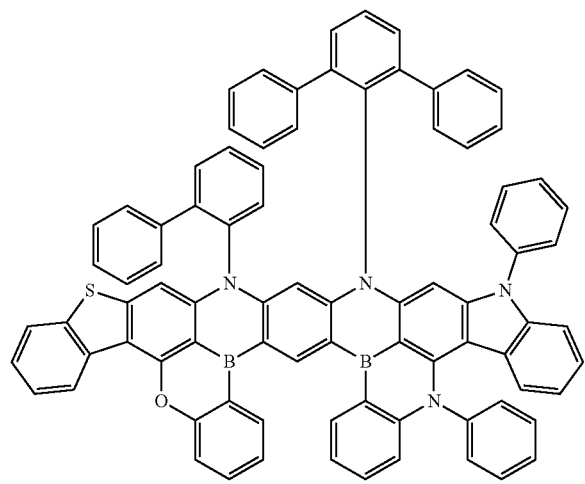
61
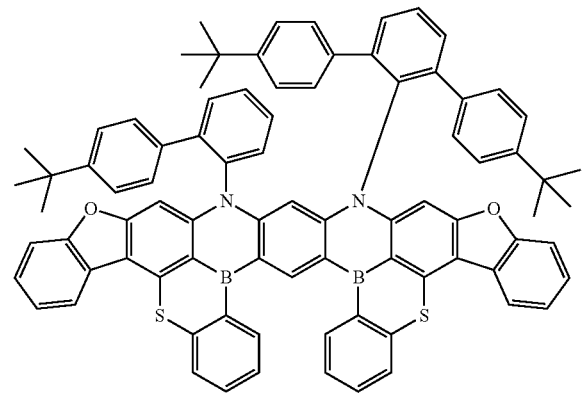
62
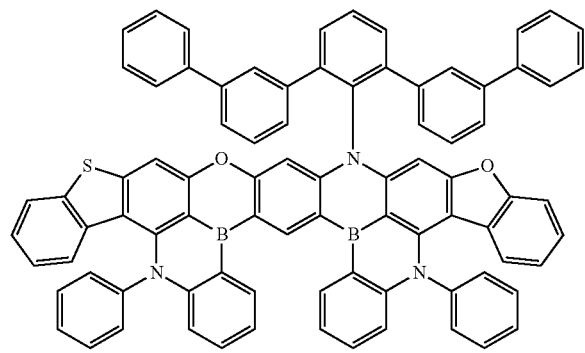
164
-continued
63
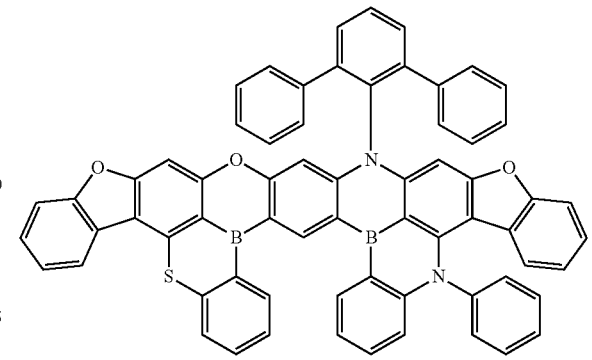
64
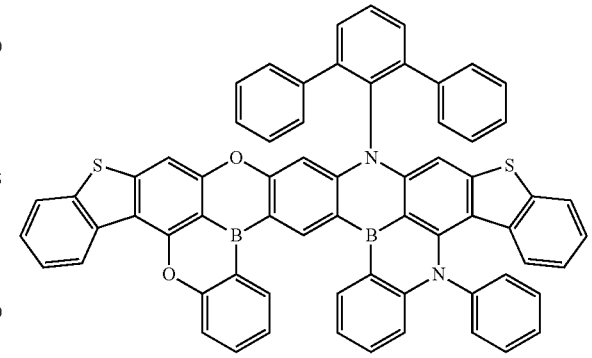
65
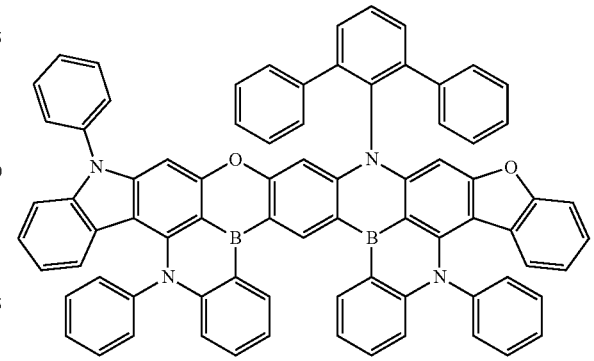
66
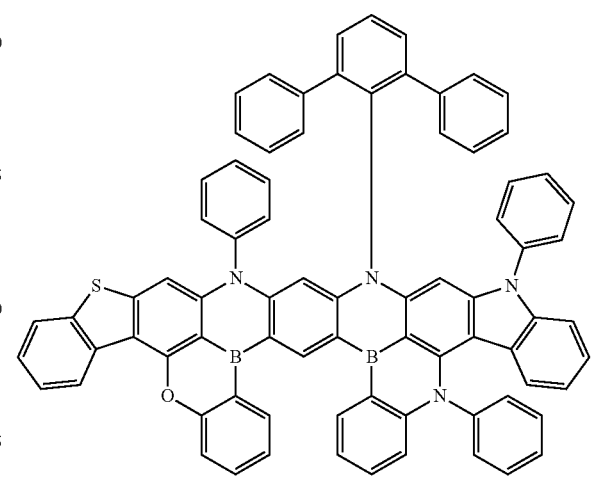

67
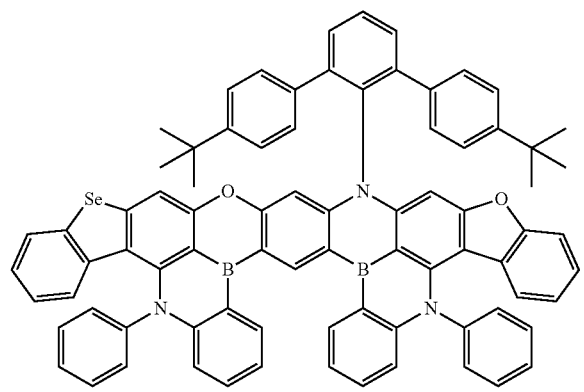
68
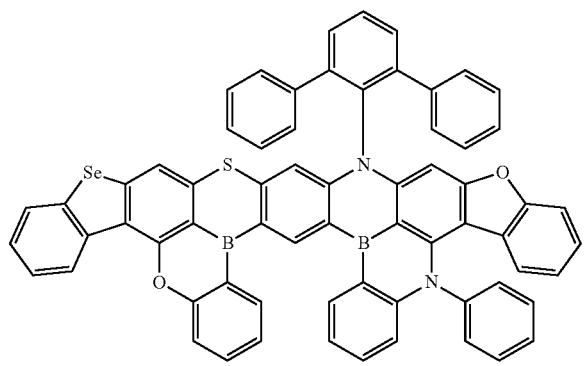
69
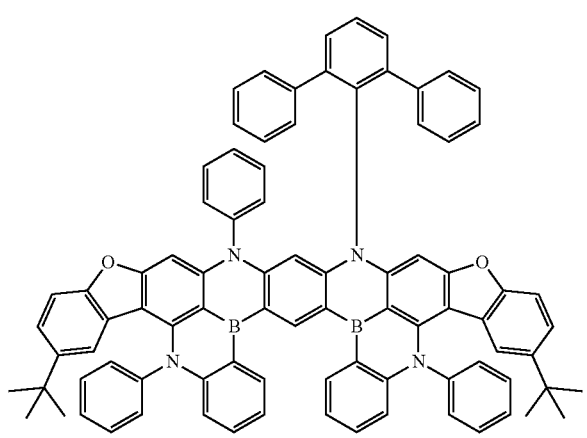
70
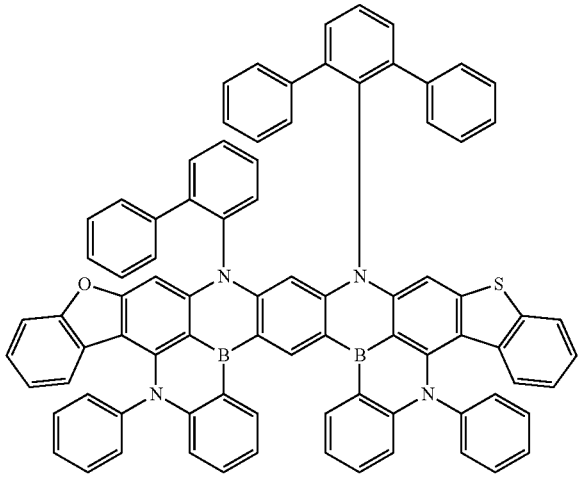
71
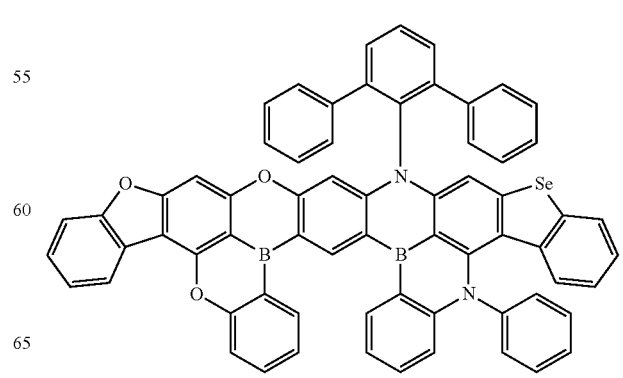
72

73
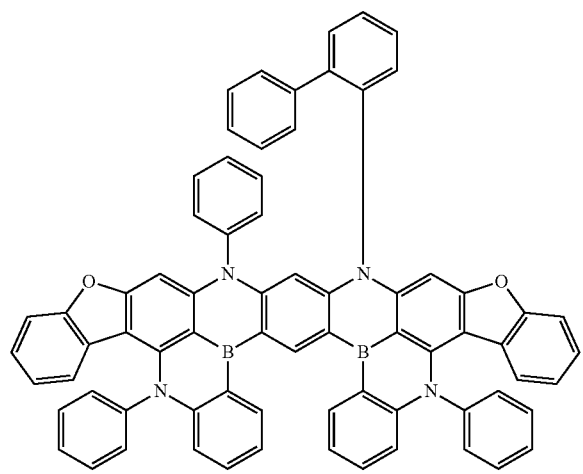
74
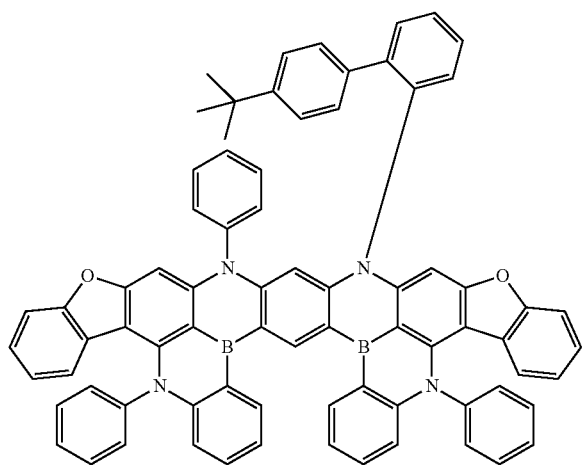
75
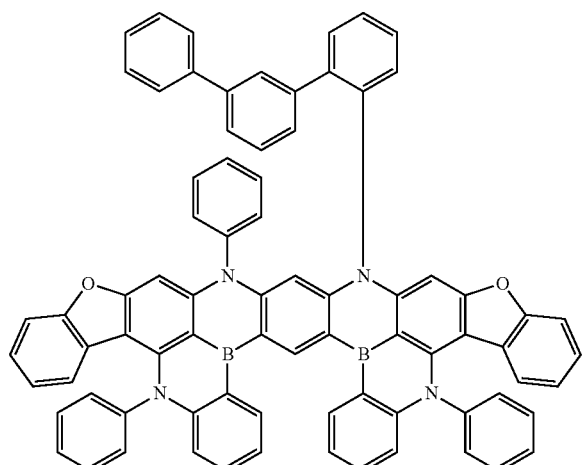
76
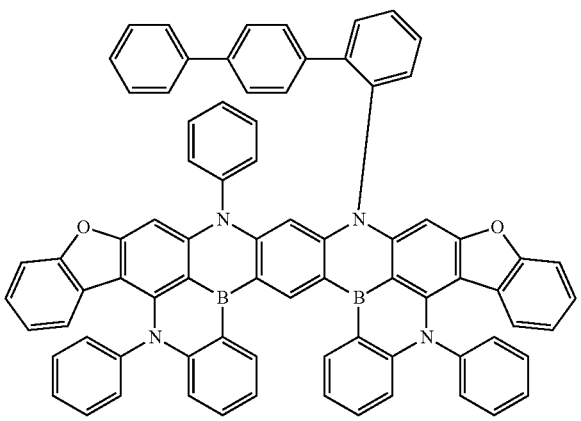
77
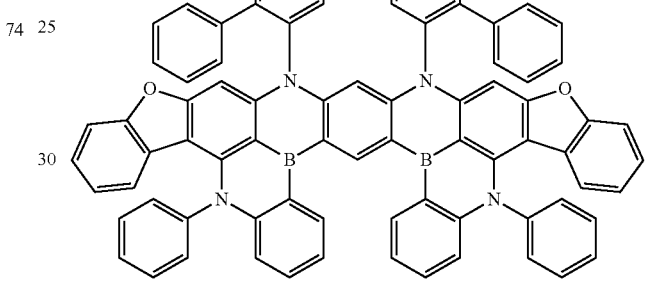
78
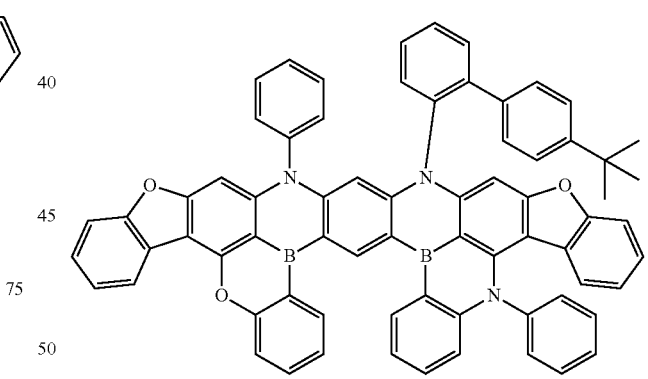
79
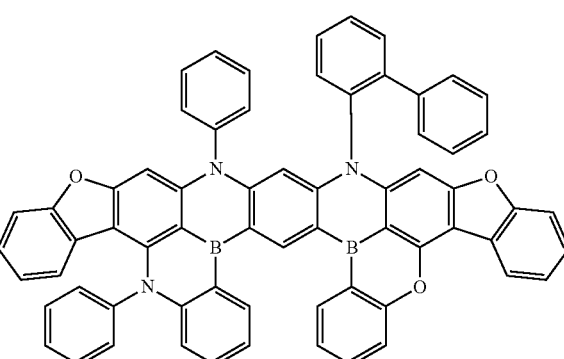

80
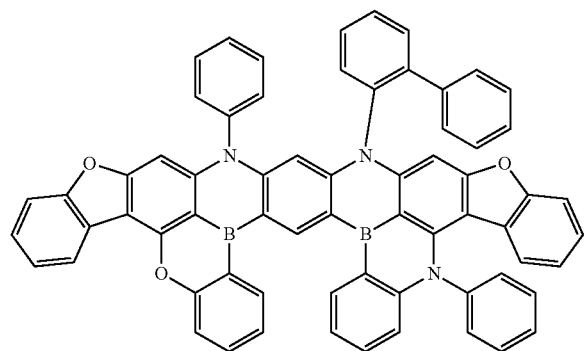
81
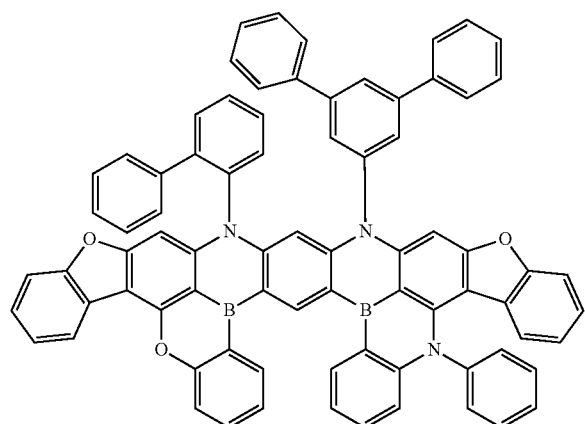
82
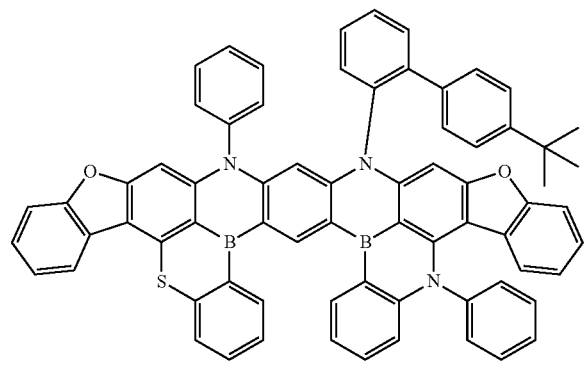
83
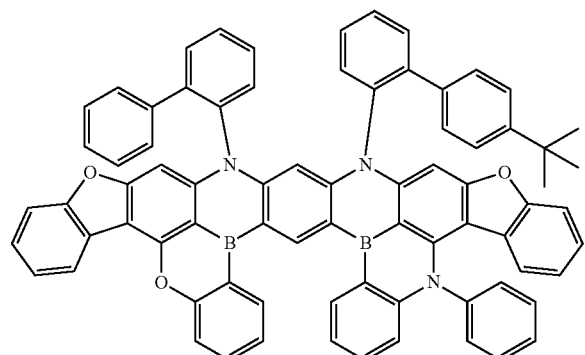
84
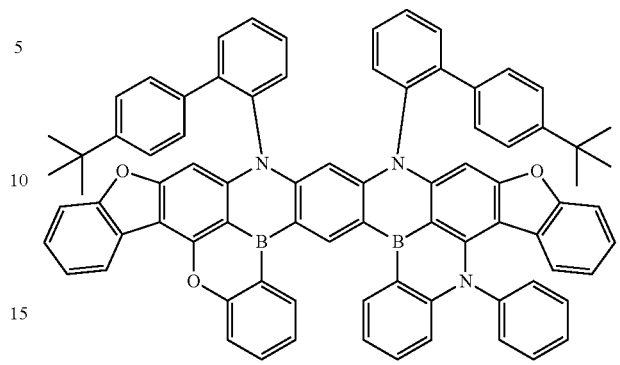
85
86
87
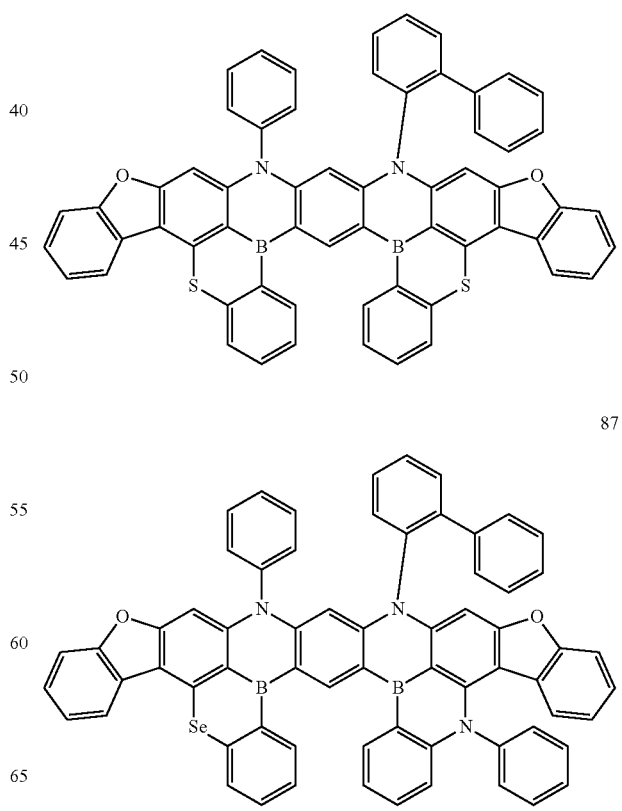

88
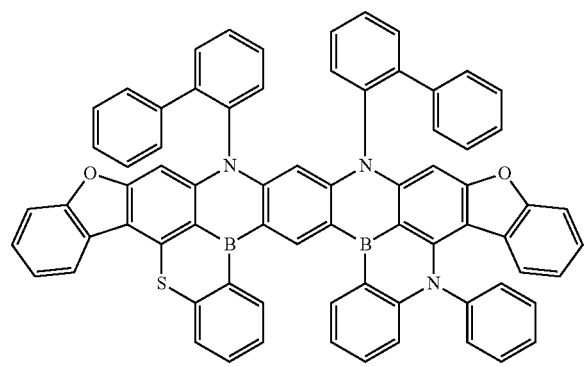
89
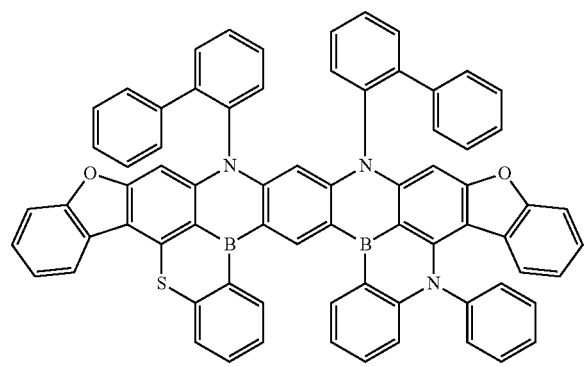
90
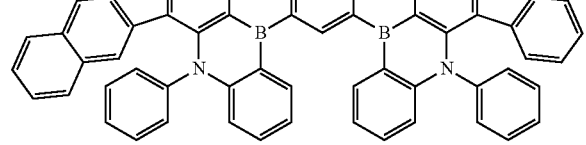
91
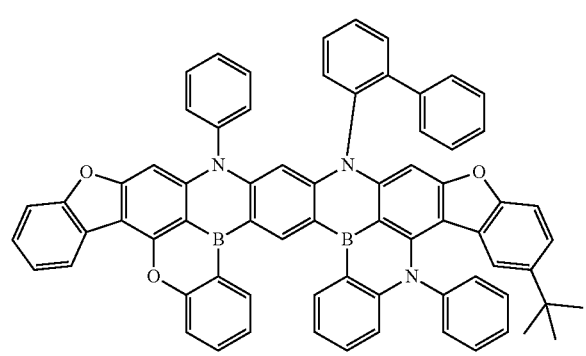
92
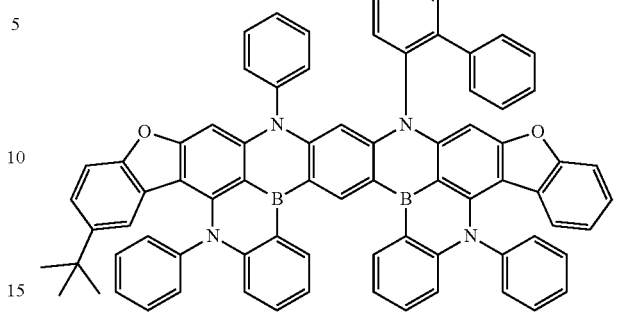
93
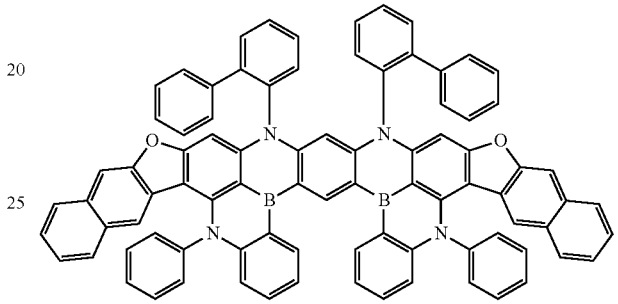
94
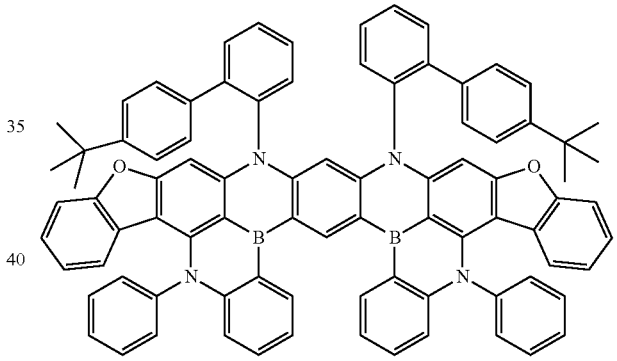
95
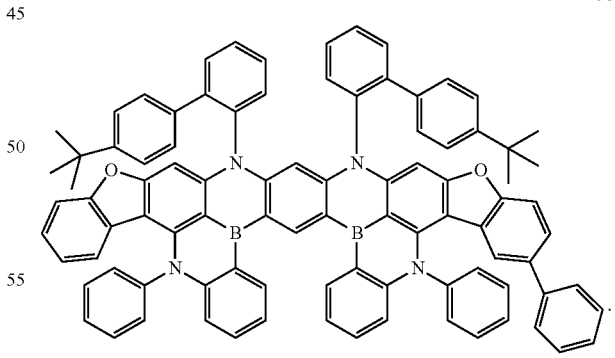
14. A light emitting device, comprising:
a first electrode;
a second electrode facing the first electrode; and
an emission layer disposed between the first electrode and the second electrode, wherein
the emission layer comprises a host and a delayed fluorescence dopant, and the delayed fluorescence dopant comprises a fused polycyclic compound represented by Formula 1:

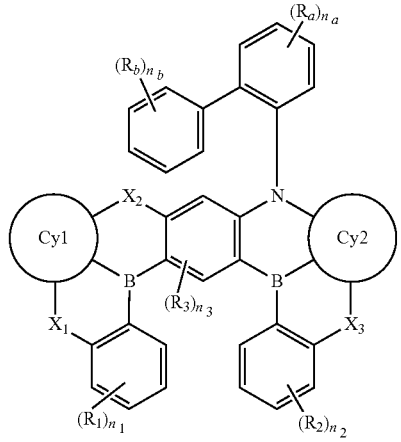

[Formula 1]

wherein in Formula 1, $X_1$ to $X_3$ are each independently $C(R_4)(R_5)$, $N(R_6)$, O, S, or Se, $R_1$ to $R_6$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $R_a$ and $R_b$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_1$ and $n_2$ are each independently an integer from 0 to 4, $n_3$ is an integer from 0 to 2, $n_a$ is an integer from 0 to 4, $n_b$ is an integer from 0 to 5, Cy1 and Cy2 are each independently a group represented by Formula 2-1 or Formula 2-2, and at least one of Cy1 and Cy2 is represented by Formula 2-1:

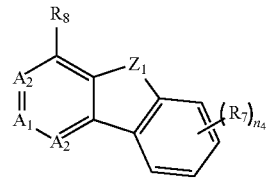

[Formula 2-1]

wherein in Formula 2-1, $Z_1$ is $C(R_9)(R_{10})$, $N(R_{11})$, O, S, or Se, $R_7$ to $R_{11}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_4$ is an integer from 0 to 4, $A_1$ is a position bonded to a boron atom in Formula 1, and $A_2$ are positions bonded to $X_1$ and $X_2$ in Formula 1, or positions bonded to a nitrogen atom and $X_3$ in Formula 1,

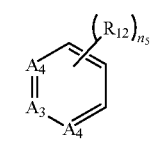

[Formula 2-2]

wherein in Formula 2-2, $R_{12}$ is a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, $n_5$ is an integer from 0 to 3, $A_3$ is a position bonded to a boron atom in Formula 1, and $A_4$ are positions bonded to $X_1$ and $X_2$ in Formula 1, or positions bonded to a nitrogen atom and $X_3$ in Formula 1.

15. The light emitting device of claim 14, wherein the host comprises a compound represented by Formula E-2a or Formula E-2b:

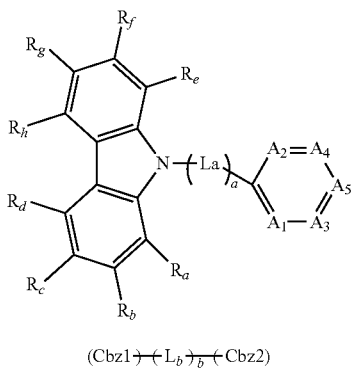

[Formula E-2a]

(Cbz1)─(L$_b$)$_{\overline{b}}$─(Cbz2)    [Formula E-2b]

wherein in Formula E-2a, a is an integer from 0 to 10,

L$_a$ is a direct linkage, a substituted or unsubstituted arylene group of 6 to 30 ring-forming carbon atoms, or a substituted or unsubstituted heteroarylene group of 2 to 30 ring-forming carbon atoms, A$_1$ to A$_5$ are each independently N or C(R$_i$), two or three of A$_1$ to A$_5$ are N, and the remainder of A$_1$ to A$_5$ are C(R$_i$), and R$_a$ to R$_i$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, and wherein in Formula E-2b, Cbz1 and Cbz2 are each independently an unsubstituted carbazole group, or a carbazole group substituted with an aryl group of 6 to 30 ring-forming carbon atoms, L$_b$ is a direct linkage, a substituted or unsubstituted arylene group of 6 to 30 ring-forming carbon atoms, or a substituted or unsubstituted heteroarylene group of 2 to 30 ring-forming carbon atoms, and b is an integer from 0 to 10.

16. The light emitting device of claim 14, further comprising a hole transport region disposed between the first electrode and the emission layer, wherein the hole transport region comprises a compound represented by Formula H-a:

[Formula H-a]

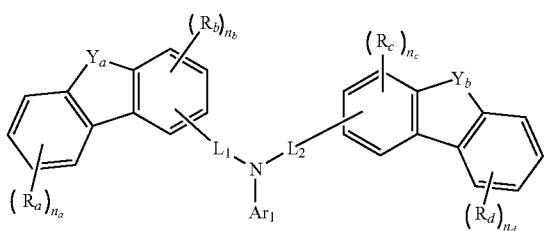

wherein in Formula H-a,

Y$_a$ and Y$_b$ are each independently C(R$_e$)(R$_f$), N(R$_g$), O, or S,

Ar$_1$ is a substituted or unsubstituted aryl group of 6 to 30 ring-forming carbon atoms, or a substituted or unsubstituted heteroaryl group of 2 to 30 ring-forming carbon atoms, L$_1$ and L$_2$ are each independently a direct linkage, a substituted or unsubstituted arylene group of 6 to 30 ring-forming carbon atoms, or a substituted or unsubstituted heteroarylene group of 2 to 30 ring-forming carbon atoms, R$_a$ to R$_g$ are each independently a hydrogen atom, a deuterium atom, a substituted or unsubstituted amine group, a substituted or unsubstituted thio group, a substituted or unsubstituted oxy group, a substituted or unsubstituted alkyl group of 1 to 20 carbon atoms, a substituted or unsubstituted alkenyl group of 2 to 20 carbon atoms, a substituted or unsubstituted aryl group of 6 to 30 ring-forming carbon atoms, or a substituted or unsubstituted heteroaryl group of 2 to 30 ring-forming carbon atoms, or are combined with an adjacent group to form a ring, n$_a$ and n$_d$ are each independently an integer from 0 to 4, and n$_b$ and n$_c$ are each independently an integer 0 to 3.

17. The light emitting device of claim 14, wherein the fused polycyclic compound represented by Formula 1 is represented by Formula 3:

[Formula 3]

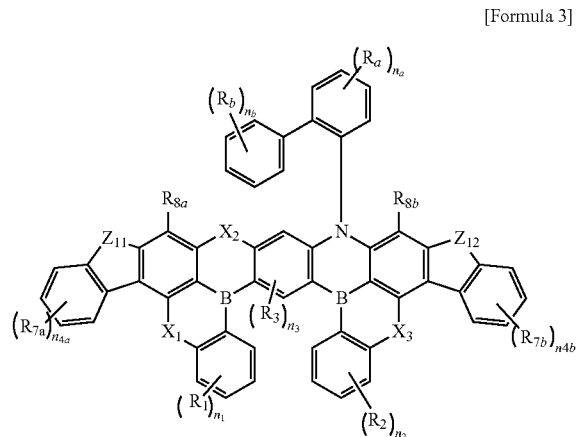

wherein in Formula 3,

Z$_{11}$ and Z$_{12}$ are each independently C(R$_{9a}$)(R$_{10a}$), N(R$_{11a}$), O, S, or Se, R$_{7a}$, R$_{7b}$, R$_{8a}$, R$_{8b}$, R$_{9a}$, R$_{10a}$, and R$_{11a}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring, n$_{4a}$ and n$_{4b}$ are each independently an integer from 0 to 4, $X_1$ to $X_3$, $R_1$ to $R_6$, $R_a$, $R_b$, $n_1$ to $n_3$, $n_a$, and $n_b$ are the same as defined in connection with Formula 1.

18. The light emitting device of claim 17, wherein the fused polycyclic compound represented by Formula 3 is represented by Formula 4:

[Formula 4]

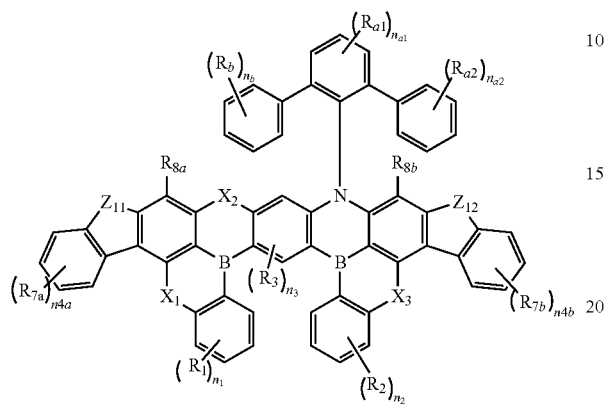

wherein in Formula 4,
$R_{a1}$ and $R_{a2}$ are each independently a hydrogen atom, a deuterium atom, a halogen atom, a cyano group, a nitro group, a substituted or unsubstituted amine group, a substituted or unsubstituted silyl group, a substituted or unsubstituted boron group, a substituted or unsubstituted oxy group, a substituted or unsubstituted thio group, a substituted or unsubstituted carbonyl group, a substituted or unsubstituted alkyl group of 2 to 30 carbon atoms, a substituted or unsubstituted aryl group of 6 to 60 ring-forming carbon atoms, or a substituted or unsubstituted heteroaryl group of 2 to 60 ring-forming carbon atoms, or are combined with an adjacent group to form a ring,
$n_{a1}$ is an integer from 0 to 3,
$n_{a2}$ is an integer from 0 to 5, and
$X_1$ to $X_3$, $Z_{11}$, $Z_{12}$, $R_1$ to $R_6$, $R_a$, $R_b$, $R_{7a}$, $R_{7b}$, $R_{8a}$, $R_{8b}$, $R_{9a}$, $R_{10a}$, $R_{11a}$, $n_1$ to $n_3$, $n_a$, $n_b$, $n_{4a}$, and $n_{4b}$ are the same as defined in connection with Formula 1 and Formula 3.

19. The light emitting device of claim 14, wherein at least one of Cy1 and Cy2 is represented by Formula 2-1a:

[Formula 2-1a]

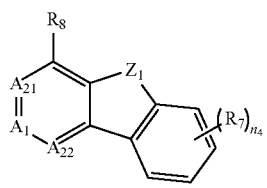

wherein in Formula 2-1a,
$A_{21}$ is a position bonded to $X_2$ in Formula 1 or a position bonded to a nitrogen atom in Formula 1,
$A_{22}$ is a position bonded to $X_1$ in Formula 1 or a position bonded to $X_3$ in Formula 1, and
$A_1$, $Z_1$, $R_7$, $R_8$, and $n_4$ are the same as defined in connection with Formula 2-1.

20. The light emitting device of claim 14, wherein the fused polycyclic compound comprises at least one selected from Compound Group 1:

[Compound Group 1]

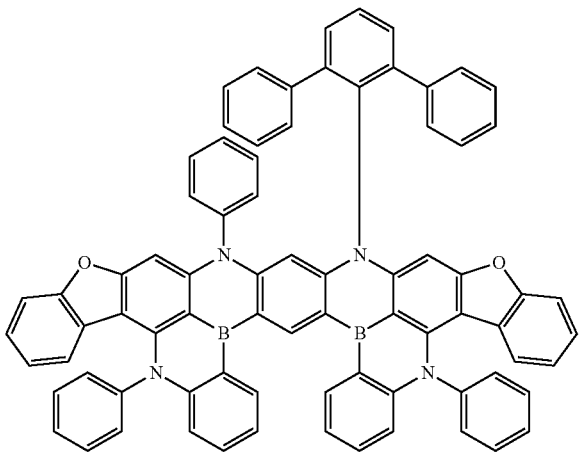

1

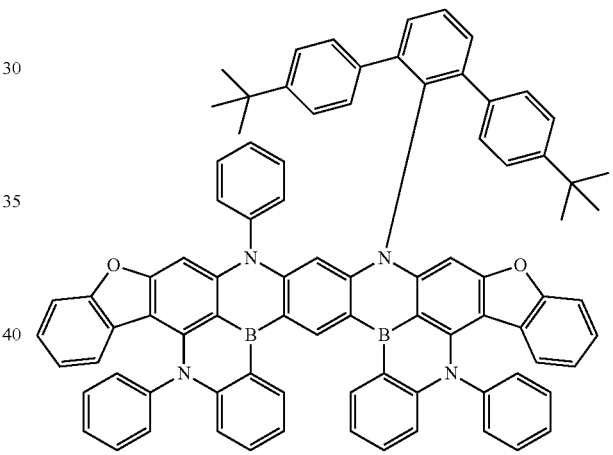

2

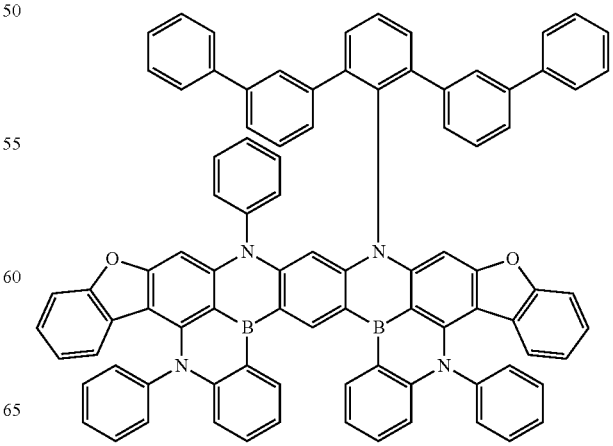

3

4
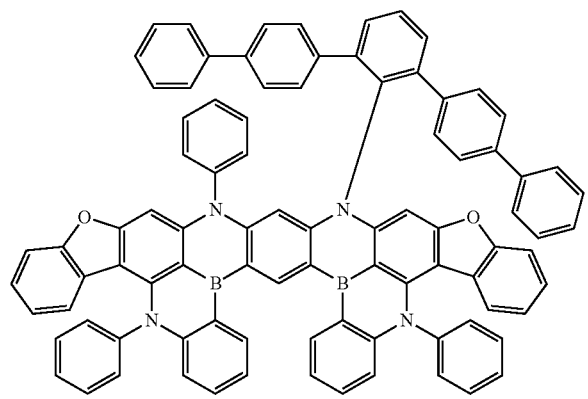
5
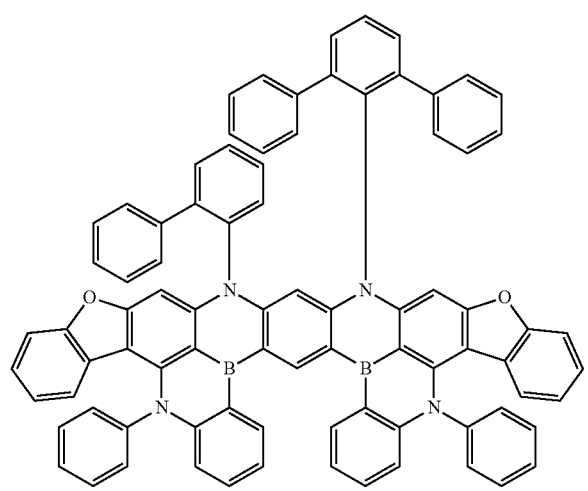
6
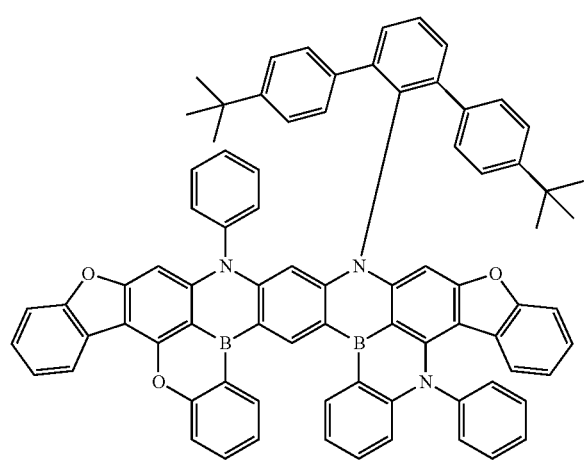
7
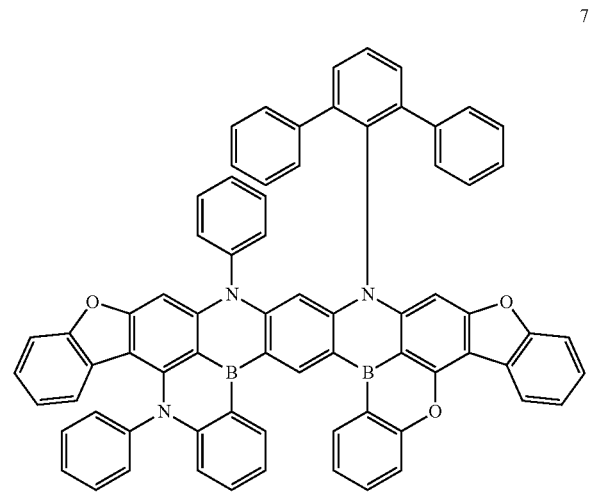
8
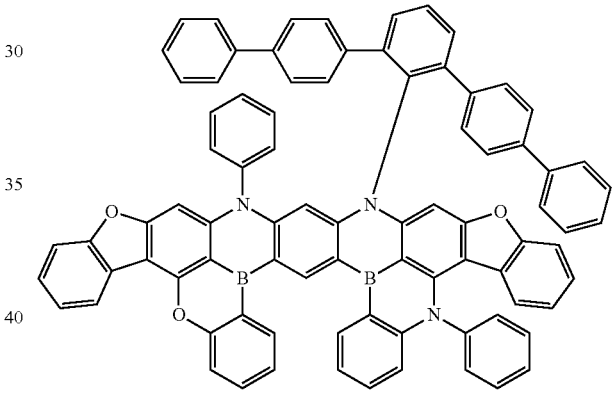
9
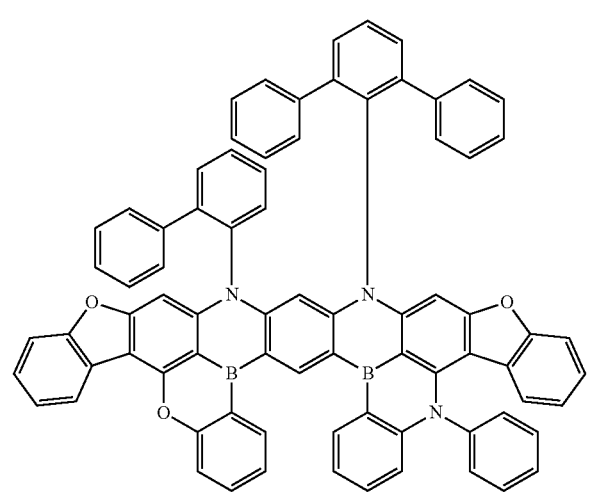

10
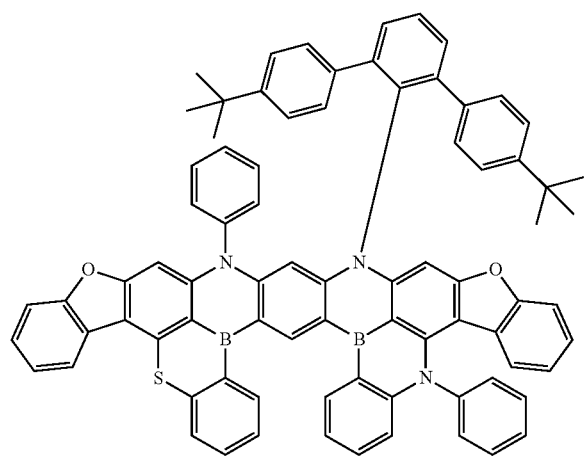
11
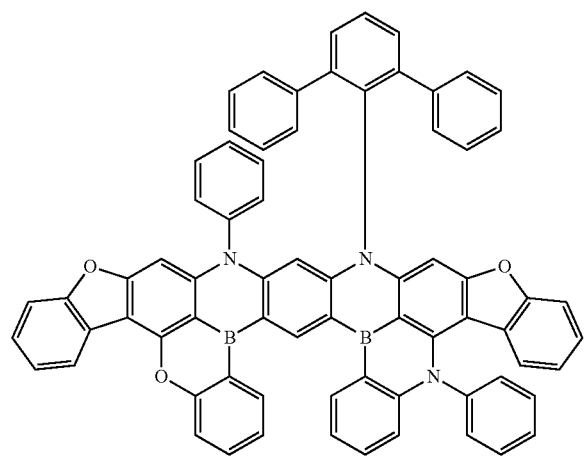
12
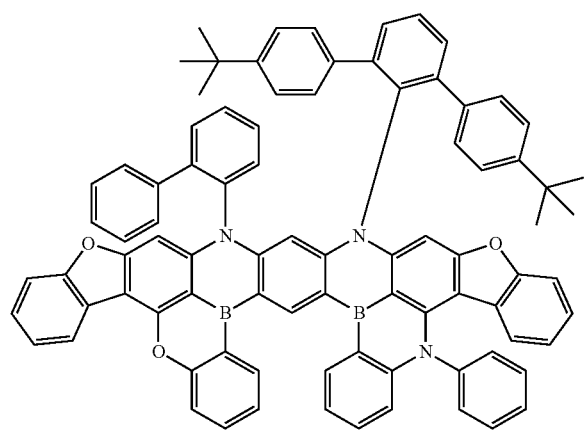
13
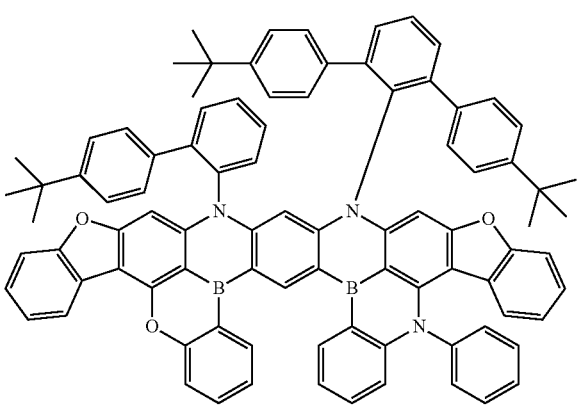
14
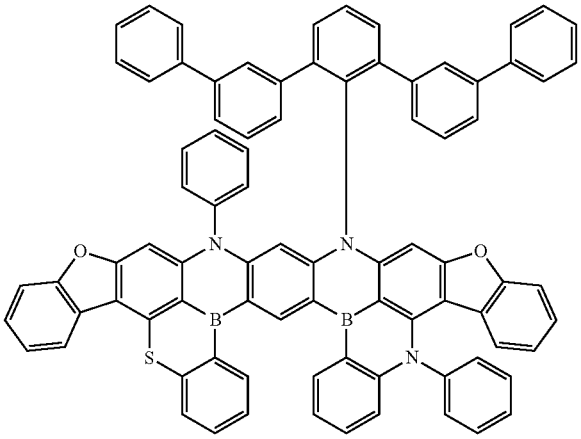
15
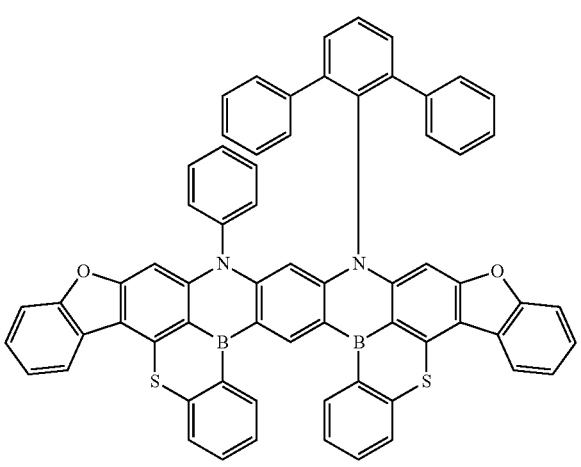

-continued
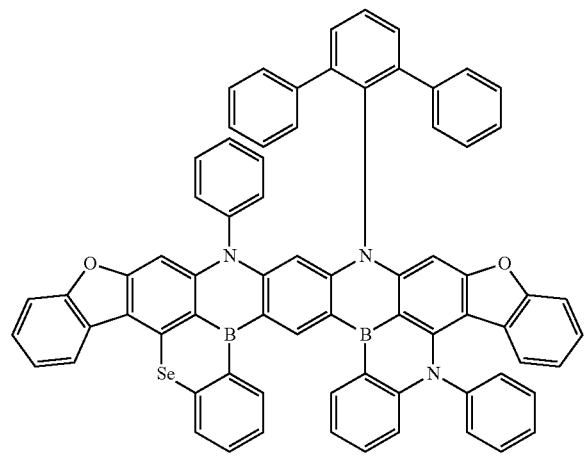
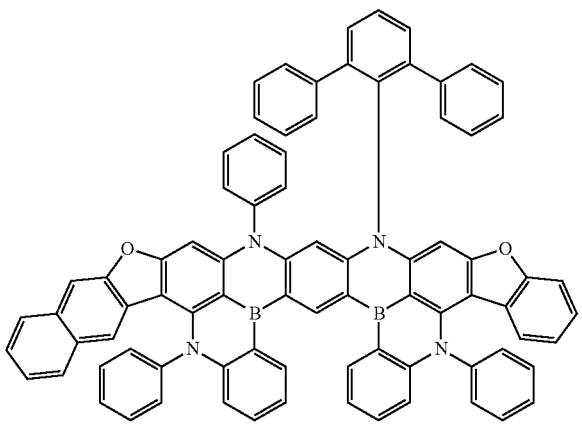
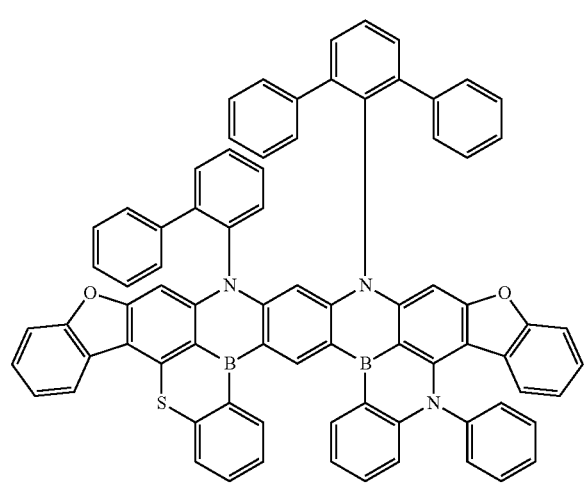
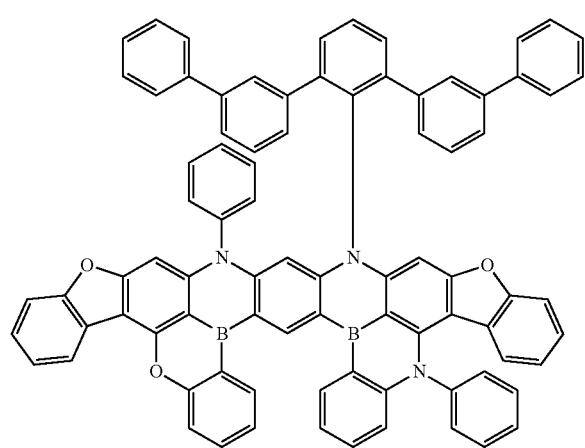
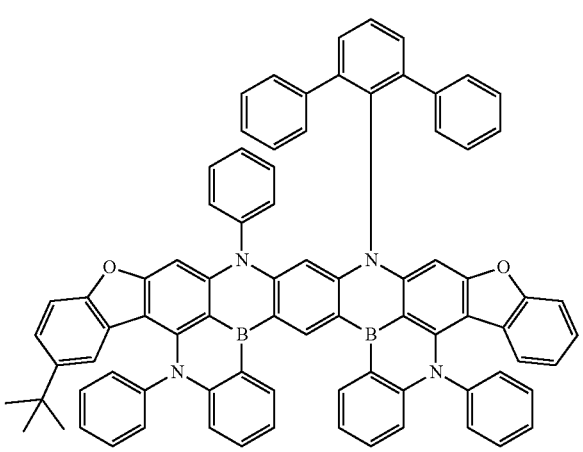

-continued
22
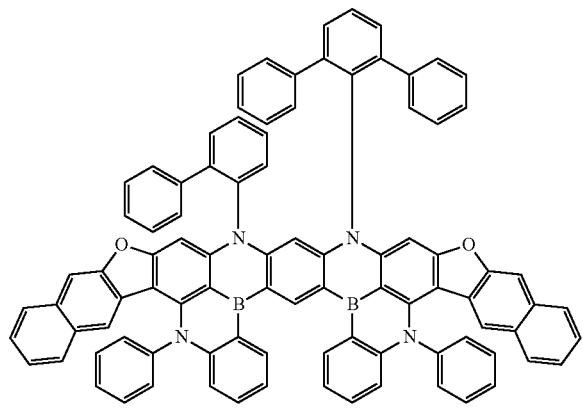
23
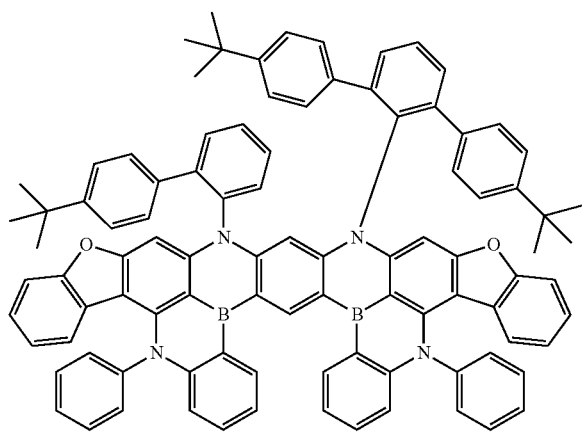
24
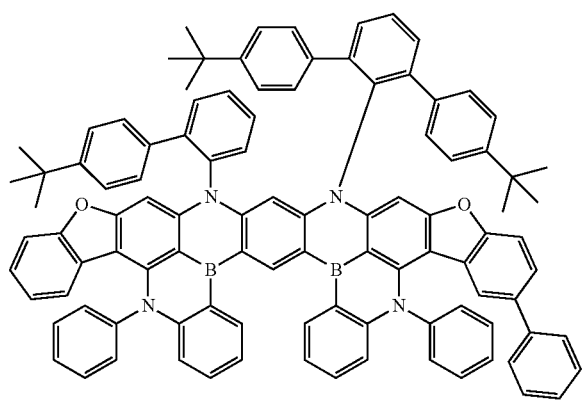
-continued
25
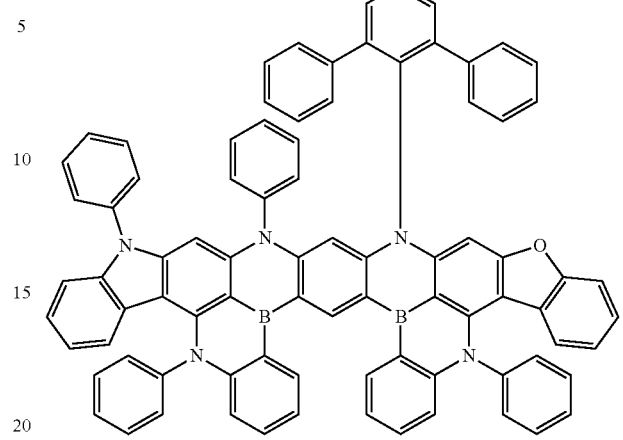
26
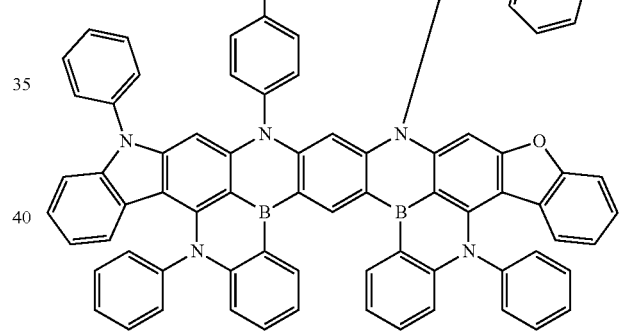
27
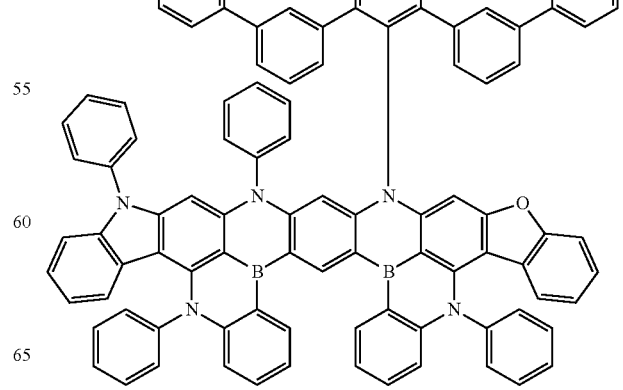

187
28
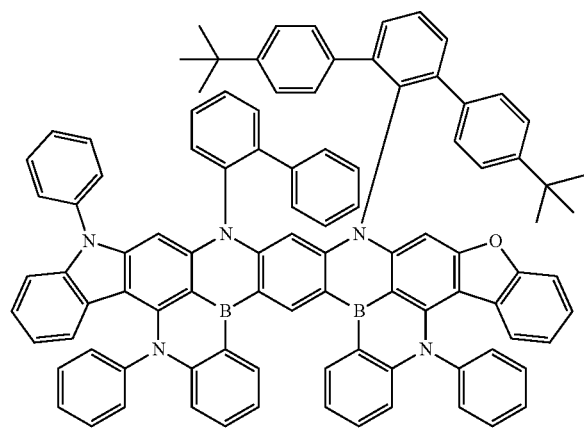
29
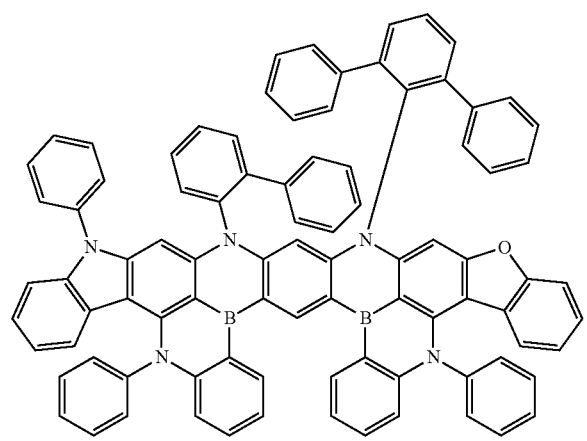
30
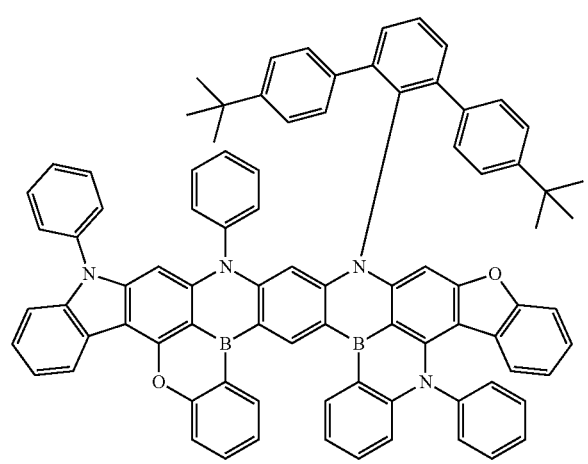
188
31
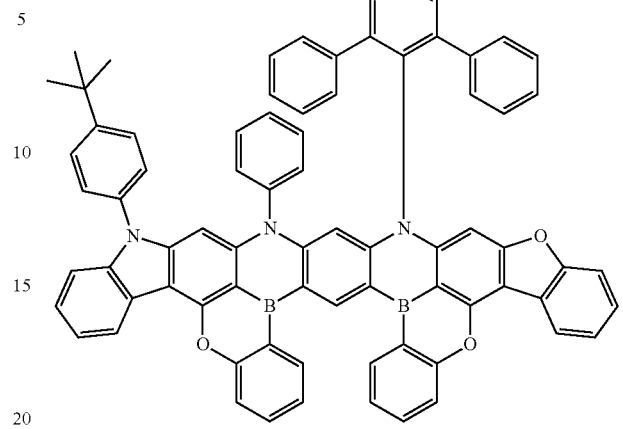
32
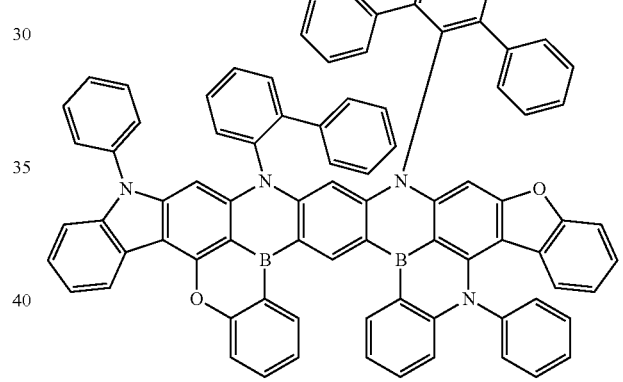
33
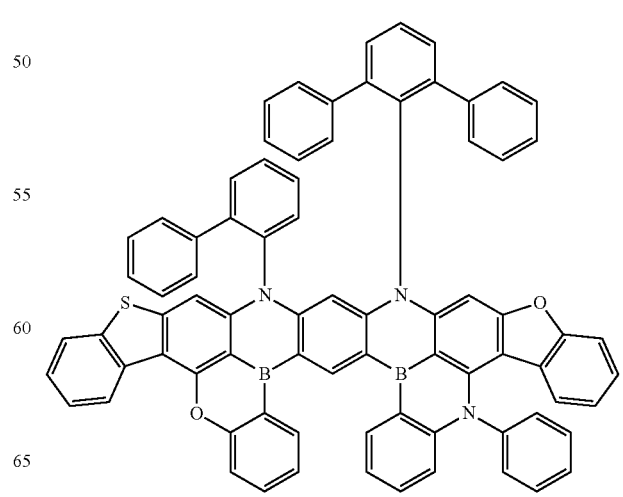

34
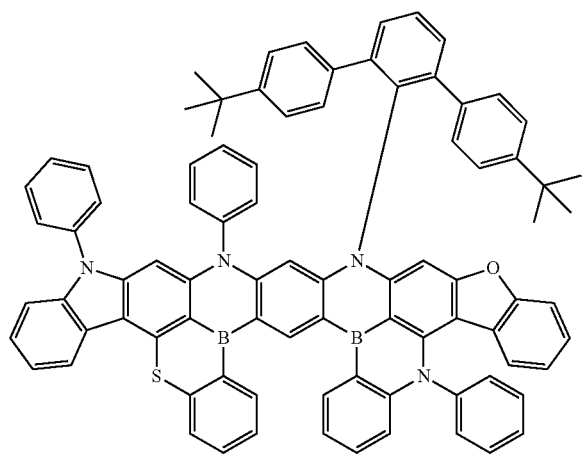
35
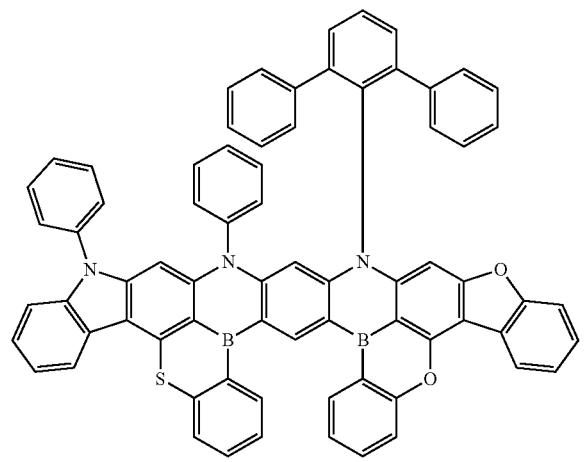
36
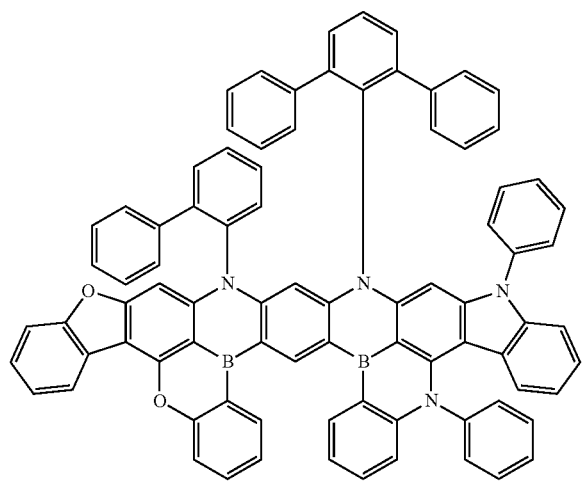
37
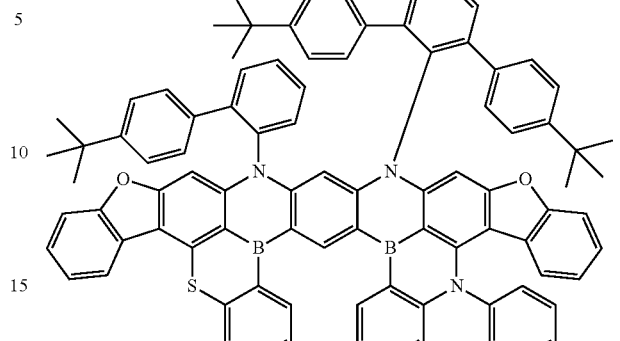
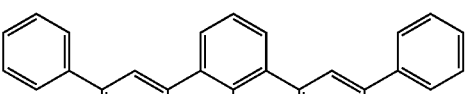
38
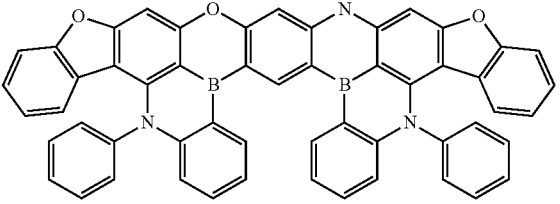
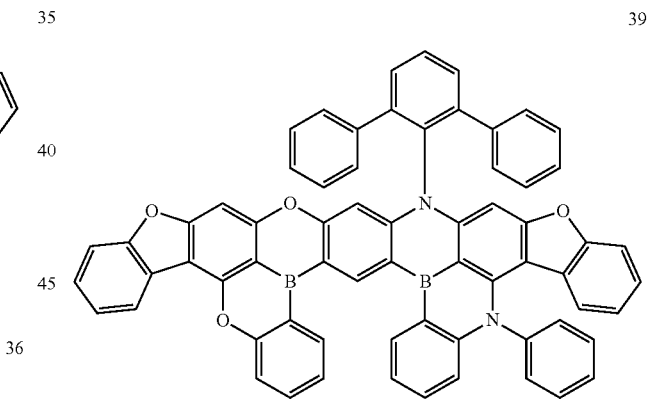
39
40
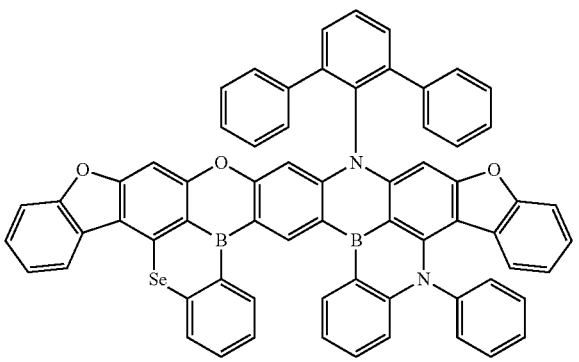

41
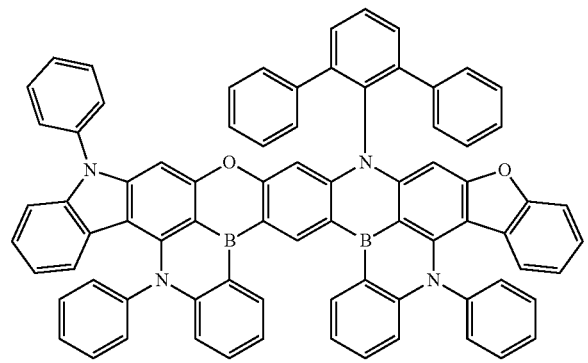
42
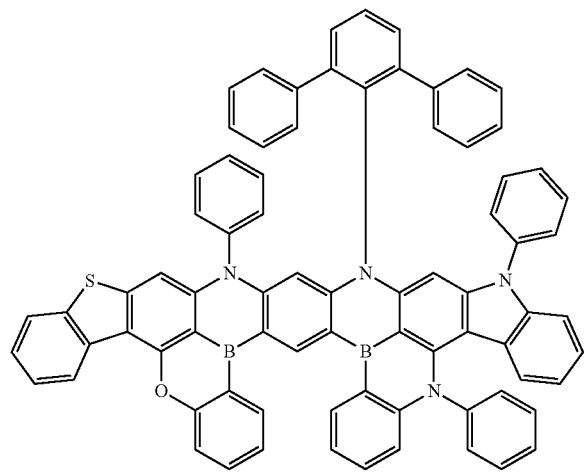
43
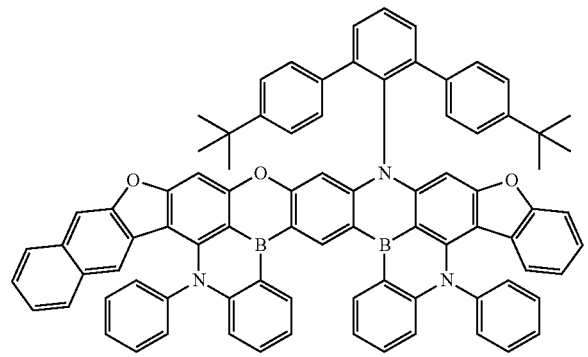
44
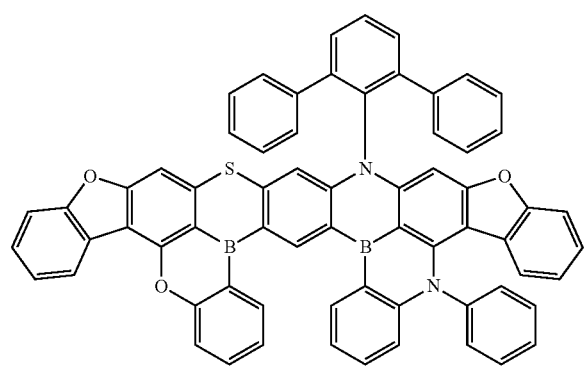
45
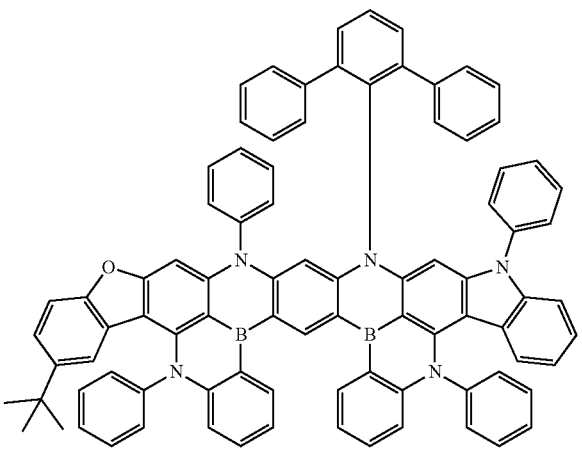
46
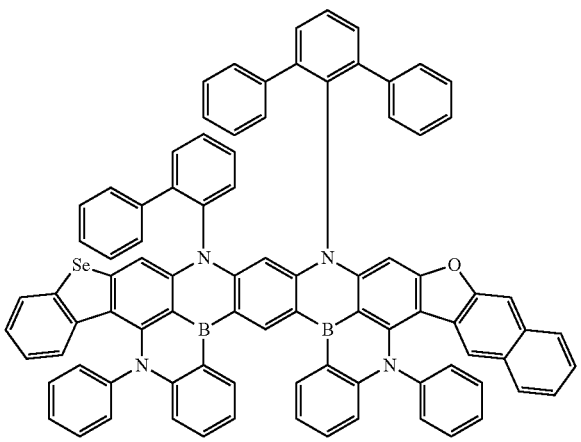
47
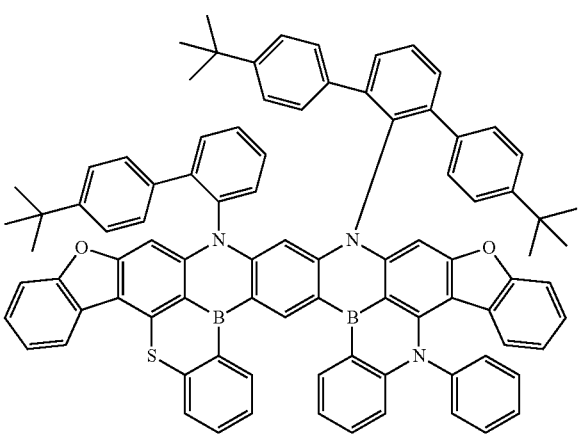

48
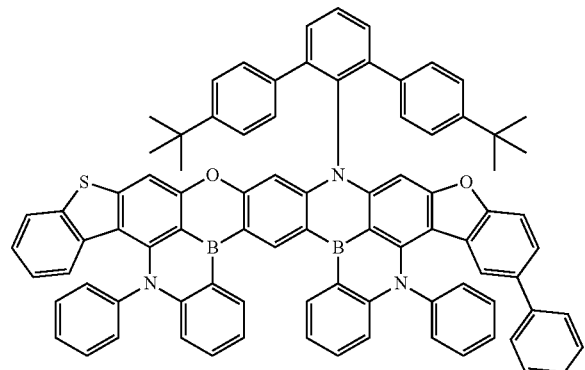
49
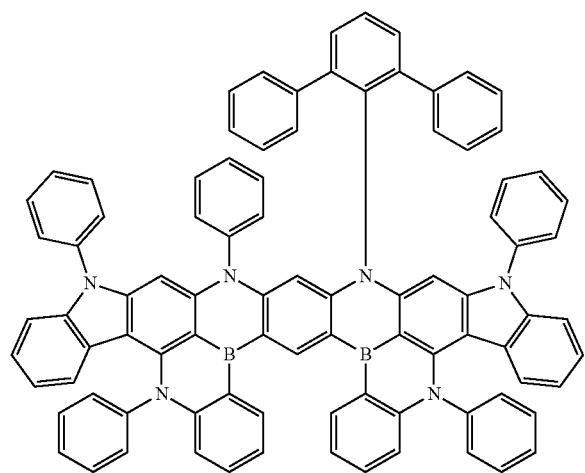
50
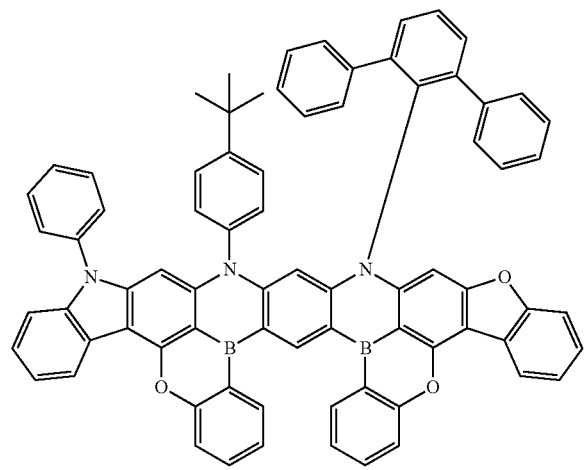
51
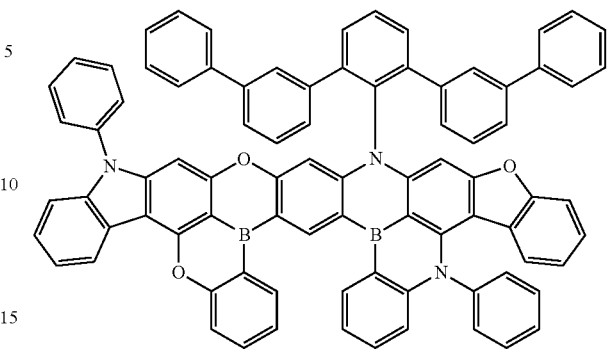
52
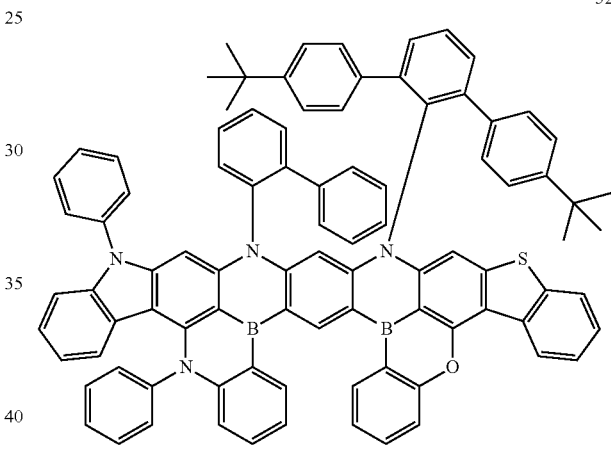
53
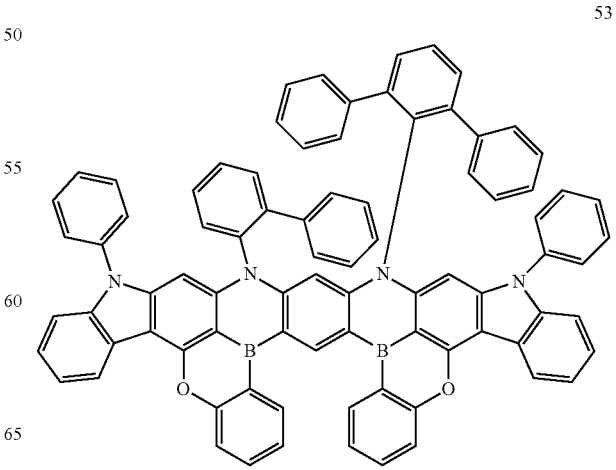

54
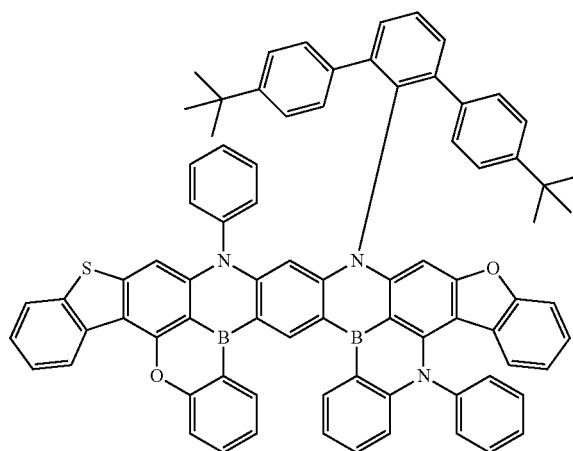
55
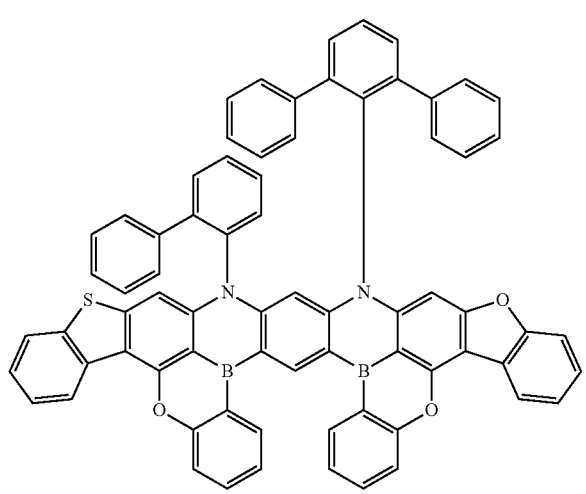
56
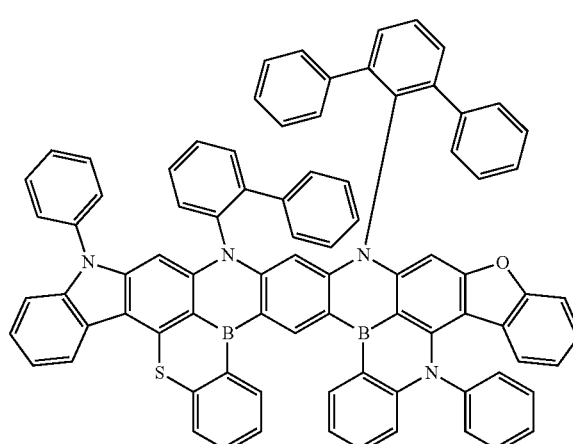
57
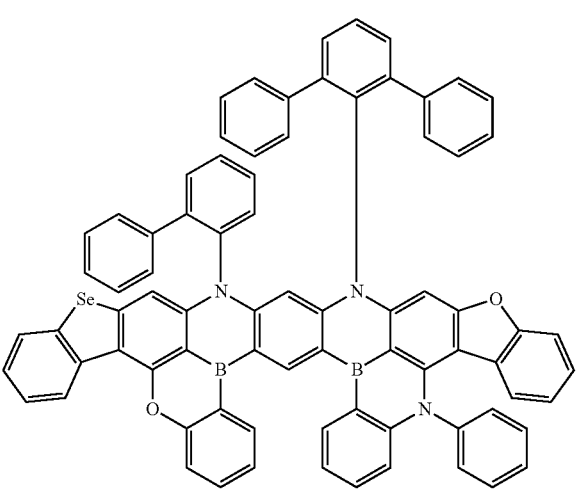
58
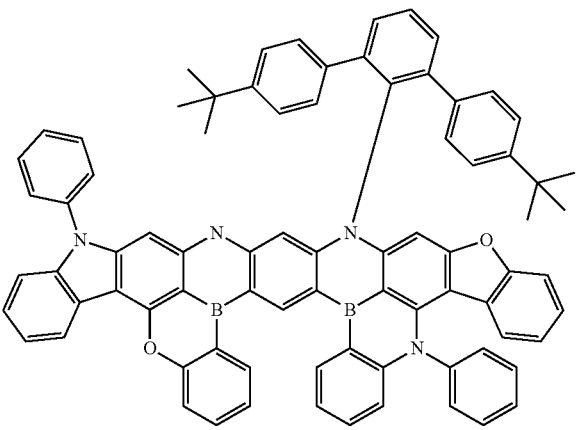
59
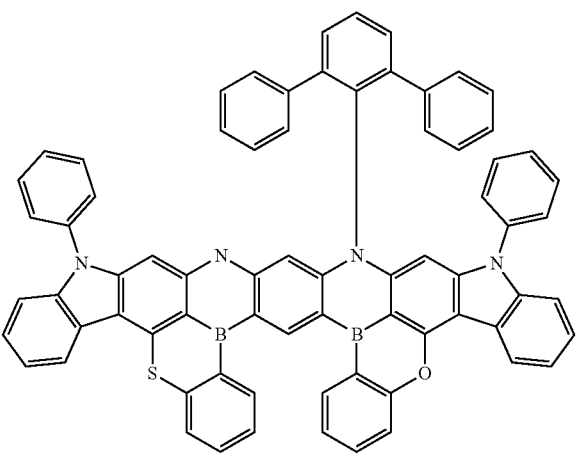

197
-continued
60
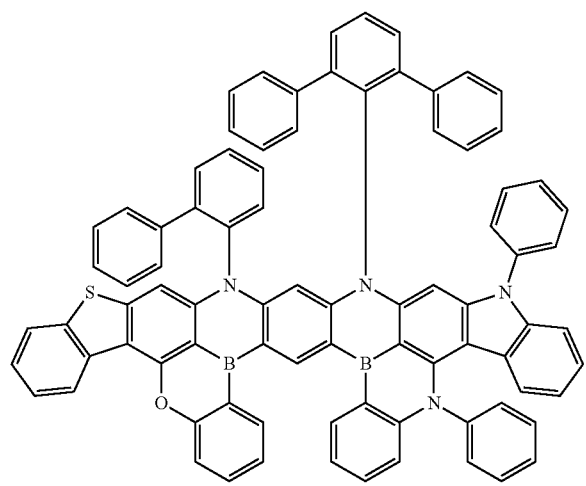
61
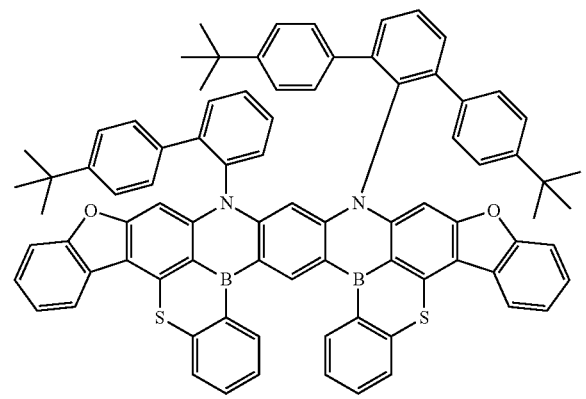
62
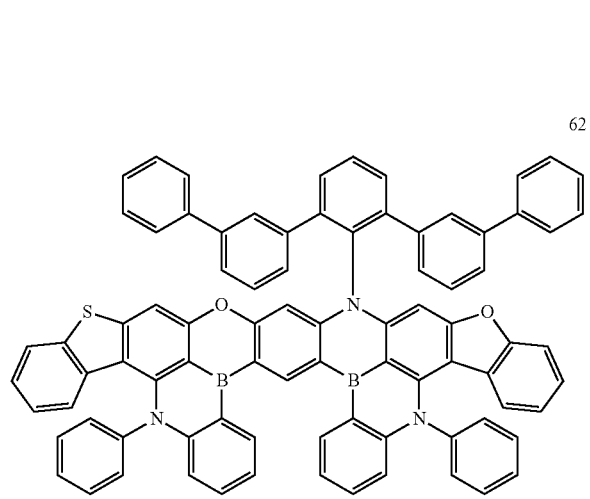
198
-continued
63
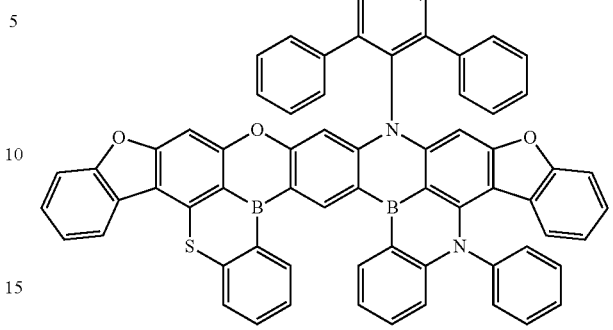
64
65
66
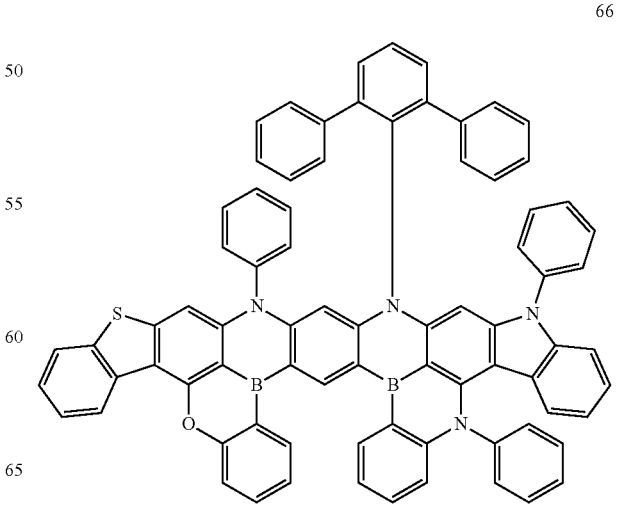

67
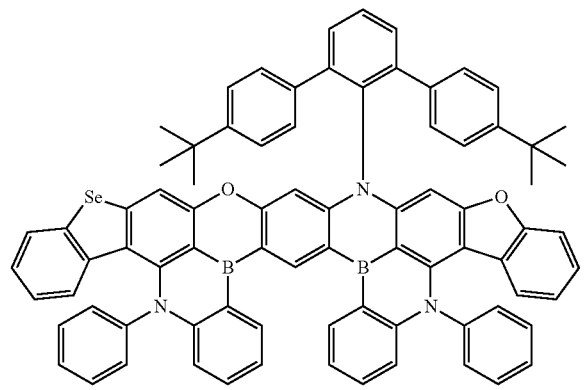
68
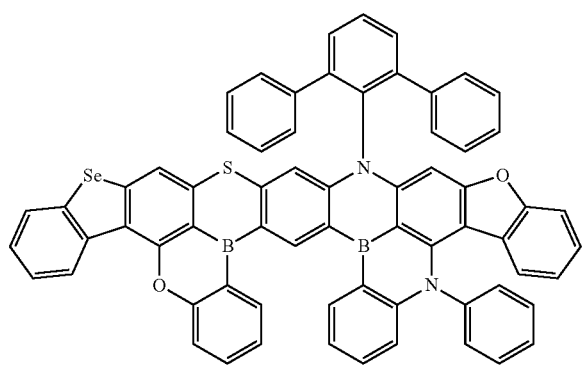
69
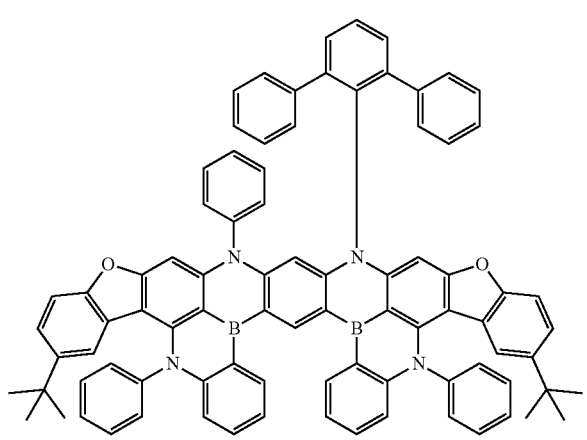
70
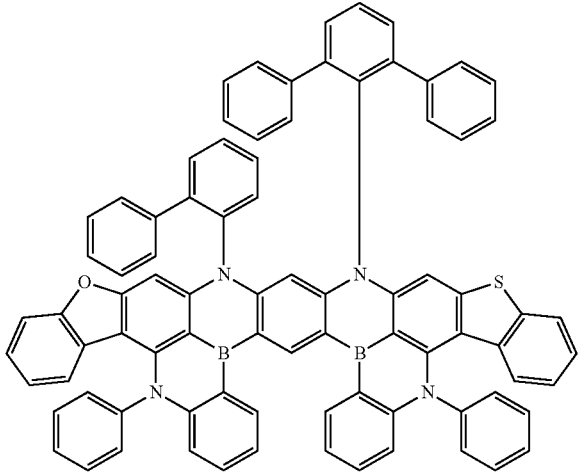
71
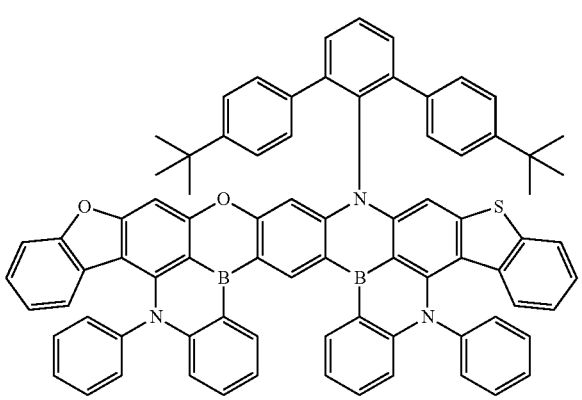
72
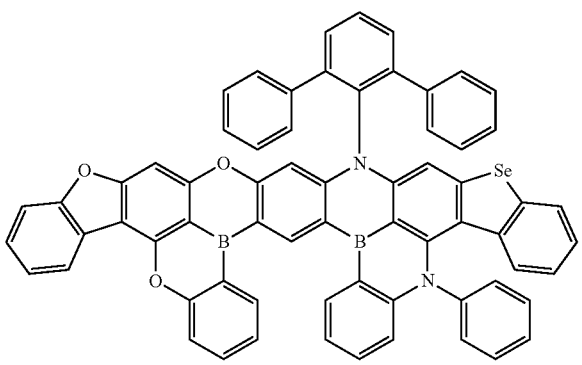

73
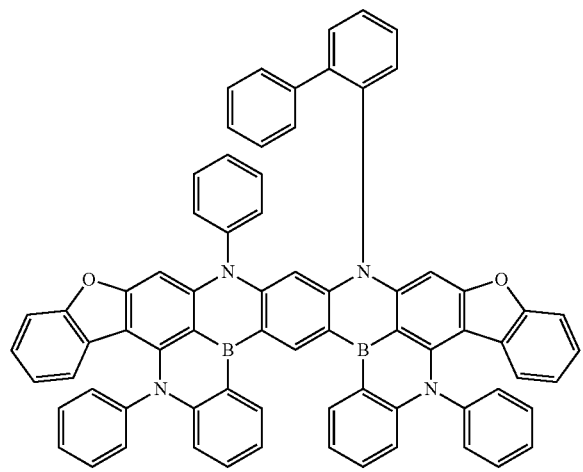
74
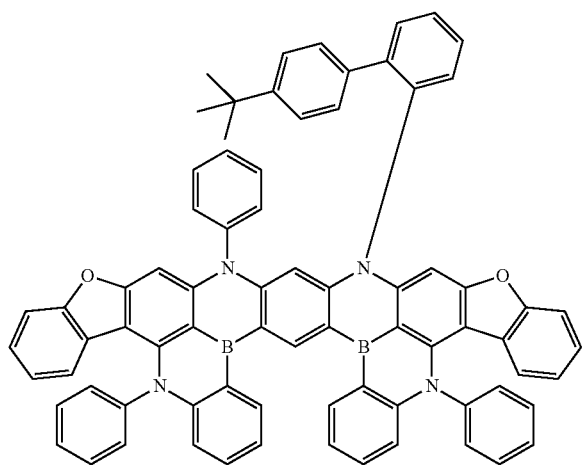
75
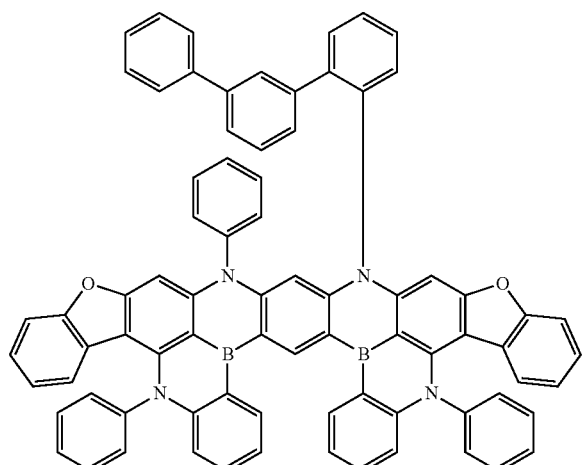
76
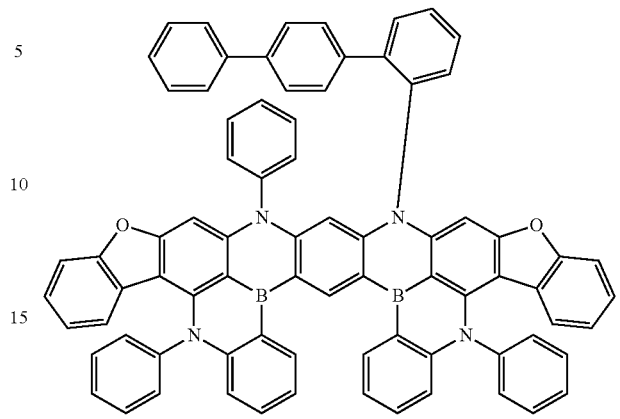
77
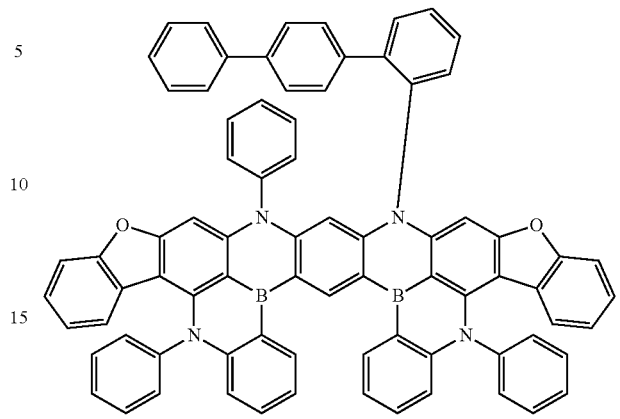
78
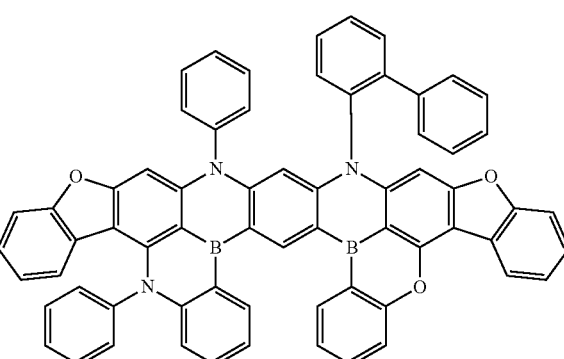
79
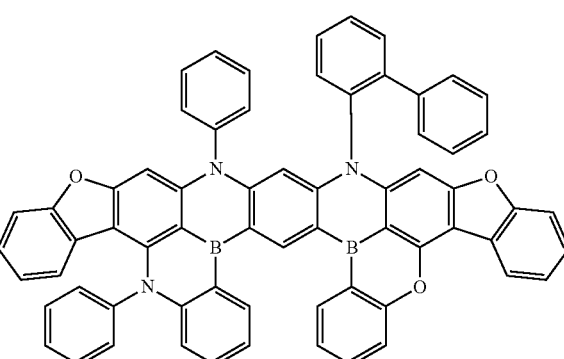

80
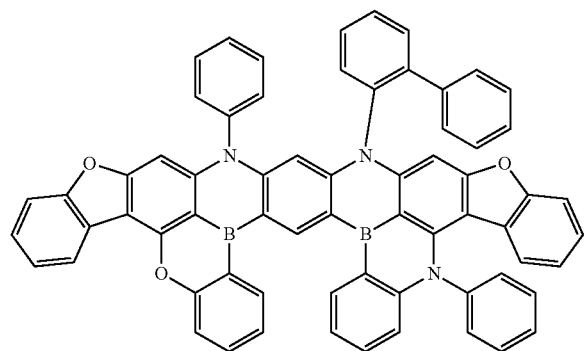
81
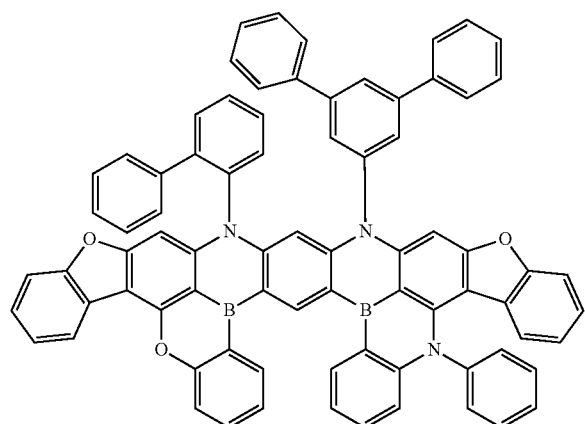
82
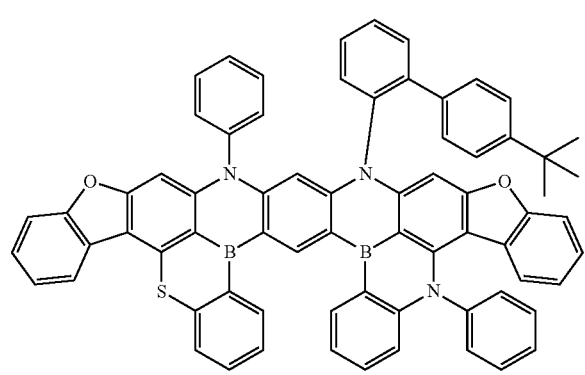
83
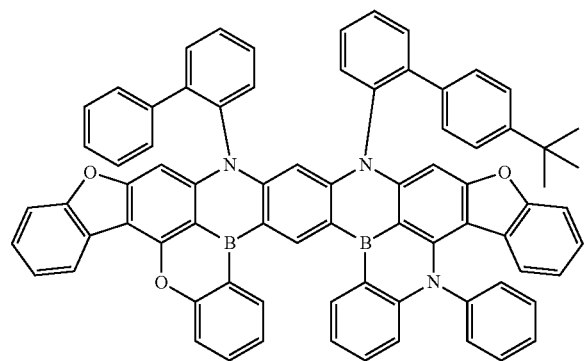
84
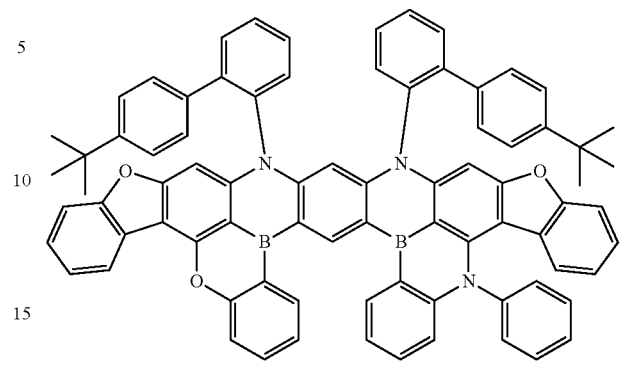
85
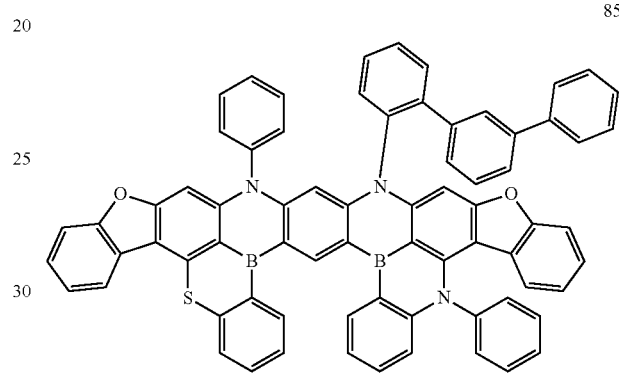
86
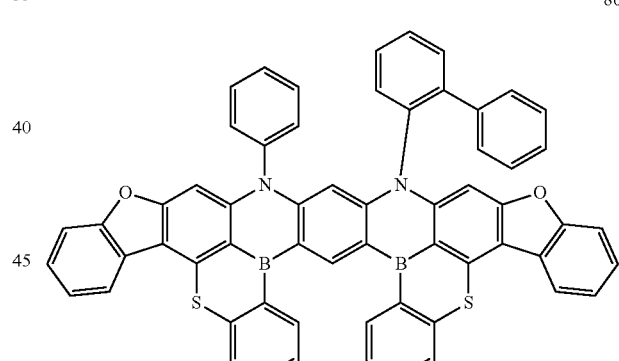
87
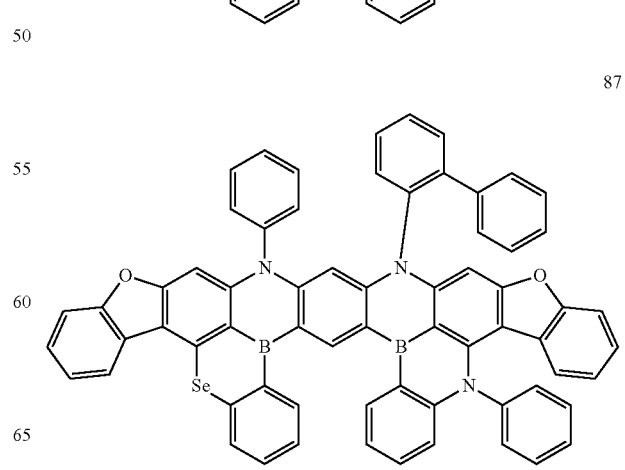

205
-continued
88
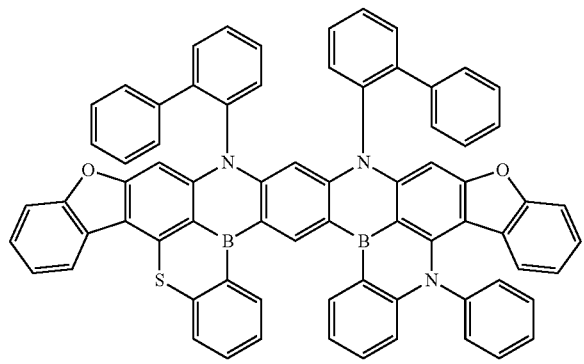
89
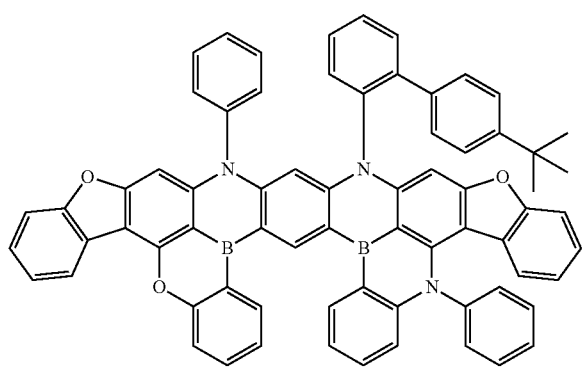
90
91
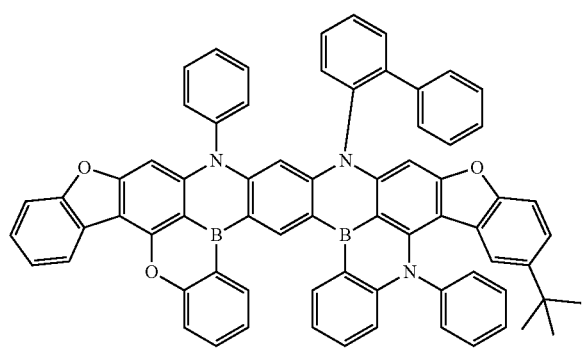
206
-continued
92
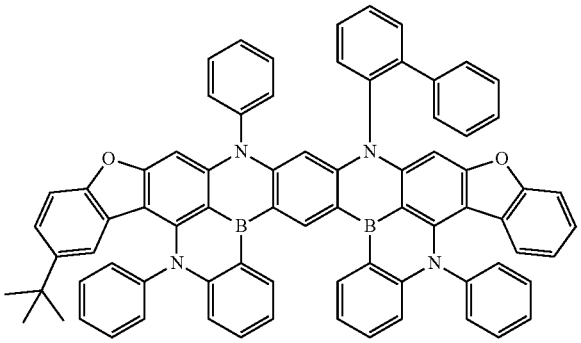
93
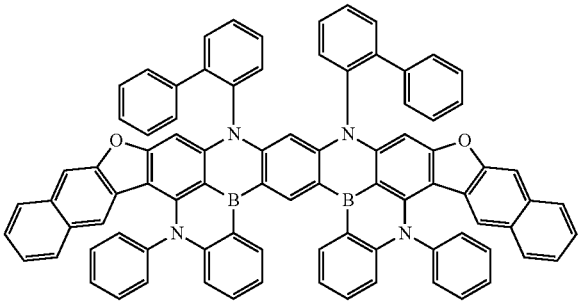
94
95
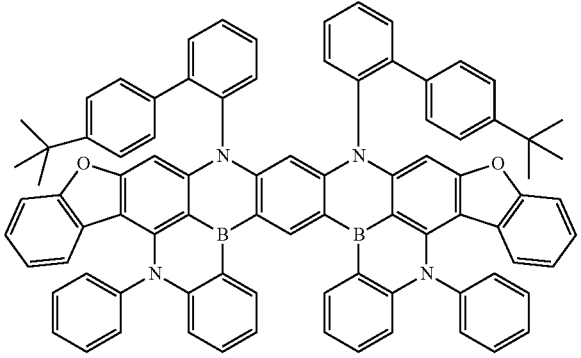
* * * * *